US012484443B2

(12) United States Patent
Sagara et al.

(10) Patent No.: US 12,484,443 B2
(45) Date of Patent: Nov. 25, 2025

(54) ORGANIC ELECTROLUMINESCENT ELEMENT

(71) Applicant: NIPPON STEEL CHEMICAL & MATERIAL CO., LTD., Tokyo (JP)

(72) Inventors: Yuta Sagara, Tokyo (JP); Masashi Tada, Tokyo (JP)

(73) Assignee: NIPPON STEEL CHEMICAL & MATERIAL CO., LTD., Tokyo (JP)

( * ) Notice: Subject to any disclaimer, the term of this patent is extended or adjusted under 35 U.S.C. 154(b) by 1020 days.

(21) Appl. No.: 16/970,566

(22) PCT Filed: Mar. 4, 2019

(86) PCT No.: PCT/JP2019/008273
§ 371 (c)(1),
(2) Date: Aug. 17, 2020

(87) PCT Pub. No.: WO2019/176605
PCT Pub. Date: Sep. 19, 2019

(65) Prior Publication Data

US 2021/0119144 A1 Apr. 22, 2021

(30) Foreign Application Priority Data

Mar. 16, 2018 (JP) ................................ 2018-049365

(51) Int. Cl.
*H10K 85/60* (2023.01)
*C09K 11/06* (2006.01)
(Continued)

(52) U.S. Cl.
CPC .......... *H10K 85/6572* (2023.02); *C09K 11/06* (2013.01); *C09K 2211/1007* (2013.01);
(Continued)

(58) Field of Classification Search
CPC ...................... H10K 2101/20; H10K 85/6572
See application file for complete search history.

(56) References Cited

U.S. PATENT DOCUMENTS 6,387,547 B1 * 5/2002 Fujita ...................... C07C 15/38
313/506
2002/0044782 A1 * 4/2002 Kota ................... G09G 3/3216
396/661
(Continued)

FOREIGN PATENT DOCUMENTS

| | | | |
|---|---|---|---|
| JP | 2014-86427 | A | 5/2014 |
| JP | 2018-170369 | A | 11/2018 |
| KR | 10-2017-0075877 | A | 7/2017 |

OTHER PUBLICATIONS

Meng, H. and Herron, N. Chapter 3 Organic Small Molecule Materials for Organic-Light Emitting Diodes, 2006, 332-333. (Year: 2006).*

(Continued)

*Primary Examiner* — Sean M DeGuire
(74) *Attorney, Agent, or Firm* — Birch, Stewart, Kolasch & Birch, LLP

(57) ABSTRACT

Provided is a thermally activated delayed fluorescent emission-type organic electroluminescent device (organic EL device) having a low driving voltage, high luminous efficiency, and a long lifetime. The organic EL device is a delayed fluorescent emission-type organic EL device including one or more light-emitting layers between an anode and a cathode opposite to each other, wherein at least one of the light-emitting layers contains a para-biphenylcarbazole compound-type host material represented by the general formula (1), and an indolocarbazole compound-type thermally activated delayed fluorescent light-emitting material including an indolocarbazole ring in a molecule thereof.

(Continued)

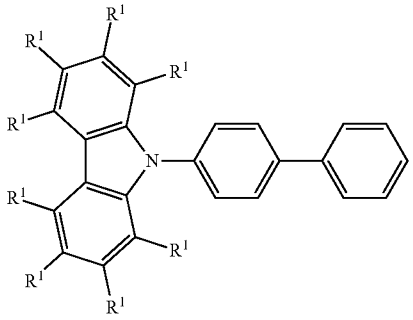

(1)

3 Claims, 1 Drawing Sheet

(51) Int. Cl.
*H10K 50/11* (2023.01)
*H10K 101/20* (2023.01)

(52) U.S. Cl.
CPC ...... *C09K 2211/1018* (2013.01); *H10K 50/11* (2023.02); *H10K 2101/20* (2023.02)

(56) References Cited

U.S. PATENT DOCUMENTS

| | | | | |
|---|---|---|---|---|
| 2012/0043531 | A1* | 2/2012 | Jung | C09B 57/008 257/E51.024 |
| 2012/0241732 | A1* | 9/2012 | Endo | H10K 85/6572 257/E51.026 |
| 2014/0197386 | A1 | 7/2014 | Kim et al. | |
| 2015/0200371 | A1* | 7/2015 | Kim | H10K 50/15 544/212 |
| 2016/0268516 | A1 | 9/2016 | Tanaka et al. | |
| 2017/0033296 | A1 | 2/2017 | Xia et al. | |
| 2017/0194569 | A1 | 7/2017 | Kim et al. | |
| 2017/0352816 | A1 | 12/2017 | Jeon et al. | |
| 2018/0212157 | A1 | 7/2018 | Oshiyama et al. | |
| 2019/0103562 | A1 | 4/2019 | Tada et al. | |

OTHER PUBLICATIONS

Meng and Herron (Year: 2006).*
Swayambrabha et al., An Approach for Measuring the Dielectric Strength of OLED Materials, Materials, Jun. 9, 2018, 11, 979. ( Year: 2018).*
International Preliminary Report on Patentability and Written Opinion of the International Searching Authority, dated Sep. 22, 2020, for International Application No. PCT/JP2019/008273, with an English translation.
Sato et al., "Organic Luminescent Molecule with Energetically Equivalent Singlet and Triplet Excited States for Organic Light-Emitting Diodes", PRL, Jun. 14, 2013, vol. 110, No. 247401, pp. 1-5 (5 pages).

* cited by examiner

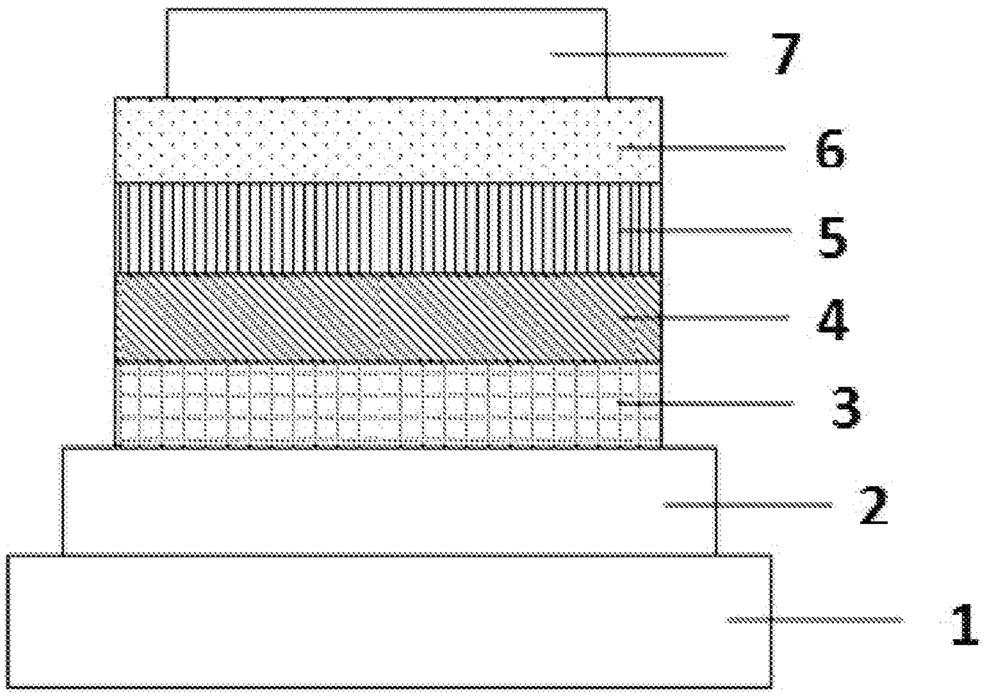
7
6
5
4
3
2
1

ORGANIC ELECTROLUMINESCENT ELEMENT

TECHNICAL FIELD

The present invention relates to a delayed fluorescent emission-type organic electroluminescent device (referred to as organic EL device).

BACKGROUND ART

When a voltage is applied to an organic EL device, a hole is injected from an anode into a light-emitting layer, and an electron is injected from a cathode into the layer. Then, in the light-emitting layer, the hole and the electron thus injected recombine to produce an exciton. At this time, according to the statistical law of electron spins, singlet excitons and triplet excitons are produced at a ratio of 1:3. The internal quantum efficiency of a fluorescent emission-type organic EL device using light emission by a singlet exciton is said to be at most 25%. Meanwhile, it has been known that the internal quantum efficiency of a phosphorescent emission-type organic EL device using light emission by a triplet exciton can be improved to 100% when intersystem crossing from a singlet exciton is efficiently performed.

In recent years, a technology for the lengthening of the lifetime of a phosphorescent organic EL device has been advancing, and has started to be applied to the display of a cellular phone or the like. With regard to a blue organic EL device, however, a practical phosphorescent emission-type organic EL device has not been developed, and hence the development of a blue organic EL device having high efficiency and a long lifetime has been required.

Further, a high-efficiency delayed fluorescent emission-type organic EL device utilizing delayed fluorescence has been recently developed. In, for example, Patent Literature 1, there is a disclosure of an organic EL device utilizing a triplet-triplet fusion (TTF) mechanism serving as one of the delayed fluorescence mechanisms. The TTF mechanism utilizes a phenomenon in which a singlet exciton is produced by collision between two triplet excitons, and is considered to be capable of improving internal quantum efficiency to 40% in theory. However, a further improvement in efficiency has been required because the efficiency of the device is lower than that of a phosphorescent light-emitting organic EL device.

Meanwhile, in Non Patent Literature 1, there is a disclosure of a delayed fluorescent emission-type organic EL device utilizing a thermally activated delayed fluorescence (TADF) mechanism. The TADF mechanism utilizes a phenomenon in which inverse intersystem crossing from a triplet exciton to a singlet exciton occurs in a material having a small energy difference between a singlet level and a triplet level, and is considered to be capable of improving internal quantum efficiency to 100% in theory. However, a further improvement in lifetime characteristic has been required as in a phosphorescent light-emitting device.

CITATION LIST

Patent Literature

[PTL 1] WO 2011/070963 A1

[PTL 2] US 2014/0197386 A1

[PTL 3] WO 2016/017760 A1

[PTL 4] WO 2015/022987 A1

[PTL 3] US 2017/0352816 A1

Non Patent Literature

[NPL 1] Phys. Rev. Lett. 2013, 110, 247401

In each of Patent Literature 1 and Non Patent Literature 1, there is a disclosure of the use of an indolocarbazole compound as a TADF material.

In Patent Literature 2, there is a disclosure of a phosphorescent organic EL device using an indolocarbazole compound and a carbazole compound as hosts, but there is no disclosure of the use of any such compound as a delayed fluorescent emission-type light-emitting layer material.

In Patent Literature 3, there is a disclosure of a delayed fluorescent emission-type organic EL device using the following compound as a host and using an indoloindole compound as a light-emitting material.

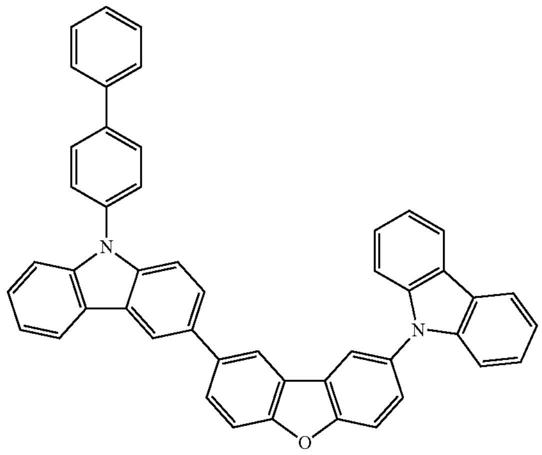 [SMILES: c1ccc(-c2ccc(-n3c4ccccc4c4cc(-c5ccc6oc7ccc(-n8c9ccccc9c9ccccc98)cc7c6c5)ccc43)cc2)cc1]

In Patent Literature 4, there is a disclosure of a delayed fluorescent emission-type organic EL device using, as a host, a compound to which 9-([1,1'-biphenyl]-4-yl)-9H-carbazole is linked and using a cyanobenzene compound as a light-emitting material.

In Patent Literature 5, there is a disclosure of a delayed fluorescent emission-type organic EL device using the following compound as a host and using, as a light-emitting material, an indolocarbazole compound containing a cyano group.

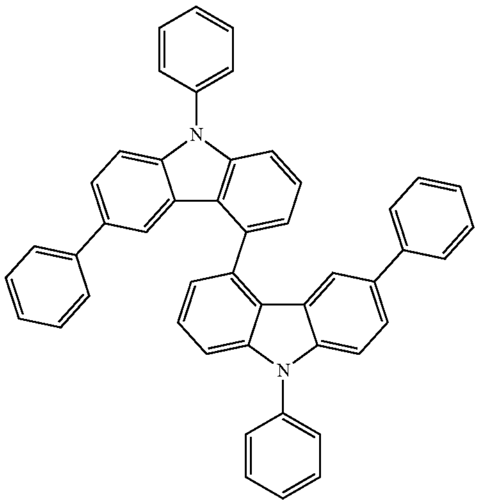 [SMILES: c1ccc(-c2ccc3c(c2)c2c(-c4cccc5c4c4cc(-c6ccccc6)ccc4n5-c4ccccc4)cccc2n3-c2ccccc2)cc1]

However, each of those literatures cannot be said to be sufficient, and hence further improvements in characteristics have been required.

SUMMARY OF INVENTION

In order to apply an organic EL device to a display device, such as a flat panel display, or a light source, the luminous efficiency of the device needs to be improved, and at the same time, stability at the time of its driving needs to be sufficiently secured. In view of the above-mentioned present circumstances, an object of the present invention is to provide an organic EL device having high efficiency and high driving stability while having a low driving voltage.

According to one embodiment of the present invention, there is provided an organic electroluminescent device (organic EL device), including one or more light-emitting layers between an anode and a cathode opposite to each other, wherein at least one of the light-emitting layers contains at least one kind of host material and at least one kind of thermally activated delayed fluorescent light-emitting material, and wherein the at least one kind of the host material is represented by the following general formula (1), and the at least one kind of the thermally activated delayed fluorescent light-emitting material is represented by the following general formula (2):

(1)

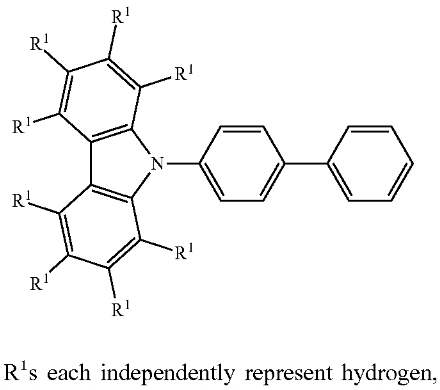

where $R^1$s each independently represent hydrogen, an aliphatic hydrocarbon group having 1 to 8 carbon atoms, a substituted or unsubstituted aromatic hydrocarbon group having 6 to 18 carbon atoms, a substituted or unsubstituted aromatic heterocyclic group having 3 to 17 carbon atoms, or a linked aromatic group formed by linking 2 to 6 aromatic rings of aromatic groups each selected from the aromatic hydrocarbon group and the aromatic heterocyclic group, and may each be fused with a carbazole ring to form a fused ring, provided that none of $R^1$s represents a carbazolyl group;

(2)

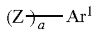

(2a)

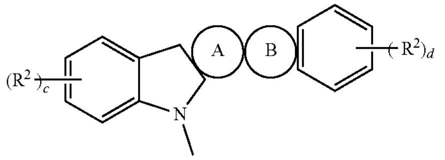

(2b)

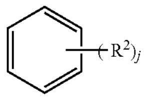

(2c)

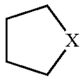

where:

Z is represented by the formula (2a), and in the formula (2a), a ring A is an aromatic hydrocarbon ring represented by the formula (2b), a ring B is a heterocycle represented by the formula (2c), and the ring A and the ring B are each fused with an adjacent ring at arbitrary positions, and X is one selected from N—$Ar^2$, an oxygen atom, and a sulfur atom;

$Ar^1$ and $Ar^2$ each independently represent a substituted or unsubstituted aromatic hydrocarbon group having 6 to 18 carbon atoms, a substituted or unsubstituted aromatic heterocyclic group having 3 to 17 carbon atoms, or a linked aromatic group formed by linking 2 to 6 aromatic rings of aromatic groups each selected from the aromatic hydrocarbon group and the aromatic heterocyclic group, and when $Ar^1$ or $Ar^2$ represents a linked aromatic group, the aromatic rings to be linked may be identical to or different from each other;

$R^2$s each independently represent an aliphatic hydrocarbon group having 1 to 10 carbon atoms, a substituted or unsubstituted aromatic hydrocarbon group having 6 to 18 carbon atoms, or a substituted or unsubstituted aromatic heterocyclic group having 3 to 17 carbon atoms, and may each be fused with an adjacent ring to form a fused ring; and a represents an integer of from 1 to 3, c and d each independently represent an integer of from 0 to 4, and j represents an integer of from 0 to 2.

A preferred mode of the present invention is described below.

1) In the general formula (1), at least one of $R^1$s represents a substituted or unsubstituted phenyl group, a substituted or unsubstituted dibenzofuranyl group, a substituted or unsubstituted dibenzothiophenyl group, a substituted or unsubstituted triazolyl group, a substituted or unsubstituted benzimidazolyl group, a substituted or unsubstituted fluorenyl group, or a linked aromatic group formed by linking 2 to 4 of the groups.

2) In the general formula (1), at least two of $R^1$s each independently represent a substituted or unsubstituted phenyl group, a substituted or unsubstituted dibenzofuranyl group, a substituted or unsubstituted dibenzothiophenyl group, a substituted or unsubstituted triazolyl group, a substituted or unsubstituted benzimidazolyl group, a substituted or unsubstituted fluorenyl group, or a linked aromatic group formed by linking 2 to 4 of the groups.

3) The host material is a mixed host material containing at least one kind of compound represented by the general formula (1).

4) The host material is a mixed host material containing at least two kinds of compounds each represented by the general formula (1).

5) A difference between an excited singlet energy (S1) and an excited triplet energy (T1) of the thermally activated delayed fluorescent light-emitting material is 0.2 eV or less, and the host material represented by the general formula (1) has an excited triplet energy (T1) larger than the excited singlet energy (S1) and the excited triplet energy (T1) of the thermally activated delayed fluorescent light-emitting material.

6) In the general formula (2), X represents —N—$Ar^2$.

7) In the general formula (2), a=1 and $Ar^1$ represents the following formula (3):

(3)

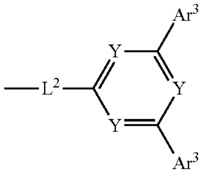

where Ys each represent a N atom or $CR^3$, and at least one of Ys represents a N atom, $R^3$ represents a hydrogen atom, or a substituted or unsubstituted aromatic hydrocarbon group having 6 to 18 carbon atoms, $L^2$ represents a single bond, an aromatic hydrocarbon group having 6 to 18 carbon atoms, or an aromatic heterocyclic group having 3 to 17 carbon atoms, and $Ar^3$s each independently represent a hydrogen atom, a substituted or unsubstituted aromatic hydrocarbon group having 6 to 18 carbon atoms, a substituted or unsubstituted aromatic heterocyclic group having 3 to 17 carbon atoms, or a group formed by linking 2 to 4 aromatic rings of aromatic groups each selected from the aromatic hydrocarbon group and the aromatic heterocyclic group.

The organic EL device of the present invention can be an organic EL device having a low driving voltage, high luminous efficiency, and a long lifetime because the device contains a specific host material and a specific thermally activated delayed fluorescent material in a light-emitting layer thereof.

BRIEF DESCRIPTION OF DRAWINGS

The FIGURE is a schematic sectional view for illustrating an example of an organic EL device.

DESCRIPTION OF EMBODIMENTS

An organic EL device of the present invention includes one or more light-emitting layers between an anode and a cathode opposite to each other, and at least one layer of the light-emitting layers contains a host material represented by the general formula (1) and a thermally activated delayed fluorescent light-emitting material (referred to as TADF material) represented by the general formula (2).

The general formula (1) is described.

The compound represented by the general formula (1) is also referred to as p-biphenylcarbazole compound because the compound has a skeleton in which biphenyl and a carbazole ring are linked to each other at a para position.

$R^1$s each independently represent a hydrogen atom, an aliphatic hydrocarbon group having 1 to 8 carbon atoms, a substituted or unsubstituted aromatic hydrocarbon group having 6 to 18 carbon atoms, a substituted or unsubstituted aromatic heterocyclic group having 3 to 17 carbon atoms, or a linked aromatic group formed by linking 2 to 6 aromatic rings of aromatic groups each selected from the aromatic hydrocarbon group and the aromatic heterocyclic group. $R^1$s each preferably represent a hydrogen atom, a substituted or unsubstituted aromatic hydrocarbon group having 6 to 16 carbon atoms, a substituted or unsubstituted aromatic heterocyclic group having 3 to 15 carbon atoms, or a linked aromatic group formed by linking 2 to 4 aromatic rings of aromatic groups each selected from the aromatic hydrocarbon group and the aromatic heterocyclic group. However, none of $R^1$s represents a substituted or unsubstituted carbazolyl group. In addition, when any one of $R^1$s has a ring, the ring may be fused with the carbazole ring.

Specific examples of the aliphatic hydrocarbon group having 1 to 8 carbon atoms include alkyl groups, such as a methyl group, an ethyl group, a propyl group, a butyl group, a pentyl group, a cyclopentyl group, a hexyl group, a cyclohexyl group, a methylcyclohexyl group, a heptyl group, and an octyl group.

The aromatic hydrocarbon group, the aromatic heterocyclic group, or the linked aromatic group may have a substituent. The substituent is specifically, for example, an aliphatic hydrocarbon group having 1 to 12 carbon atoms, or an alkoxy group having 1 to 12 carbon atoms, and is preferably an aliphatic hydrocarbon group having 1 to 8 carbon atoms, or an alkoxy group having 1 to 8 carbon atoms. Specific examples of the aliphatic hydrocarbon group include alkyl groups, such as a methyl group, an ethyl group, a propyl group, a butyl group, a pentyl group, a cyclopentyl group, a hexyl group, a cyclohexyl group, a methylcyclohexyl group, a heptyl group, and an octyl group, and specific examples of the alkoxy group include a methoxy group, an ethoxy group, a propoxy group, and a butoxy group.

Specific examples of the aromatic hydrocarbon group having 6 to 18 carbon atoms, the aromatic heterocyclic group having 3 to 17 carbon atoms, or the linked aromatic group formed by linking 2 to 6 aromatic rings of aromatic groups each selected from the aromatic hydrocarbon group and the aromatic heterocyclic group include groups each produced by removing one hydrogen atom from benzene, naphthalene, azulene, anthracene, phenanthrene, pyrene, chrysene, naphthacene, triphenylene, acenaphthene, coronene, indene, fluorene, fluoranthene, tetracene, pentacene, furan, dibenzofuran, thiophene, dibenzothiophene, oxazole, pyrrole, pyridine, pyridazine, pyrimidine, pyrazine, triazine, benzimidazole, oxadiazole, triazole, imidazole, pyrazole, thiazole, indole, indazole, benzimidazole, benzothiazole, benzoxazole, quinoxaline, quinazoline, cinnoline, quinoline, isoquinoline, phthalazine, naphthyridine, carboline, diazacarbazole, fluorene, or a linked aromatic compound formed by linking 2 to 6 of these compounds. Preferred examples thereof include groups each produced by removing one hydrogen atom from benzene, naphthalene, phenanthrene, triphenylene, dibenzofuran, dibenzothiophene, pyridine, pyridazine, pyrimidine, pyrazine, triazine, quinazoline, quinoline, diazacarbazole, benzimidazole, fluorene, or a linked aromatic compound formed by linking 2 to 4 of these compounds. Further, more preferred examples thereof include groups each produced by removing one hydrogen atom from benzene, dibenzofuran, dibenzothiophene, triazine, benzimidazole, fluorene, or a linked aromatic compound formed by linking 2 to 4 of these compounds. Examples of the linked aromatic compound include biphenyl and terphenyl.

In addition, when any one of $R^1$s has a ring, the ring may be fused with the carbazole ring. In, for example, the case where any one of $R^1$s has a benzene ring, a naphthalene ring, a furan ring, a thiophene ring, or an indole ring, any such ring may be fused with the carbazole ring to form a fused ring having 4 or more rings. In this case, the fused ring preferably has 4 to 6 rings, and more preferably has 4 or 5 rings.

The term linked aromatic group as used herein refers to a group obtained through the linking of two or more aromatic rings by direct bonding, and the aromatic rings to be linked may be identical to or different from each other. Each of the aromatic rings may be an aromatic hydrocarbon ring or an aromatic heterocyclic group, and may be linear or branched. In addition, the aromatic rings may each have a substituent. The number of the carbon atoms of the linked aromatic group is the total sum of the numbers of the carbon atoms of the aromatic groups for forming the linked aromatic group.

It is more preferred that at least one of $R^1$s represent an aromatic group selected from the group consisting of a phenyl group, a dibenzofuranyl group, a dibenzothiophenyl group, a triazolyl group, a benzimidazolyl group, a fluorenyl group, and a linked aromatic group formed by linking 2 to 4 of the groups, or a substituted aromatic group obtained by bonding a substituent to the aromatic group. It is still more preferred that at least two of $R^1$s each represent the aromatic group or the substituted aromatic group.

Although the substituent in this case is the same as that described above, the substituent is preferably an alkyl group having 1 to 8 carbon atoms, or an alkoxy group having 1 to 8 carbon atoms.

In this description, when an aromatic hydrocarbon group, an aromatic heterocyclic group, or the like whose number of carbon atoms has been specified has a substituent, the number of the carbon atoms of the substituent is not calculated in the calculation of the number of the carbon atoms of the aromatic hydrocarbon group, the aromatic heterocyclic group, or the like. However, the total number of carbon atoms including the number of the carbon atoms of the substituent preferably falls within the above-mentioned specified range.

Specific examples of the compound represented by the general formula (1) are shown below.

1-1

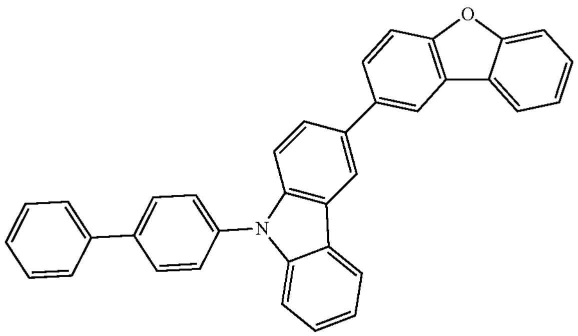

1-2

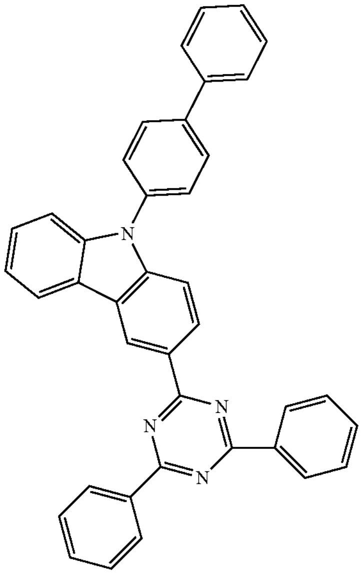

1-3

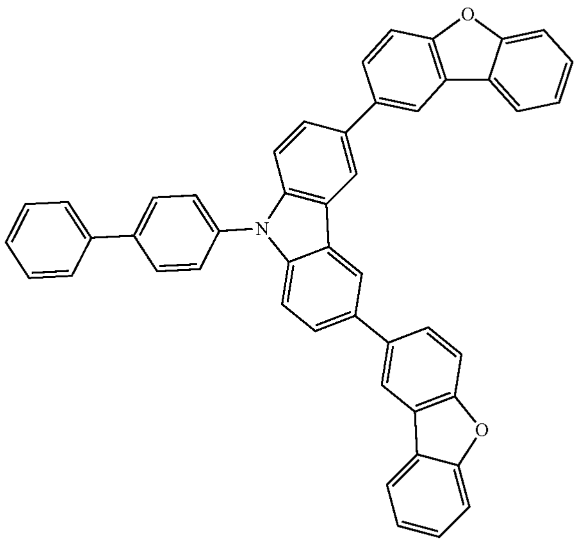

-continued
1-4
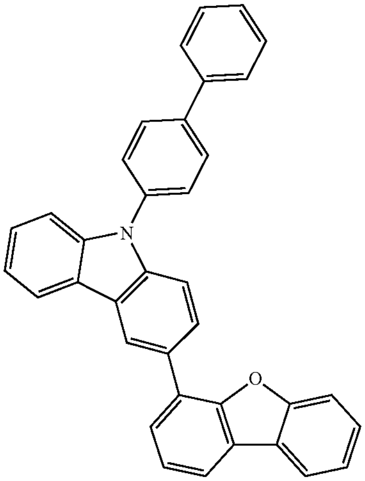
1-5
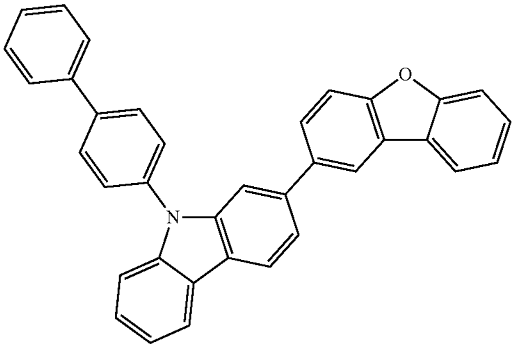
1-6
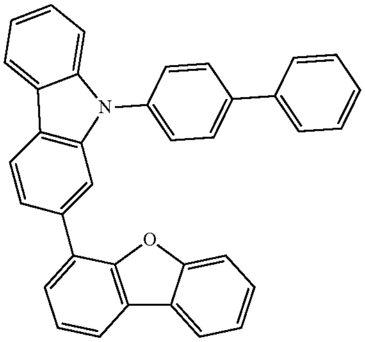
-continued
1-7
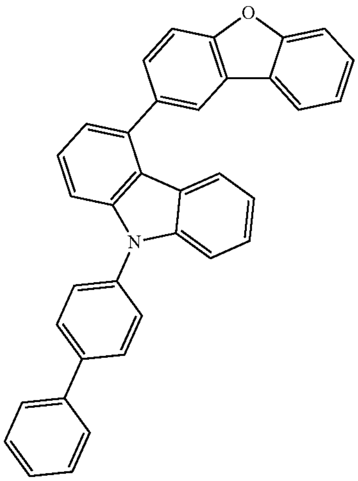
1-8
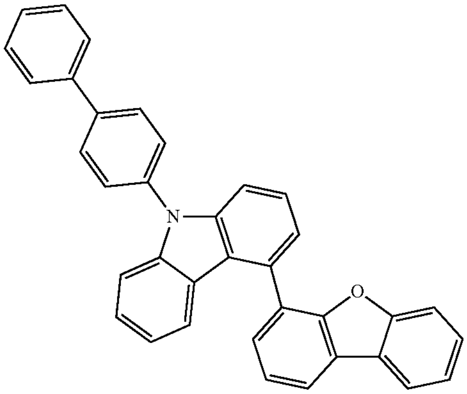
1-9
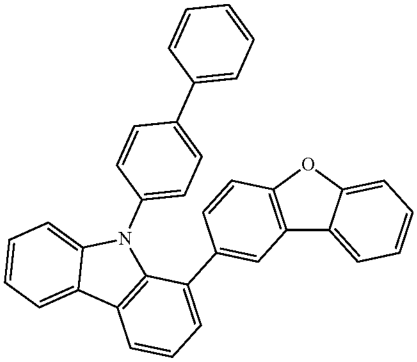
1-10
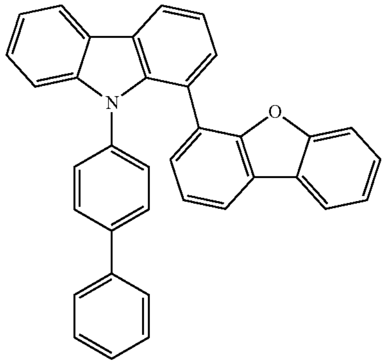

-continued
1-11
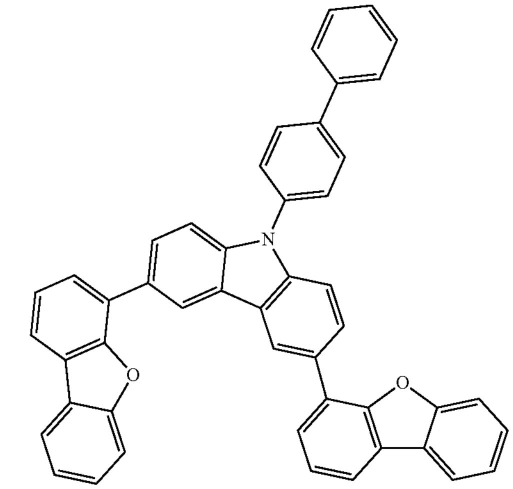
1-12
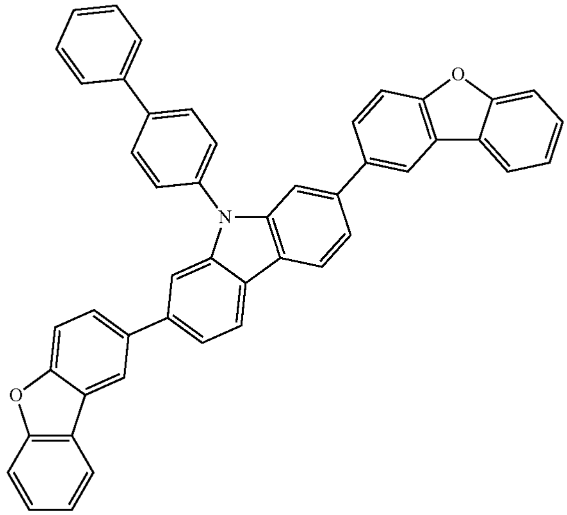
1-13
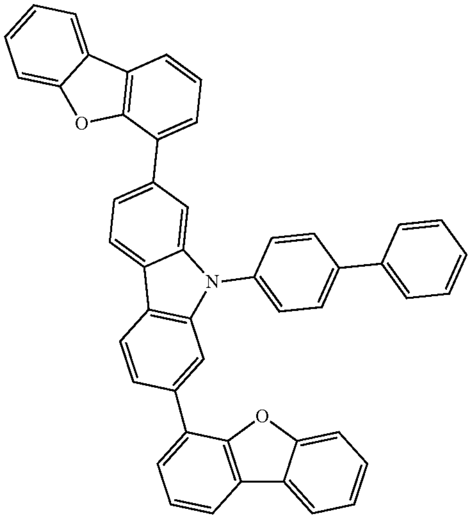
-continued
1-14
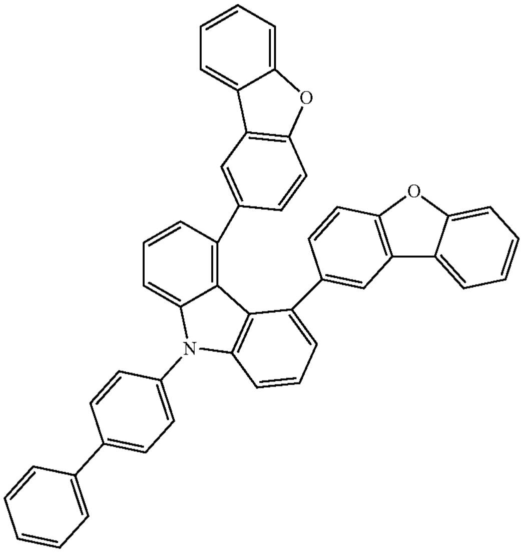
1-15
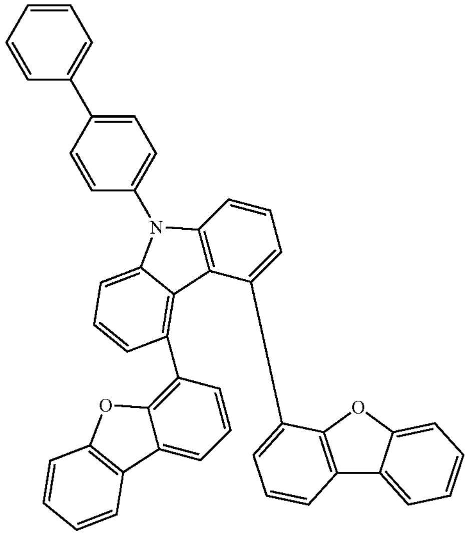
1-16
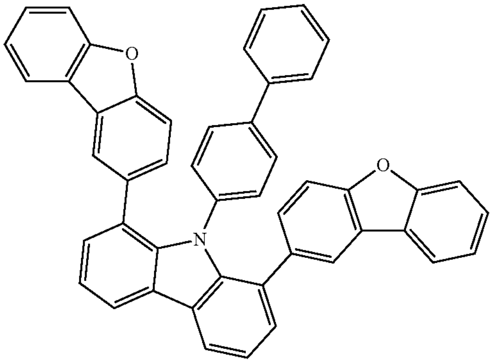

-continued
1-17
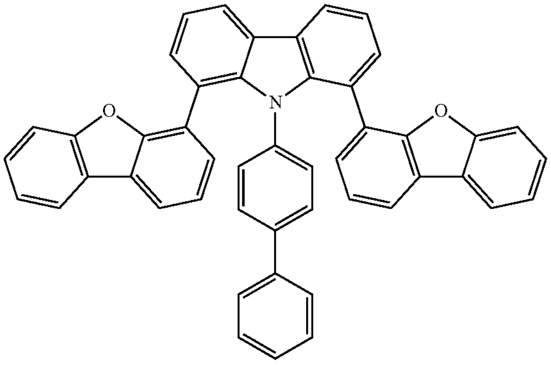
1-18
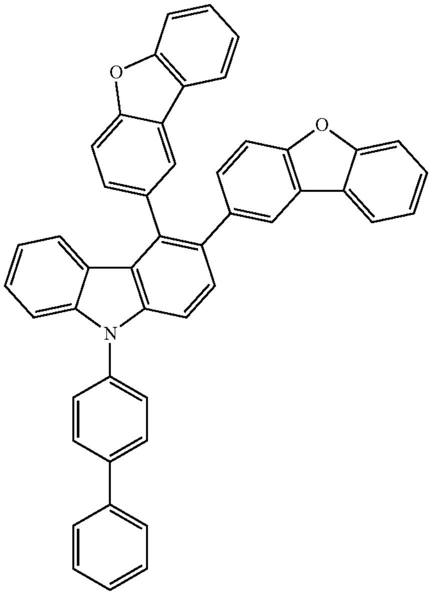
1-19
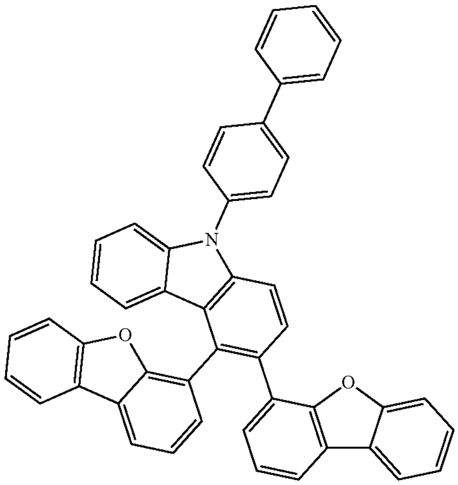
-continued
1-20
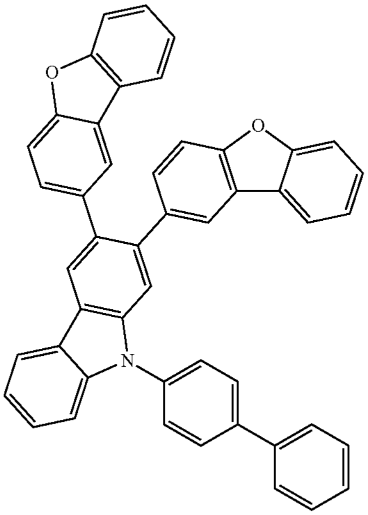
1-21
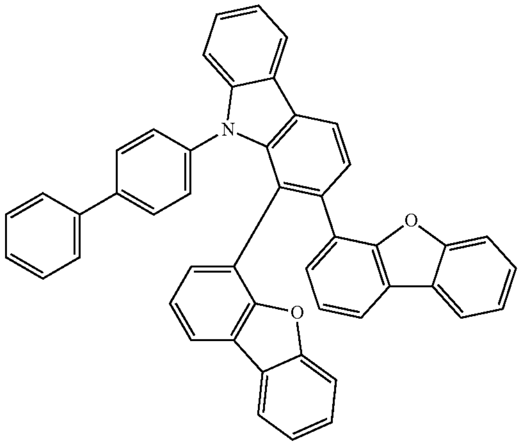
1-22
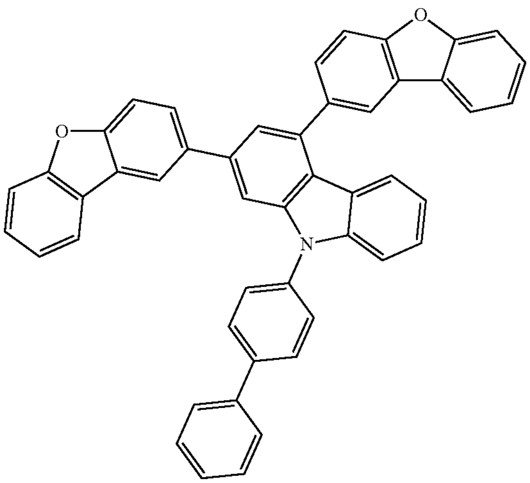

-continued
1-23
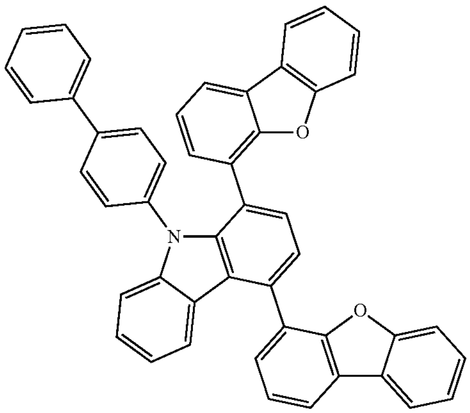
1-24
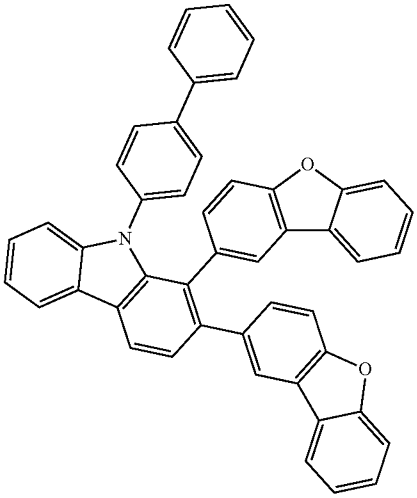
1-25
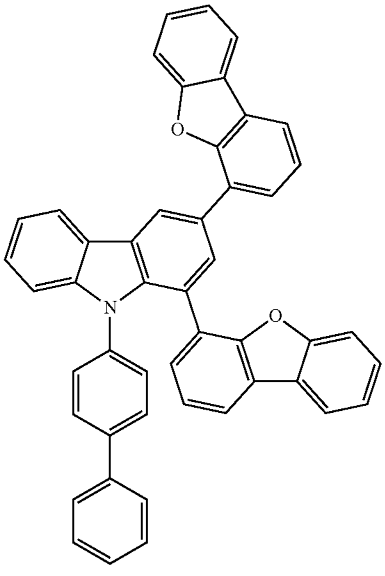
-continued
1-26
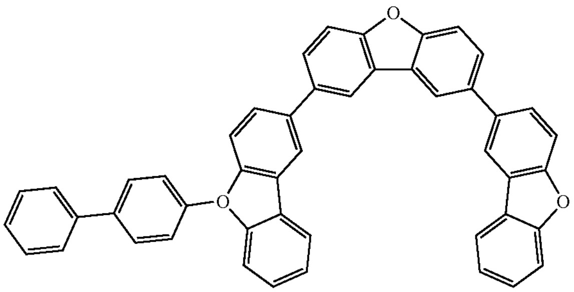
1-27
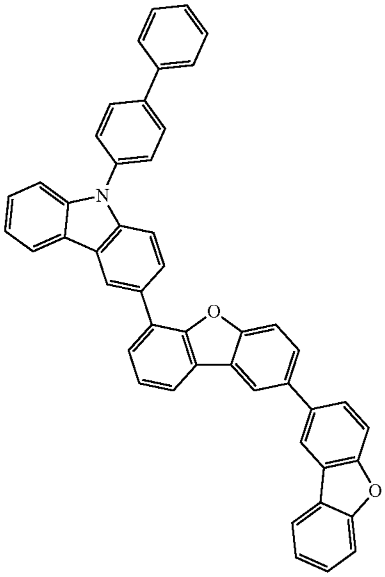
1-28
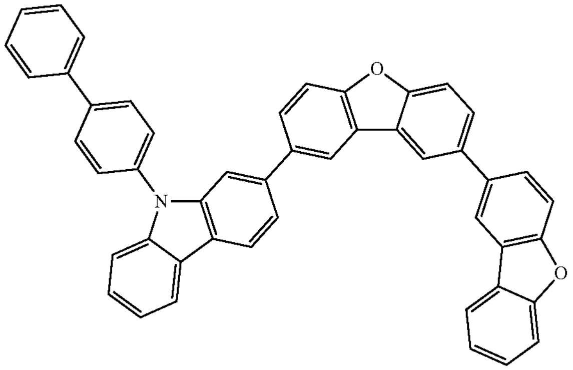

-continued
1-29
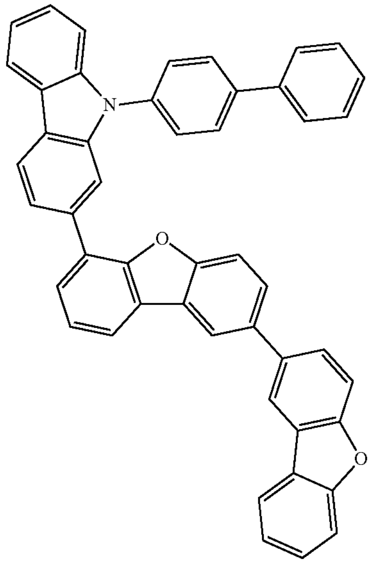
1-30
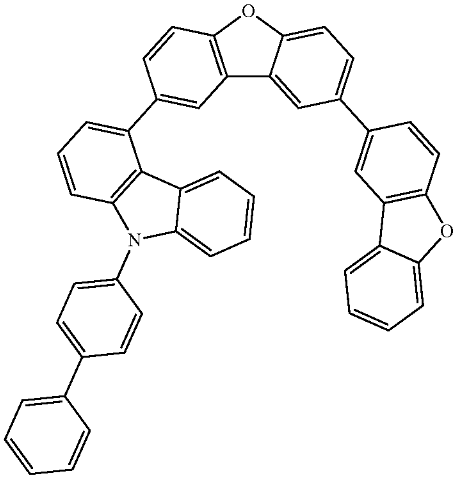
1-31
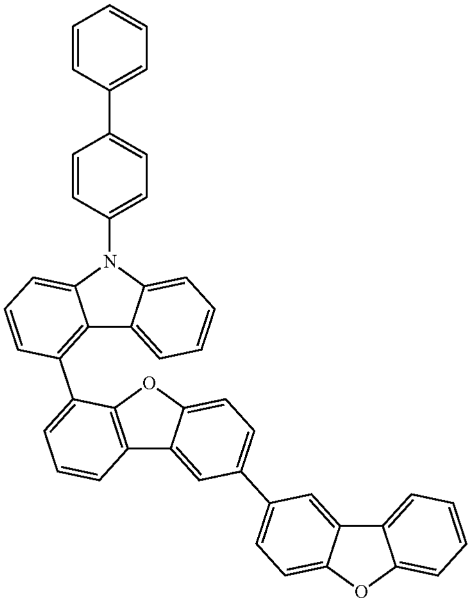
-continued
1-32
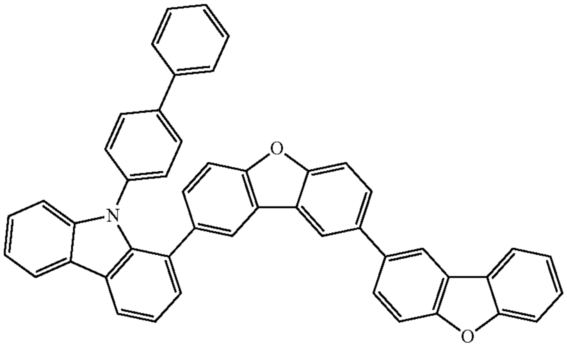
1-33
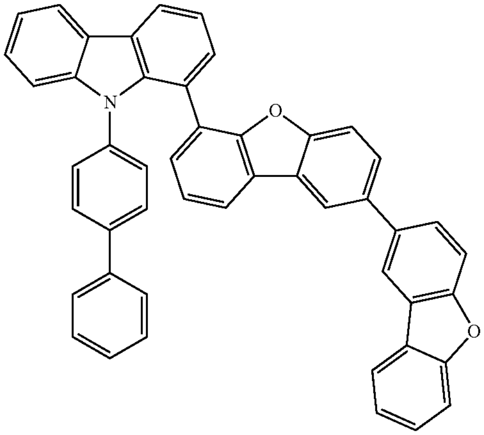
1-34
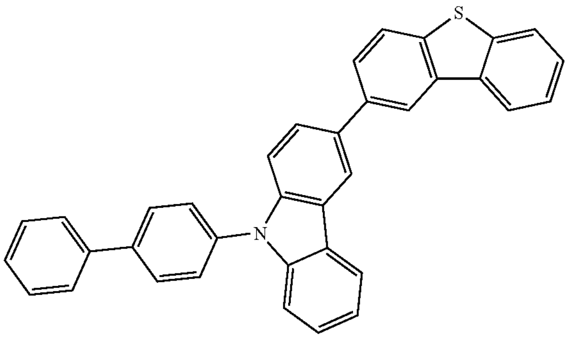
1-35
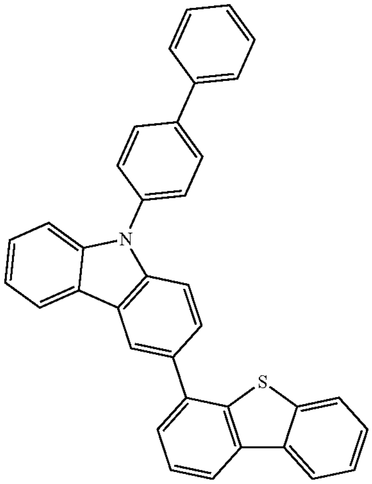

-continued
1-36
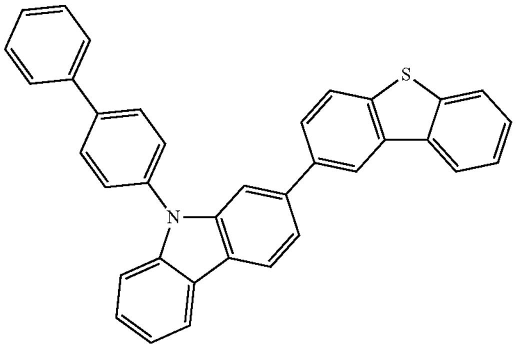
1-37
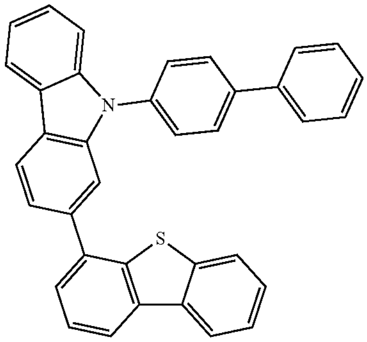
1-38
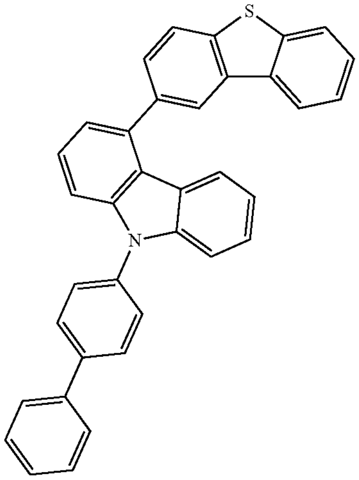
1-39
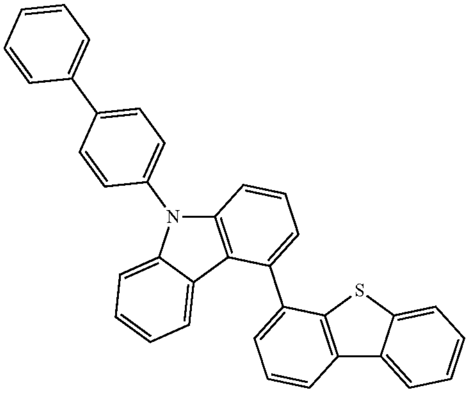
-continued
1-40
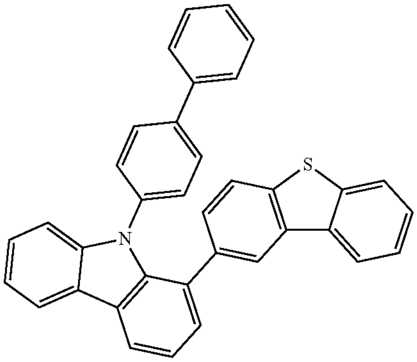
1-41
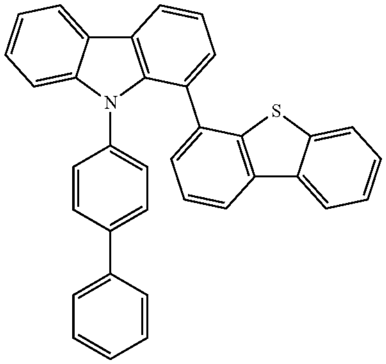
1-42
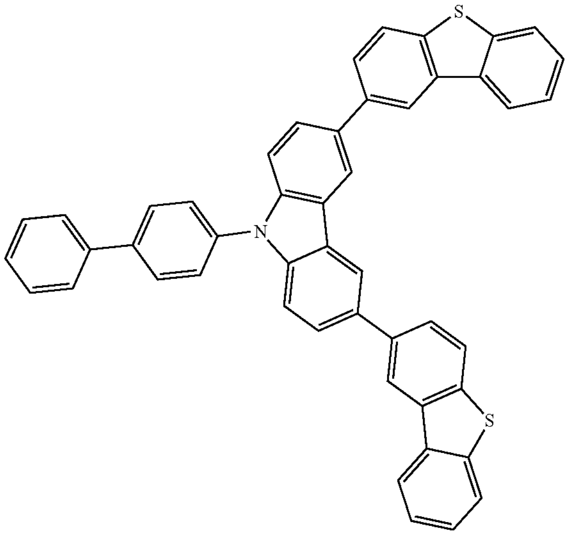

-continued
1-43
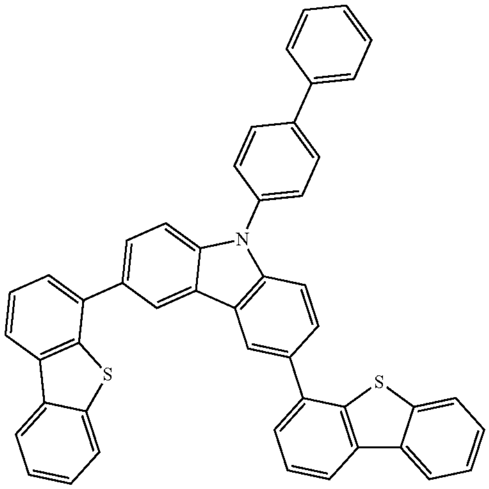
1-44
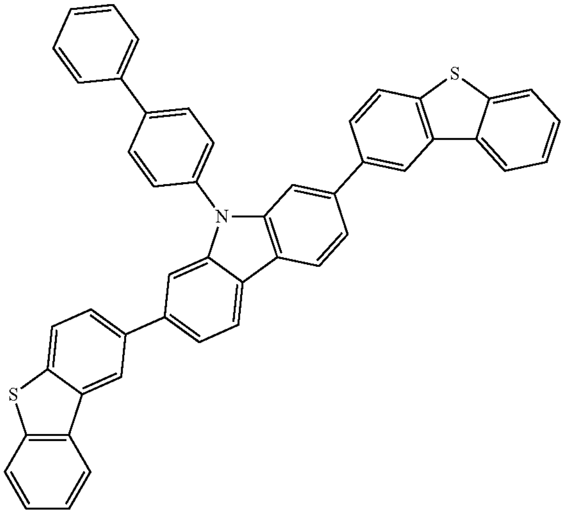
1-45
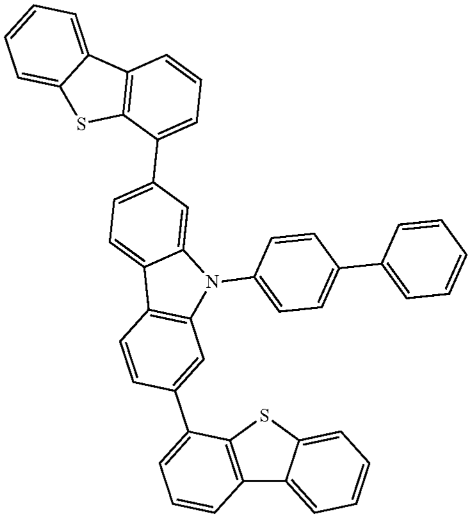
-continued
1-46
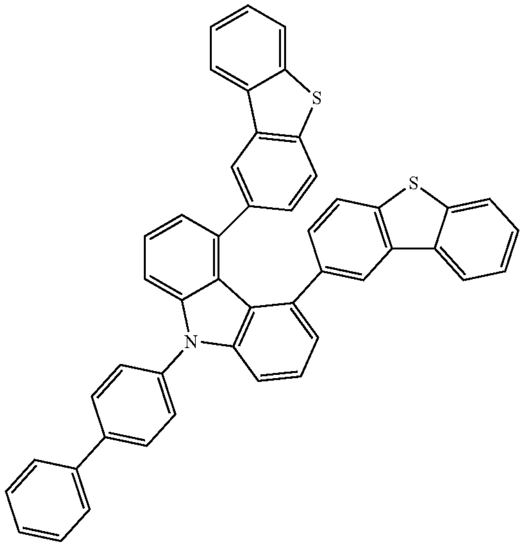
1-47
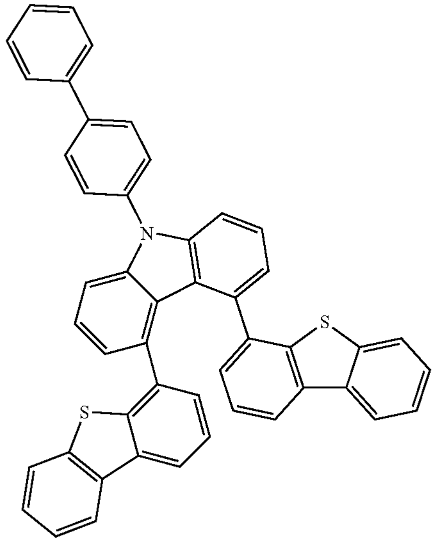
1-48
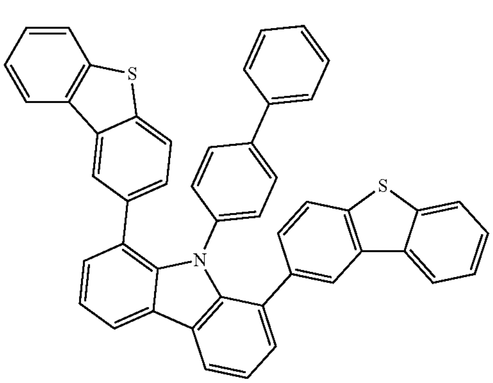

-continued
1-49
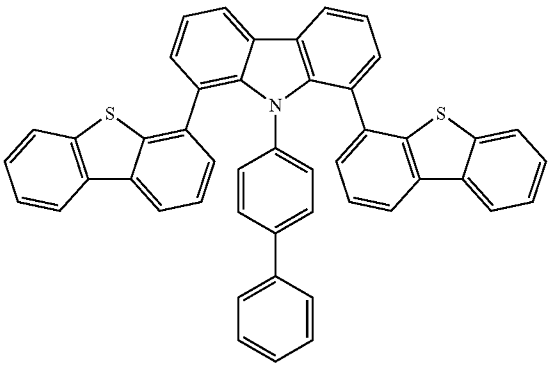
1-50
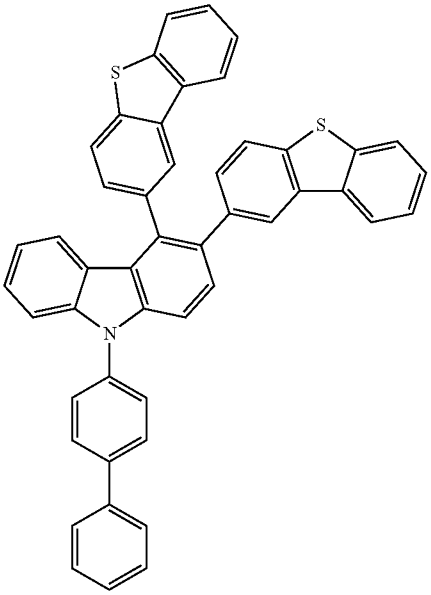
1-51
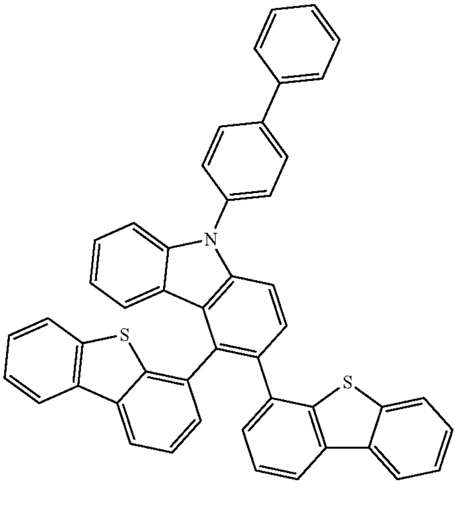
-continued
1-52
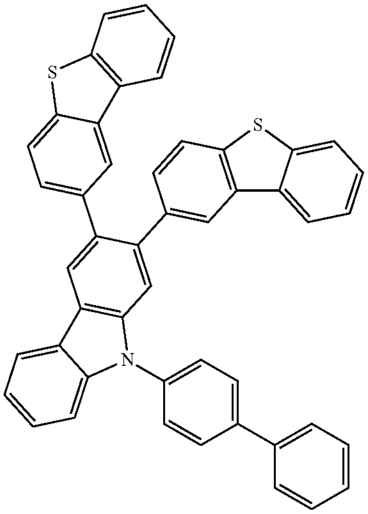
1-53
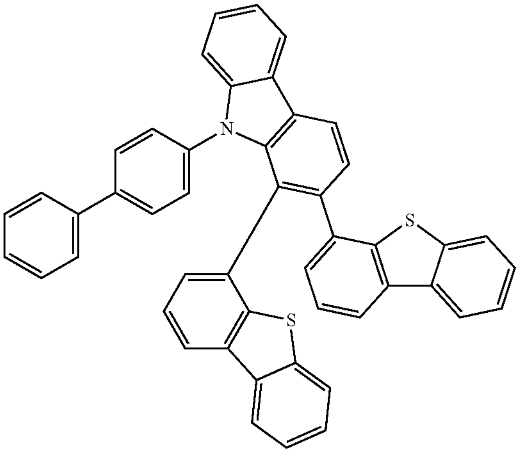
1-54
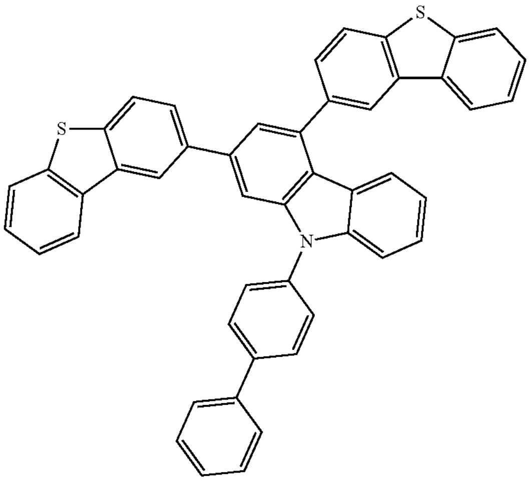

-continued
1-55
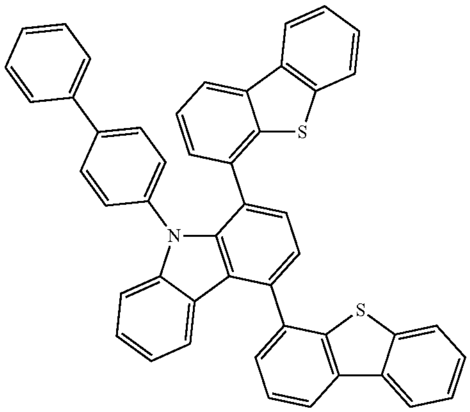
1-56
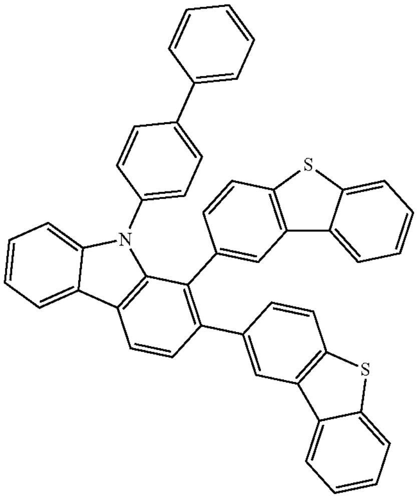
1-57
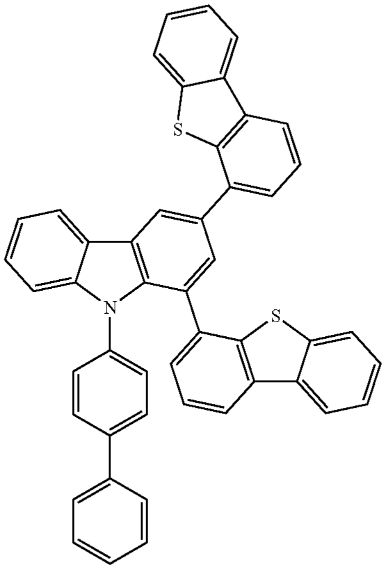
-continued
1-58
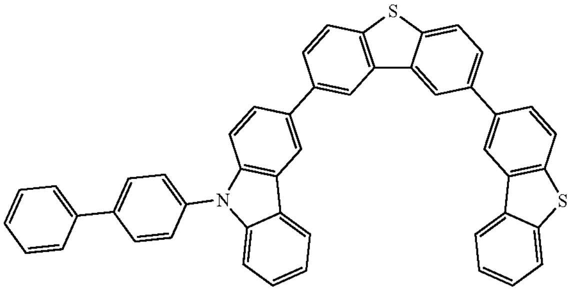
1-59
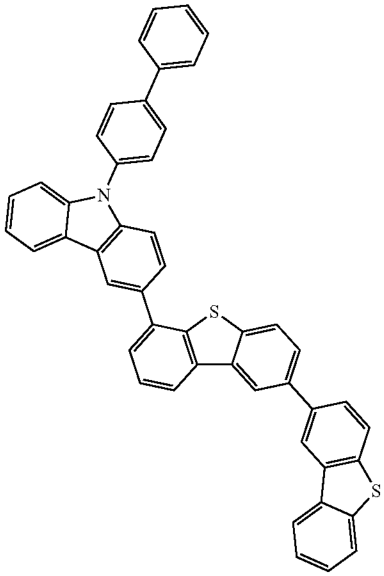
1-60
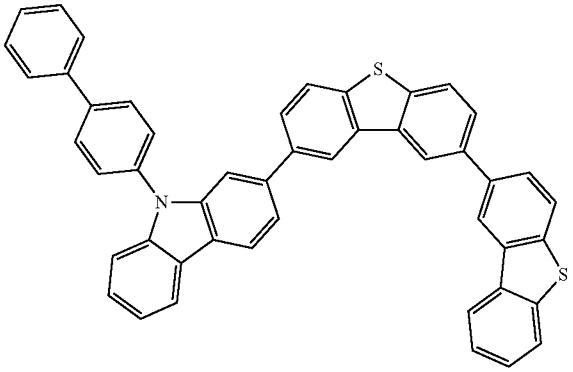

-continued
1-61
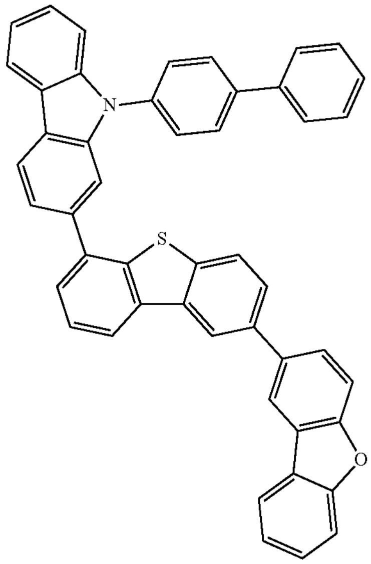
1-62
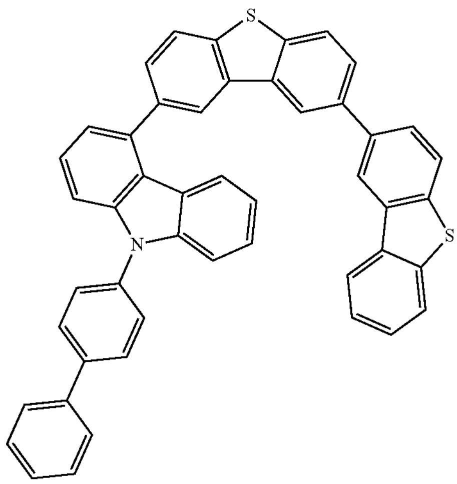
1-63
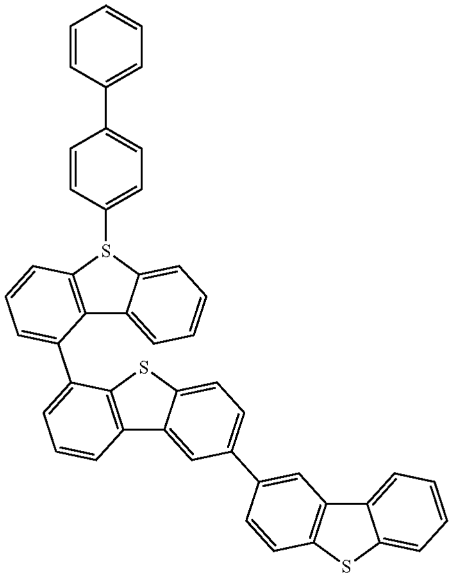
-continued
1-64
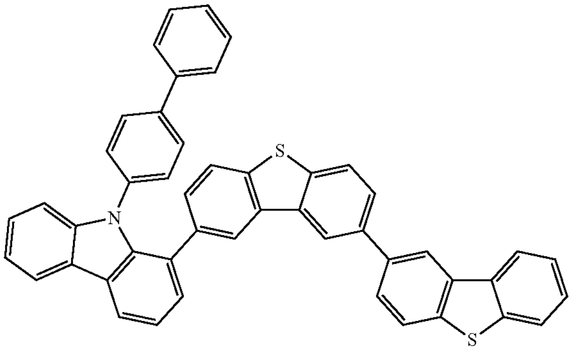
1-65
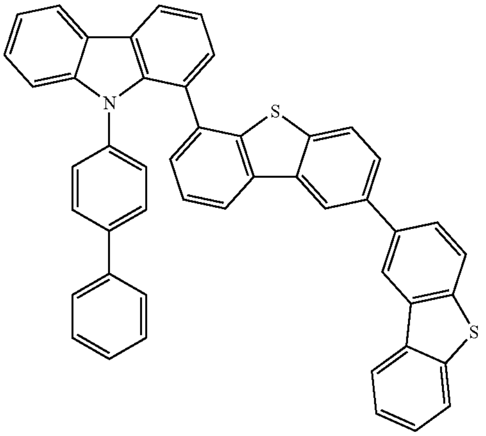
1-66
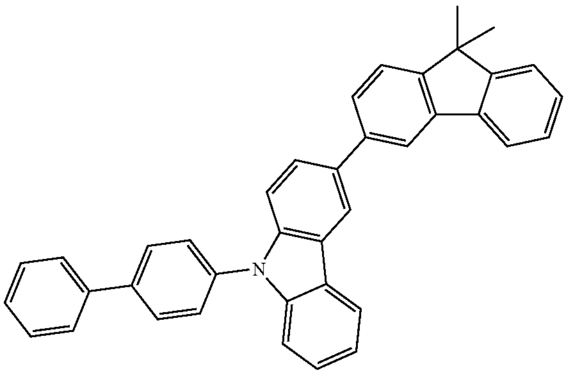

-continued
1-67
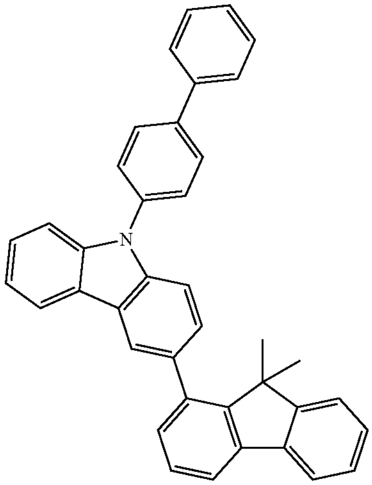
1-68
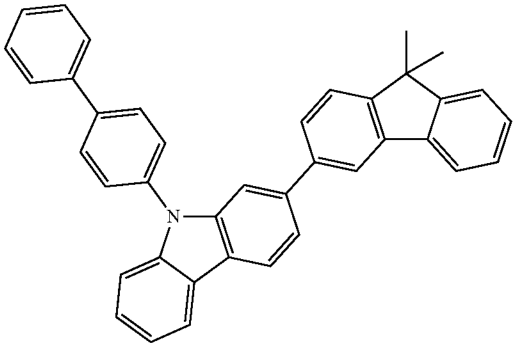
1-69
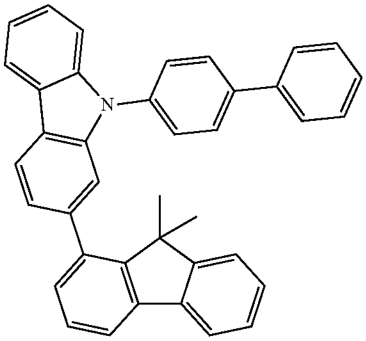
1-70
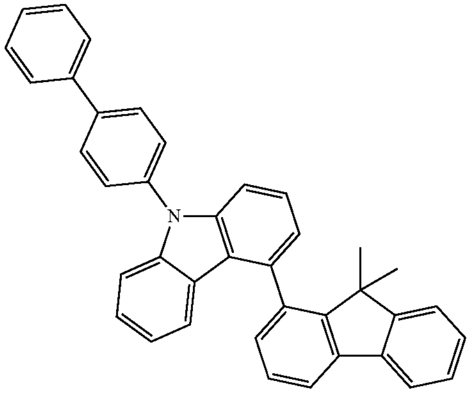
-continued
1-71
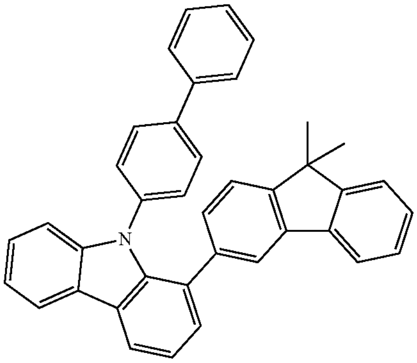
1-72
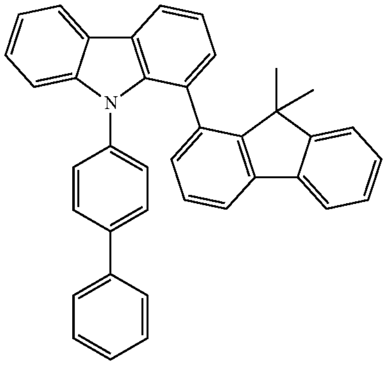
1-73
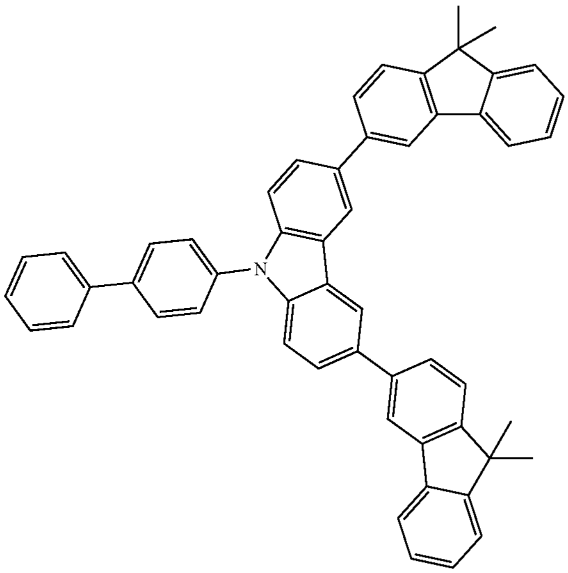

-continued
1-74
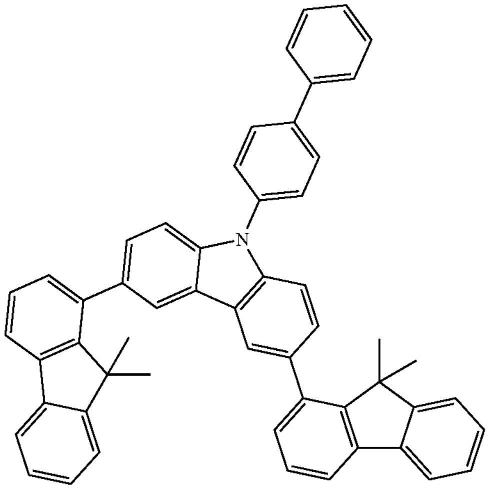
1-75
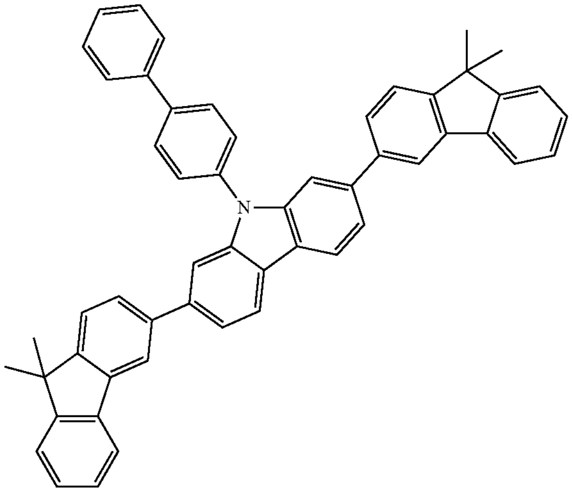
1-76
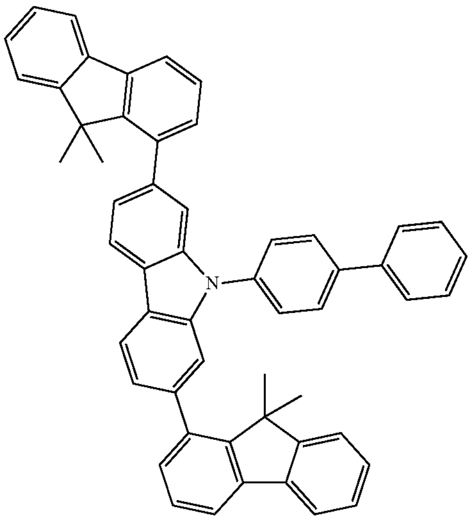
-continued
1-77
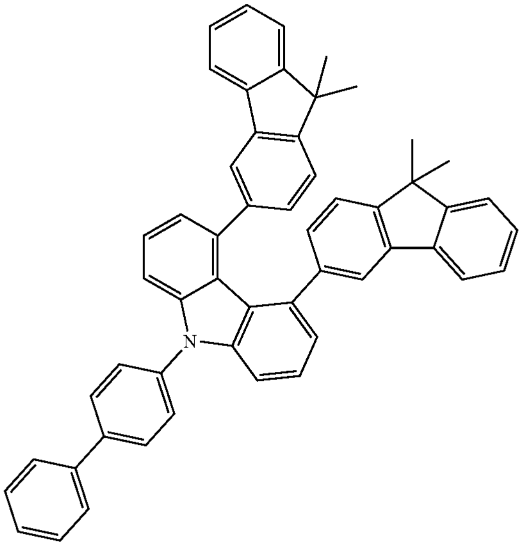
1-78
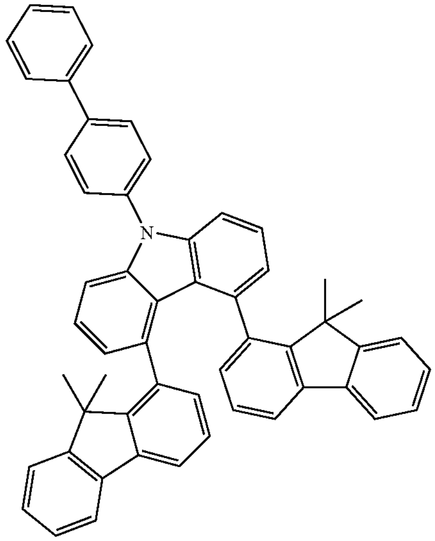
1-79
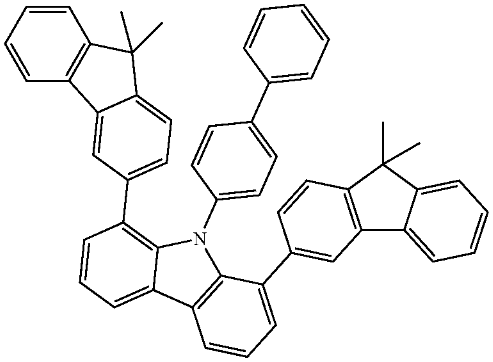

-continued
1-80
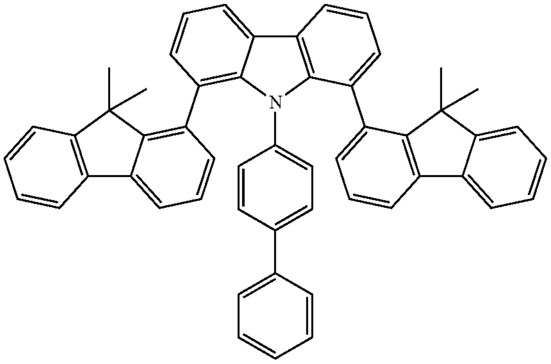
1-81
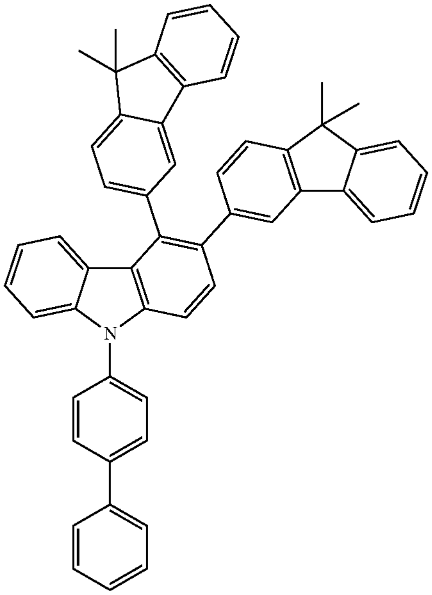
1-82
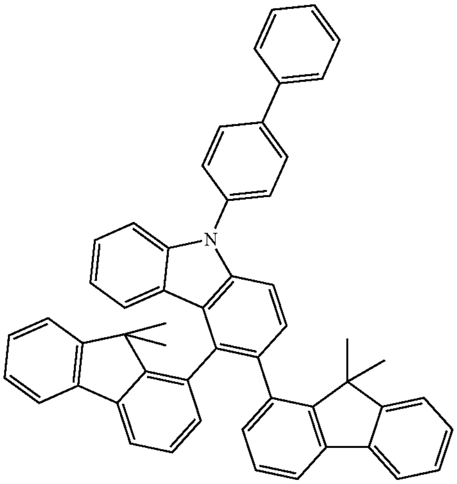
-continued
1-83
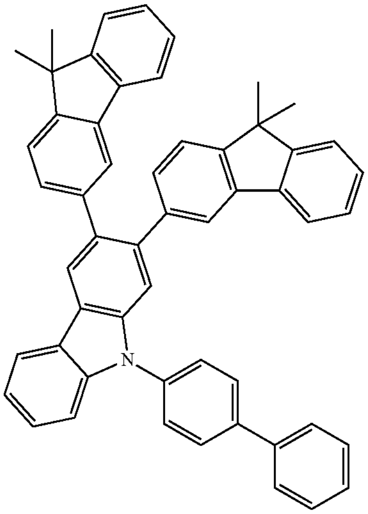
1-84
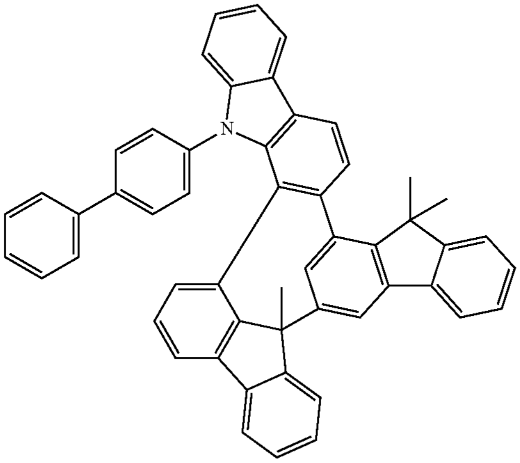
1-85
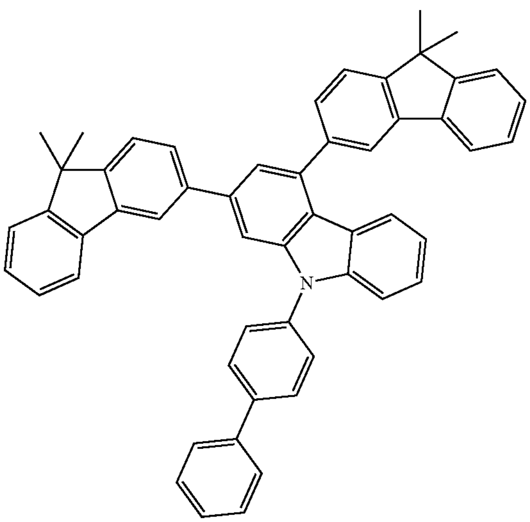

-continued
1-86
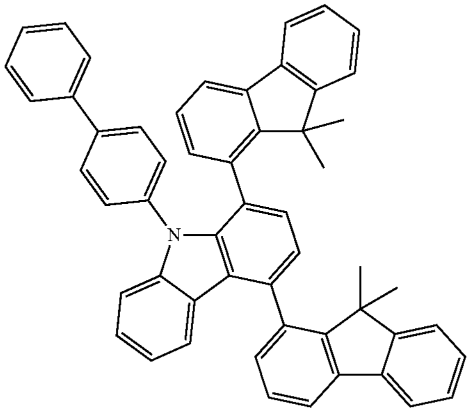
1-87
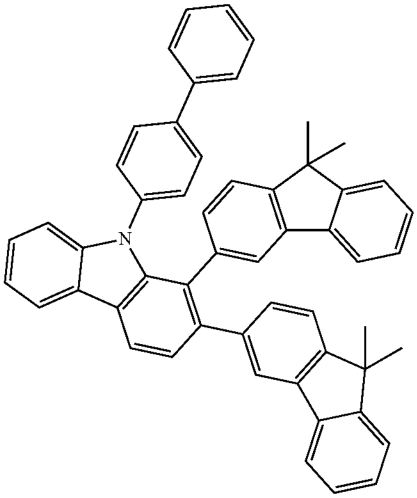
1-88
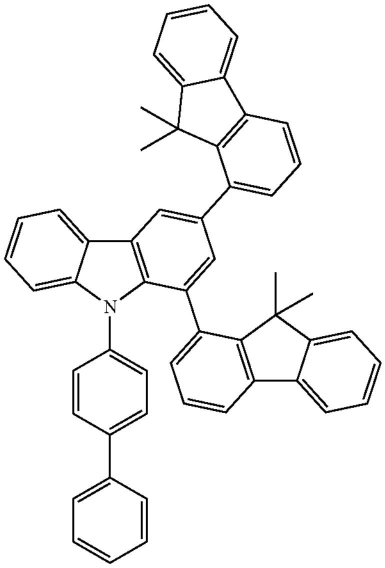
-continued
1-89
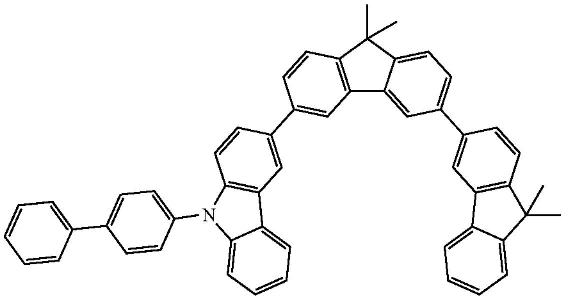
1-90
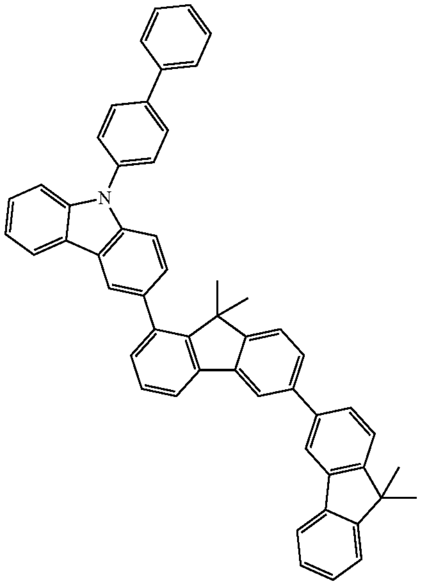
1-91
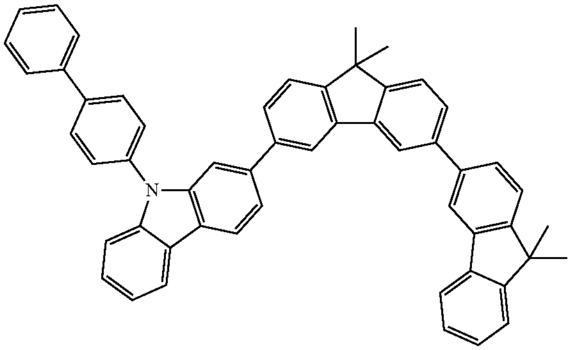

-continued
1-92
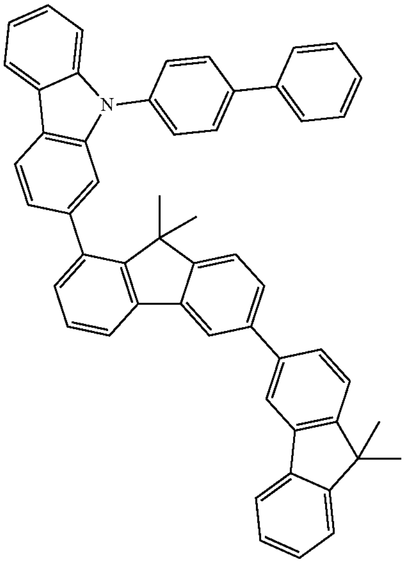
1-93
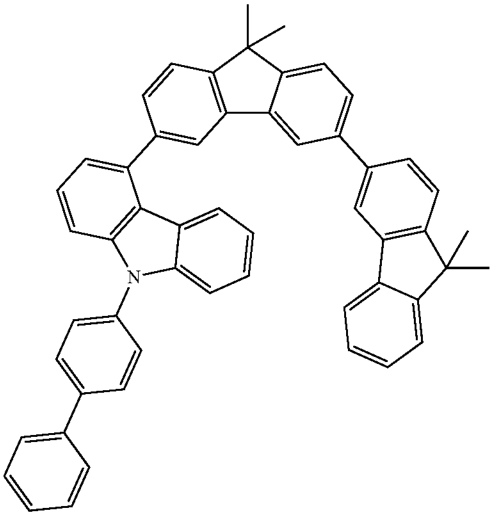
-continued
1-94
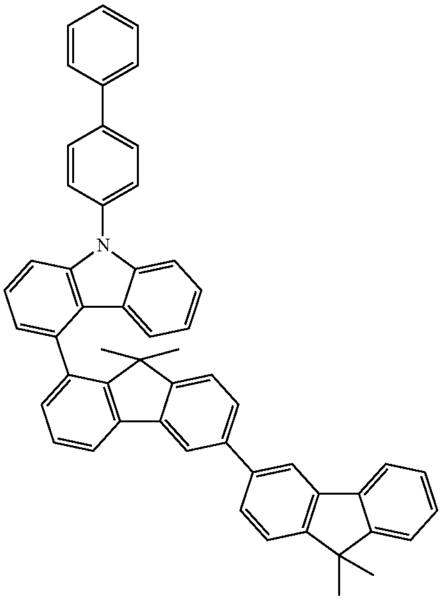
1-95
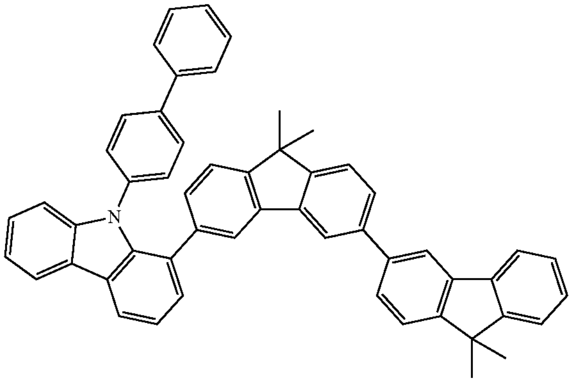
1-96
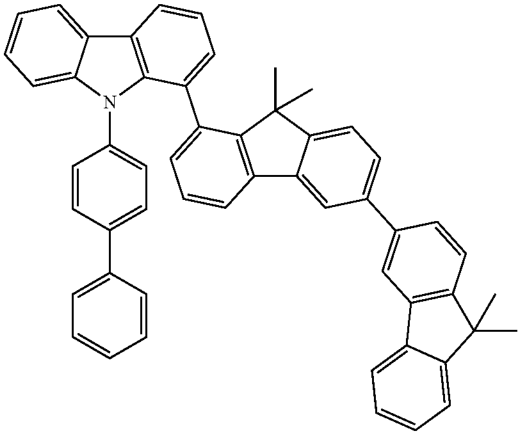

-continued
1-97
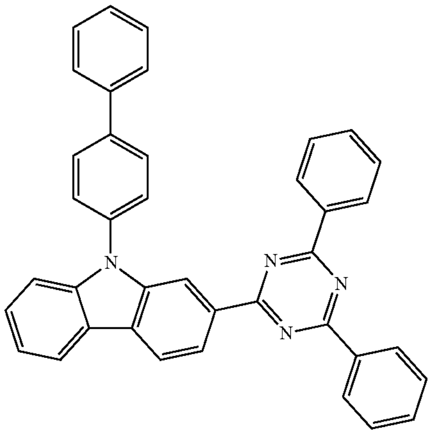
1-98
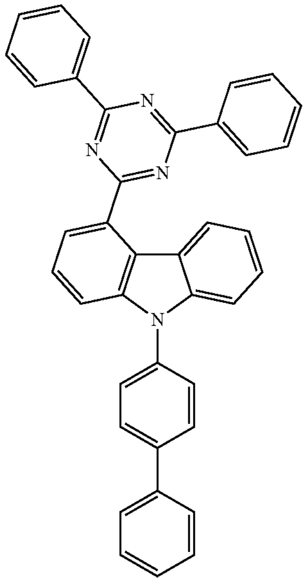
1-99
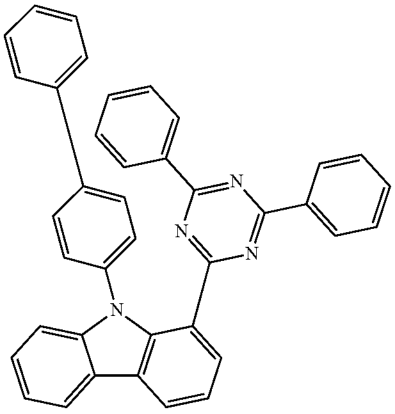
-continued
1-100
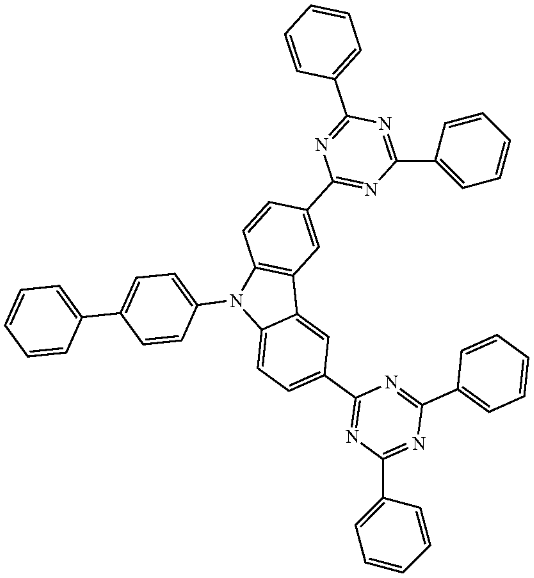
1-101
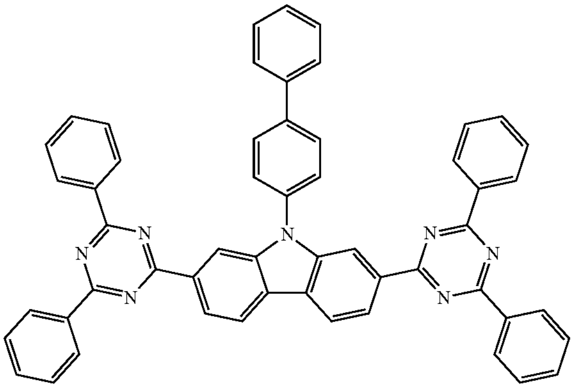
1-102
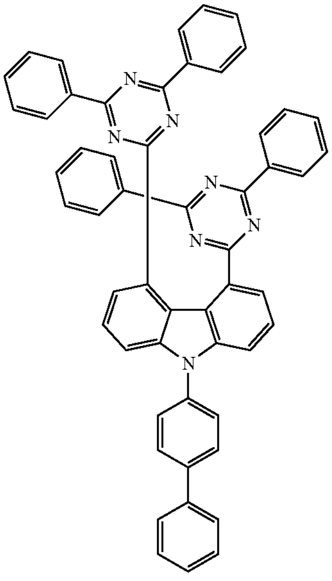

-continued
1-103
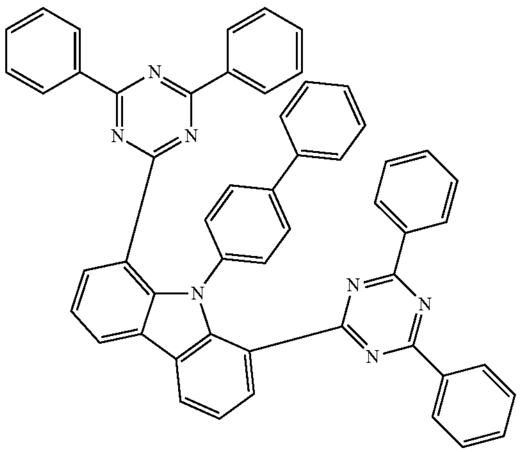
1-104
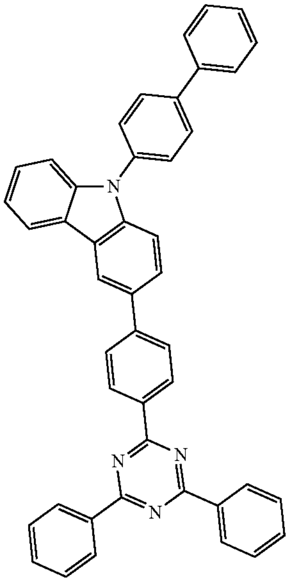
1-105
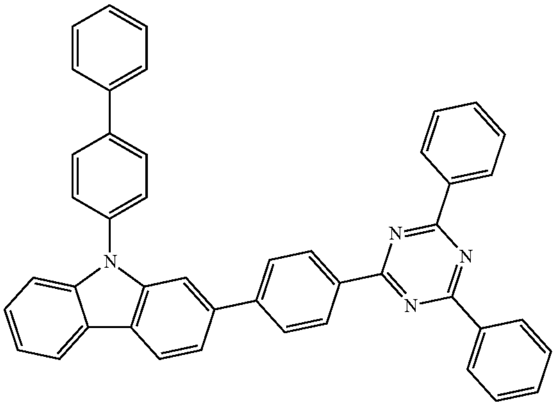
-continued
1-106
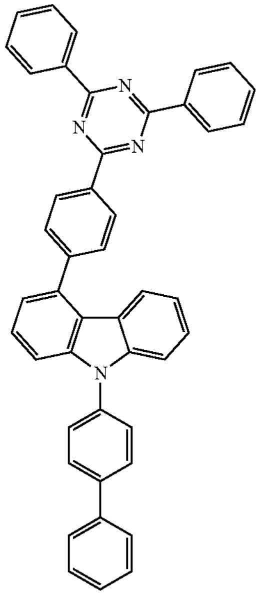
1-107
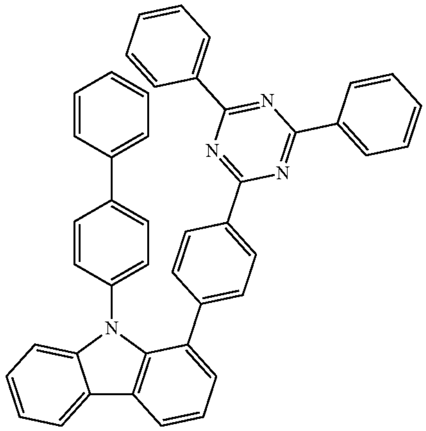
1-108
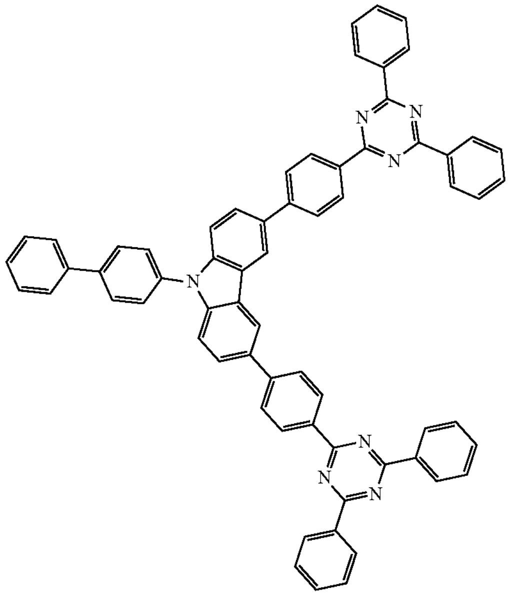

-continued
1-109
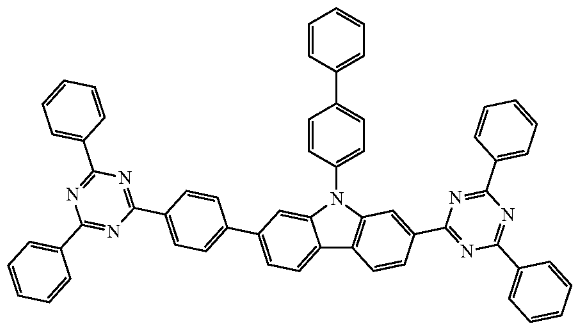
1-110
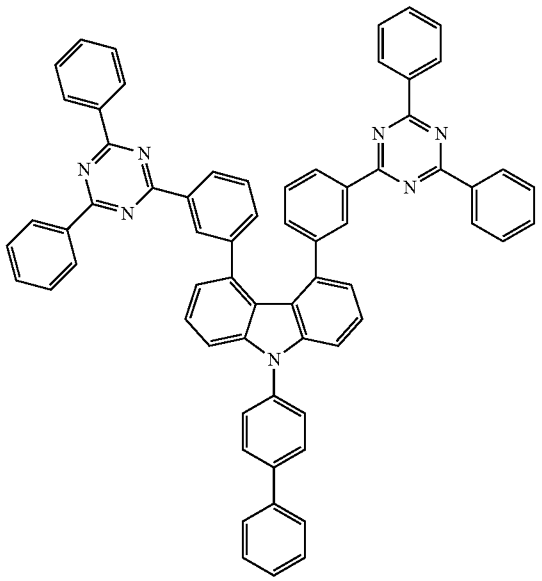
1-111
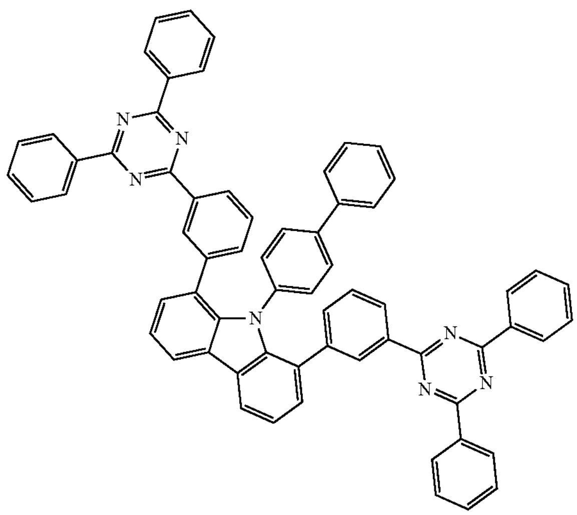
-continued
1-112
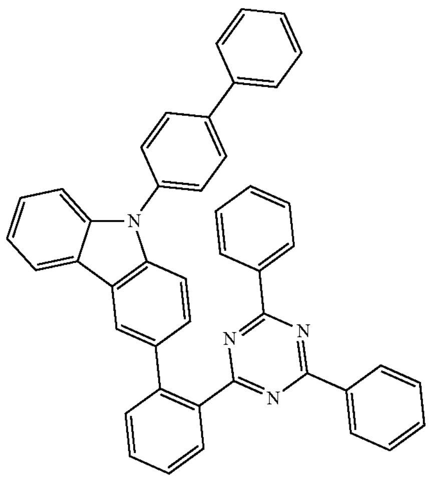
1-113
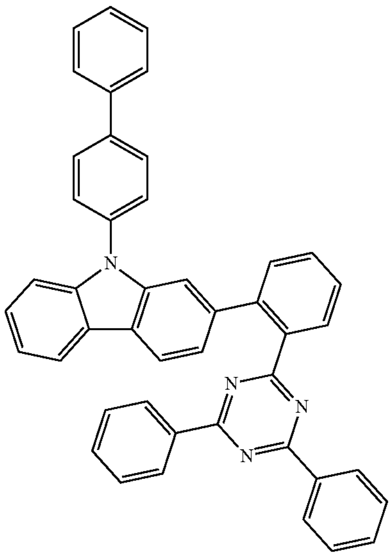
1-114
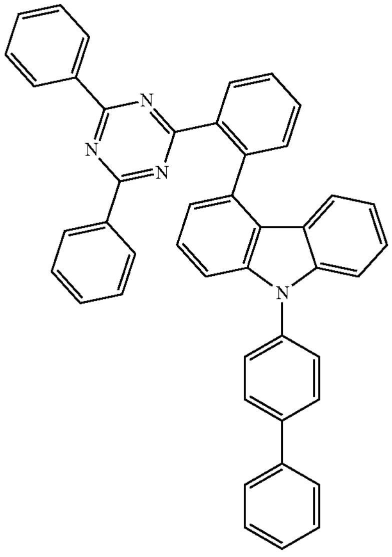

-continued
1-115
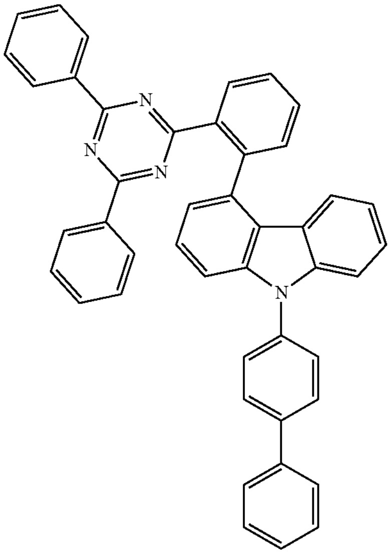
1-116
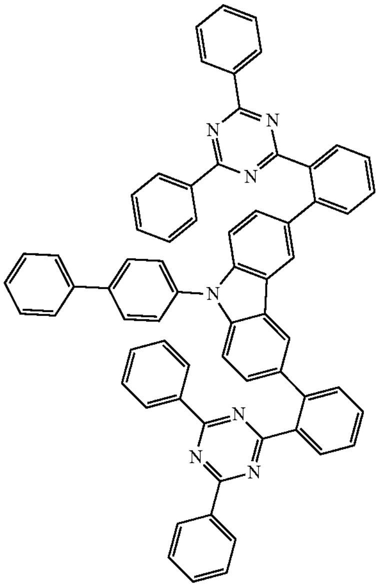
-continued
1-117
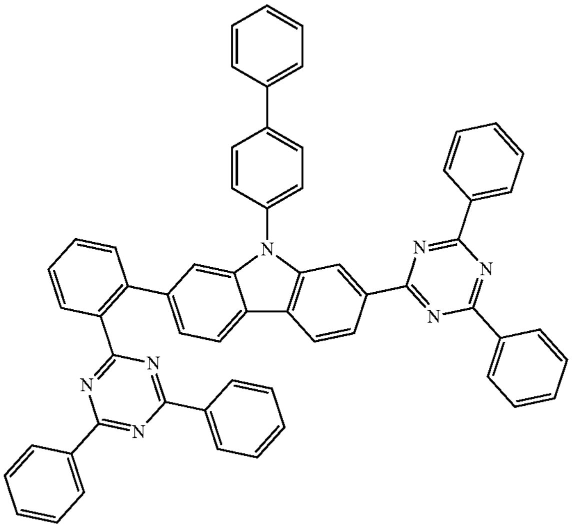
1-118
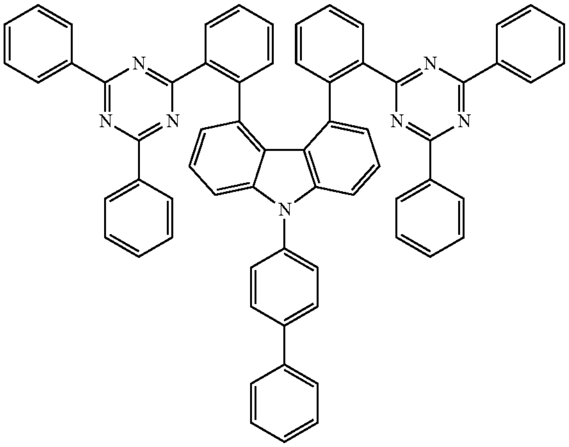
1-119
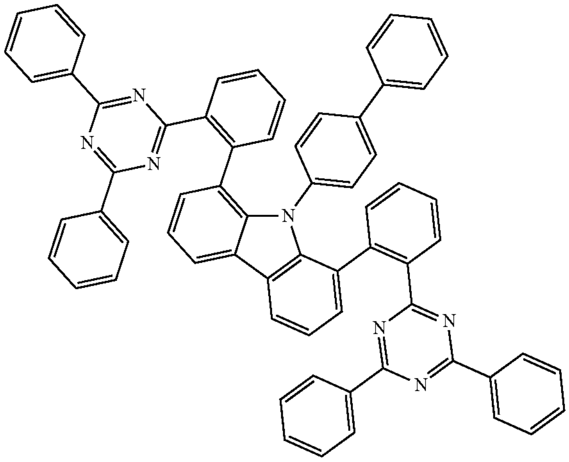

-continued 1-121

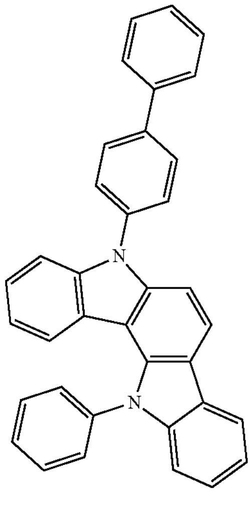

1-122

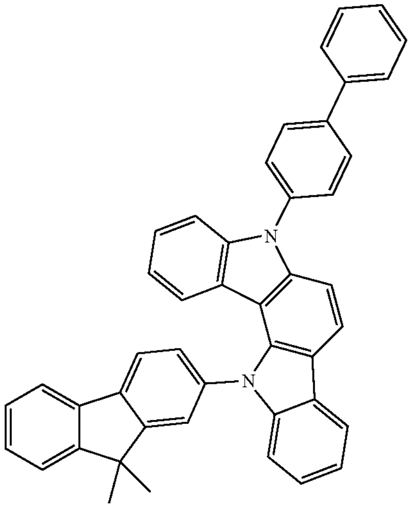

1-123

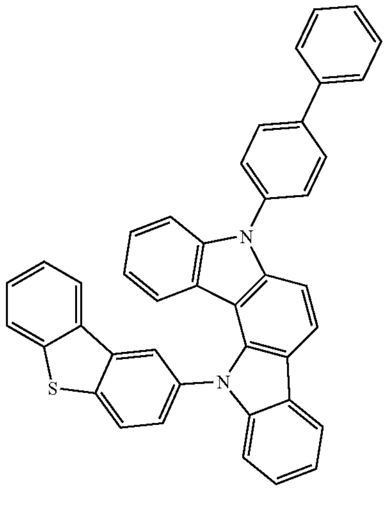

Next, the thermally activated delayed fluorescent light-emitting material (TADF material) is described.

The TADF material is a compound represented by the general formula (2) or a material containing the compound.

In the general formula (2), Z is a group represented by the formula (2a), and in the formula (2a), a ring A is an aromatic hydrocarbon ring represented by the formula (2b), a ring B is a heterocycle represented by the formula (2c), and the ring A and the ring B are each fused with an adjacent ring at arbitrary positions. X is selected from N—$Ar^2$, an oxygen atom, and a sulfur atom. X preferably represents N—$Ar^2$.

a represents an integer of from 1 to 3, preferably an integer of 1 or 2, more preferably an integer of 1. c and d each independently represent an integer of from 0 to 4, and j represents an integer of from 0 to 2. c+d+j represents preferably an integer of from 0 to 4, more preferably 0, 1, or 2.

$Ar^1$ represents an a-valent group, and $Ar^2$ represents a monovalent group. $Ar^1$ and $Ar^2$ each independently represent a substituted or unsubstituted aromatic hydrocarbon group having 6 to 18 carbon atoms, a substituted or unsubstituted aromatic heterocyclic group having 3 to 17 carbon atoms, or a linked aromatic group formed by linking 2 to 6 aromatic rings of aromatic groups each selected from the aromatic hydrocarbon group and the aromatic heterocyclic group. $Ar^1$ and $Ar^2$ each preferably represent a substituted or unsubstituted aromatic hydrocarbon group having 6 to 16 carbon atoms, a substituted or unsubstituted aromatic heterocyclic group having 3 to 15 carbon atoms, or a linked aromatic group formed by linking 2 to 4 aromatic rings of aromatic groups each selected from the aromatic hydrocarbon group and the aromatic heterocyclic group. $Ar^1$ and $Ar^2$ each more preferably represent a substituted or unsubstituted aromatic hydrocarbon group having 6 to 12 carbon atoms, a substituted or unsubstituted aromatic heterocyclic group having 3 to 12 carbon atoms, or a linked aromatic group formed by linking 2 to 4 aromatic rings of aromatic groups each selected from the aromatic hydrocarbon group and the aromatic heterocyclic group. With regard to the description of the linked aromatic group, reference is made to the description of the linked aromatic group described in the foregoing.

Specific examples of $Ar^1$ and $Ar^2$ include groups each produced from benzene, naphthalene, azulene, anthracene, phenanthrene, pyrene, chrysene, naphthacene, triphenylene, acenaphthene, coronene, indene, fluorene, fluoranthene, tetracene, pentacene, furan, dibenzofuran, thiophene, dibenzothiophene, oxazole, pyrrole, pyridine, pyridazine, pyrimidine, pyrazine, triazine, diphenyltriazine, benzimidazole, oxadiazole, triazole, imidazole, pyrazole, thiazole, indole, indazole, benzimidazole, benzothiazole, benzoxazole, quinoxaline, quinazoline, cinnoline, quinoline, isoquinoline, phthalazine, naphthyridine, carbazole, carboline, diazacarbazole, or a linked aromatic compound formed by linking 2 to 6 of these compounds. Preferred examples thereof include groups each produced from benzene, naphthalene, anthracene, phenanthrene, fluorene, furan, dibenzofuran, thiophene, dibenzothiophene, pyridine, pyridazine, pyrimidine, pyrazine, triazine, diphenyltriazine, benzimidazole, oxadiazole, triazole, imidazole, pyrazole, thiazole, indole, indazole, benzimidazole, benzothiazole, benzoxazole, quinoxaline, quinazoline, cinnoline, quinoline, isoquinoline, phthalazine, naphthyridine, carbazole, carboline, diazacarbazole, or a linked aromatic compound formed by linking 2 to 4 of these compounds. More preferred examples thereof include groups each produced from benzene, naphthalene, dibenzofuran, dibenzothiophene, pyridine, pyridazine, pyrimidine, pyrazine, triazine, diphenyltriazine, quinoline, isoquinoline, carbazole, or a linked aromatic compound formed by linking 2 to 4 of these compounds.

In addition, when a=1 in the formula (2), $Ar^1$ preferably represents, for example, a group represented by the formula (3).

In the formula (3), $L^2$ represents a single bond or a divalent group. The divalent group is an aromatic hydrocarbon group having 6 to 18 carbon atoms, or an aromatic heterocyclic group having 3 to 17 carbon atoms. The divalent group is preferably an aromatic hydrocarbon group having 6 to 16 carbon atoms, more preferably an aromatic heterocyclic group having 6 carbon atoms. Herein, the aromatic hydrocarbon group having 6 carbon atoms is a phenylene group.

Specific examples of $L^2$ except the single bond include groups each produced from benzene, naphthalene, azulene, anthracene, phenanthrene, pyrene, chrysene, naphthacene, triphenylene, acenaphthene, coronene, indene, fluorene, fluoranthene, tetracene, pentacene, furan, dibenzofuran, thiophene, dibenzothiophene, oxazole, pyrrole, pyridine, pyridazine, pyrimidine, pyrazine, triazine, diphenyltriazine, benzimidazole, oxadiazole, triazole, imidazole, pyrazole, thiazole, indole, indazole, benzimidazole, benzothiazole, benzoxazole, quinoxaline, quinazoline, cinnoline, quinoline, isoquinoline, phthalazine, naphthyridine, carbazole, carboline, or diazacarbazole. Preferred examples thereof include groups each produced from benzene, naphthalene, anthracene, phenanthrene, triphenylene, or fluorene. A more preferred example thereof is a phenylene group.

In the formula (3), Ys each represent a N atom or $CR^3$, and at least one of Ys represents a N atom. $Ar^3$s each independently represent a hydrogen atom, a substituted or unsubstituted aromatic hydrocarbon group having 6 to 18 carbon atoms, or a substituted or unsubstituted aromatic heterocyclic group having 3 to 17 carbon atoms.

Specific examples of the aromatic hydrocarbon group or the aromatic heterocyclic group include groups each produced by removing one hydrogen atom from benzene, fluorene, dibenzofuran, dibenzothiophene, pyridine, pyridazine, pyrimidine, pyrazine, triazine, benzimidazole, oxadiazole, triazole, imidazole, pyrazole, thiazole, indole, indazole, benzimidazole, benzothiazole, benzoxazole, carbazole, carboline, or diazacarbazole.

When $Ar^1$, $Ar^2$, $Ar^3$, or $L^2$ represents an aromatic hydrocarbon group, an aromatic heterocyclic group, or a linked aromatic group, any such group may have a substituent. The substituent when the group has the substituent is the same as that described for the substituent of $R^1$ of the general formula (1).

$R^2$ represents an aliphatic hydrocarbon group having 1 to 10 carbon atoms, a substituted or unsubstituted aromatic hydrocarbon group having 6 to 18 carbon atoms, or a substituted or unsubstituted aromatic heterocyclic group having 3 to 17 carbon atoms, and in the case where $R^2$ has a ring, the ring may be fused with a ring substituted with the ring to form a fused ring. The fused ring in this case preferably has 6 to 10 rings.

Specific examples of the aliphatic hydrocarbon group having 1 to 10 carbon atoms include a methyl group, an ethyl group, a propyl group, a butyl group, a pentyl group, a hexyl group, a heptyl group, an octyl group, a nonane group, and a decane group.

Specific examples of the aromatic hydrocarbon group having 6 to 18 carbon atoms or the aromatic heterocyclic group having 3 to 17 carbon atoms include groups each produced by removing one hydrogen atom from benzene, naphthalene, azulene, anthracene, phenanthrene, fluorene, dibenzofuran, dibenzothiophene, pyridine, pyridazine, pyrimidine, pyrazine, triazine, diphenyltriazine, benzimidazole, oxadiazole, triazole, imidazole, pyrazole, thiazole, indole, indazole, benzimidazole, benzothiazole, benzoxazole, quinoxaline, quinazoline, cinnoline, quinoline, isoquinoline, phthalazine, naphthyridine, carbazole, carboline, or diazacarbazole. Preferred examples thereof include groups each produced by removing one hydrogen atom from benzene, naphthalene, dibenzofuran, thiophene, dibenzothiophene, pyridine, pyridazine, pyrimidine, pyrazine, triazine, diphenyltriazine, benzimidazole, oxadiazole, triazole, imidazole, pyrazole, thiazole, indole, indazole, benzimidazole, benzothiazole, benzoxazole, quinoxaline, quinazoline, cinnoline, quinoline, isoquinoline, phthalazine, naphthyridine, carbazole, carboline, or diazacarbazole. More preferred examples thereof include groups each produced by removing one hydrogen atom from benzene, naphthalene, dibenzofuran, dibenzothiophene, pyridine, pyridazine, pyrimidine, pyrazine, triazine, diphenyltriazine, quinoline, isoquinoline, or carbazole.

When $R^2$ represents an aromatic hydrocarbon group or an aromatic heterocyclic group, $R^2$ may have a substituent. When $R^2$ has a substituent, a preferred substituent is an aliphatic hydrocarbon group having 1 to 8 carbon atoms, or an alkoxy group having 1 to 8 carbon atoms.

Specific examples of the aliphatic hydrocarbon group having 1 to 8 carbon atoms, and the alkoxy group having 1 to 8 carbon atoms are identical to the specific examples of the substituent of $R^1$.

Specific examples of the compound represented by the general formula (2) are shown below.

2-1

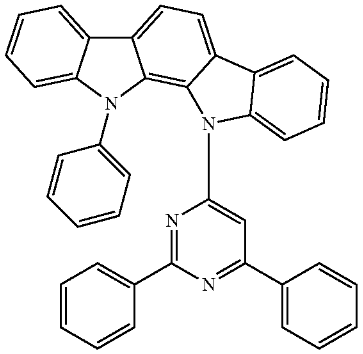

2-2

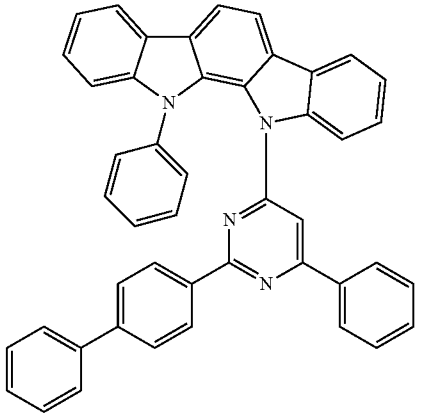

-continued
2-3
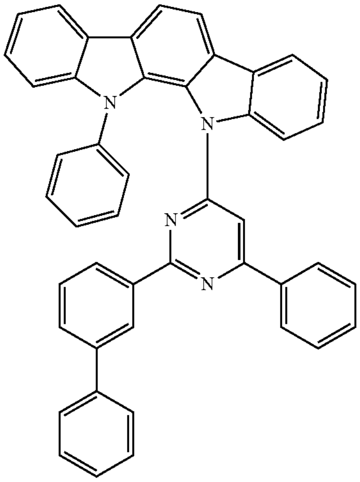
2-4
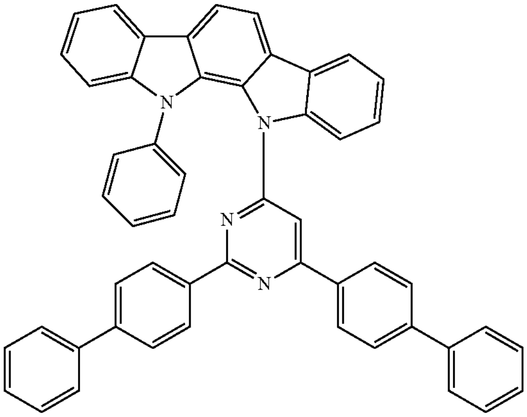
2-5
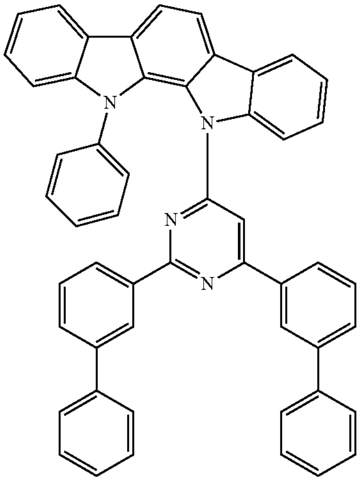
-continued
2-6
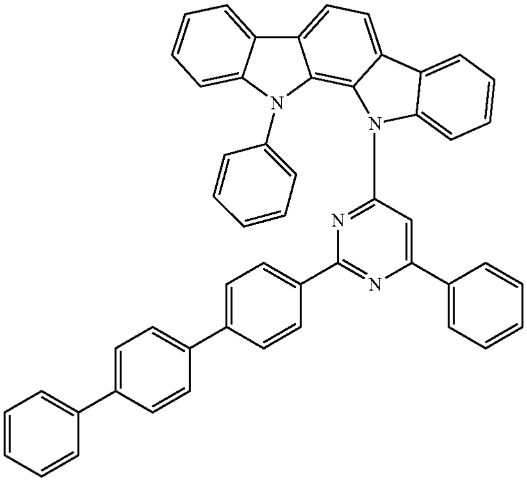
2-7
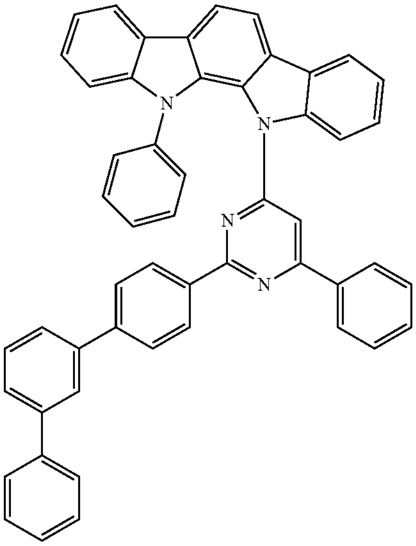
2-8
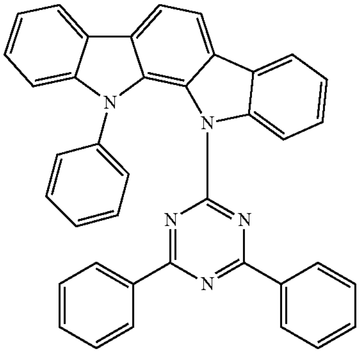

-continued
2-9
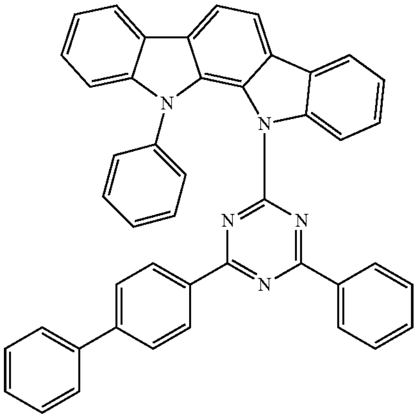
2-10
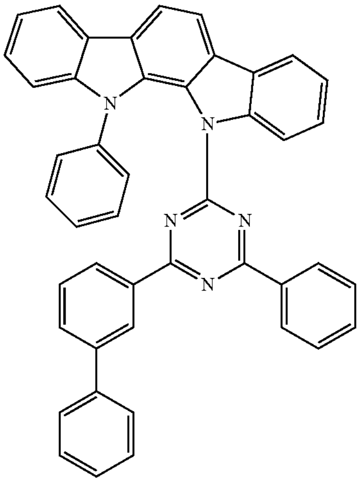
2-11
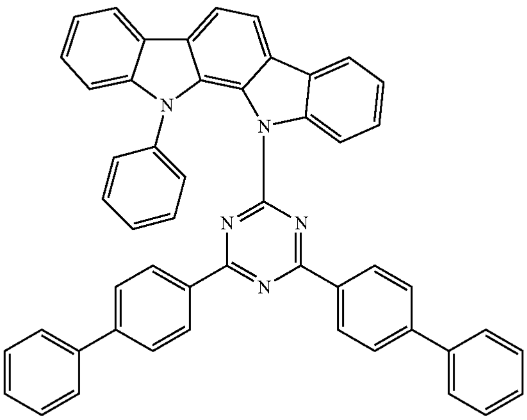
-continued
2-12
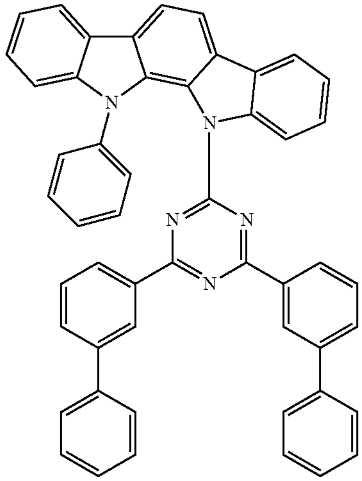
2-13
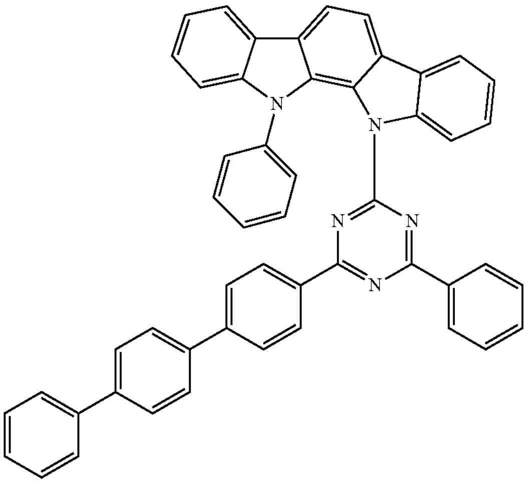
2-14
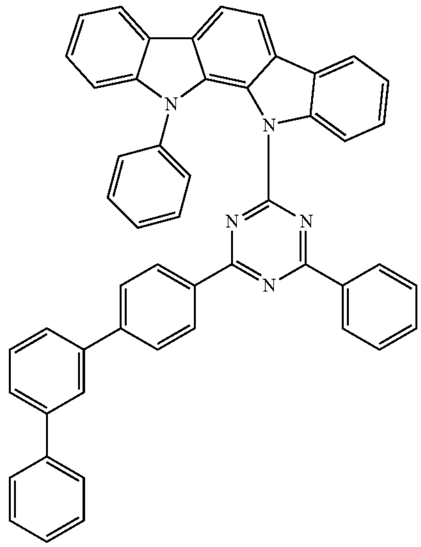

-continued
2-15
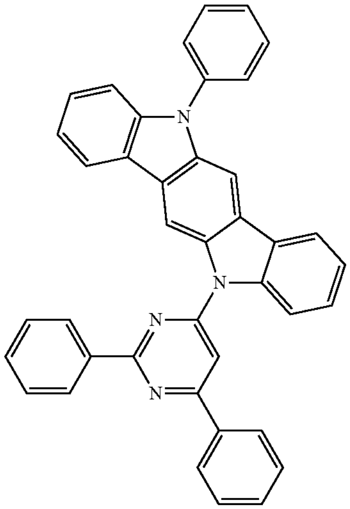
2-16
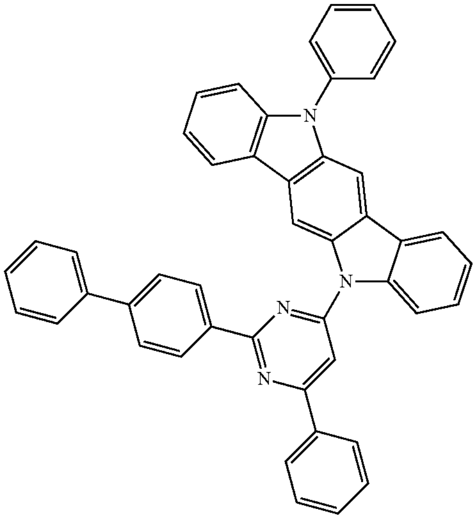
2-17
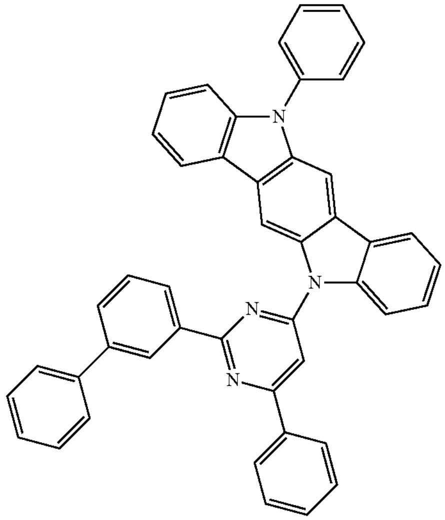
-continued
2-18
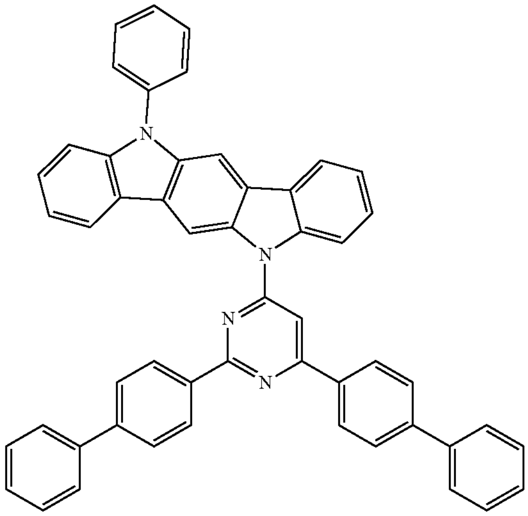
2-19
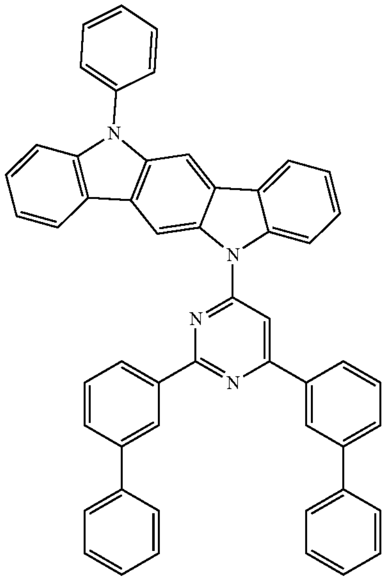

-continued
2-20
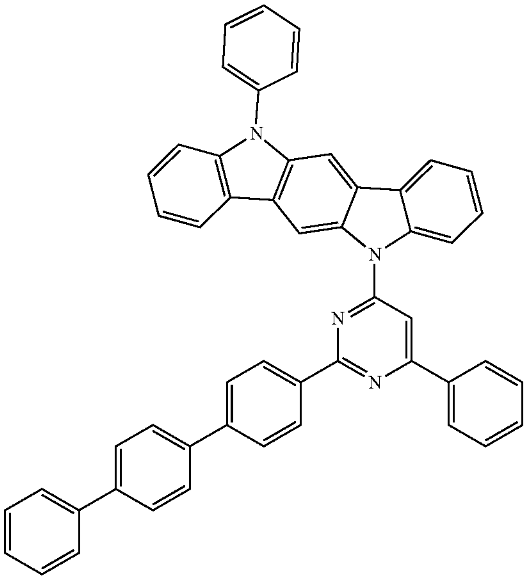
2-21
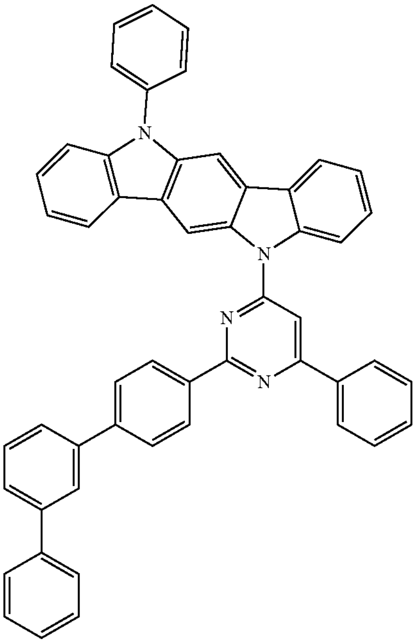
-continued
2-22
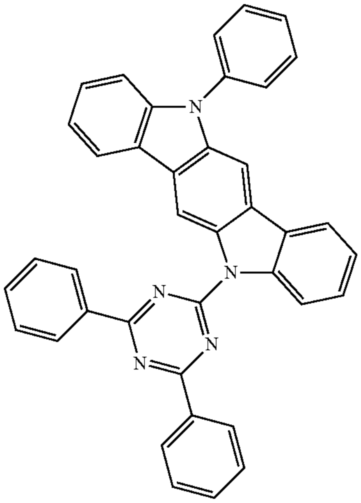
2-23
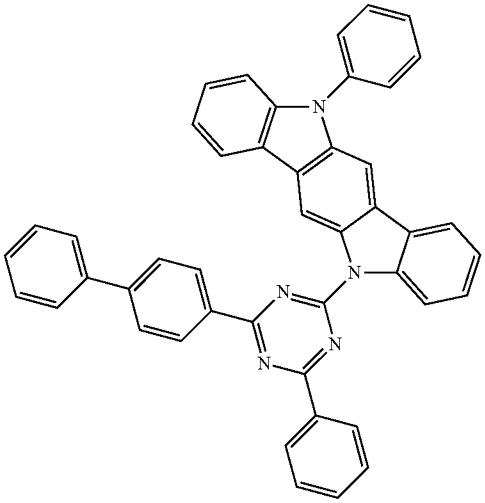
2-24
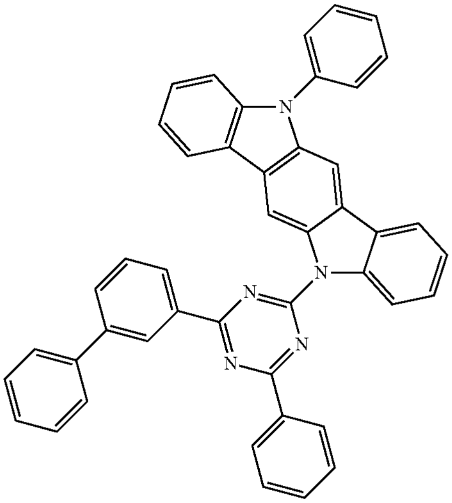

-continued
2-25
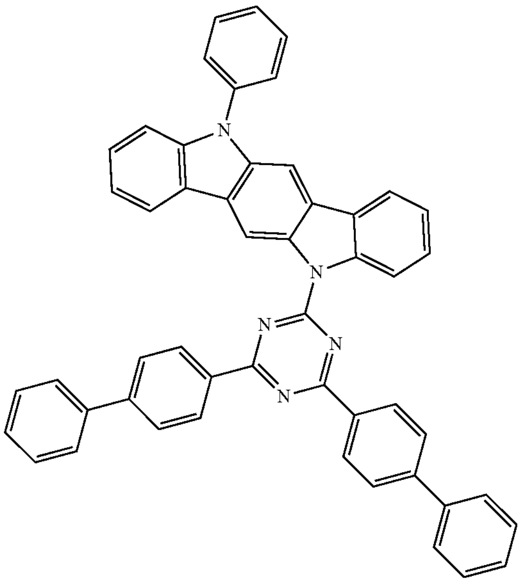
2-26
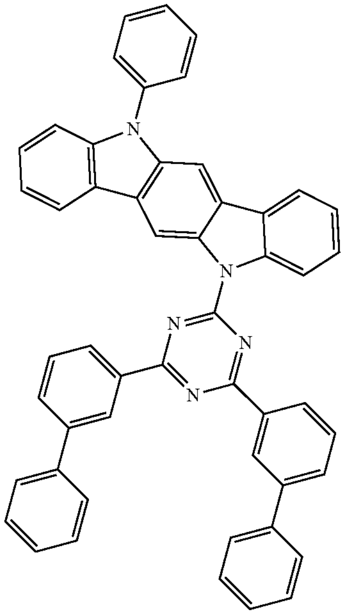
-continued
2-27
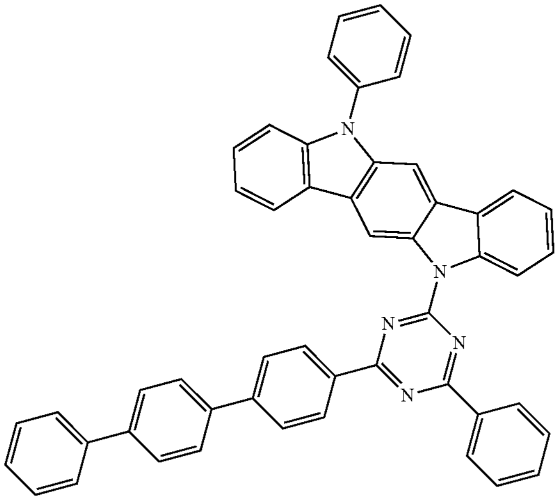
2-28
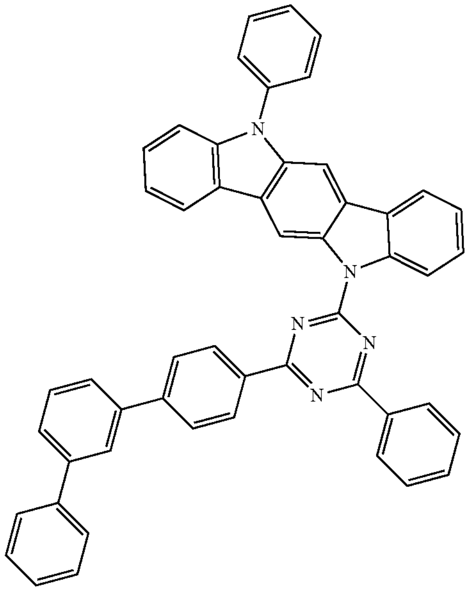
2-29
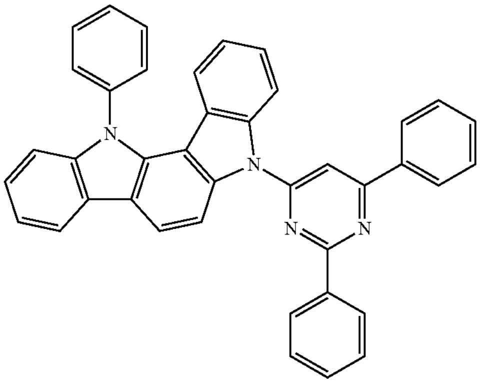

-continued
2-30
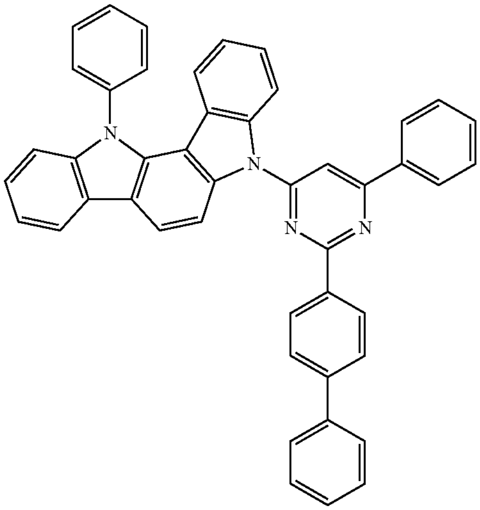
2-31
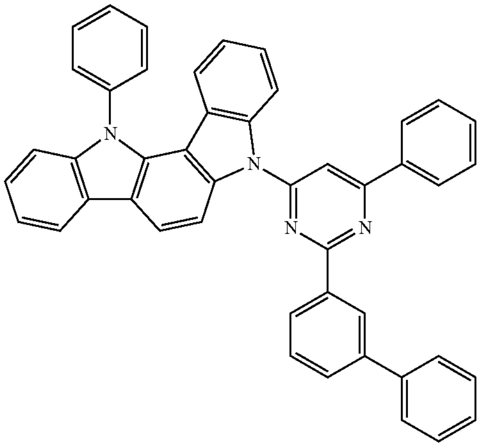
2-32
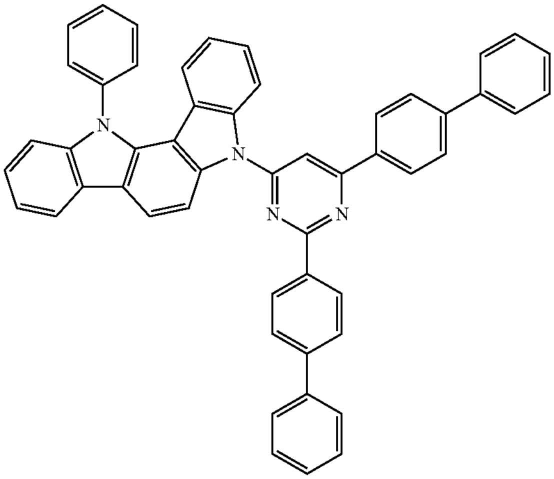
-continued
2-33
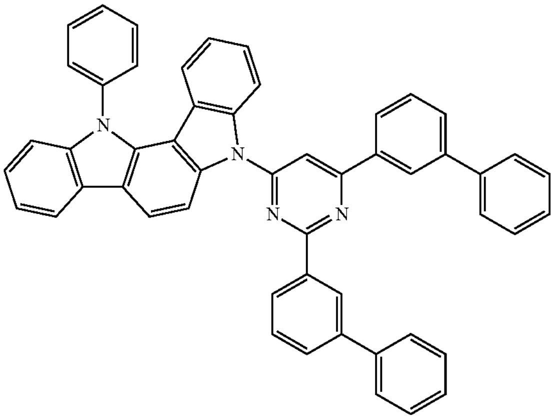
2-34
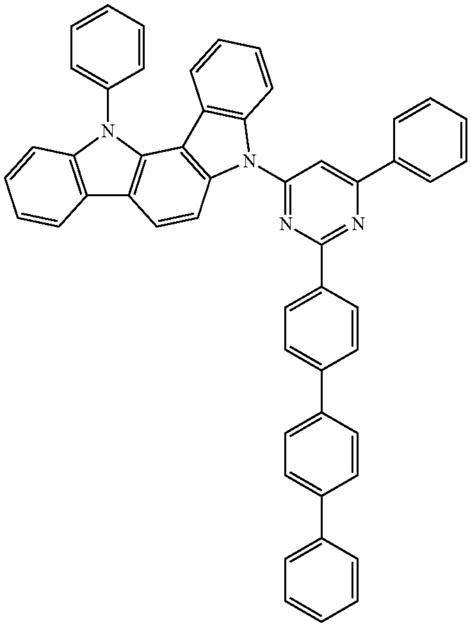
2-35
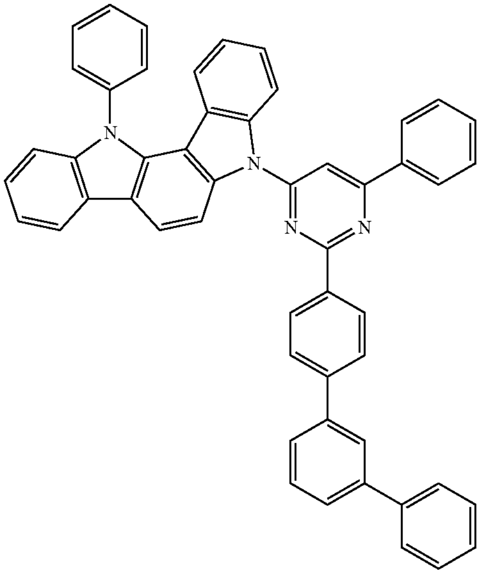

-continued
2-36
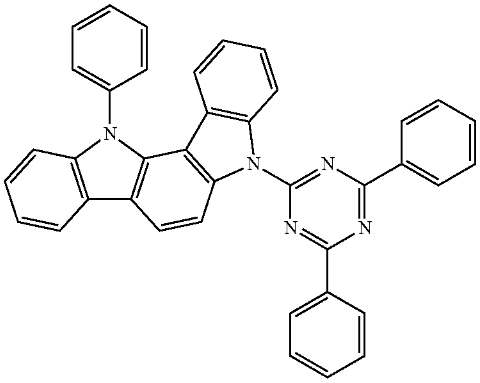
2-37
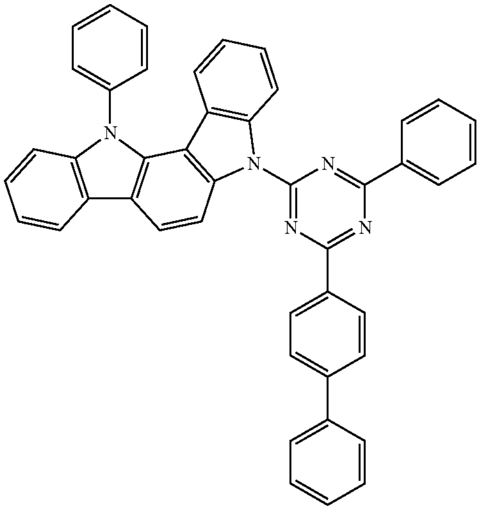
2-38
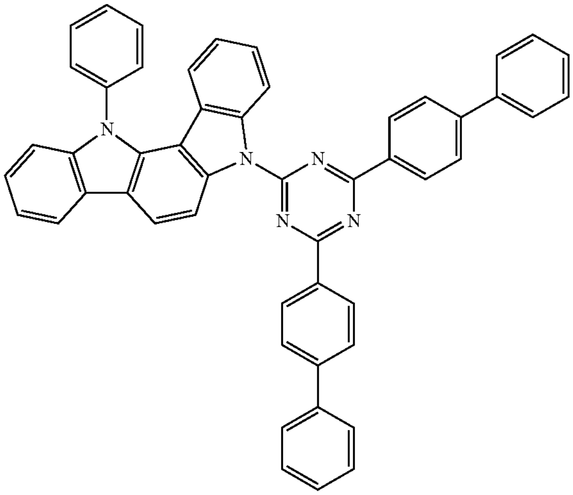
-continued
2-39
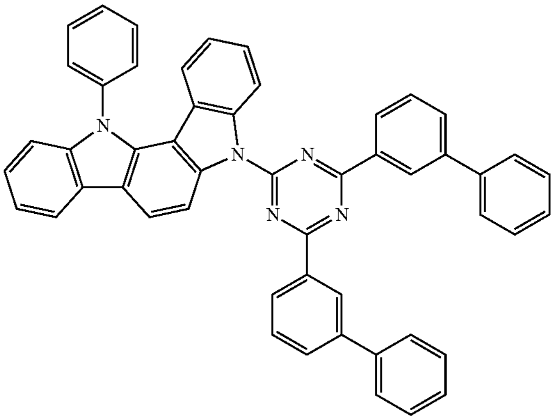
2-40
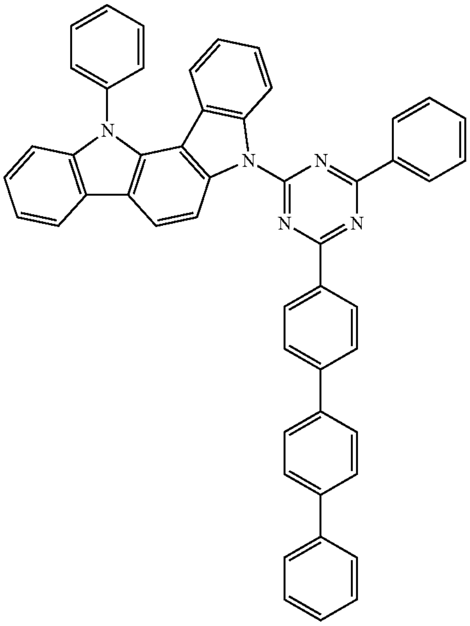
2-41
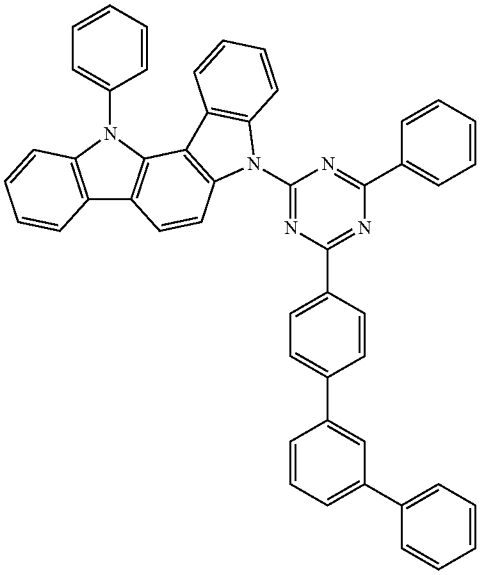

-continued
2-42
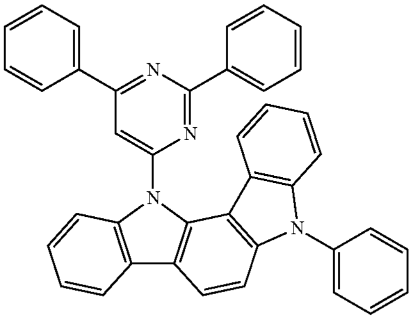
2-43
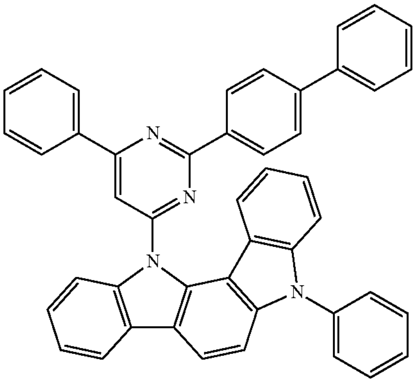
2-44
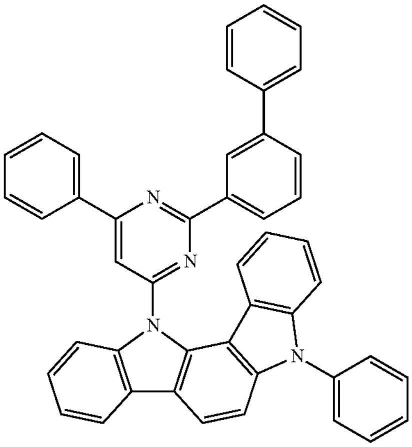
2-45
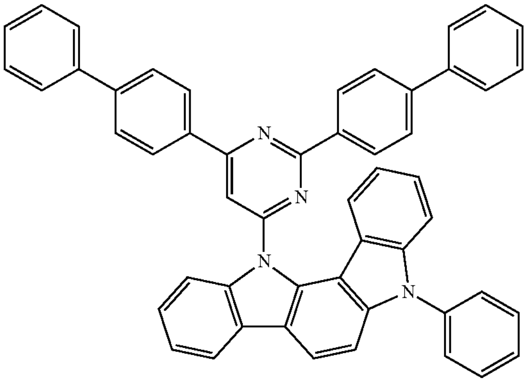
-continued
2-46
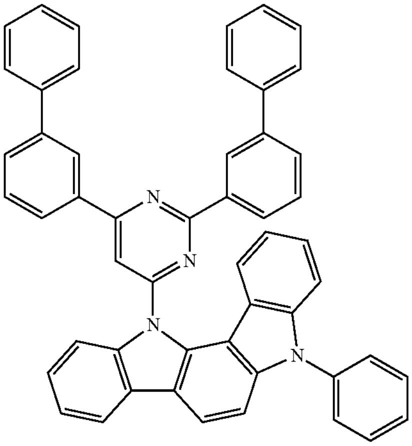
2-47
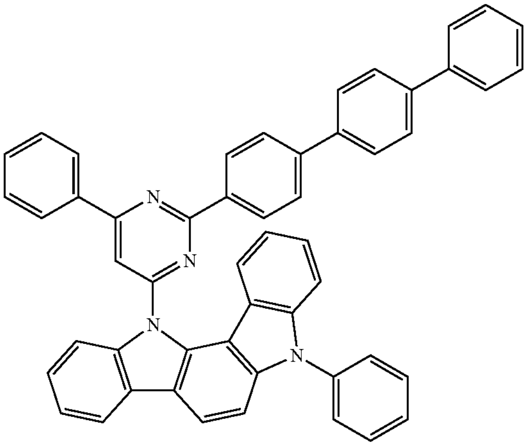
2-48
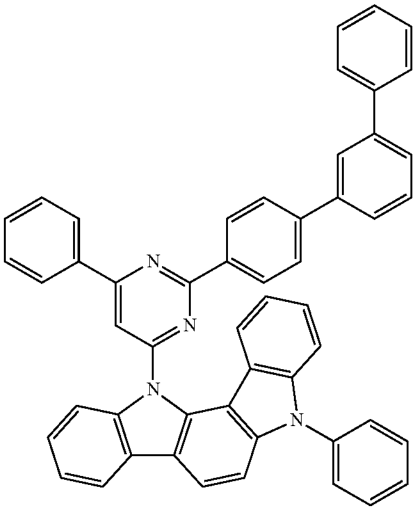

-continued
2-49
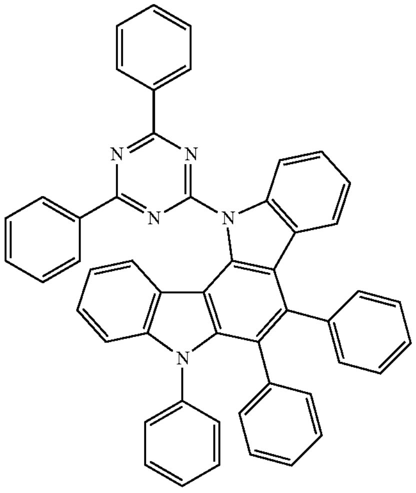
2-50
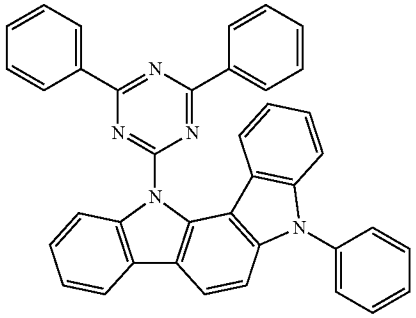
2-51
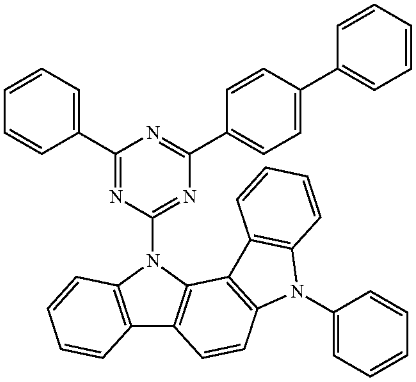
2-52
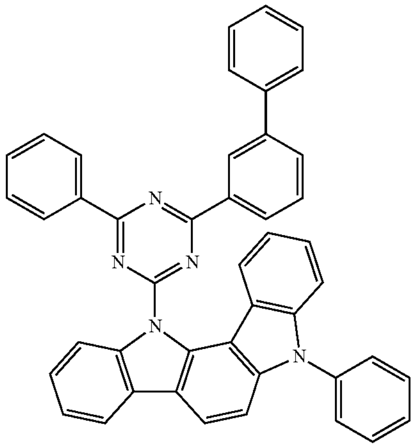
-continued
2-53
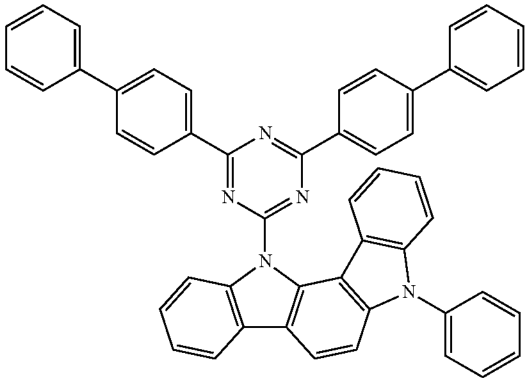
2-54
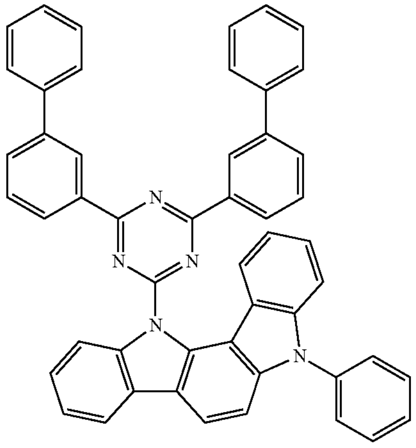
2-55
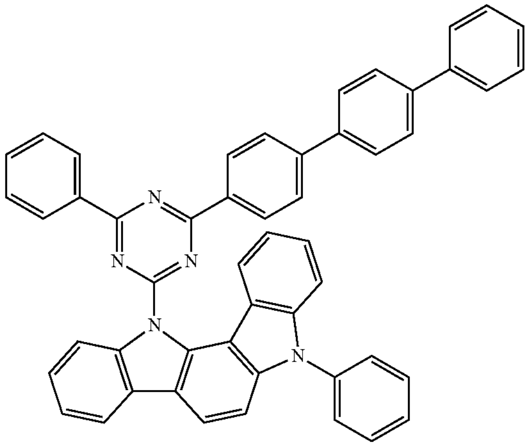

-continued
2-56
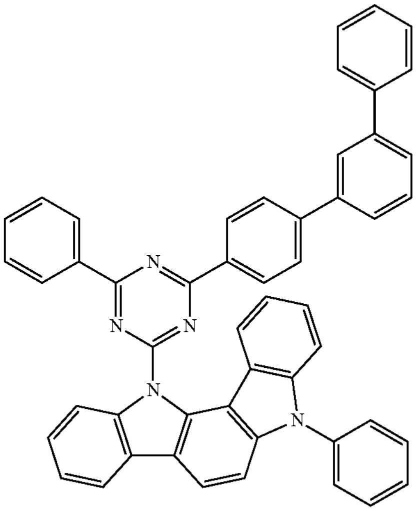
2-57
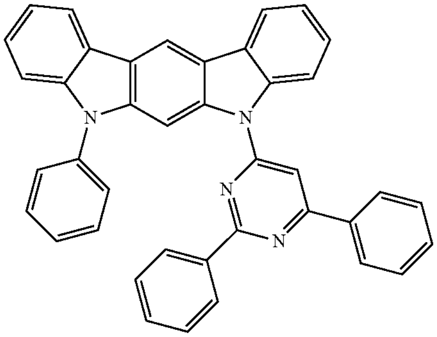
2-58
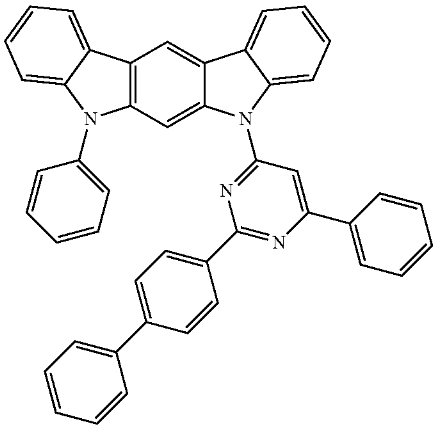
-continued
2-59
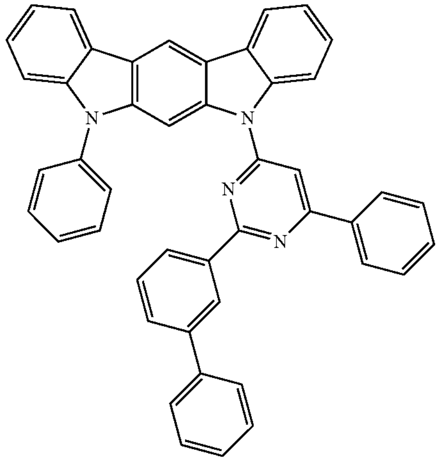
2-60
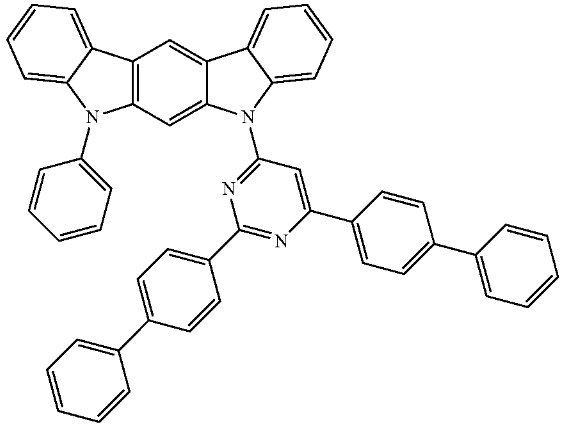
2-61
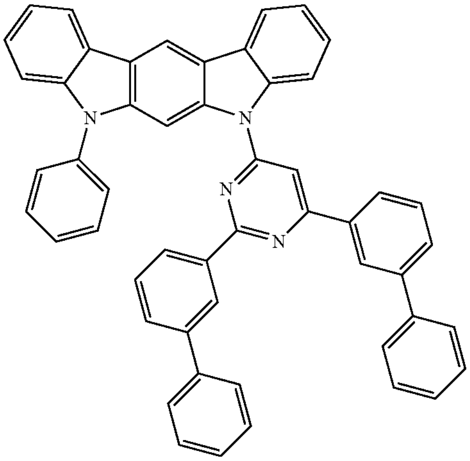

-continued
2-62
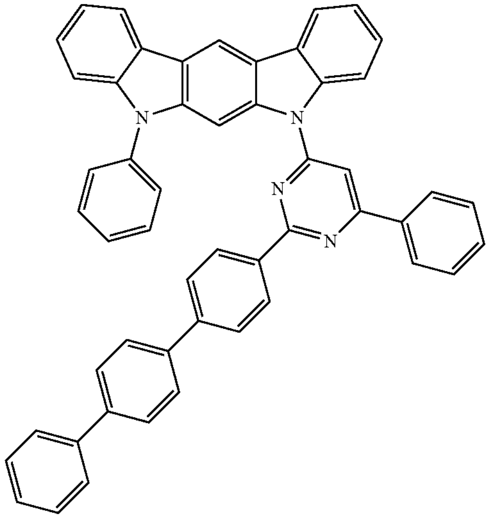
2-63
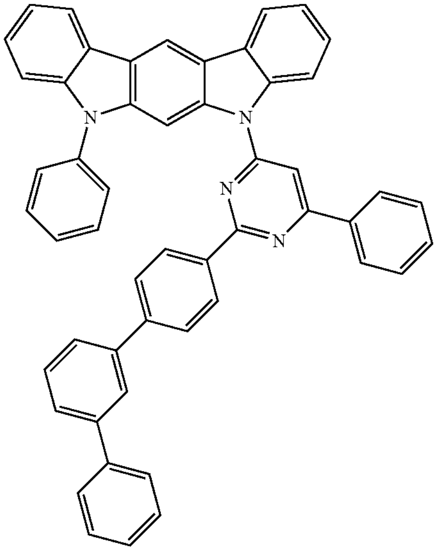
2-64
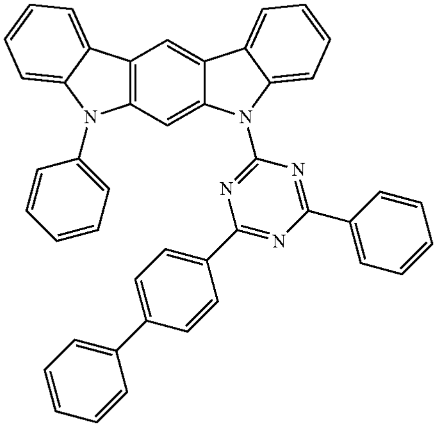
-continued
2-65
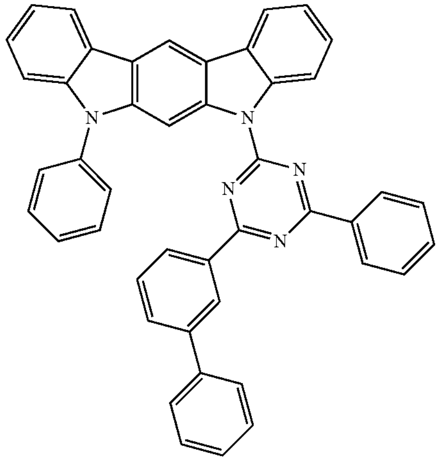
2-66
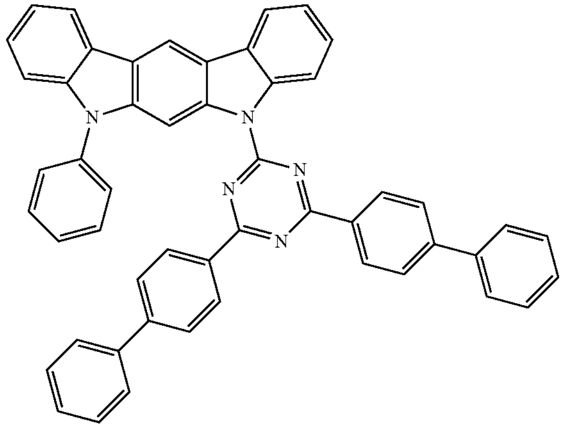
2-67
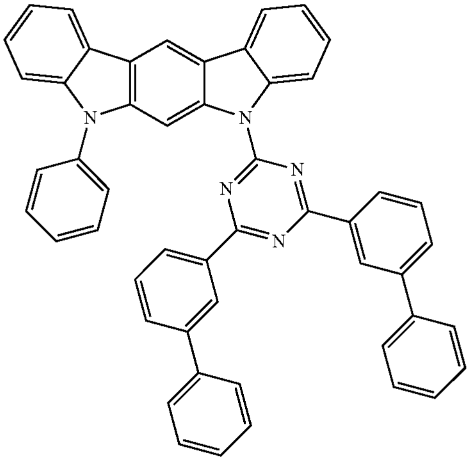

-continued
2-68
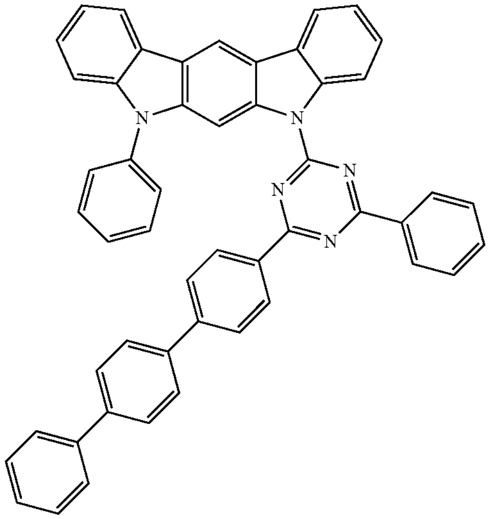
2-69
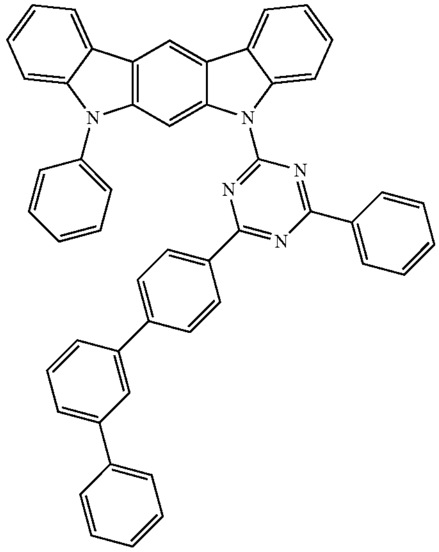
2-70
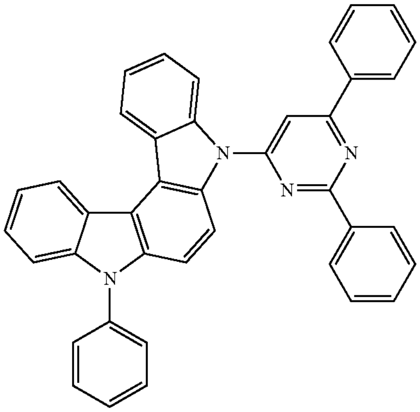
-continued
2-71
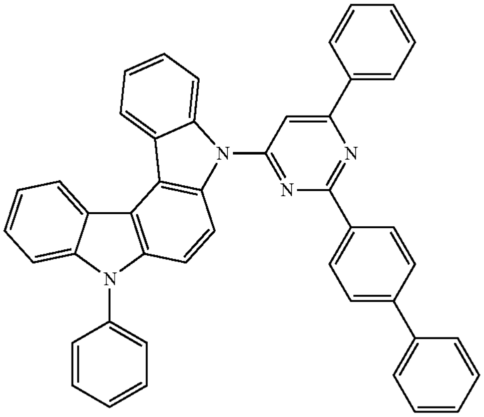
2-72
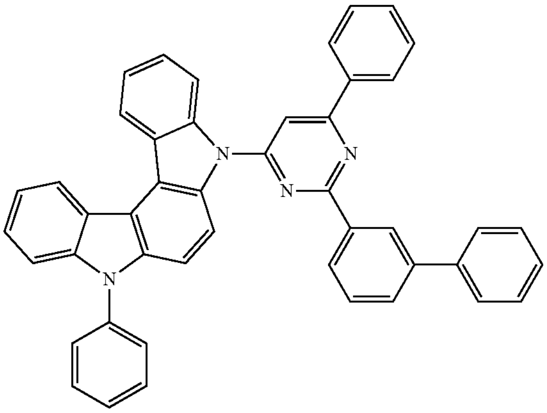
2-73
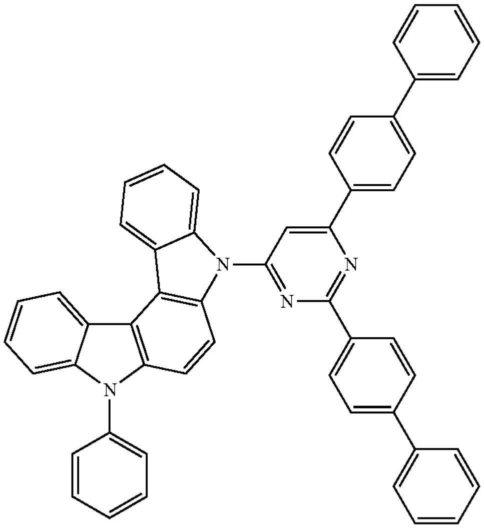

-continued
2-74
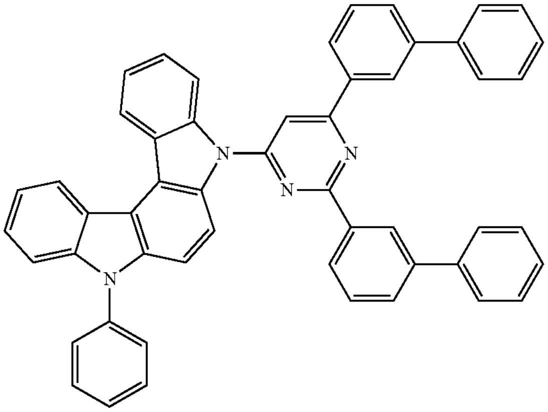
2-75
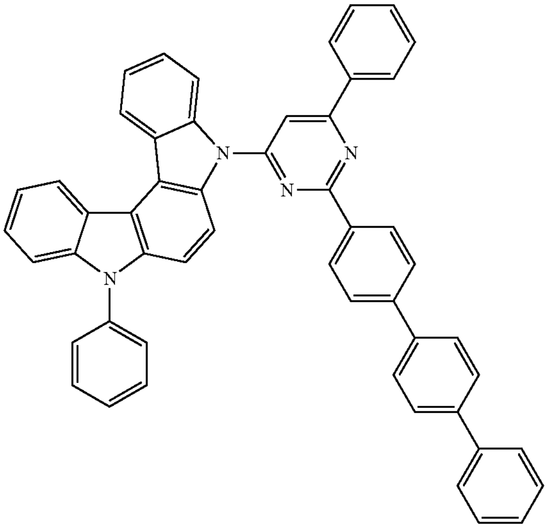
2-76
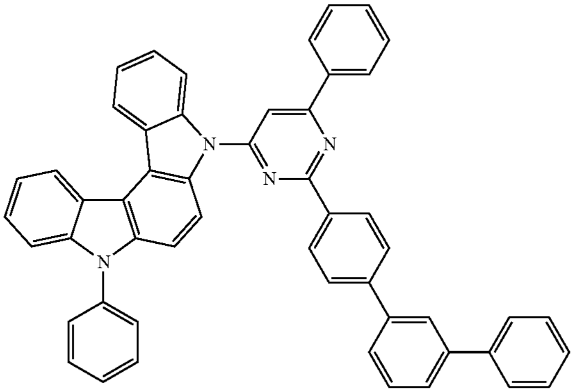
-continued
2-77
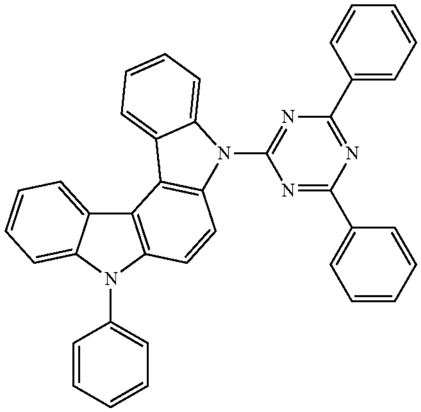
2-78
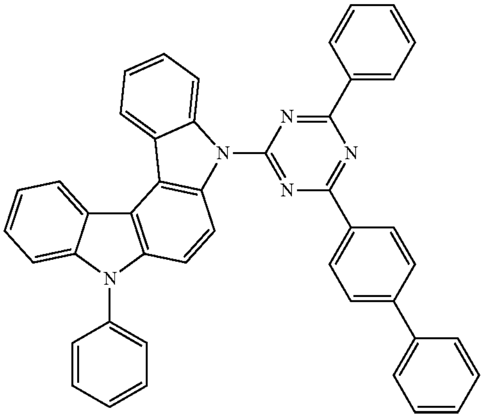
2-79
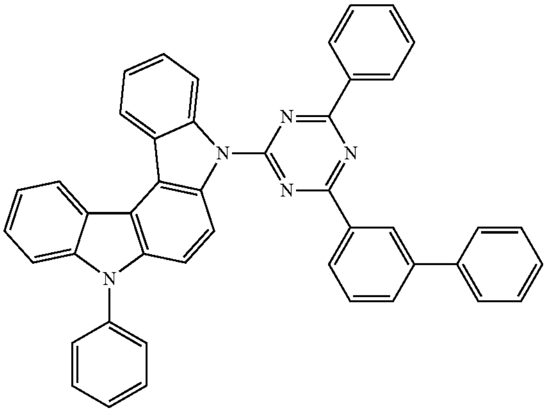

2-80
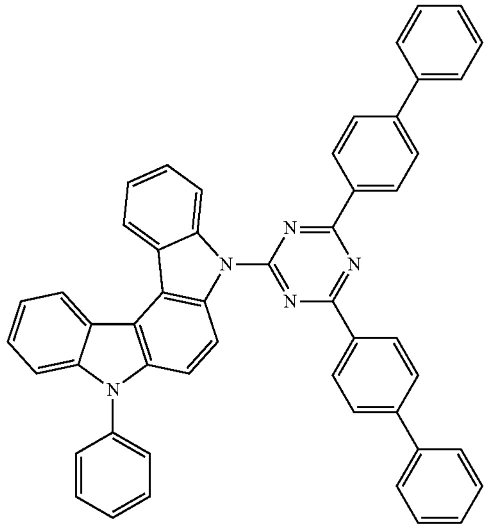
2-81
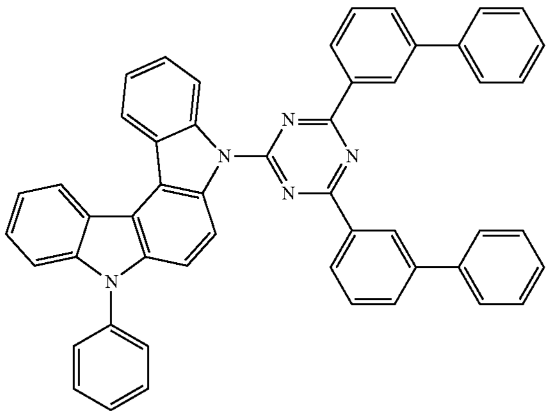
2-82
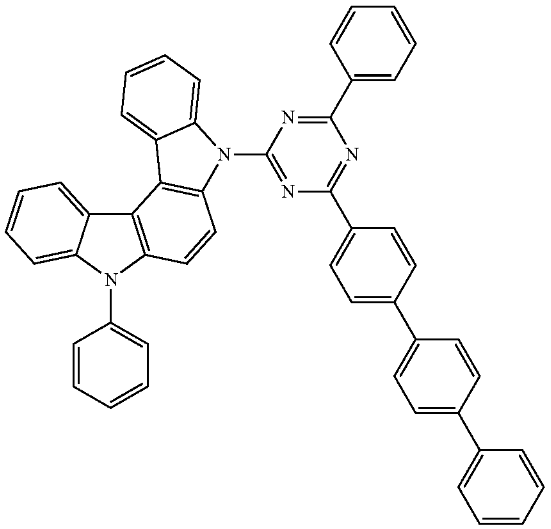
2-83
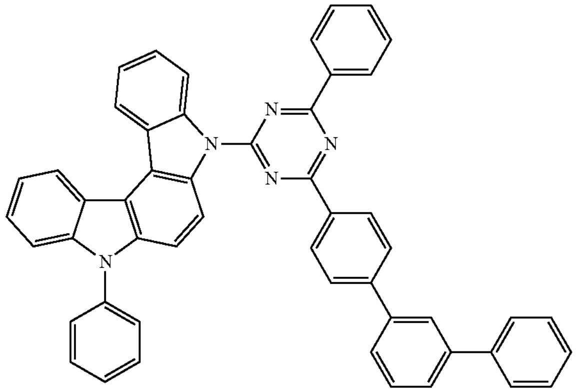
2-84
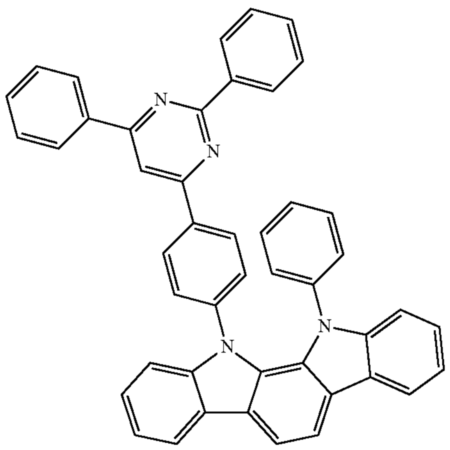
2-85
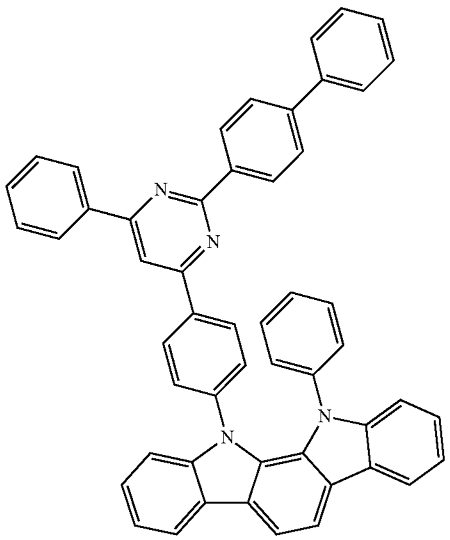

-continued
2-86
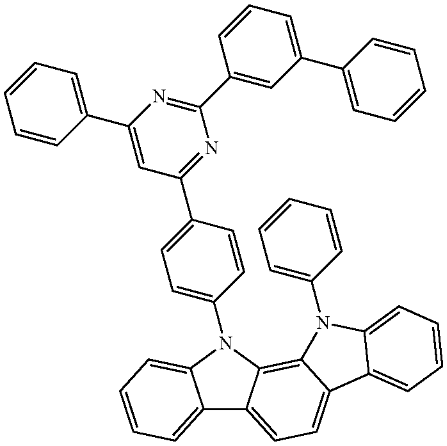
2-87
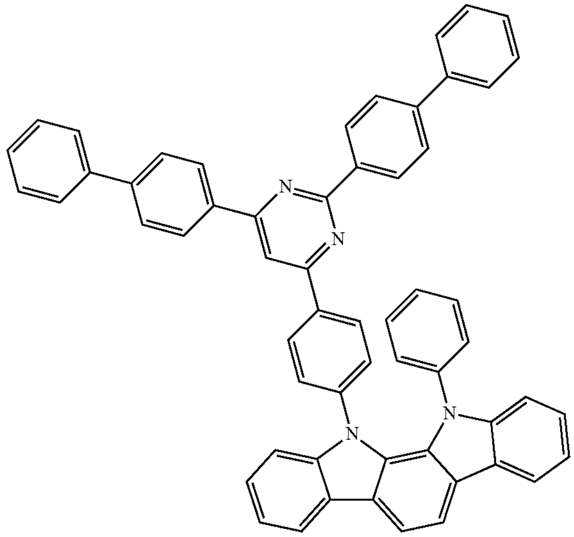
2-88
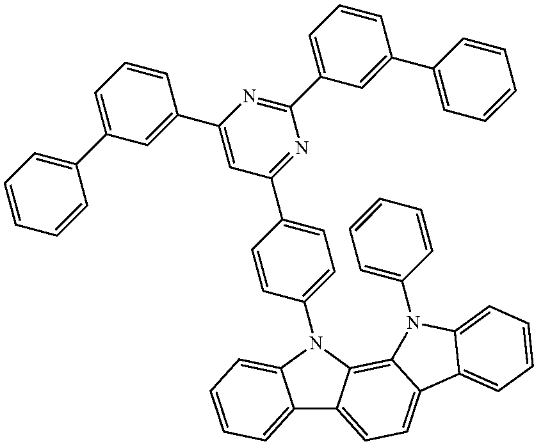
-continued
2-89
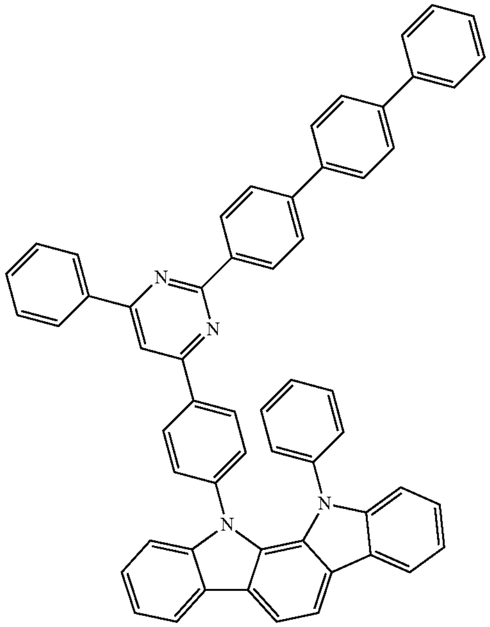
2-90
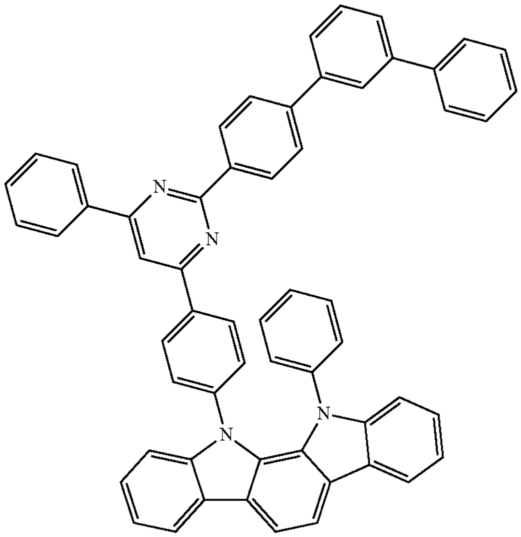
2-91
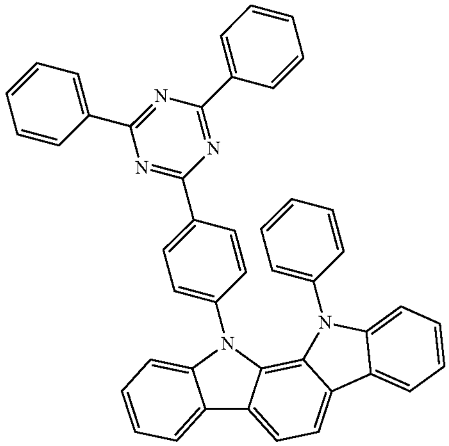

-continued
2-92
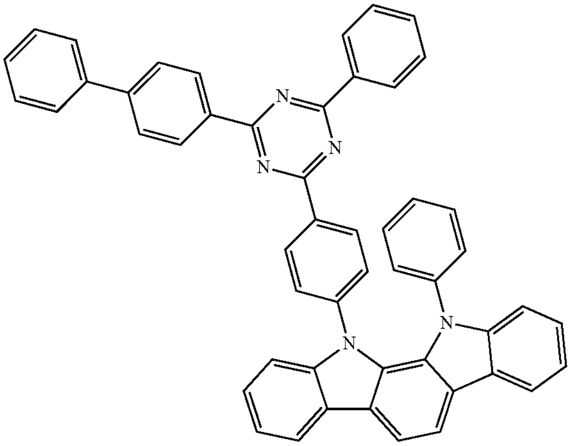
2-93
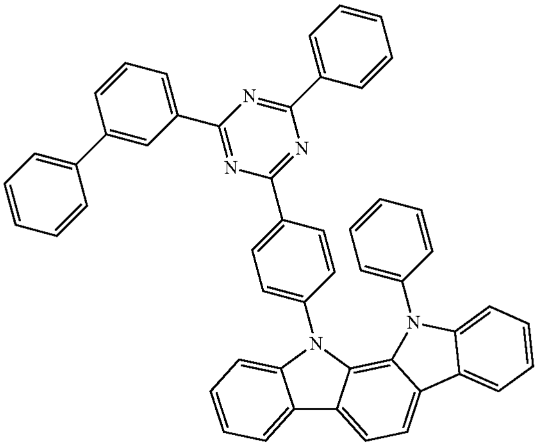
2-94
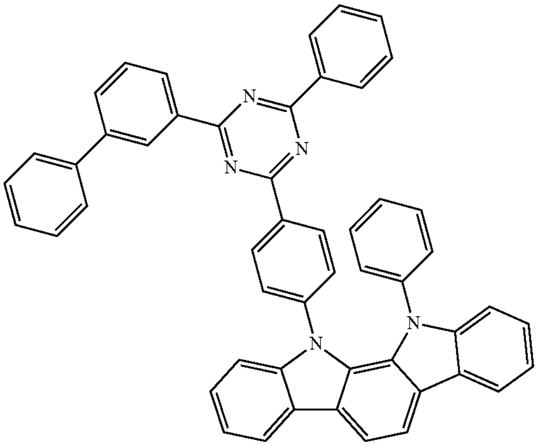
-continued
2-95
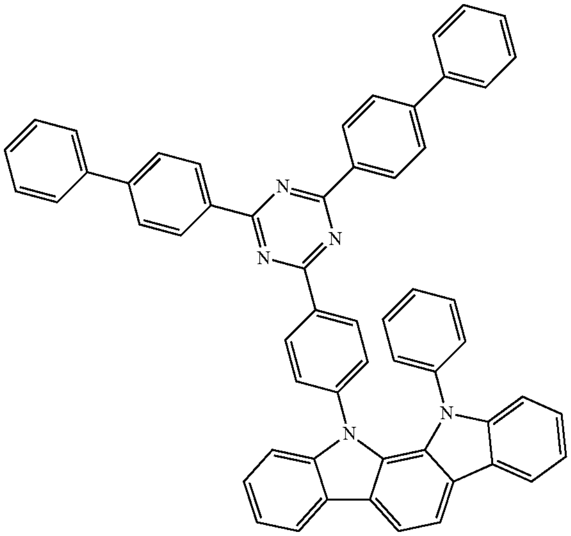
2-96
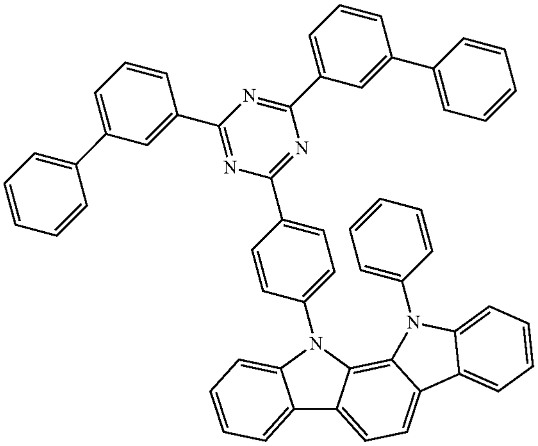
2-97
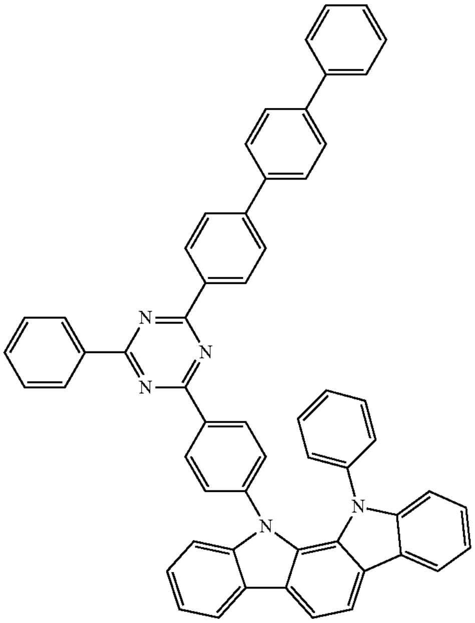

-continued
2-98
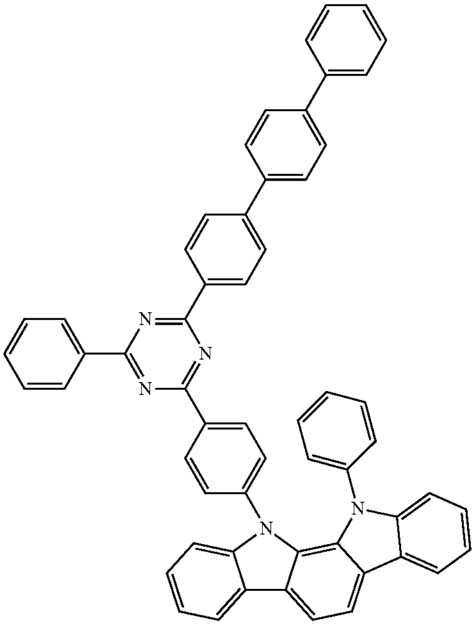
2-99
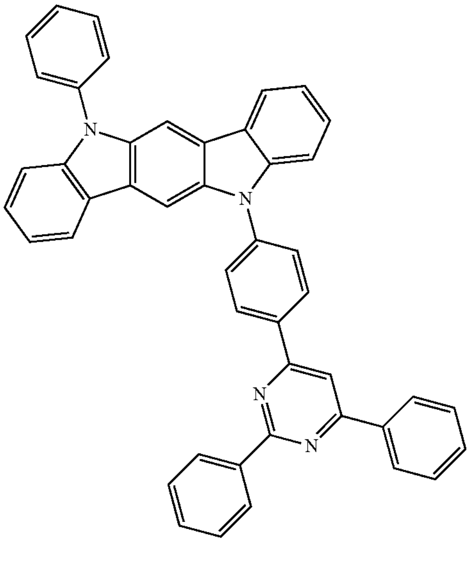
-continued
2-100
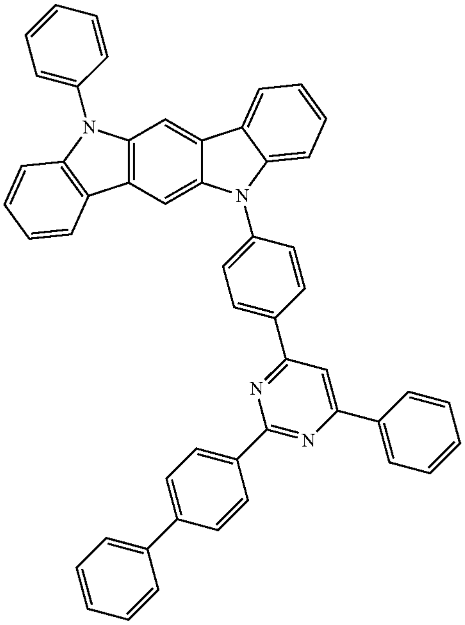
2-101
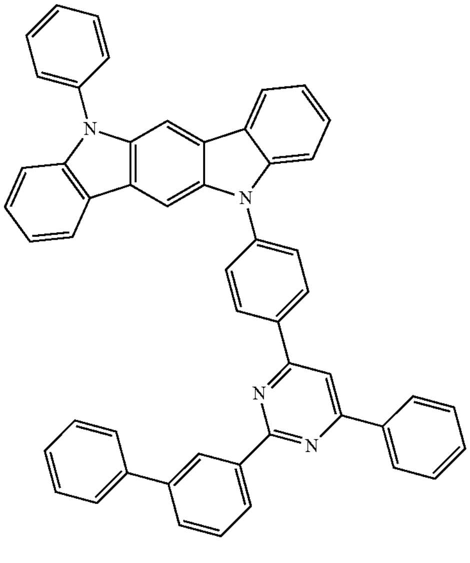

-continued
2-102
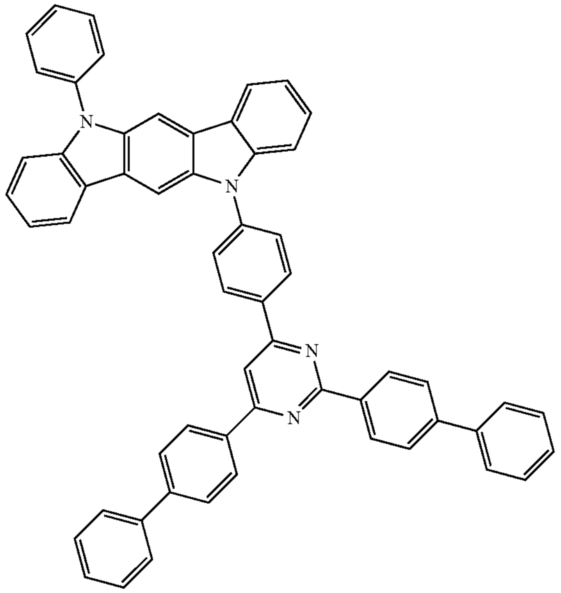
2-103
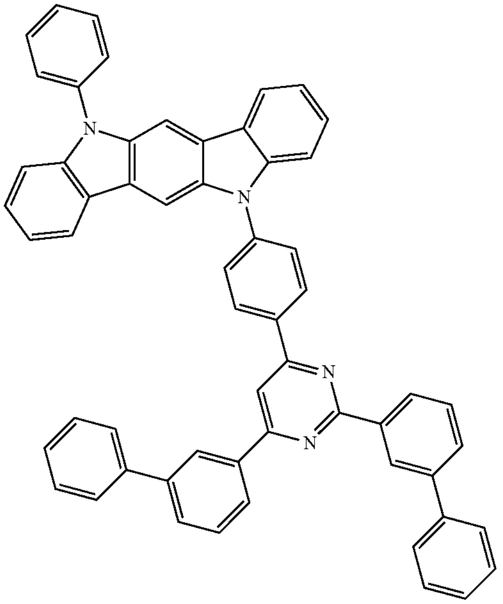
-continued
2-104
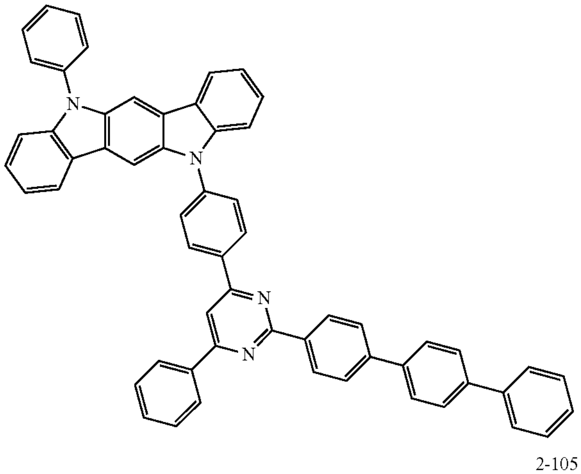
2-105
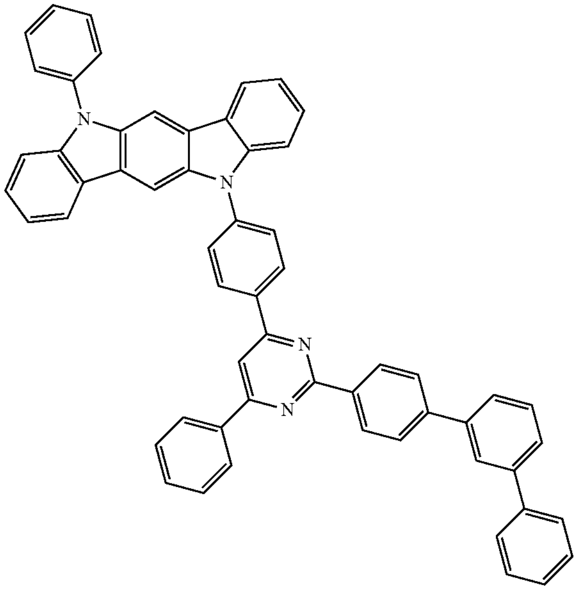
2-106
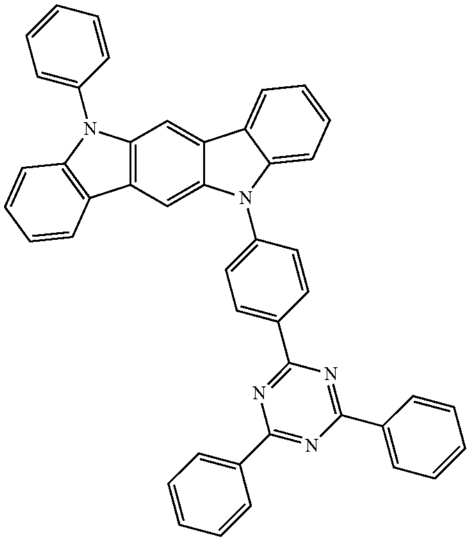

2-107
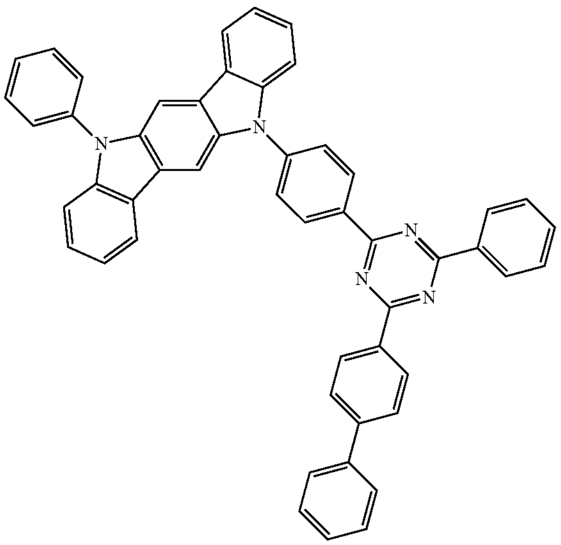
2-108
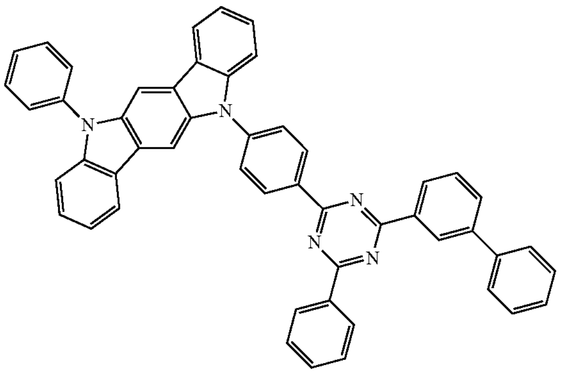
2-109
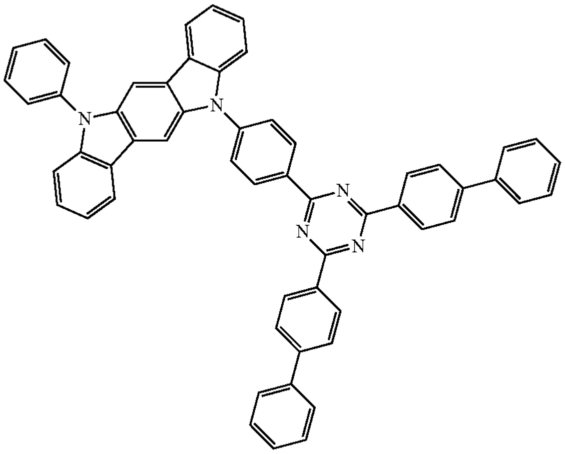
2-110
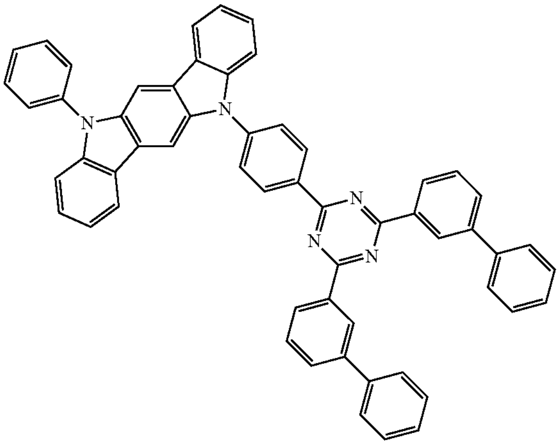
2-111
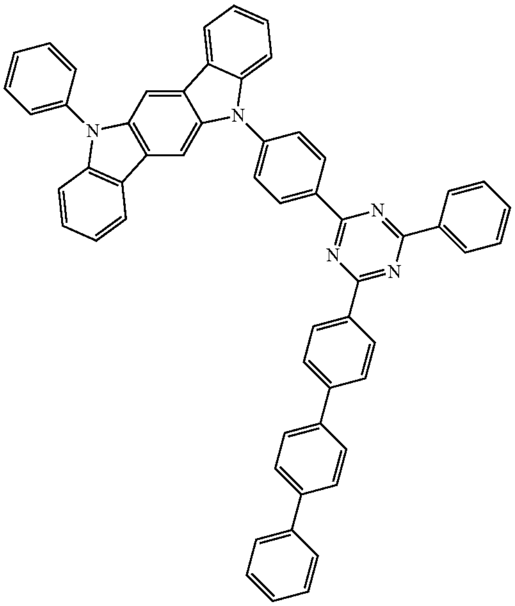

-continued
2-112
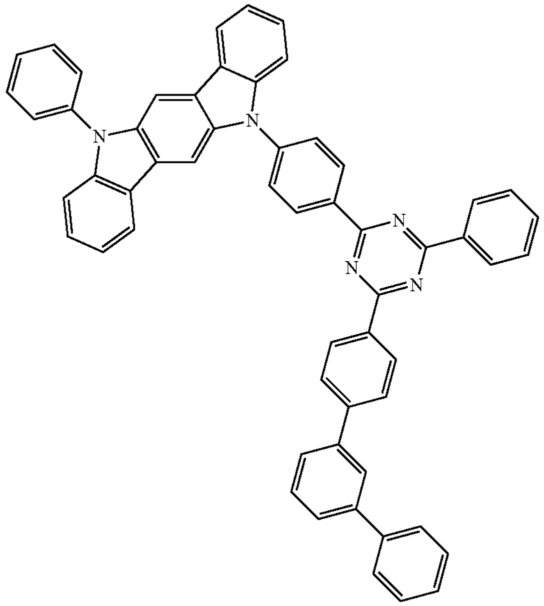
2-113
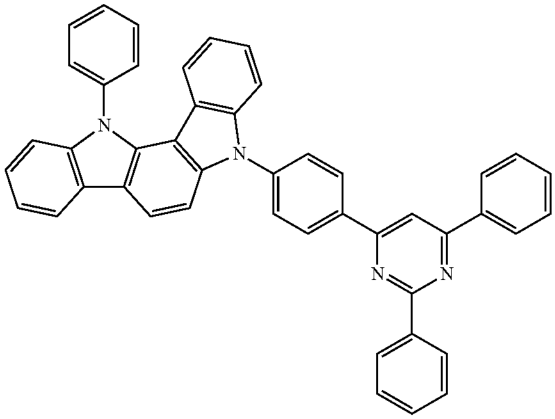
2-114
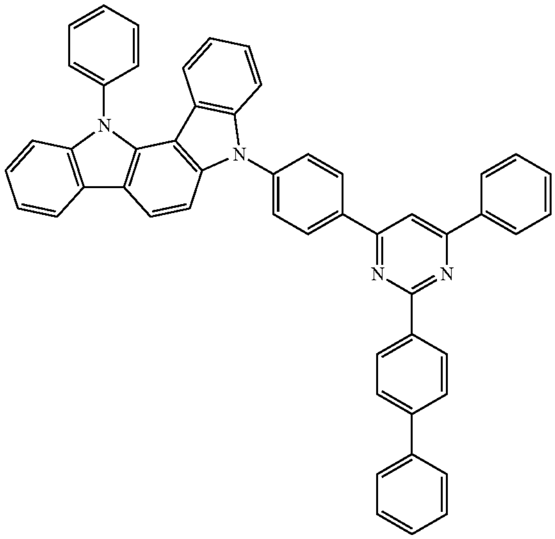
-continued
2-115
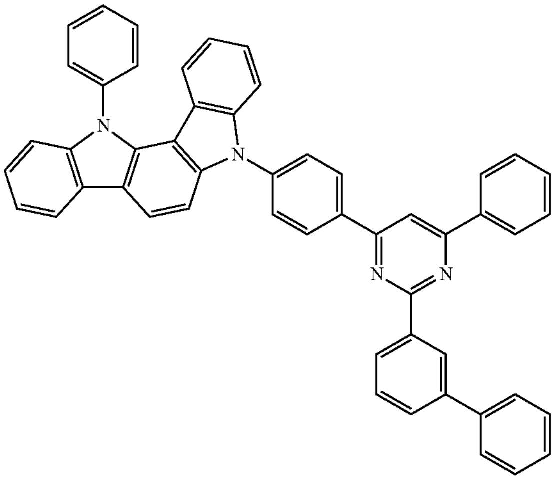
2-116
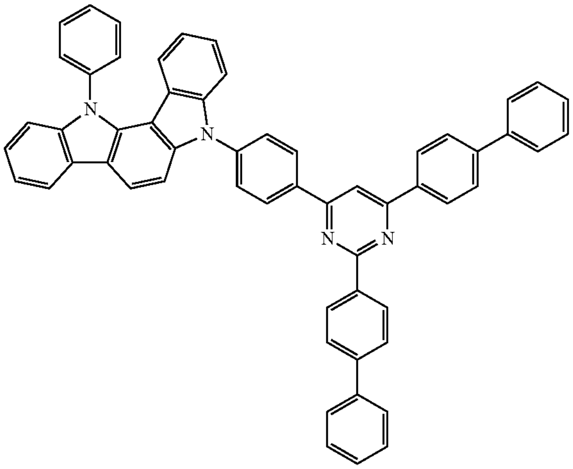
2-117
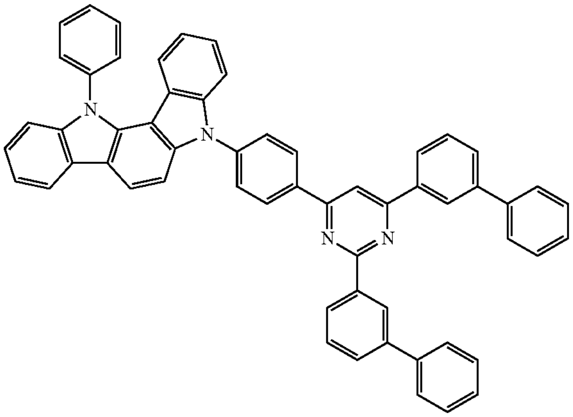

-continued
2-118
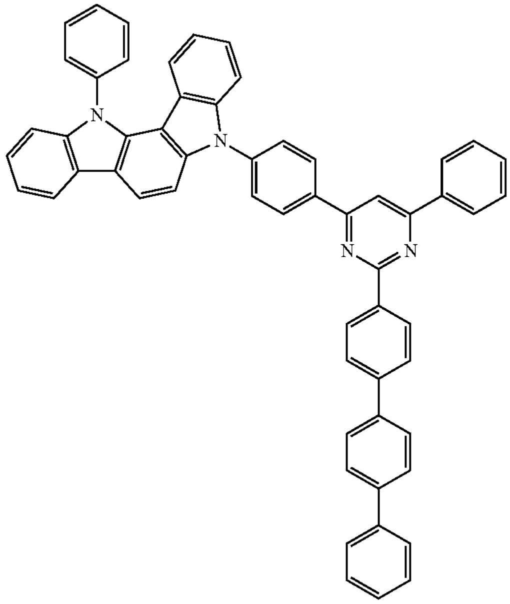
2-119
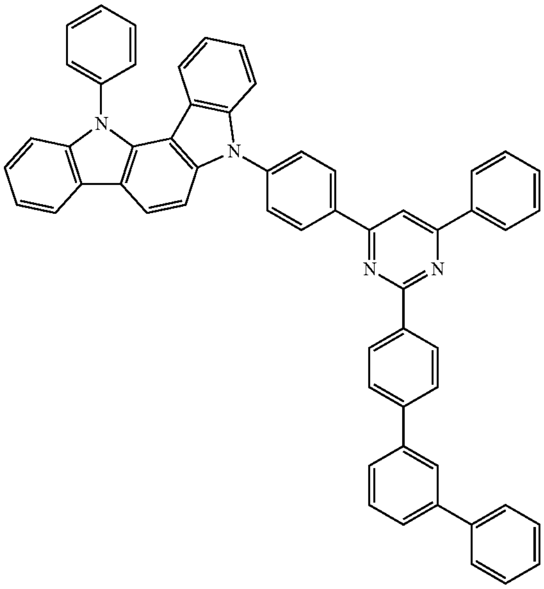
-continued
2-120
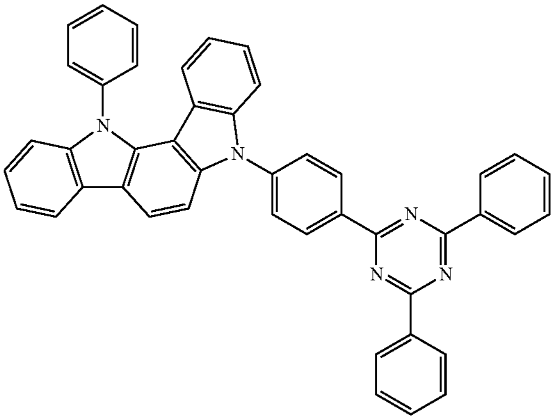
2-121
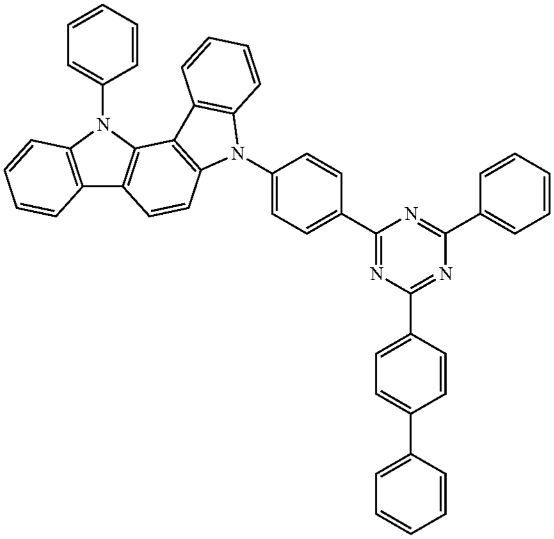
2-122
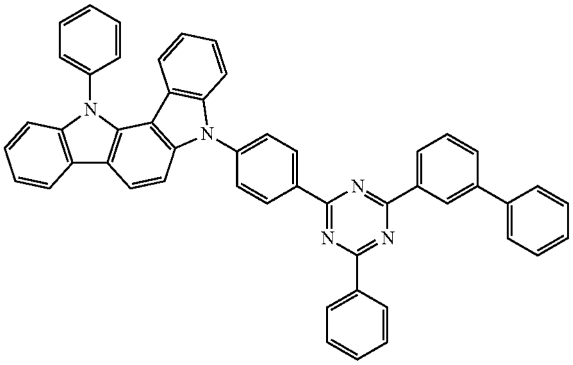

-continued
2-123
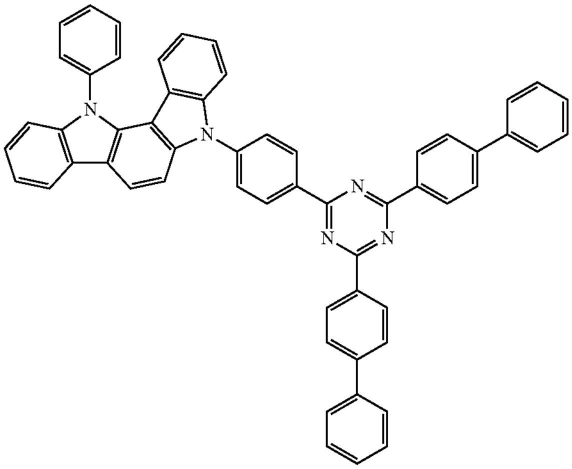
2-124
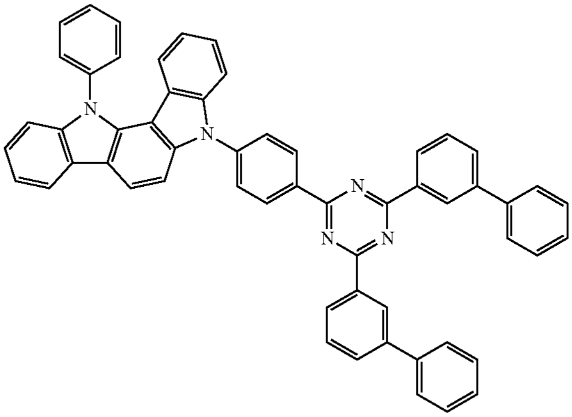
2-125
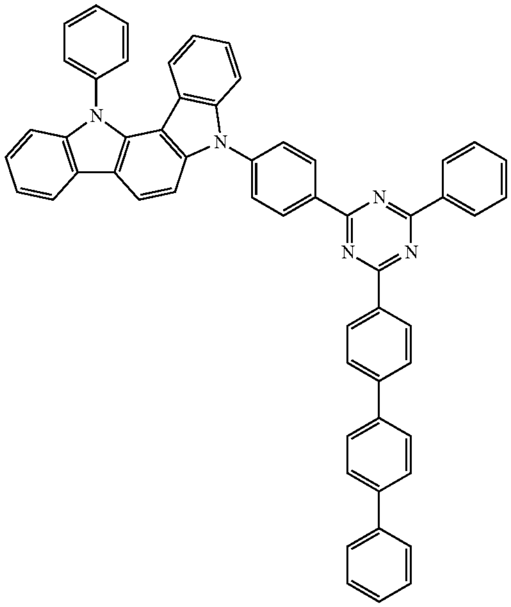
-continued
2-126
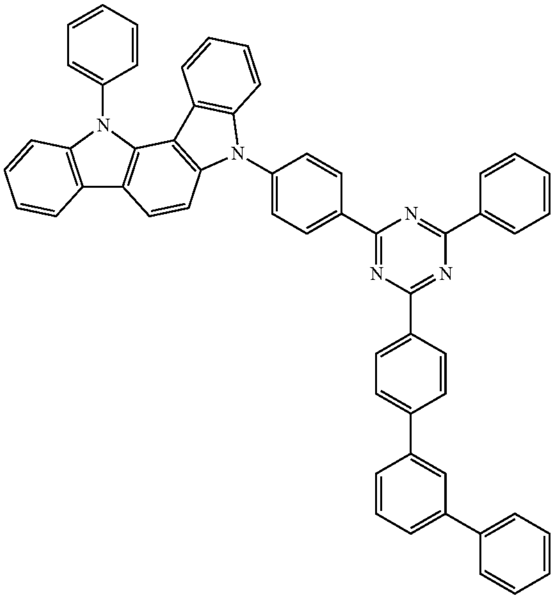
2-127
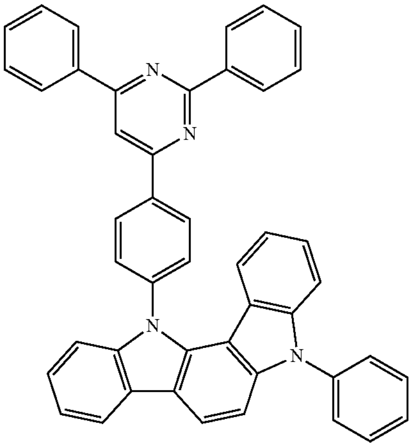
2-128
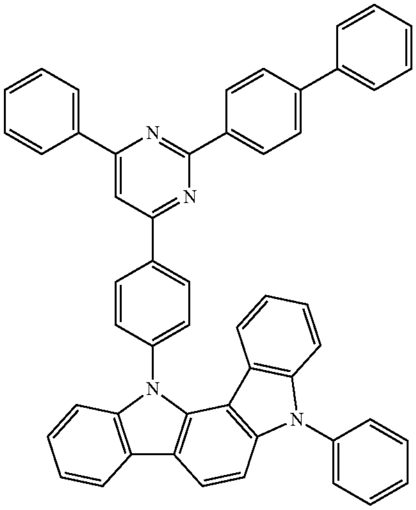

-continued
2-129
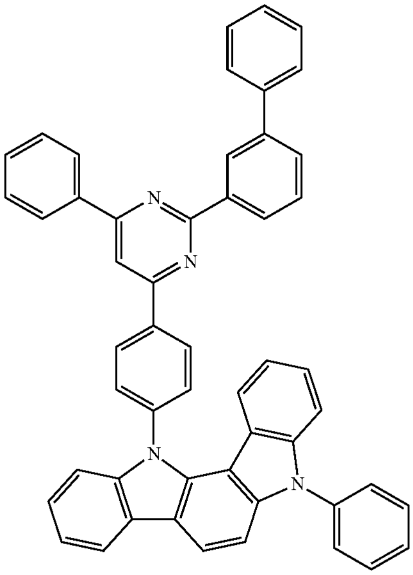
2-130
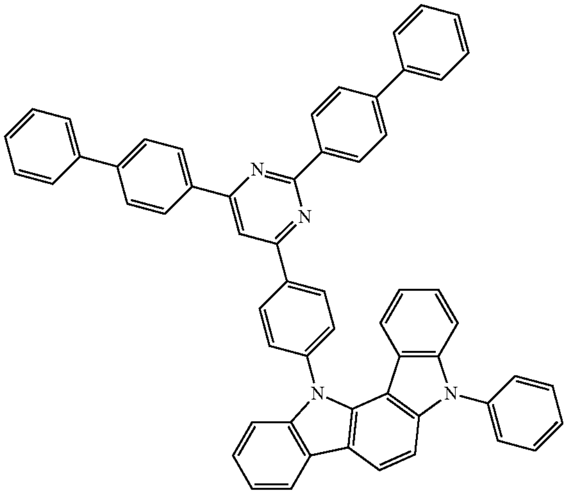
2-131
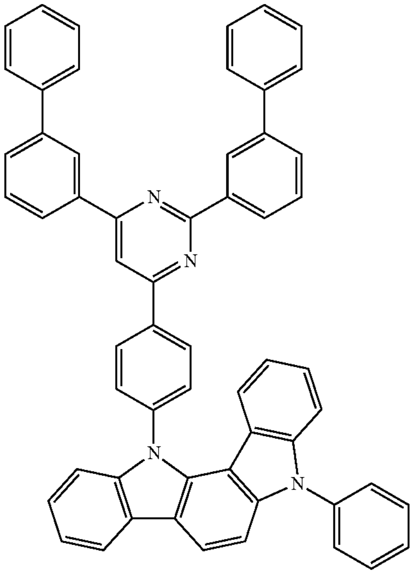
-continued
2-132
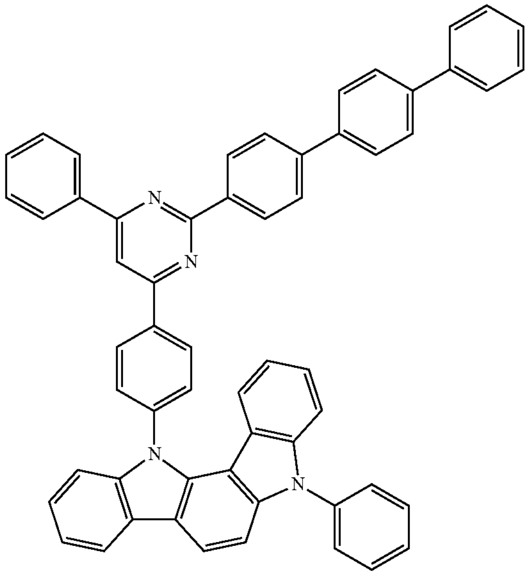
2-133
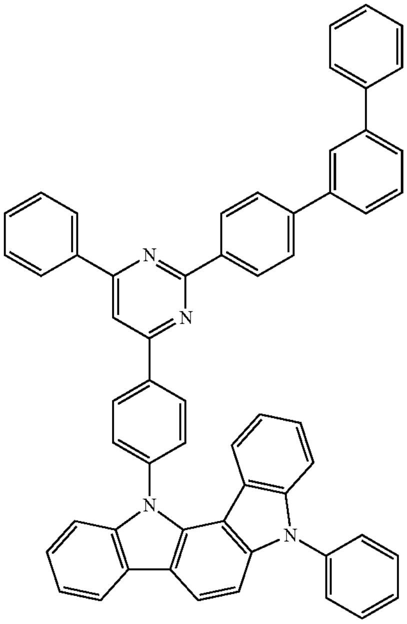

-continued
2-134
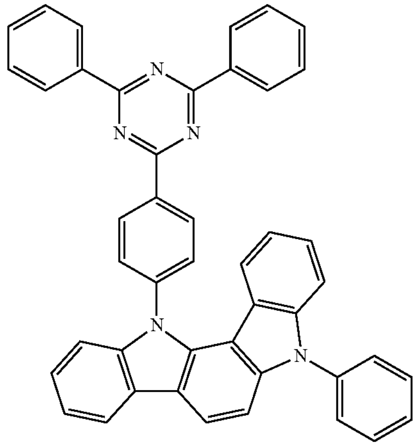
2-135
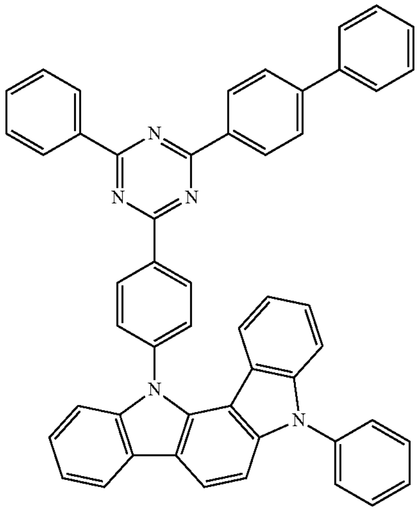
2-136
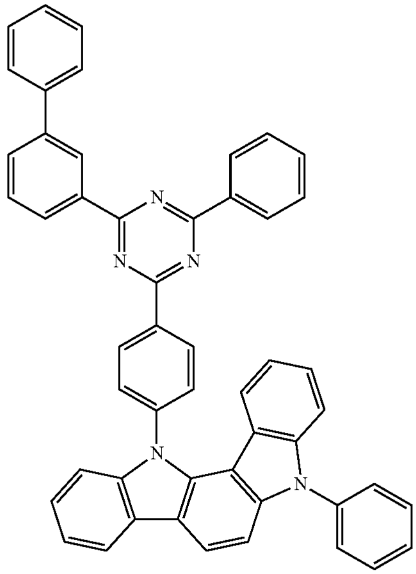
-continued
2-137
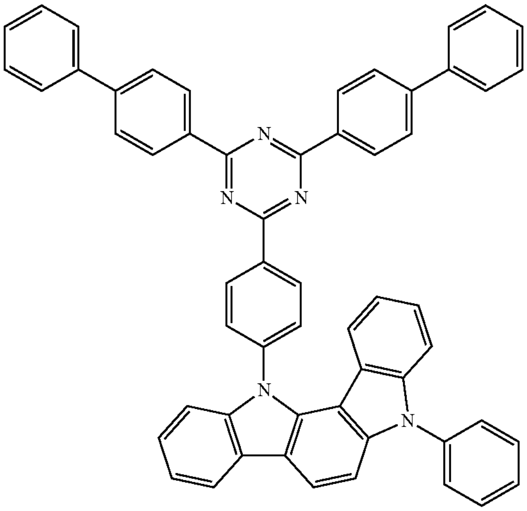
2-138
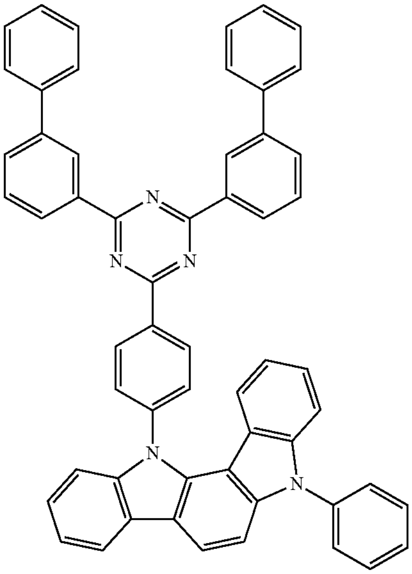

-continued
2-139
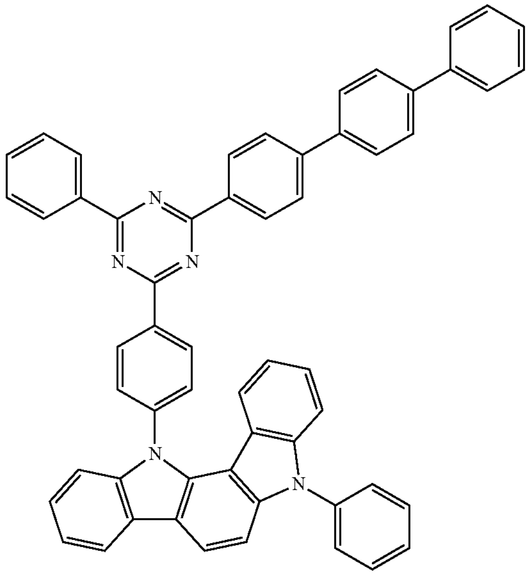
2-140
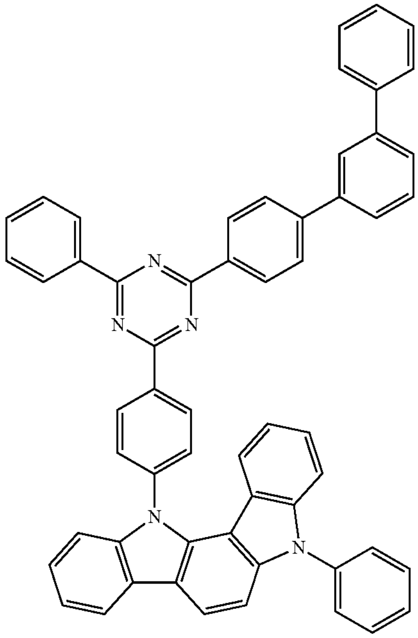
-continued
2-141
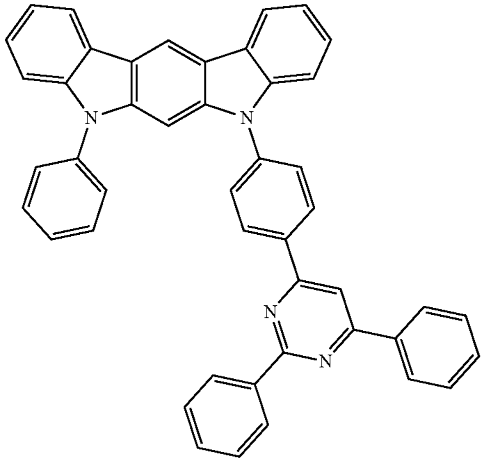
2-142
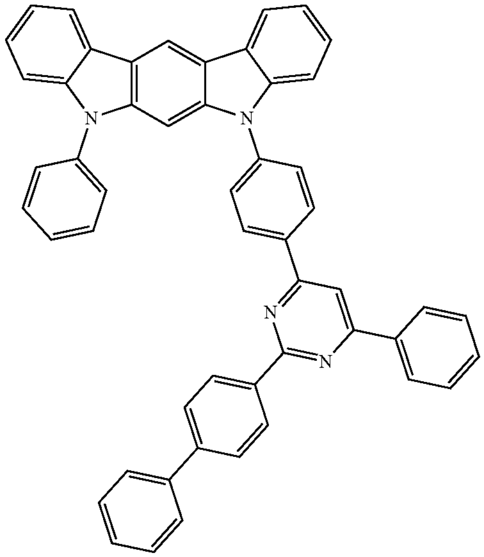
2-143
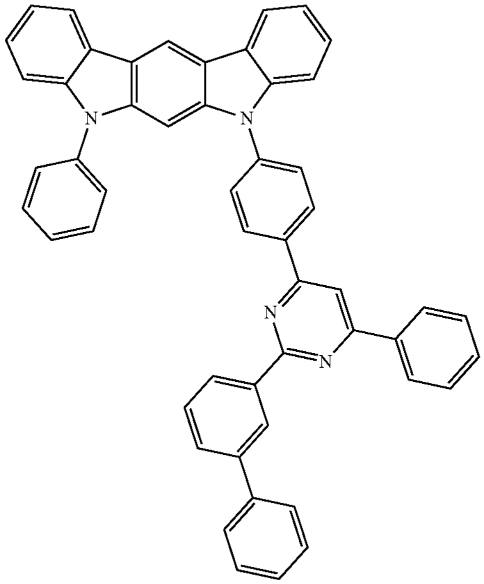

-continued
2-144
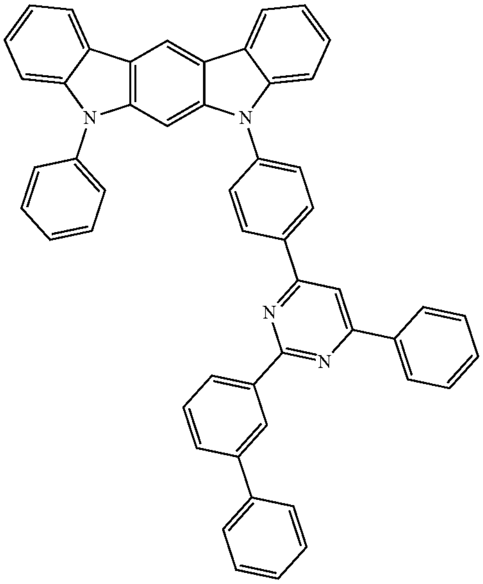
2-145
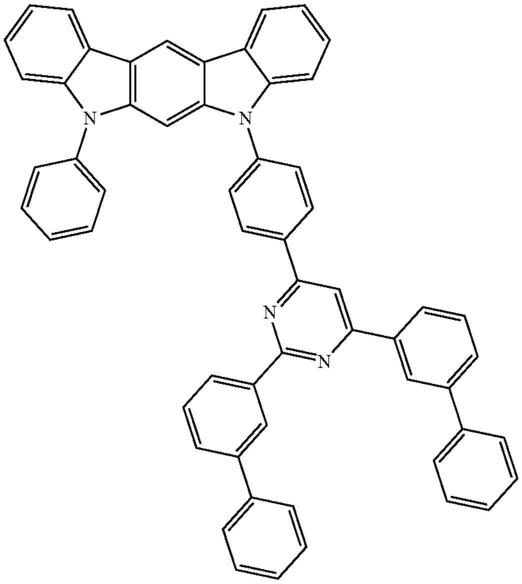
2-146
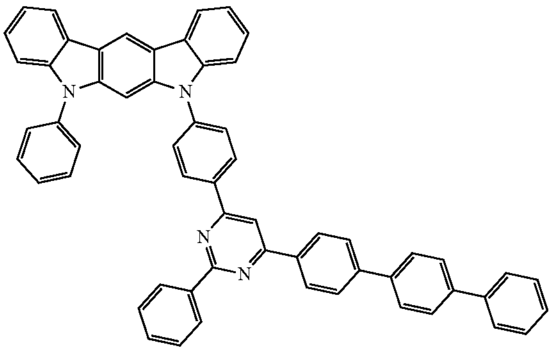
-continued
2-147
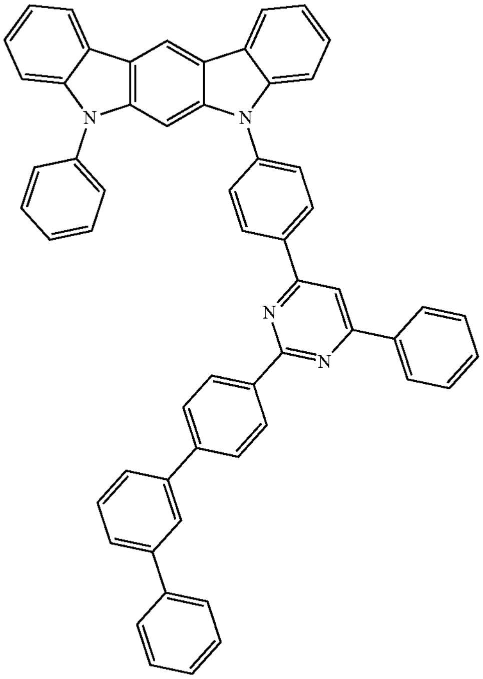
2-148
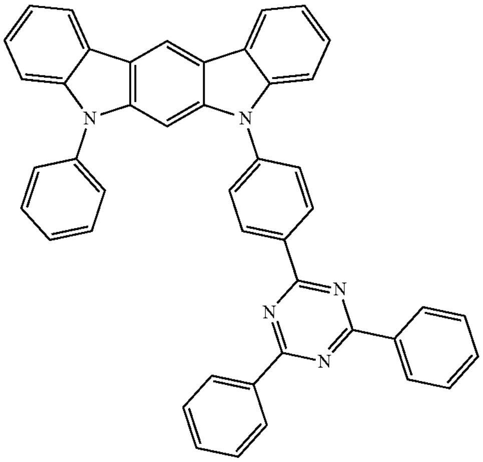

-continued
2-149
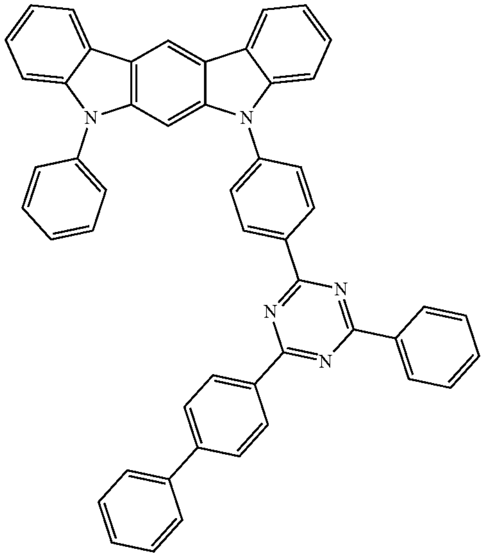
2-150
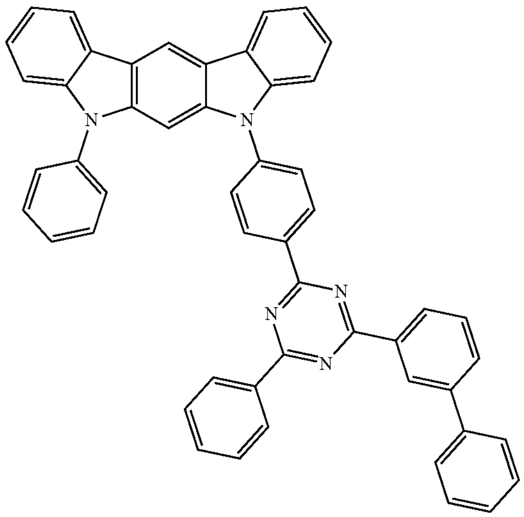
2-151
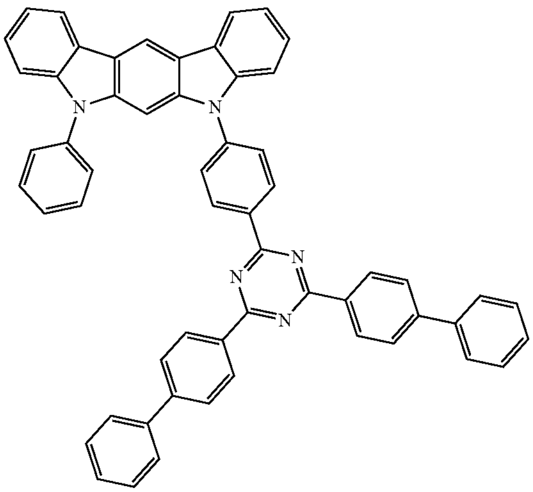
-continued
2-152
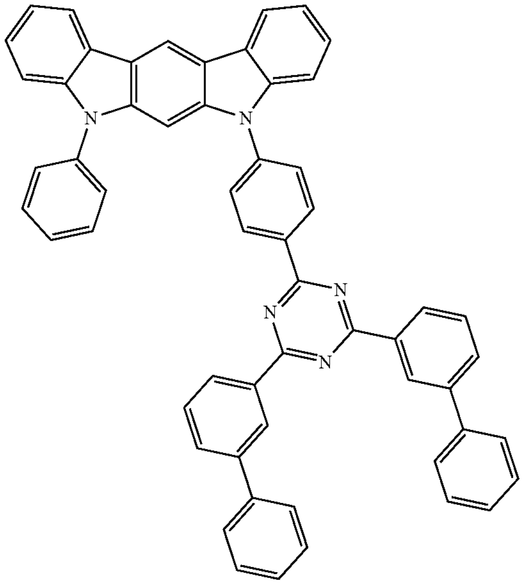
2-153
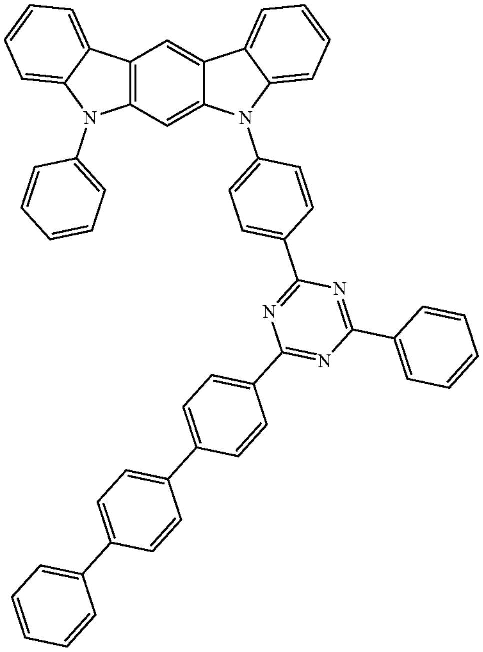

-continued
2-154
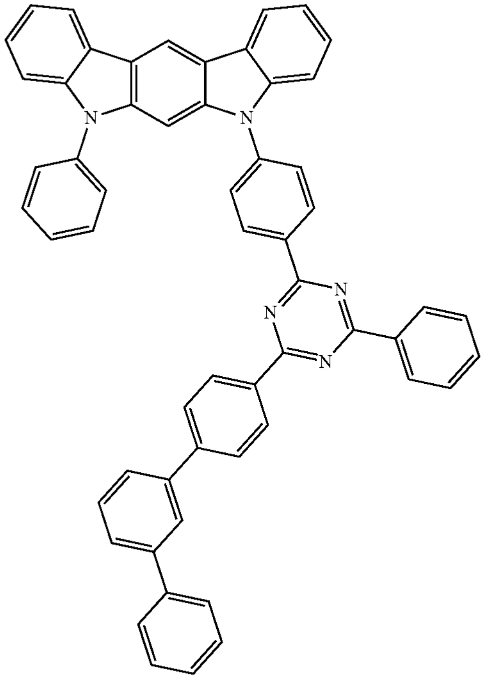
2-155
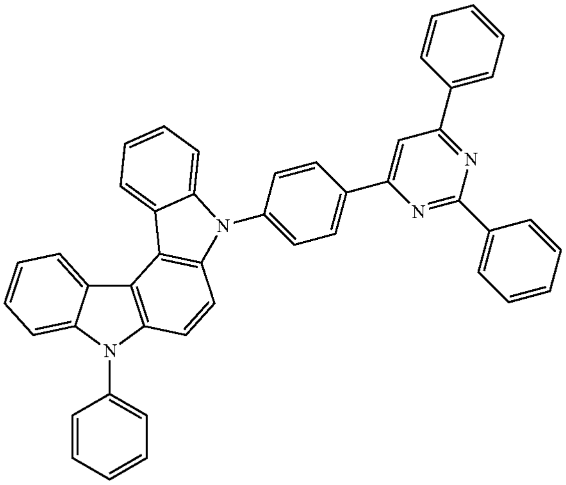
2-156
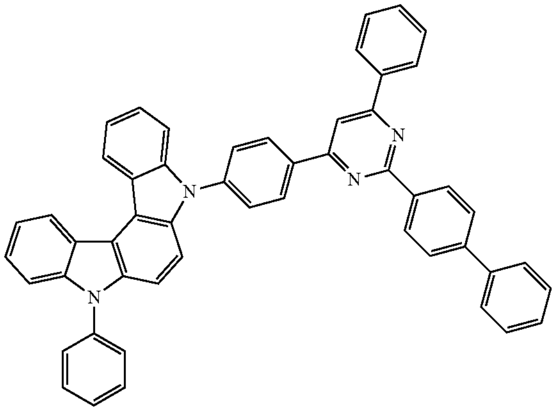
-continued
2-157
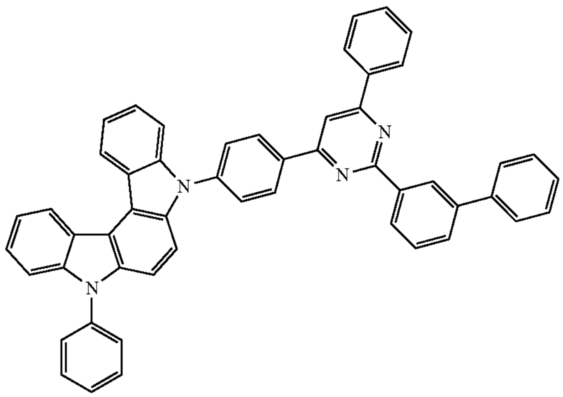
2-158
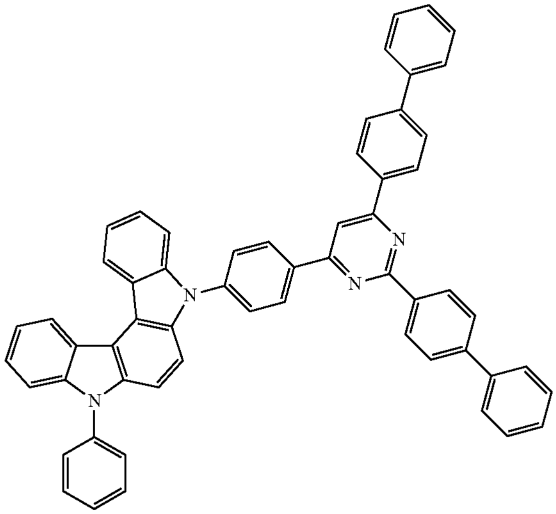
2-159
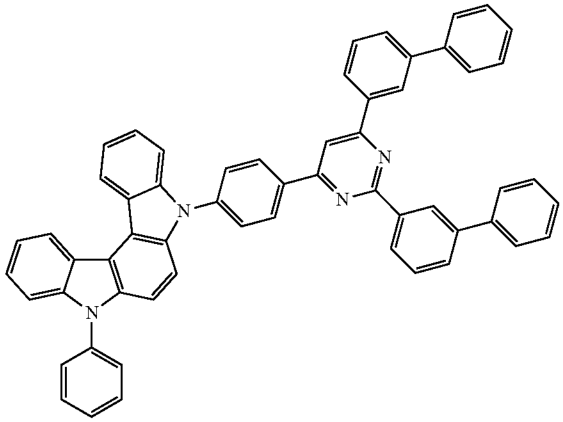

-continued
2-160
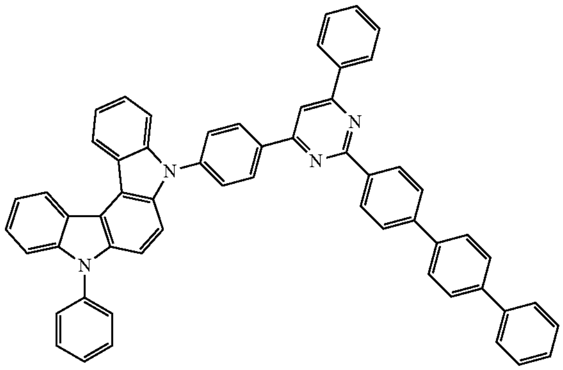
2-161
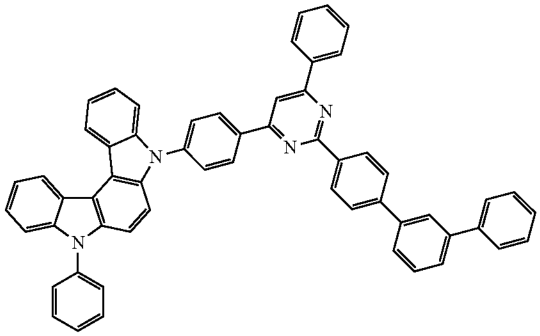
2-162
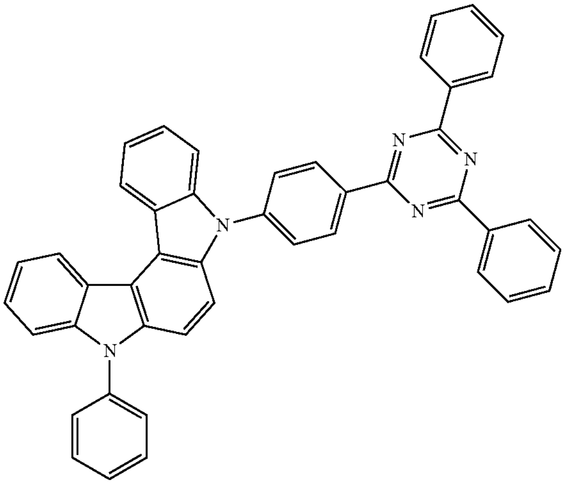
-continued
2-163
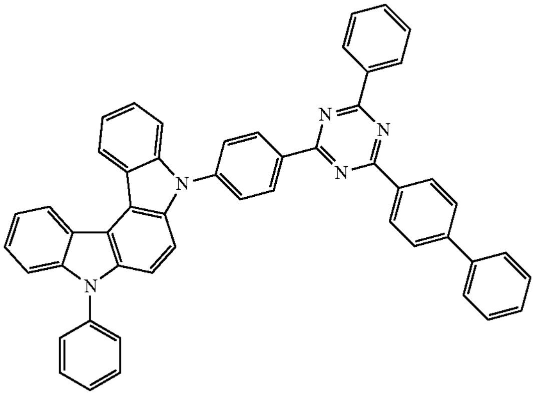
2-164
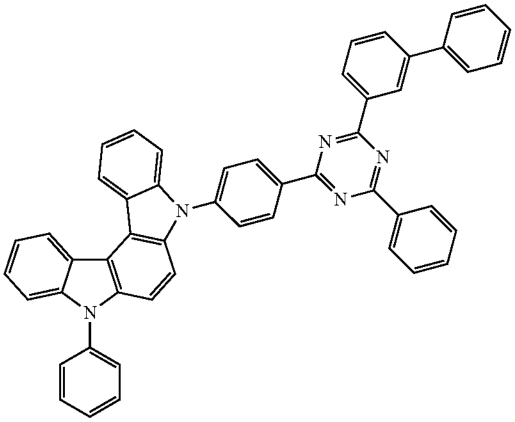
2-165
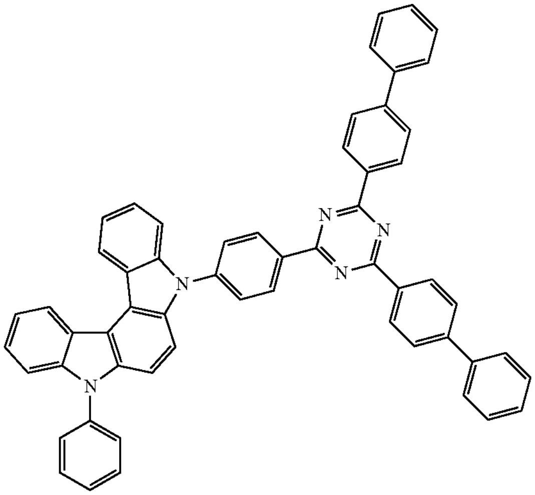

-continued
2-166
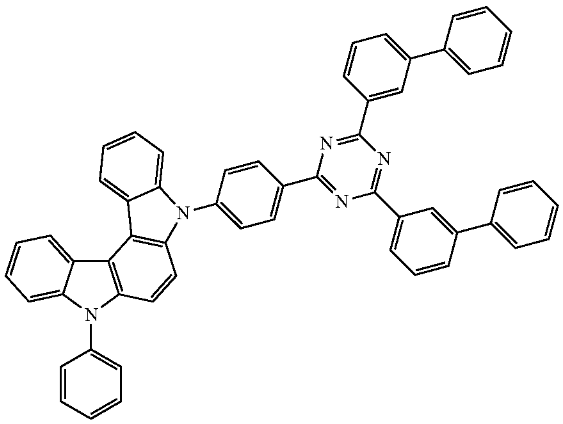
2-167
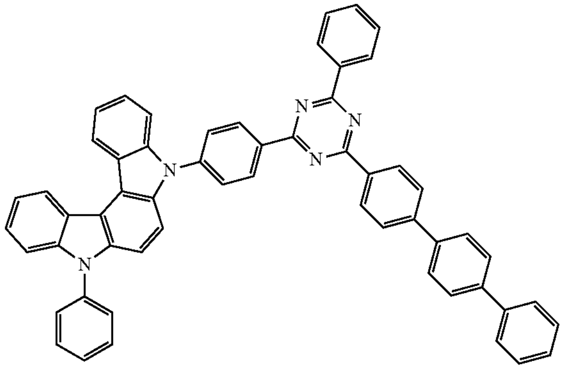
2-168
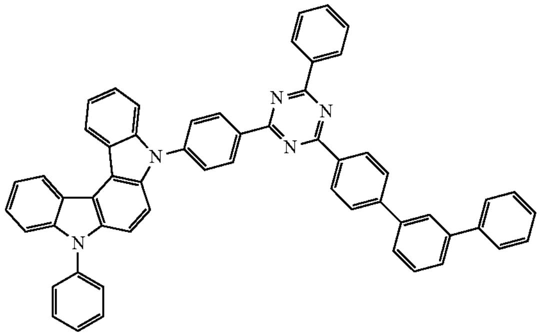
2-169
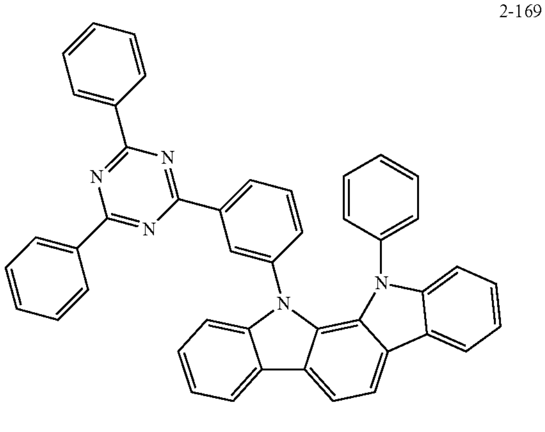
-continued
2-170
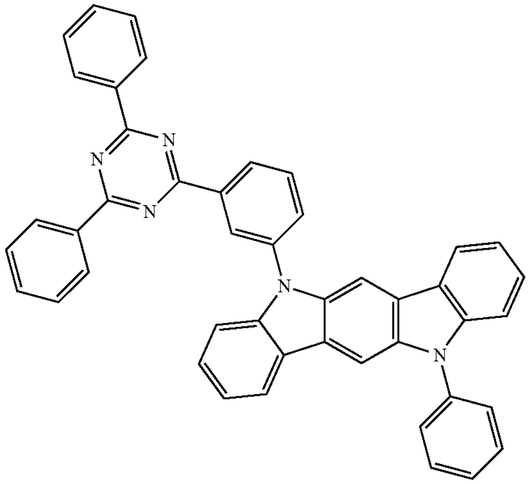
2-171
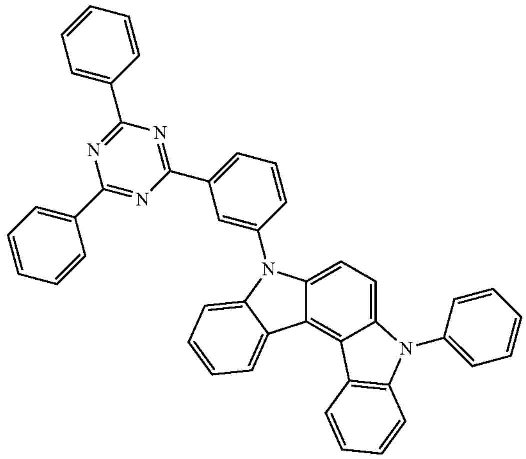
2-172
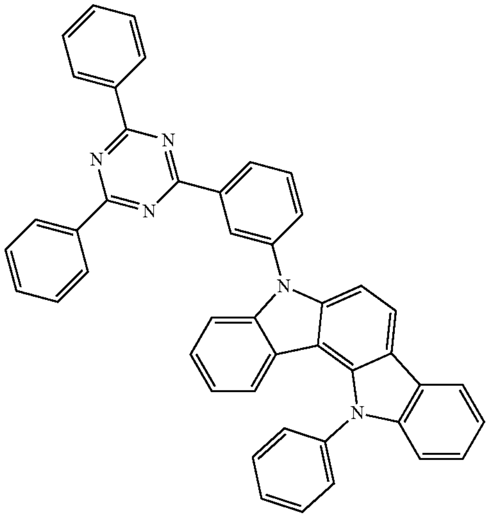

-continued
2-173
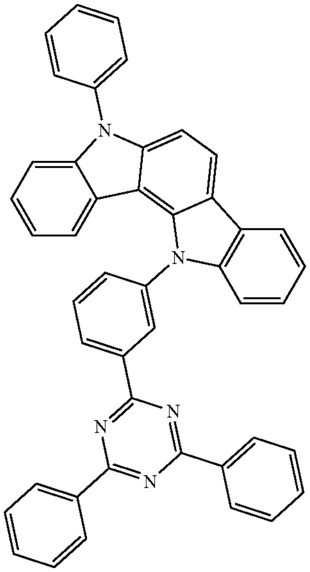
2-174
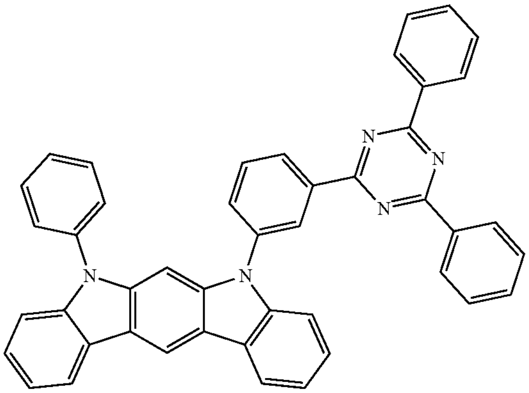
2-175
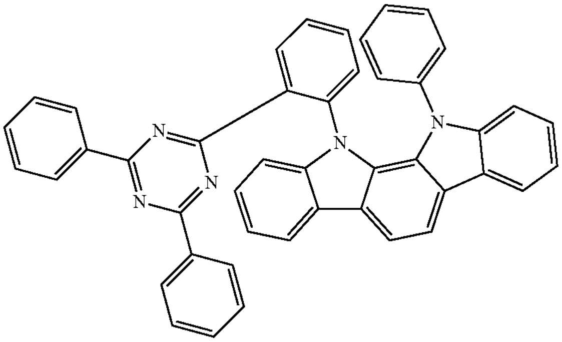
-continued
2-176
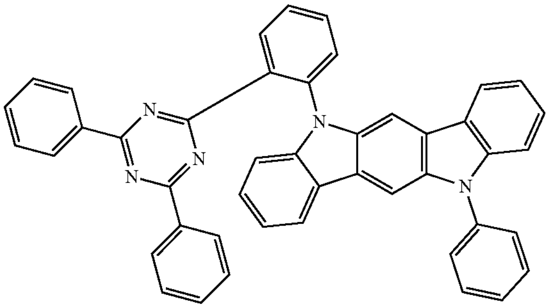
2-177
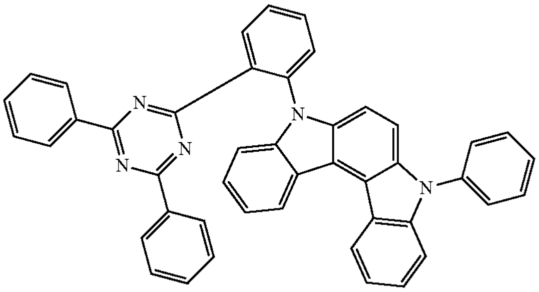
2-178
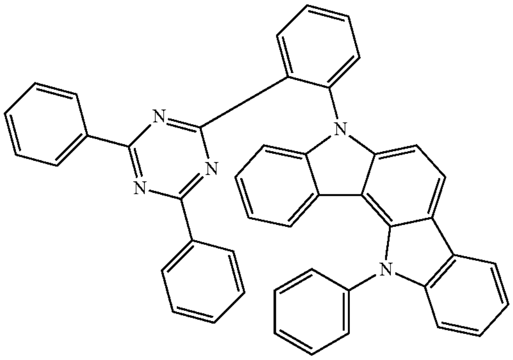
2-179
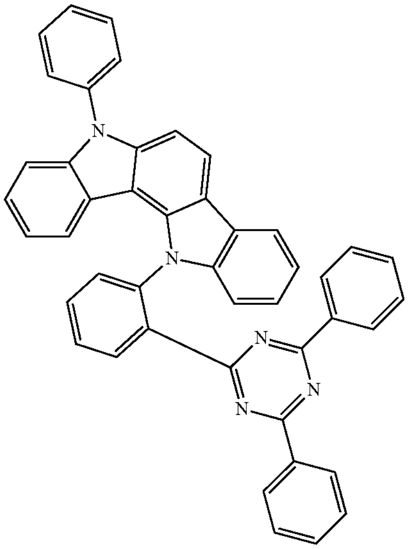

-continued
2-180
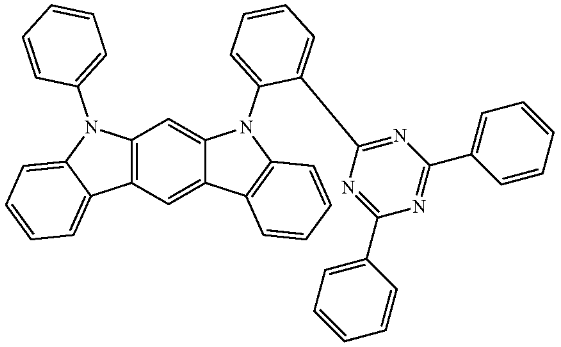
2-181
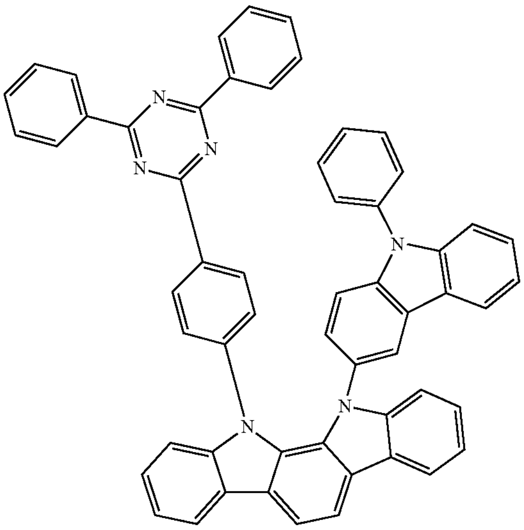
2-182
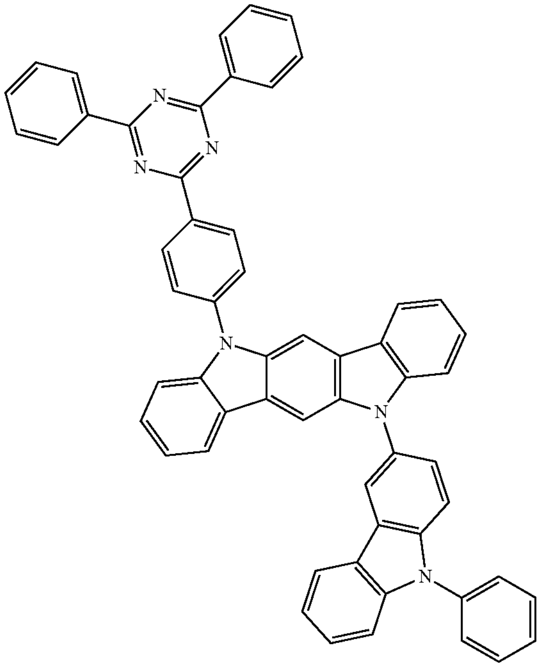
-continued
2-183
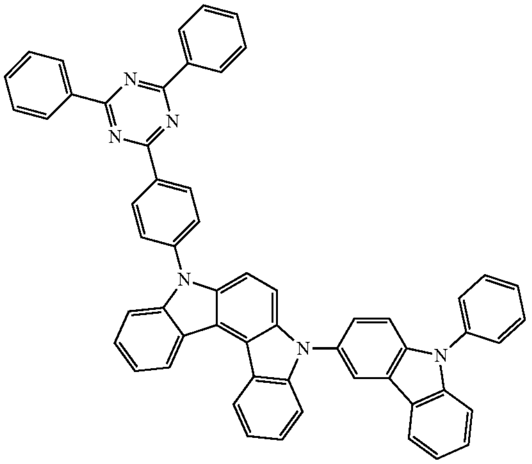
2-184
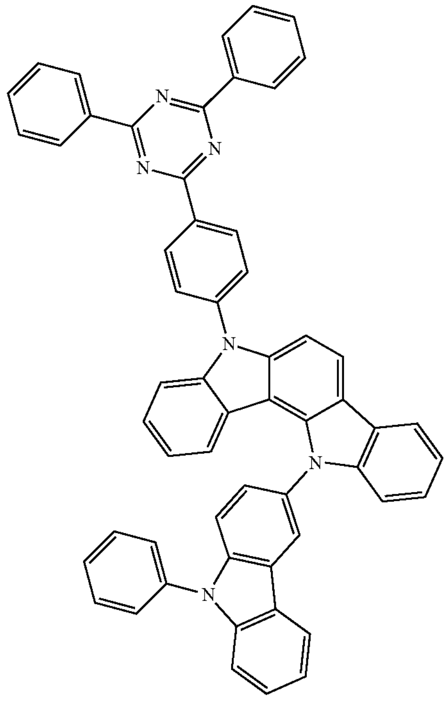

-continued
2-185
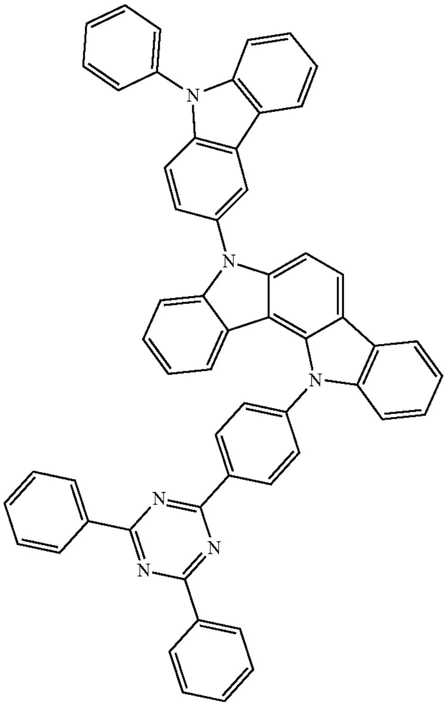
2-186
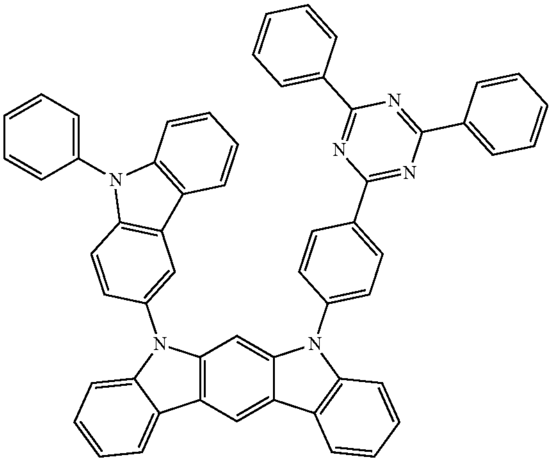
-continued
2-187
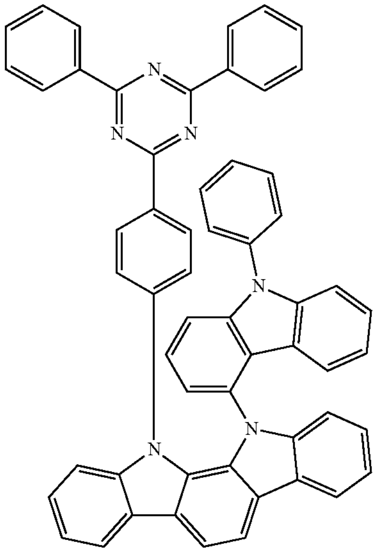
2-188
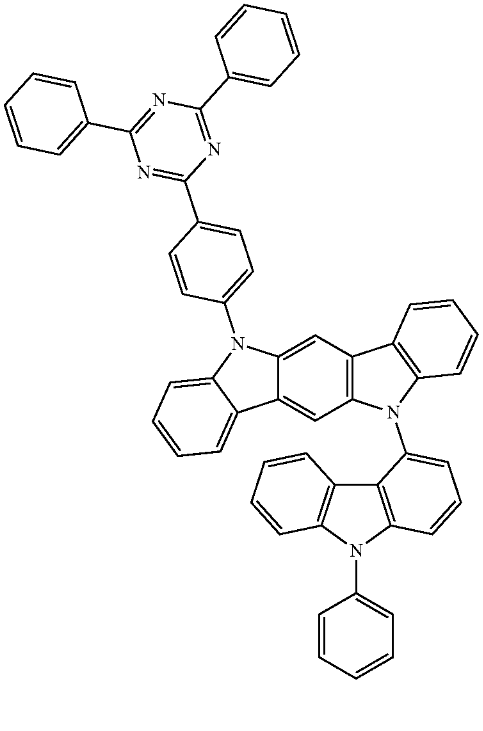

-continued
2-189
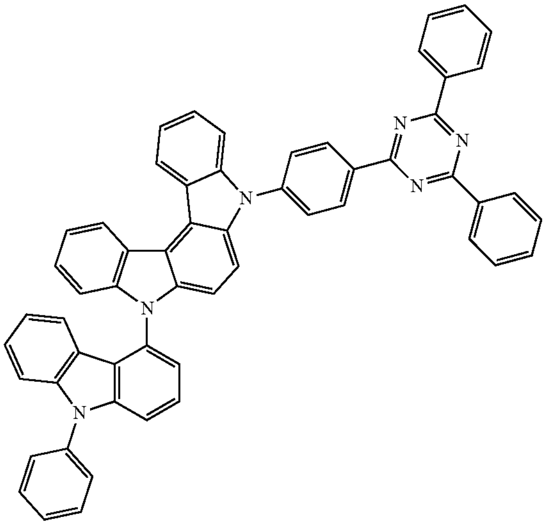
2-190
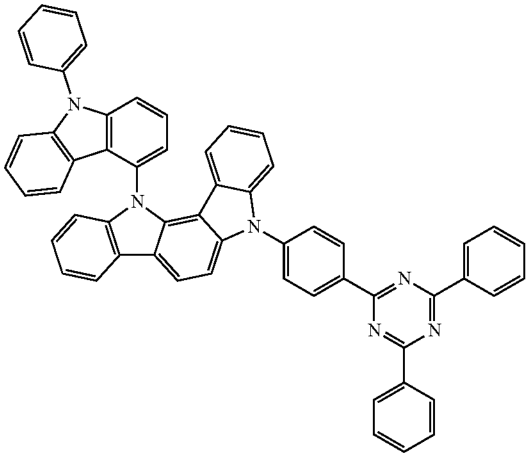
2-191
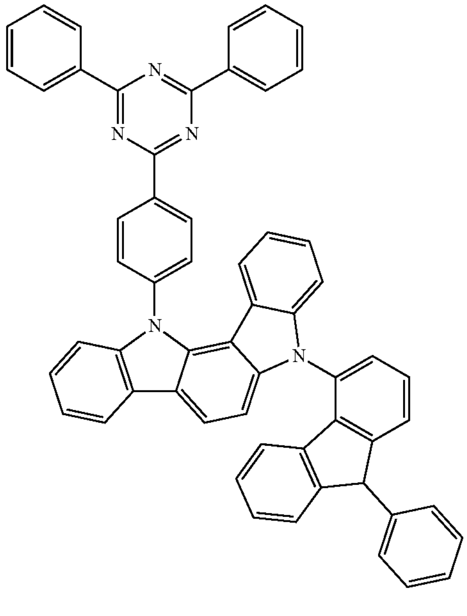
-continued
2-192
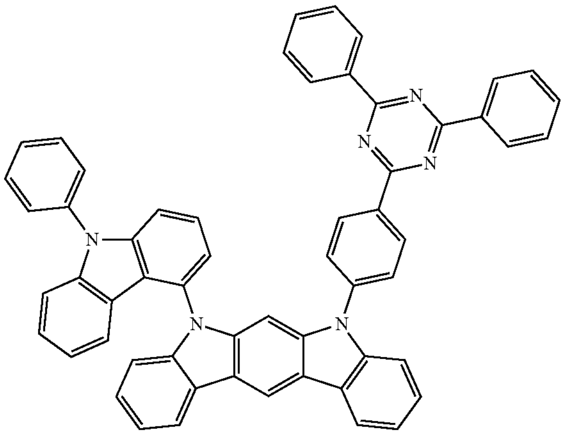
2-193
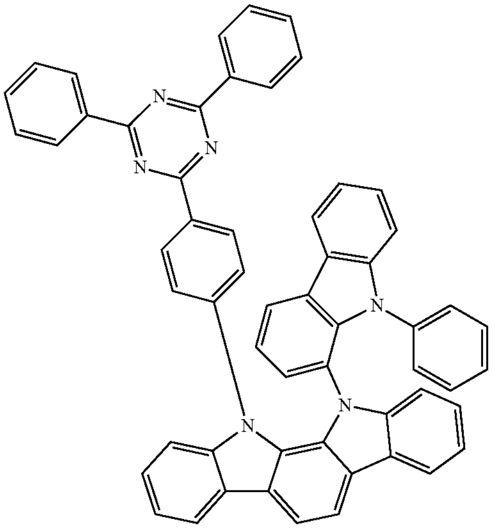
2-194
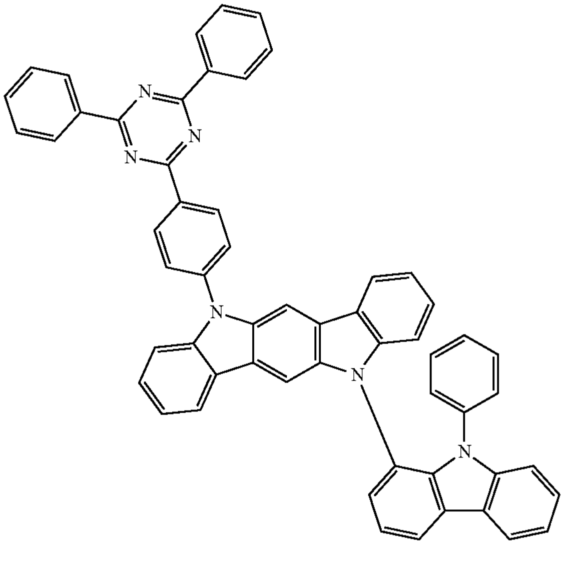

-continued
2-195
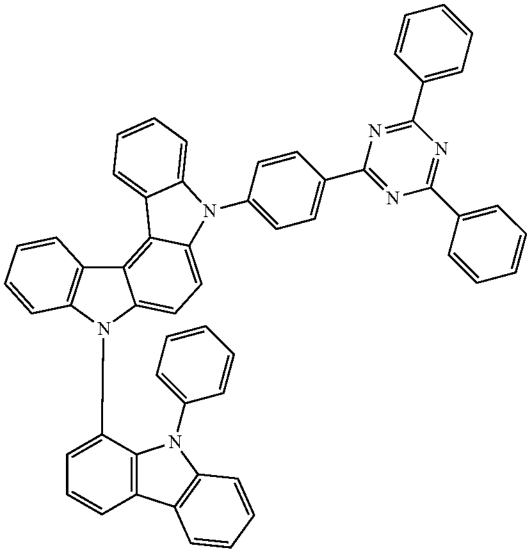
2-195
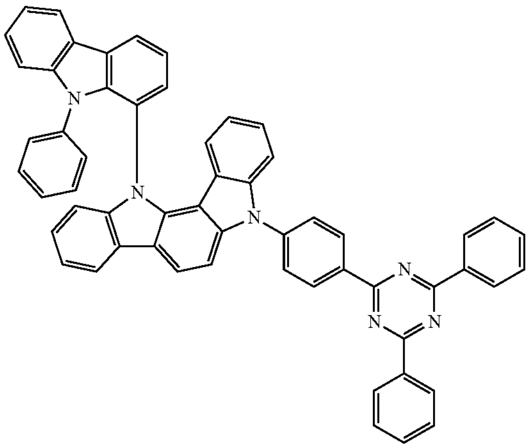
-continued
2-197
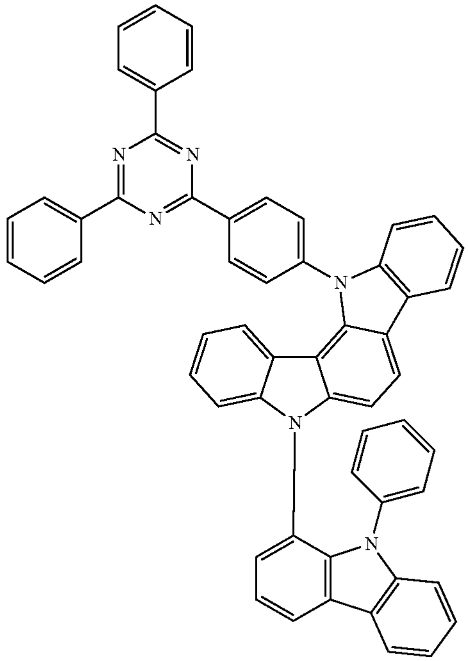
2-198
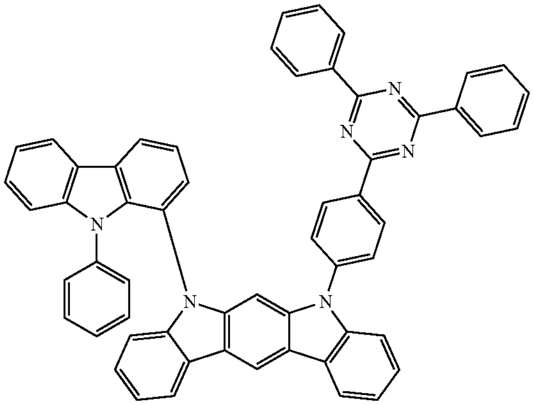
2-199
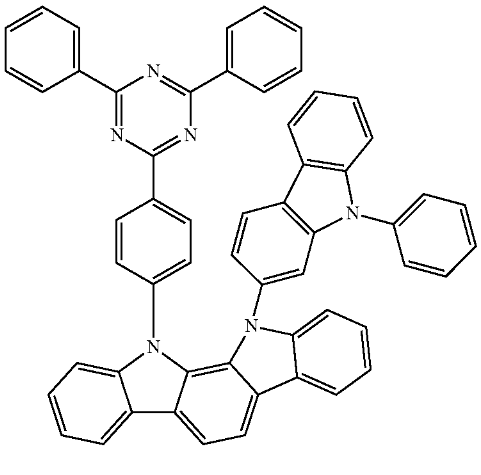

-continued
2-200
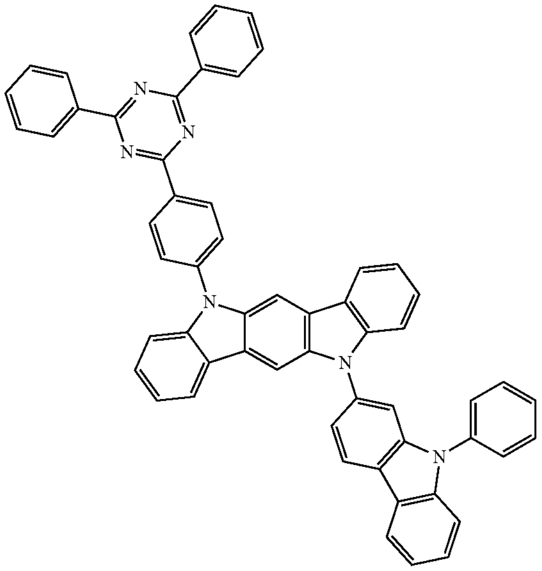
2-201
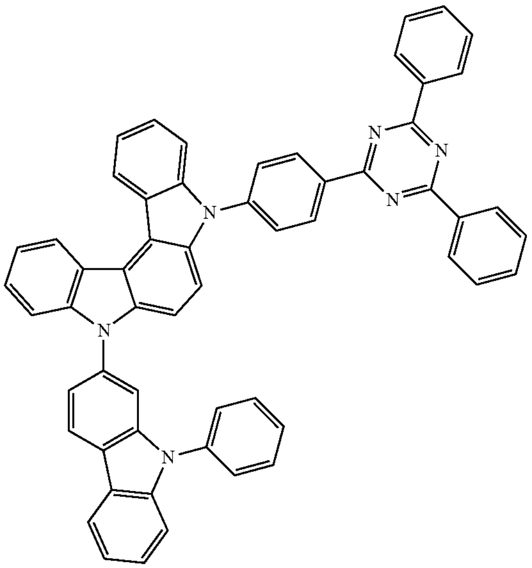
2-202
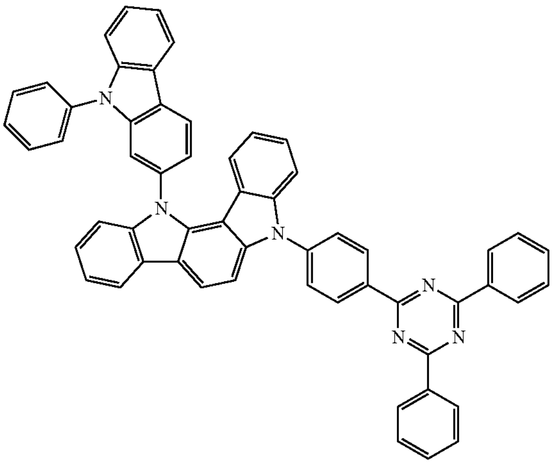
-continued
2-203
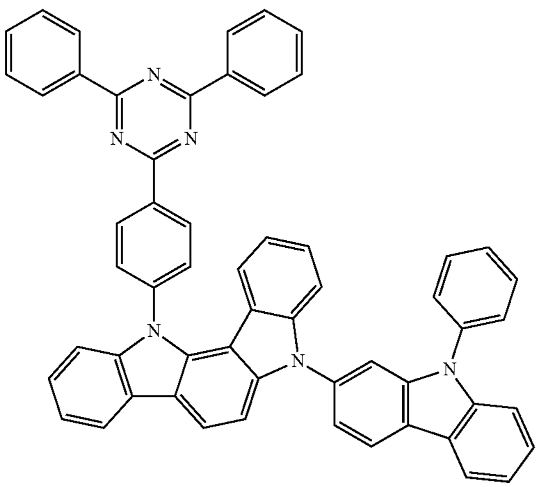
2-204
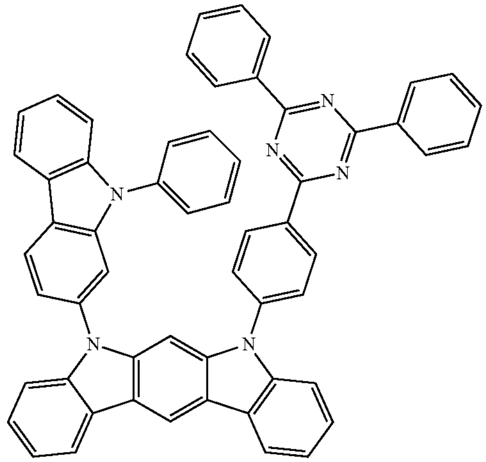
2-205
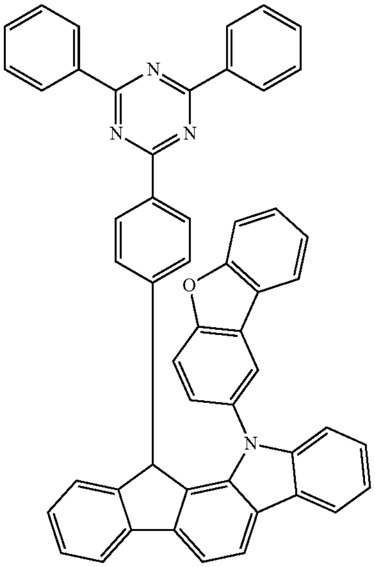

-continued
2-206
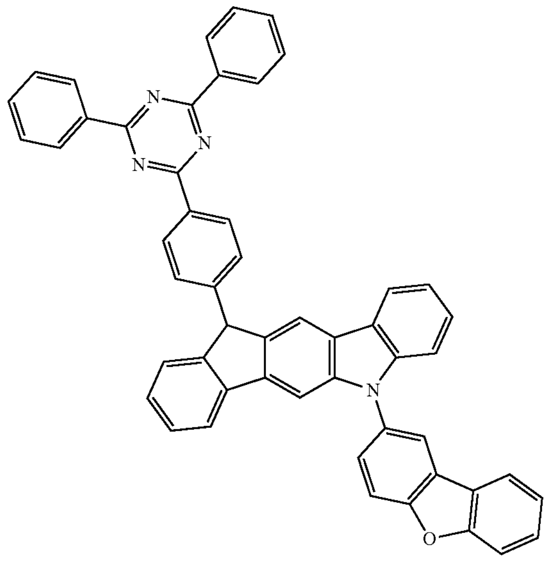
2-207
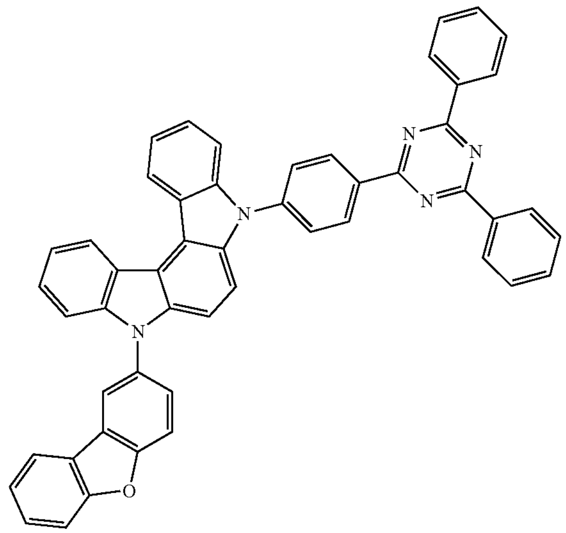
2-208
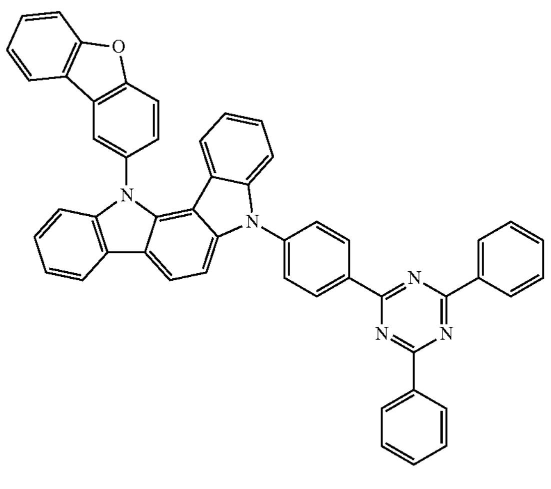
-continued
2-209
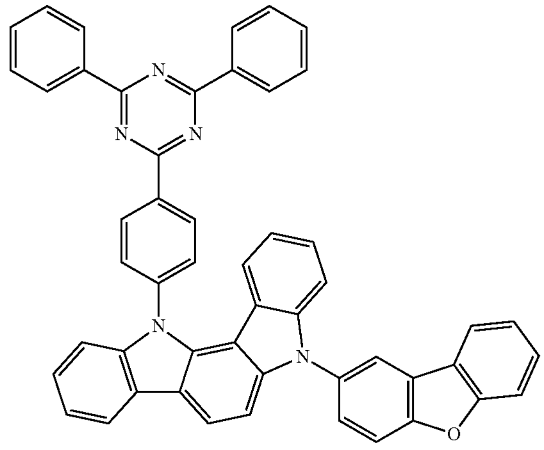
2-210
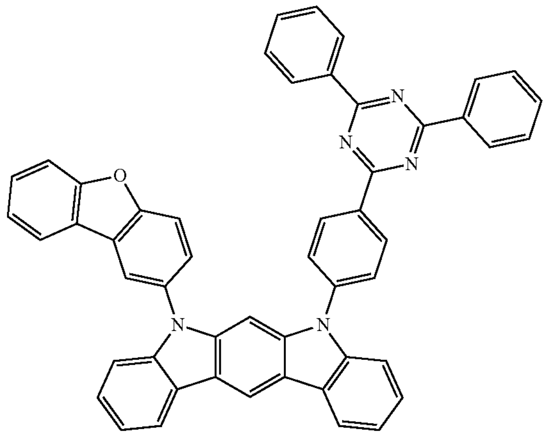
2-211
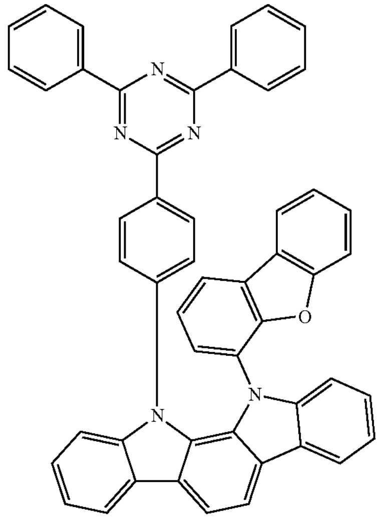

-continued
2-212
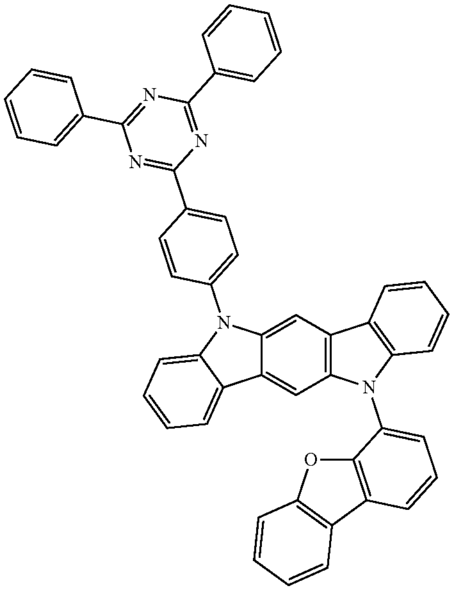
2-213
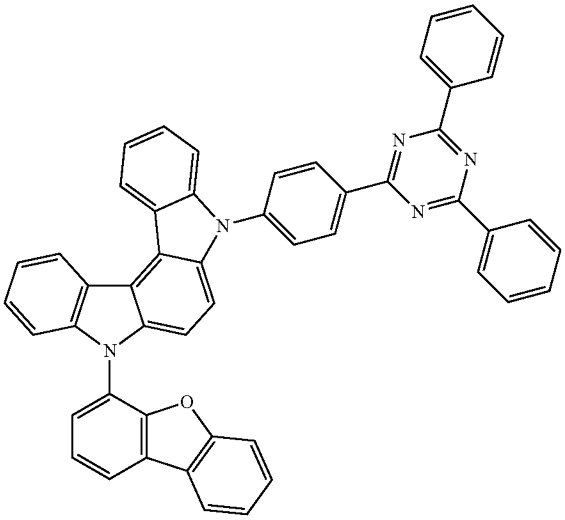
2-214
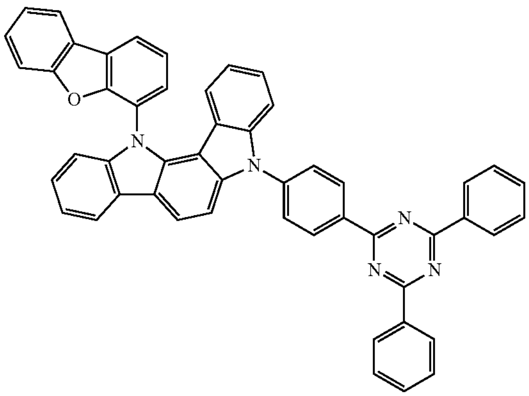
-continued
2-215
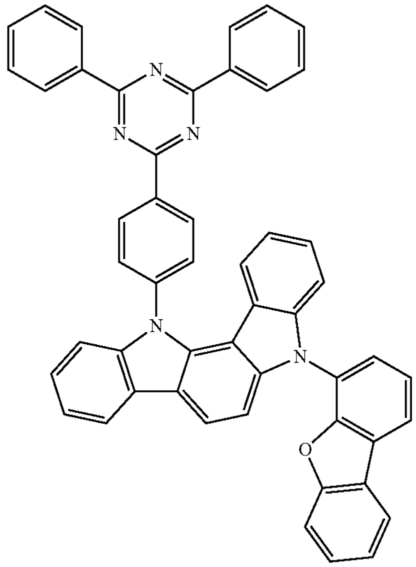
2-216
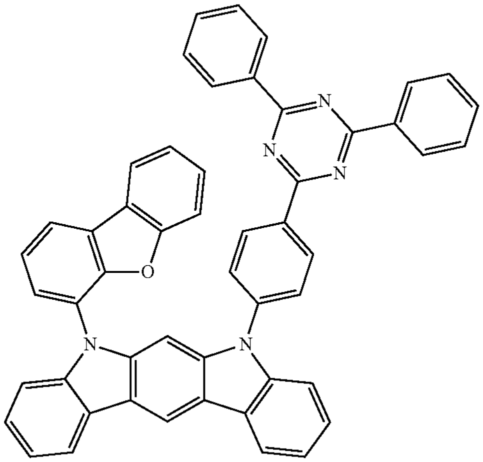
2-217
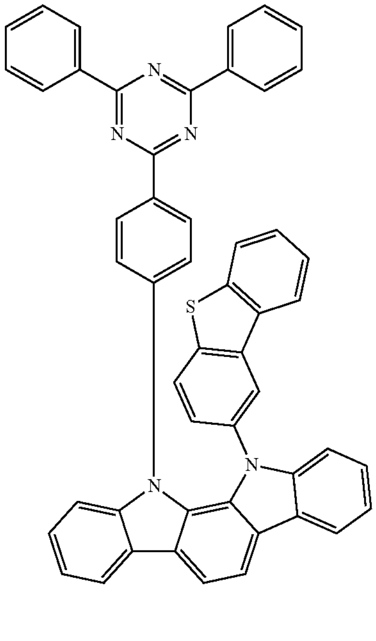

-continued
2-218
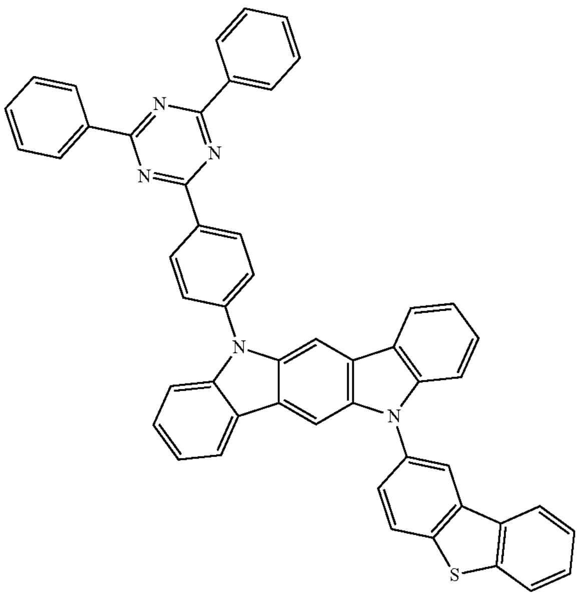
2-219
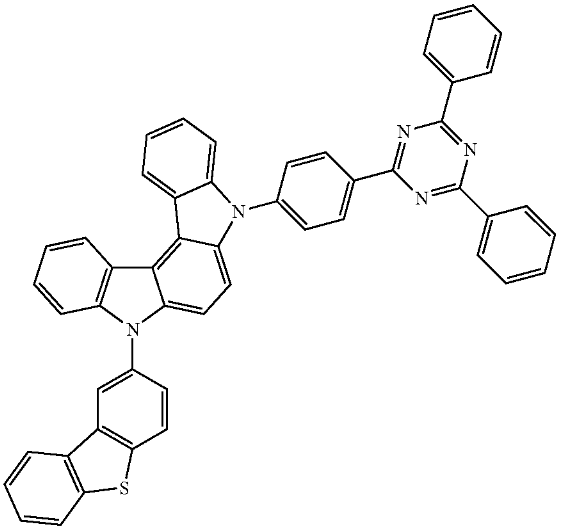
2-220
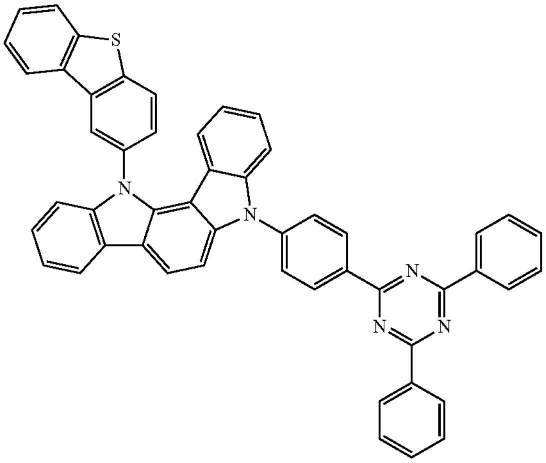
-continued
2-221
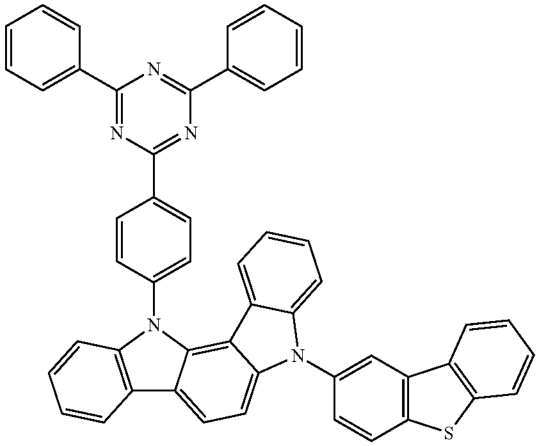
2-222
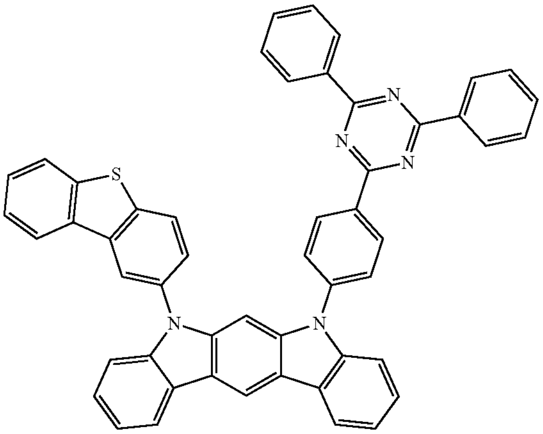
2-223
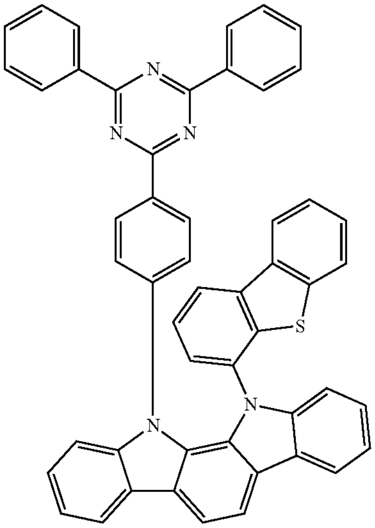

-continued
2-224
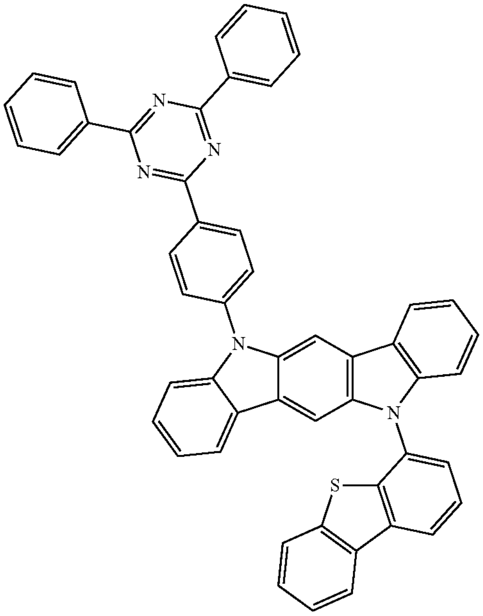
2-225
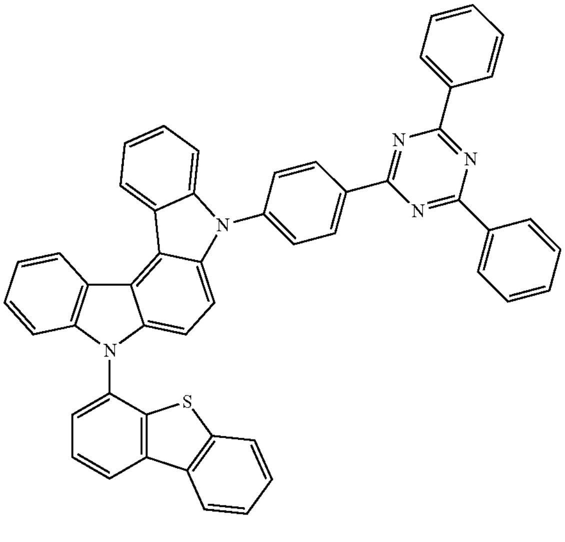
2-226
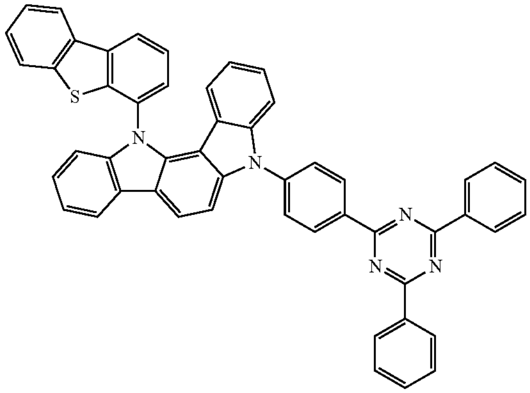
-continued
2-227
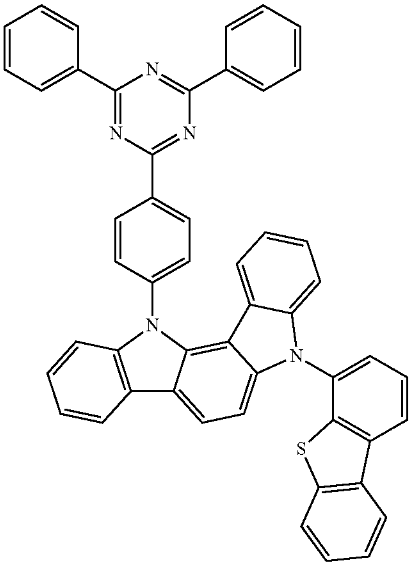
2-228
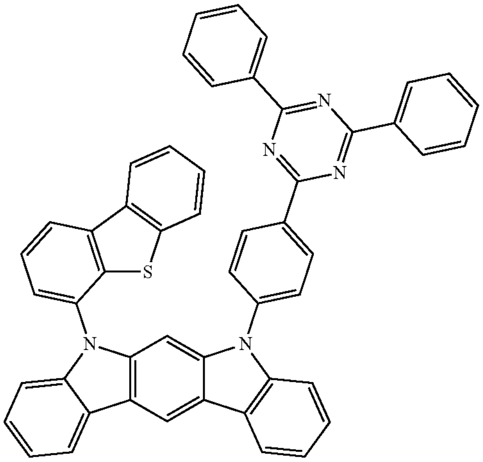
2-229
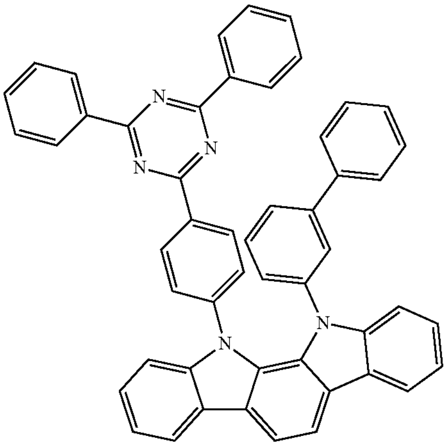

-continued
2-230
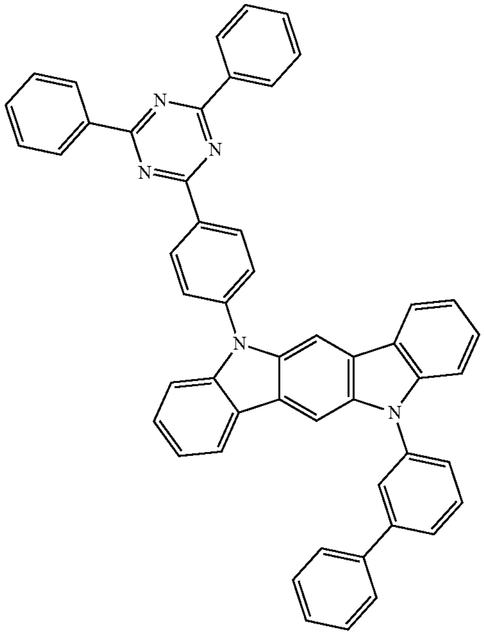
2-231
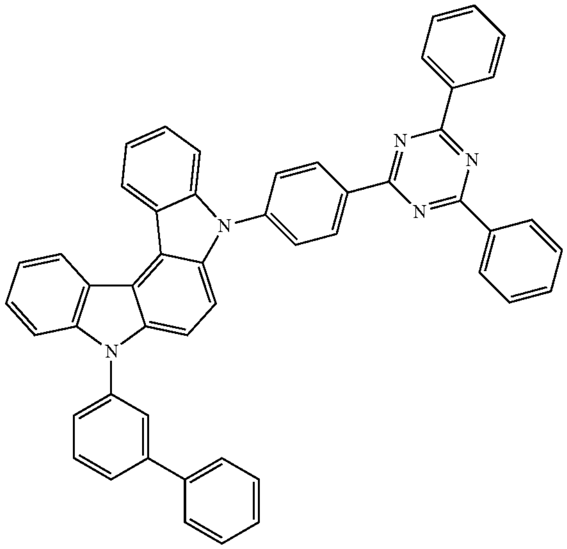
-continued
2-232
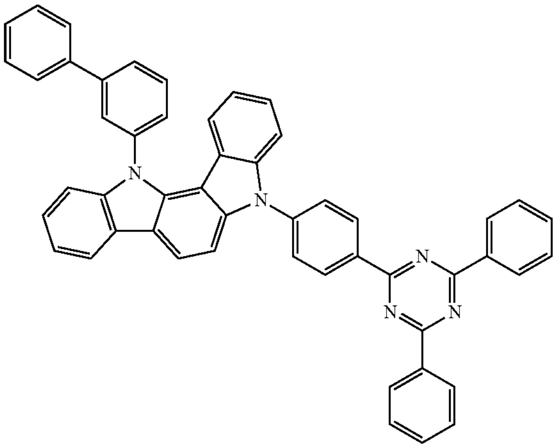
2-233
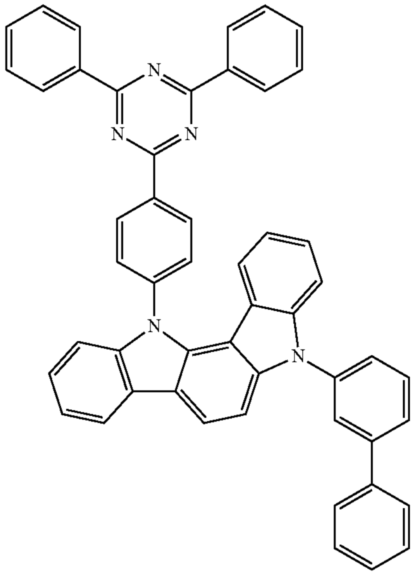
2-234
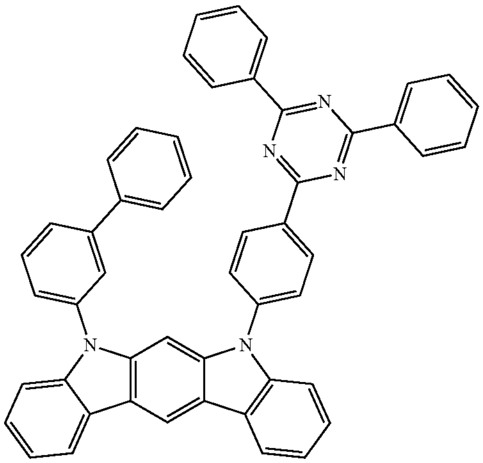

-continued
2-235
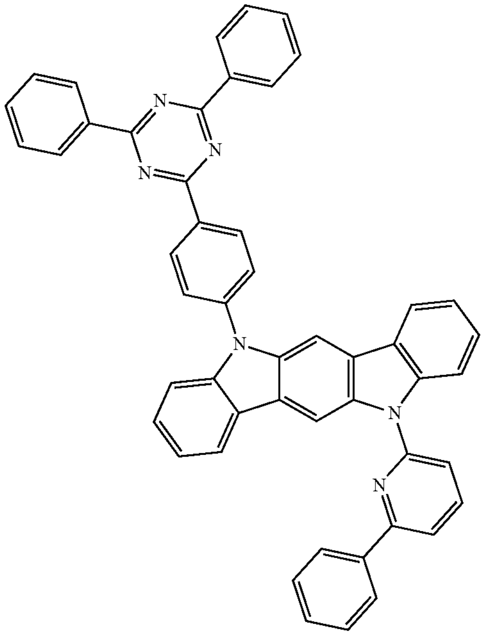
2-236
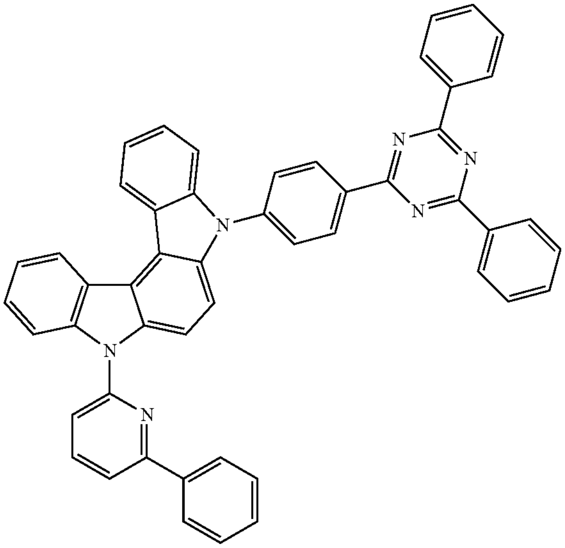
-continued
2-237
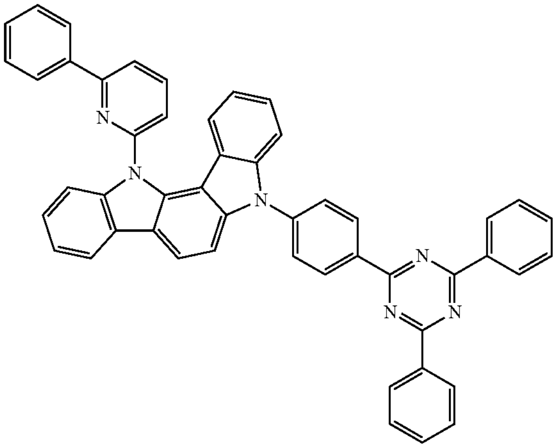
2-238
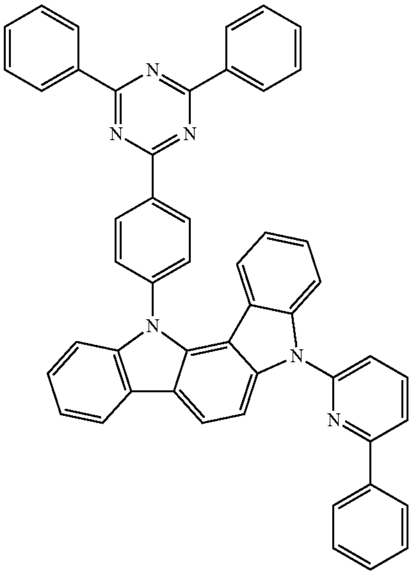
2-239
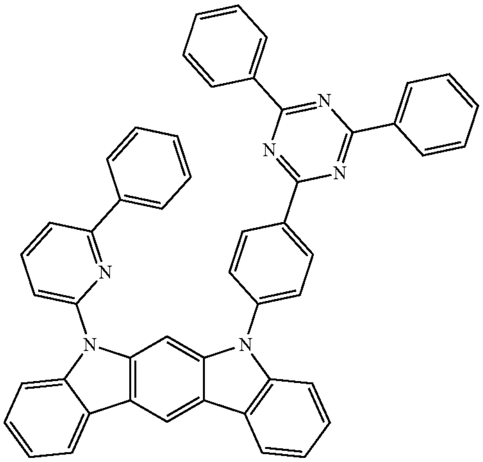

2-240
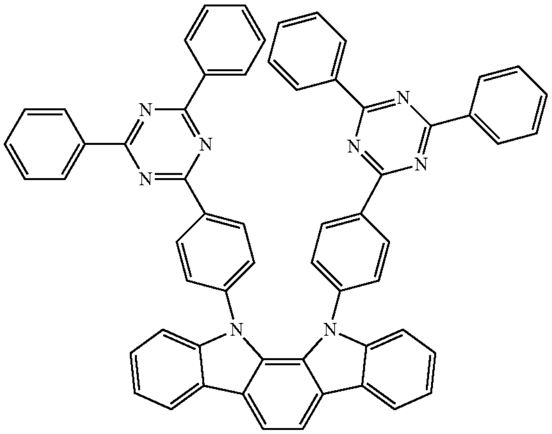
2-241
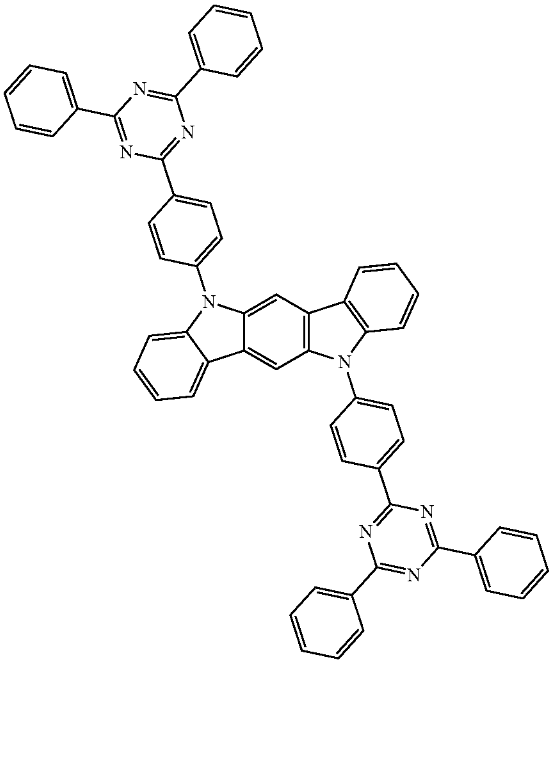
2-242
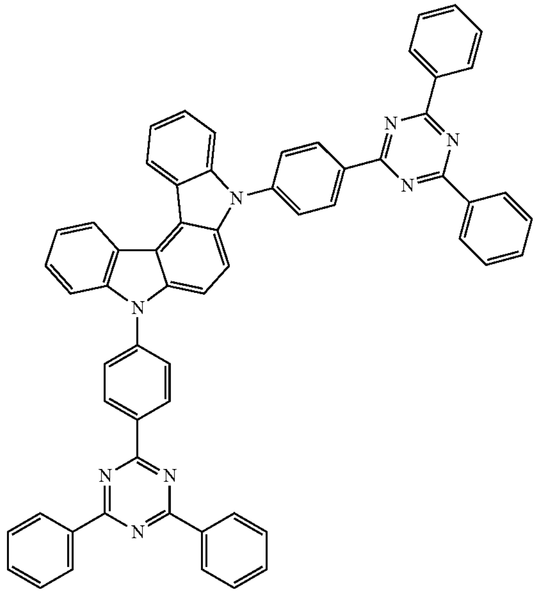
2-243
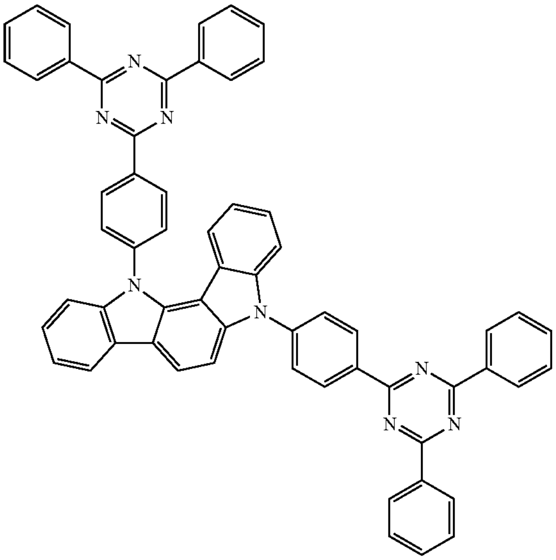
2-244
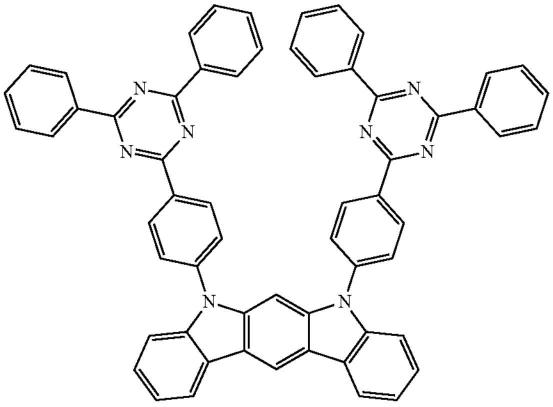

-continued
2-245
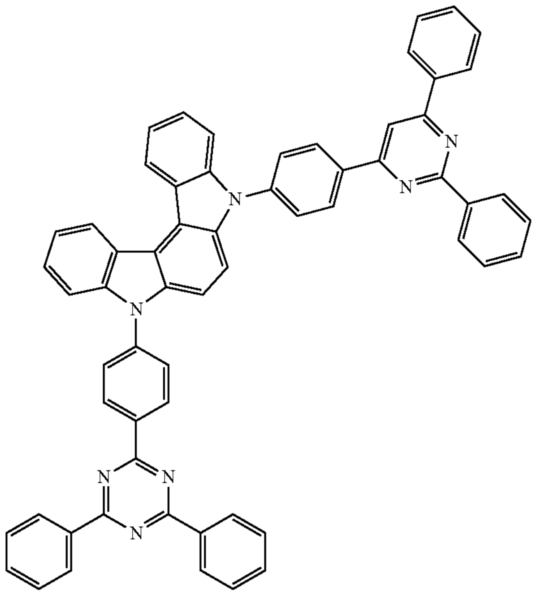
2-246
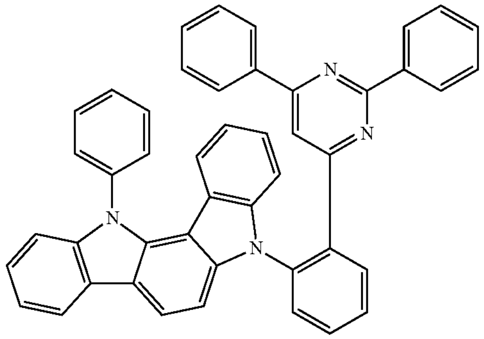
2-247
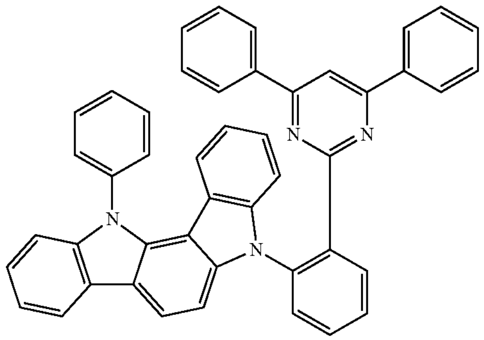
2-248
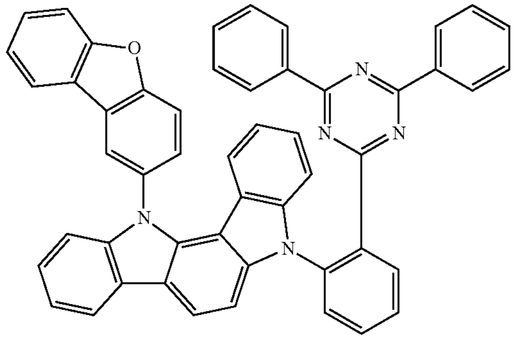
-continued
2-249
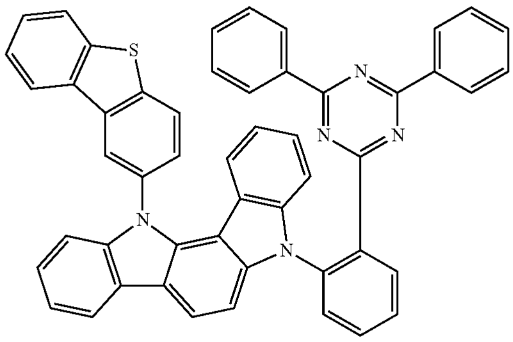
2-250
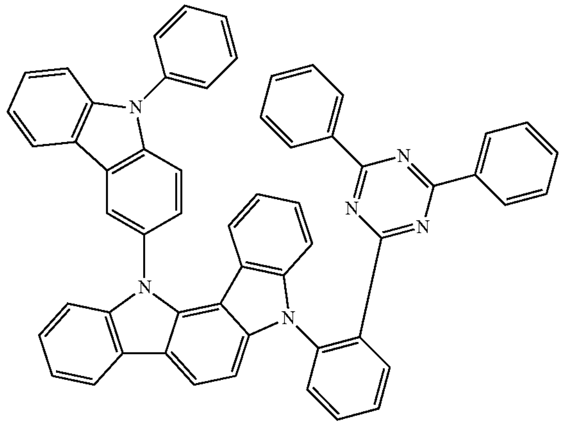
2-251
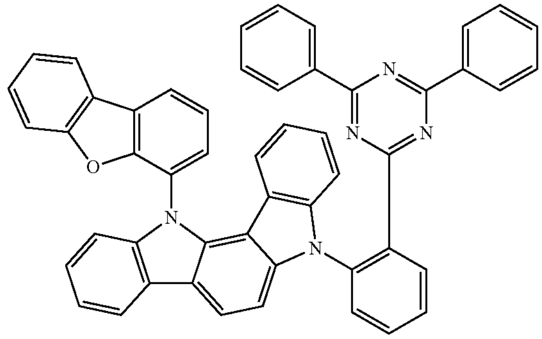
2-252
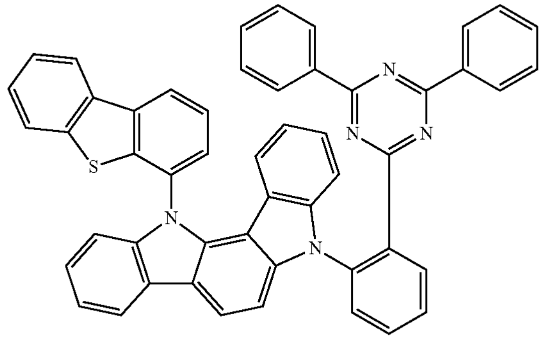

-continued
2-253
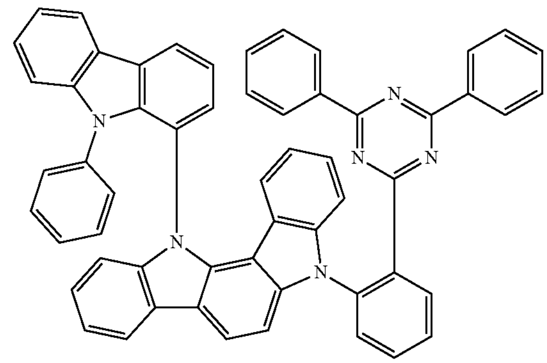
2-254
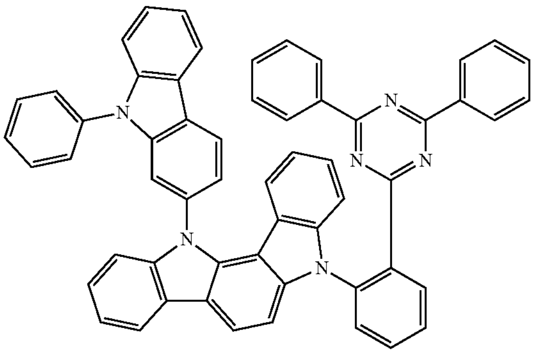
2-255
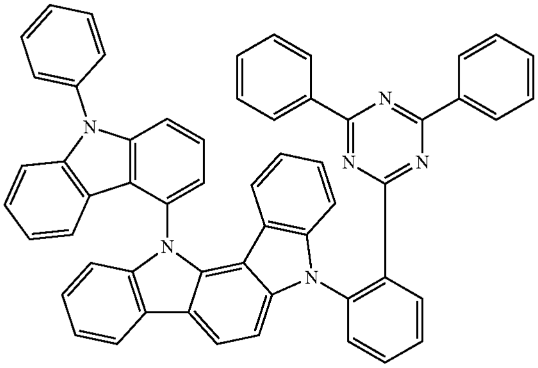
2-256
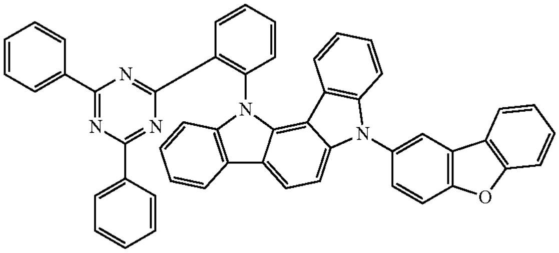
-continued
2-257
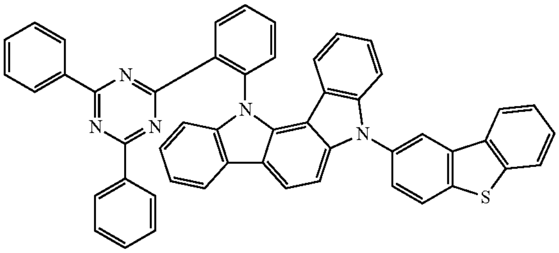
2-258
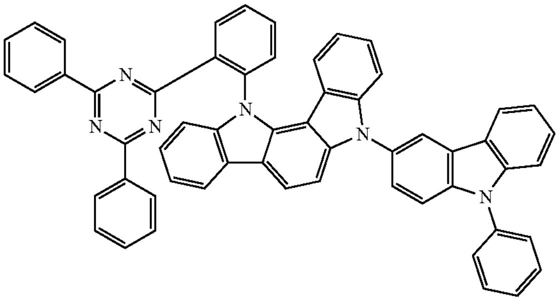
2-259
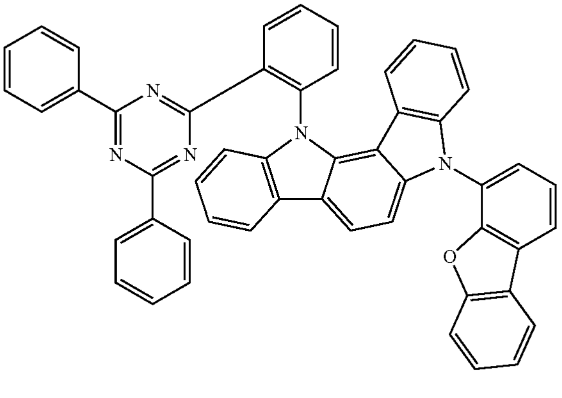
2-260
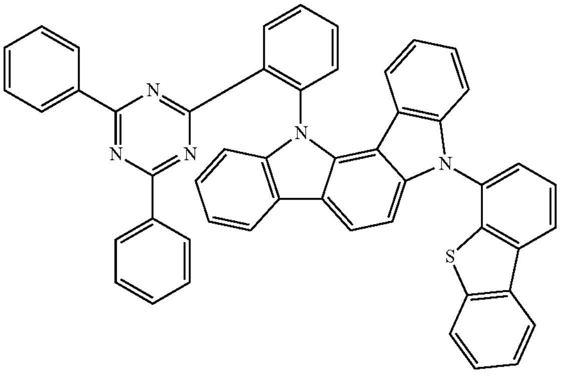

-continued
2-261
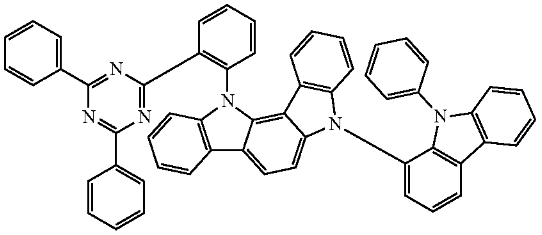
2-262
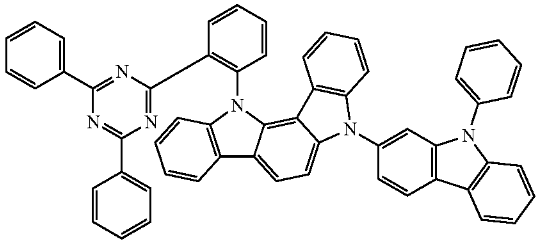
2-263
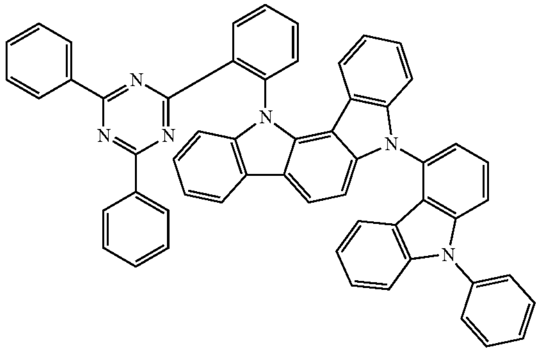
2-264
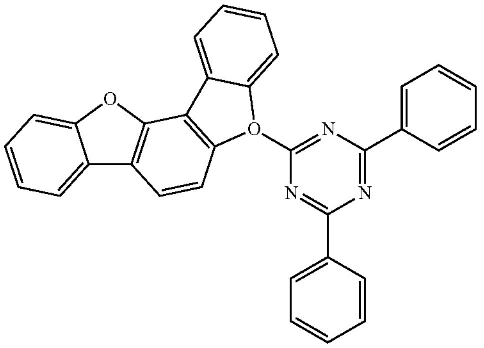
-continued
2-265
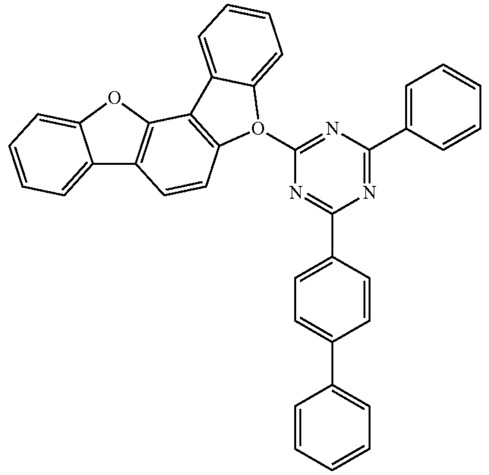
2-266
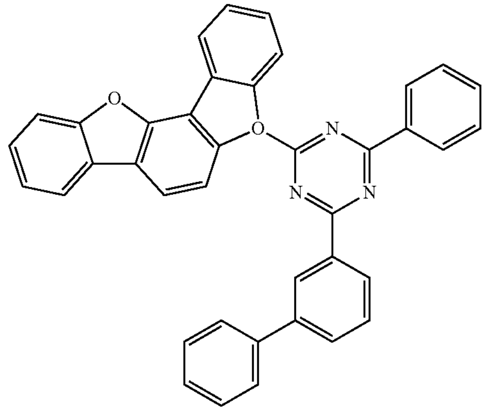
2--267
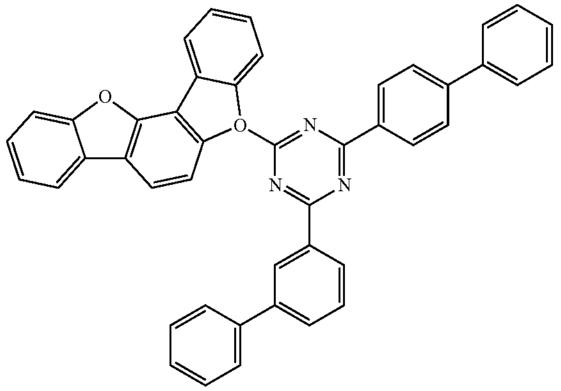
2-268
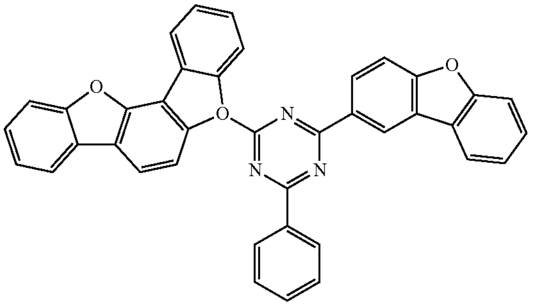

-continued
2-269
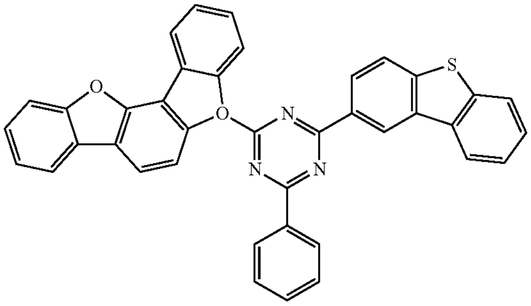
2-270
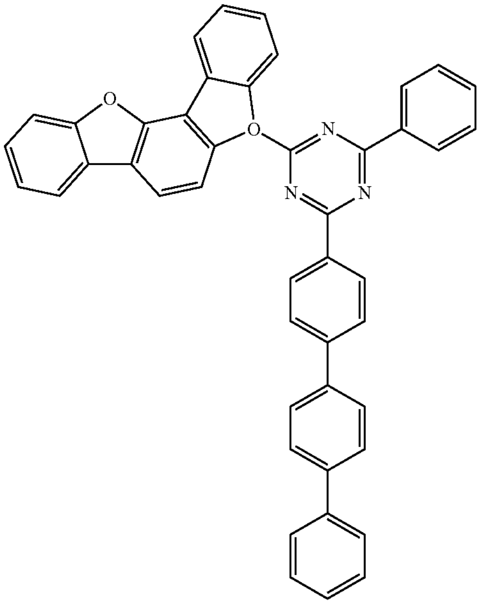
2-271
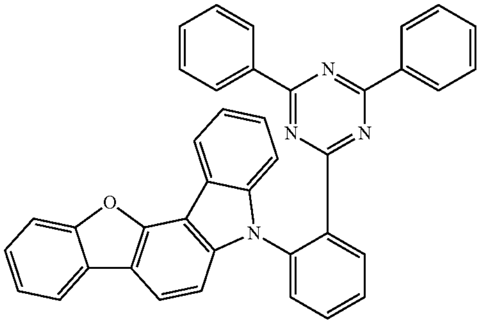
-continued
2-272
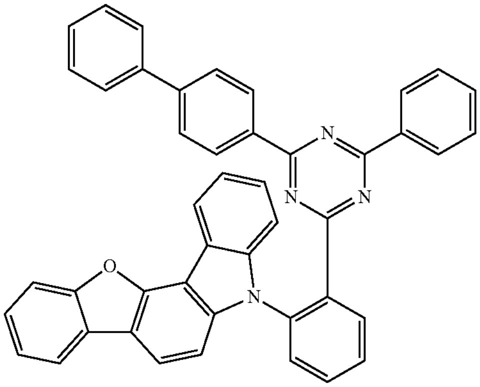
2-273
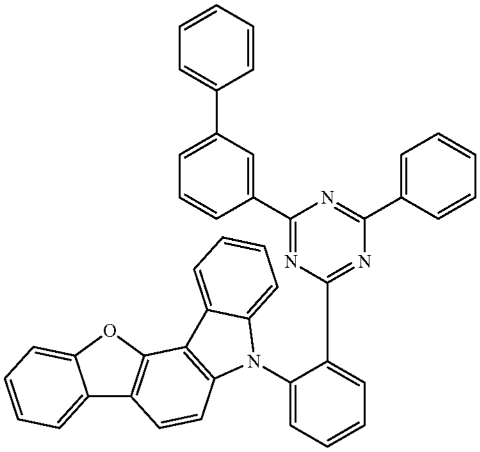
2-274
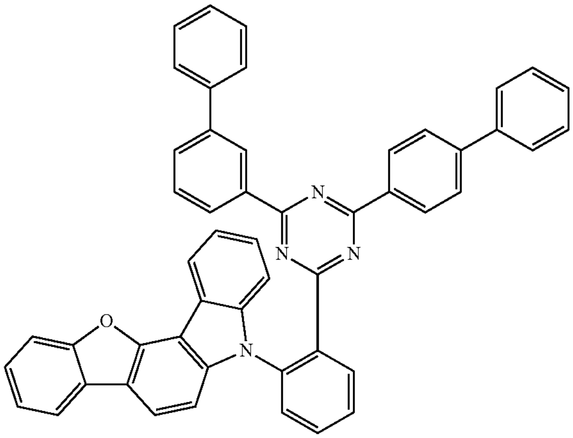
2-275
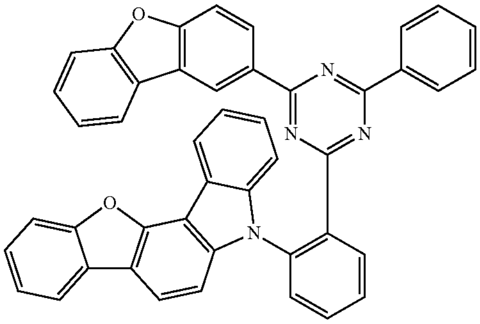

-continued
2-276
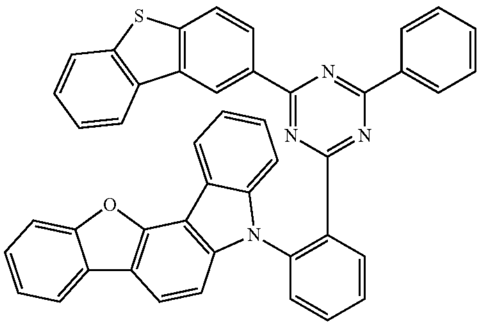
2-277
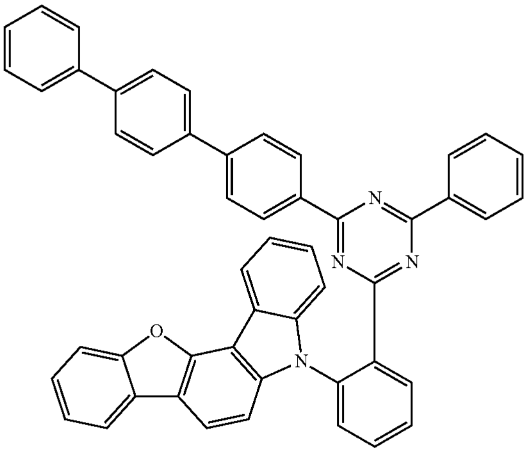
2-278
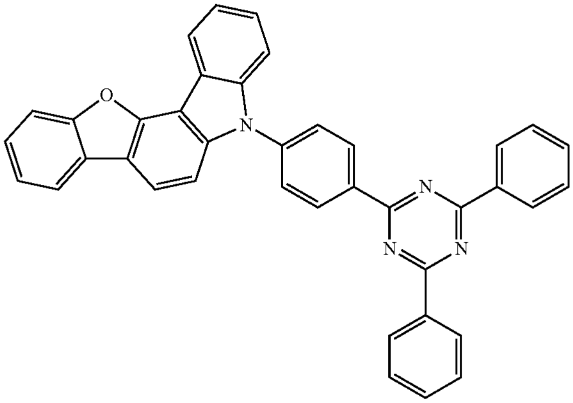
2-279
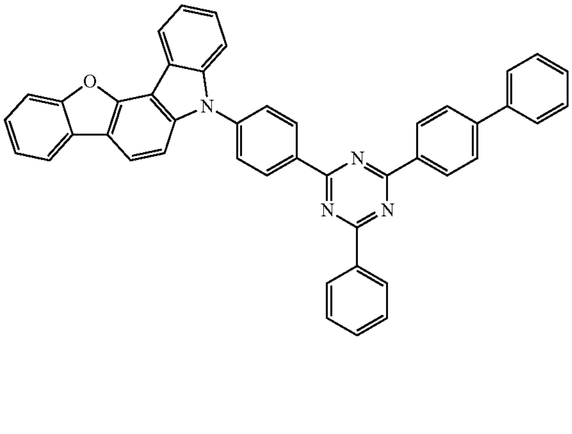
-continued
2-280
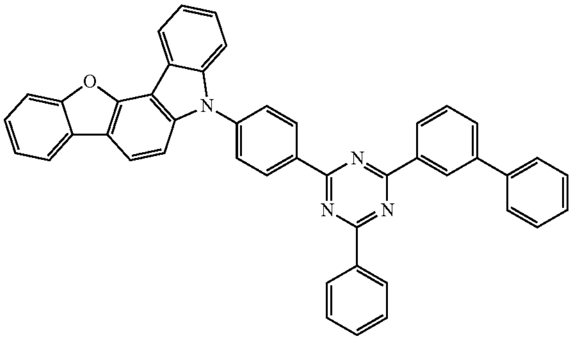
2-281
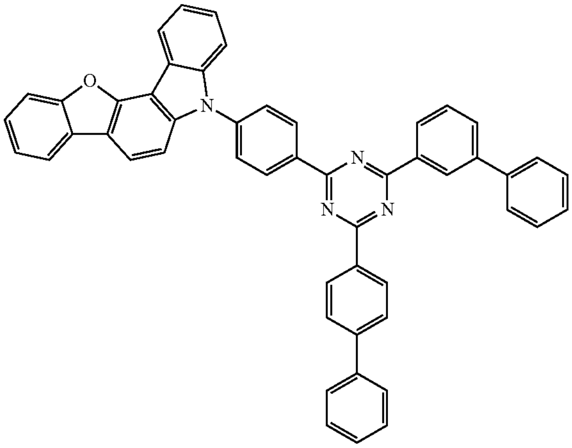
2-282
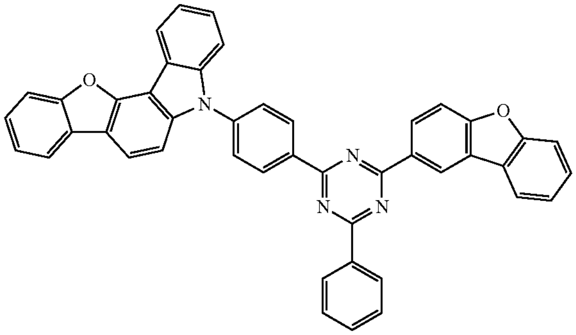

-continued
2-283
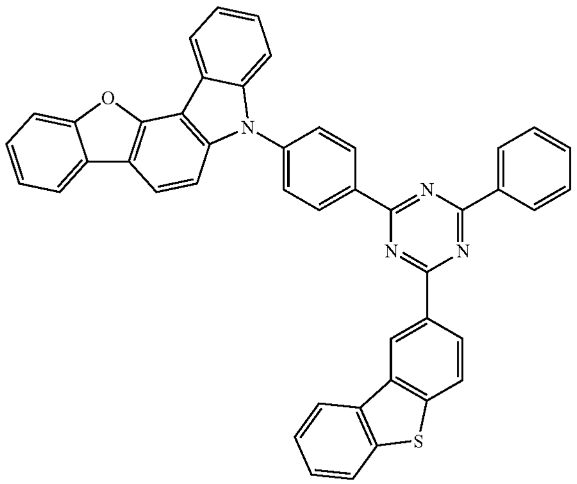
2-284
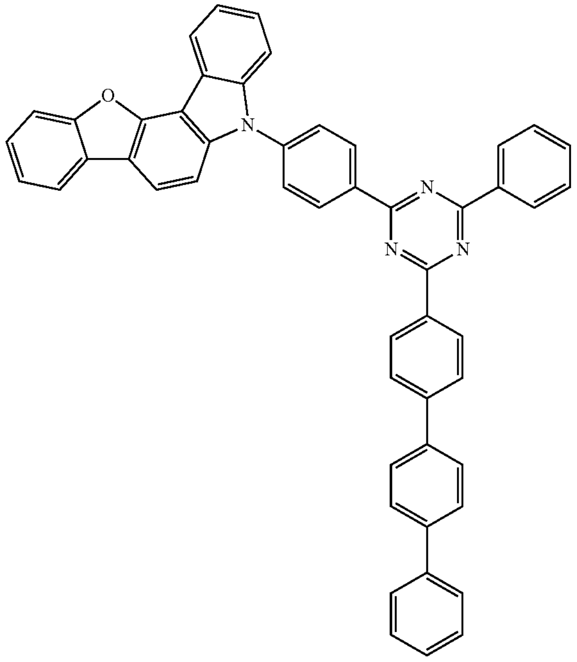
2-285
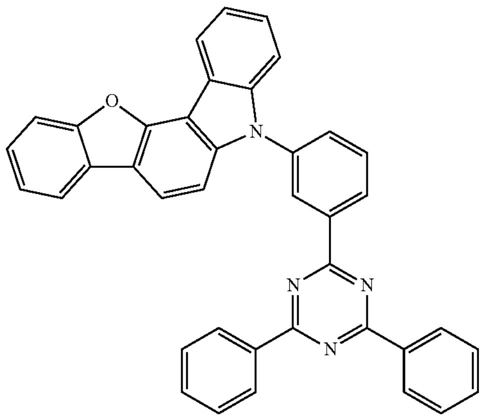
-continued
2-286
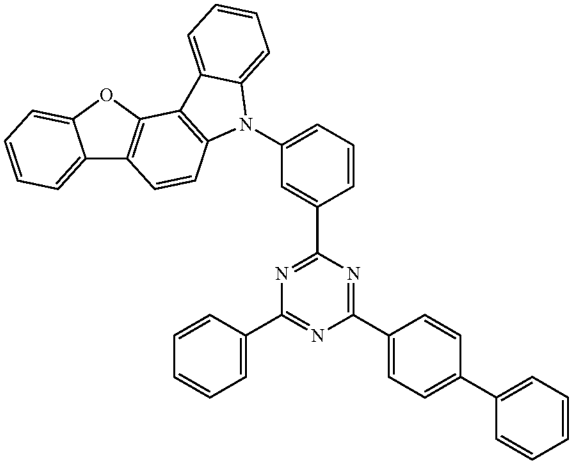
2-287
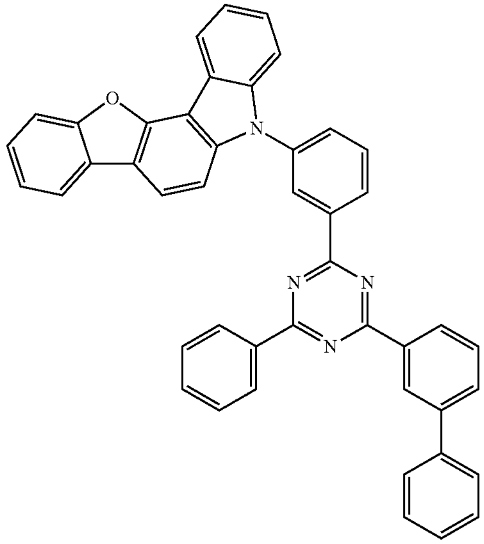
2-288
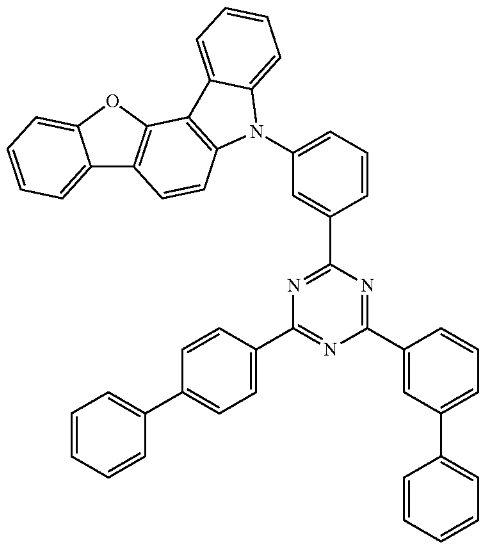

-continued
2-289
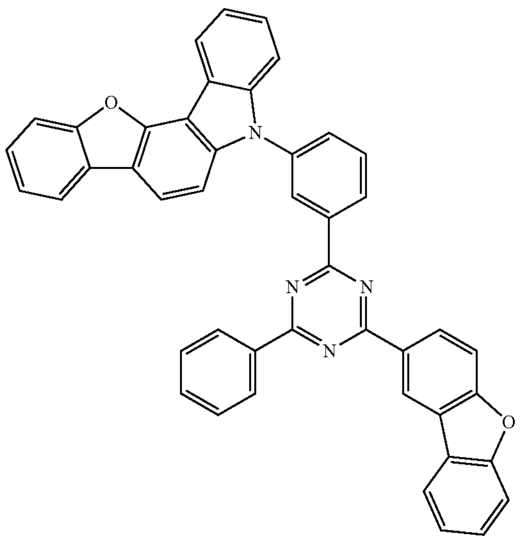
2-290
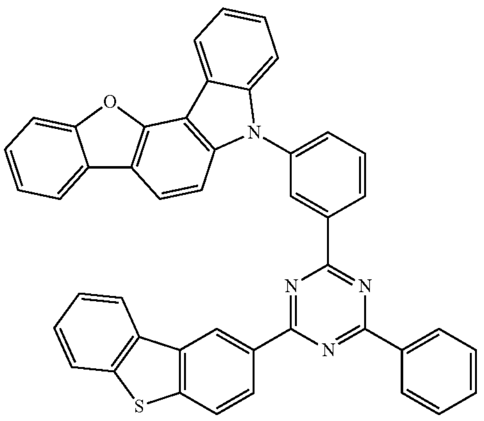
2-291
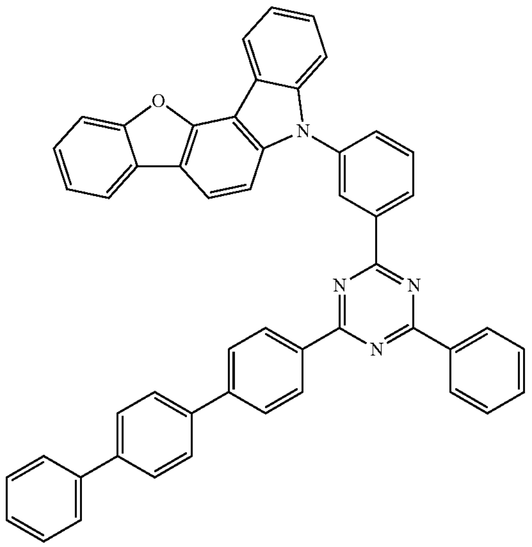
-continued
2-292
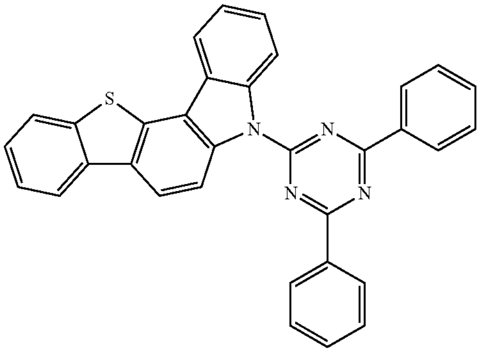
2-293
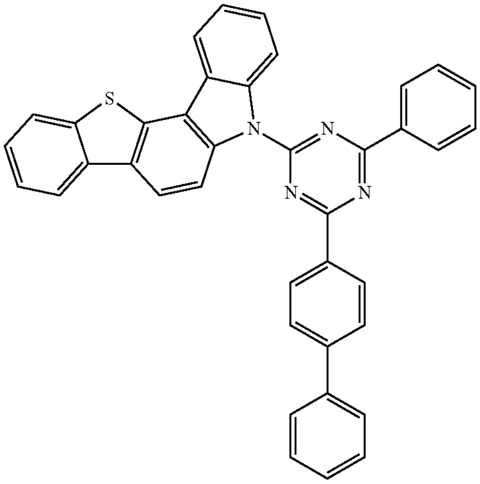
2-294
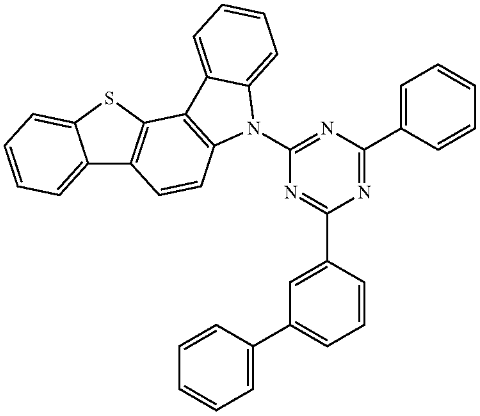

-continued
2-295
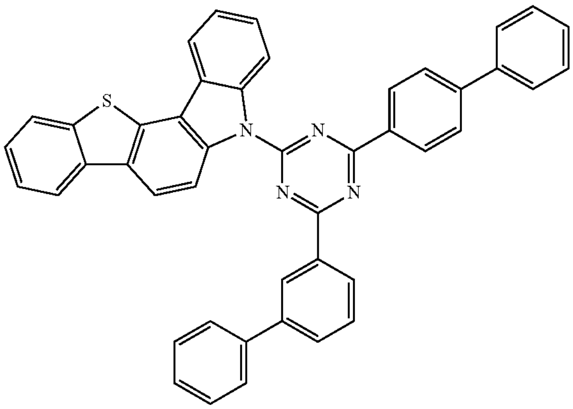
2-296
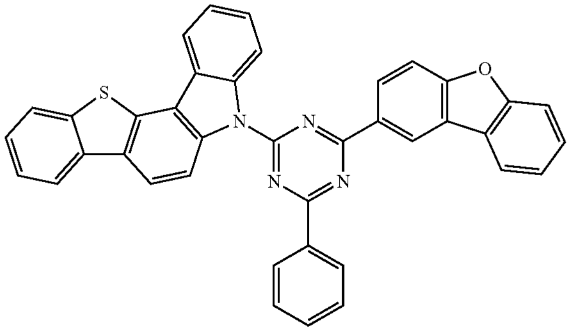
2-297
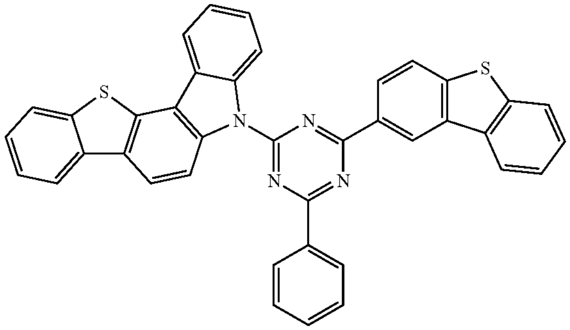
-continued
2-298
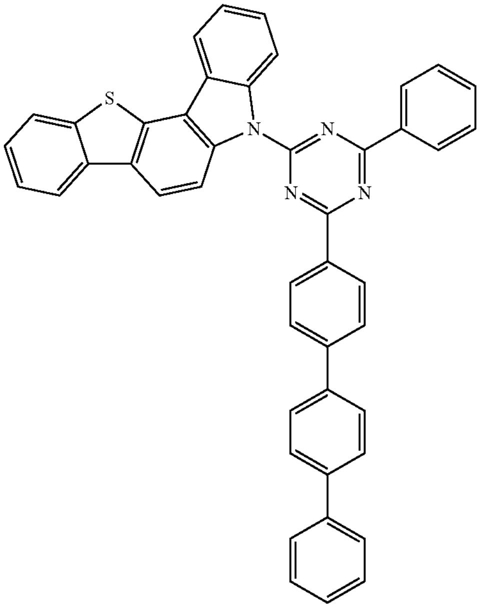
2-299
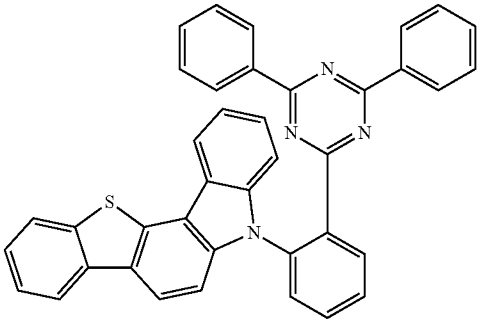
2-300
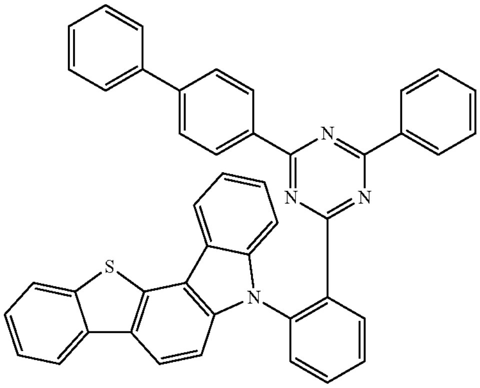

-continued
2-301
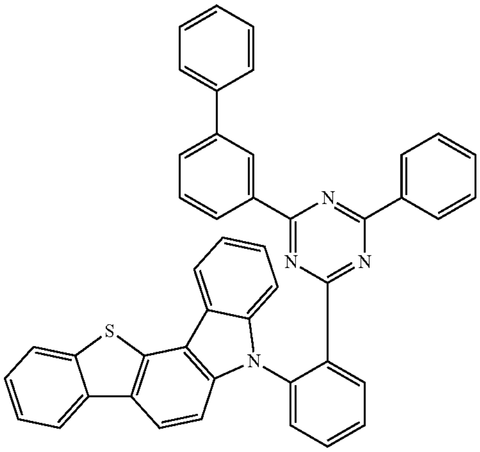
2-302
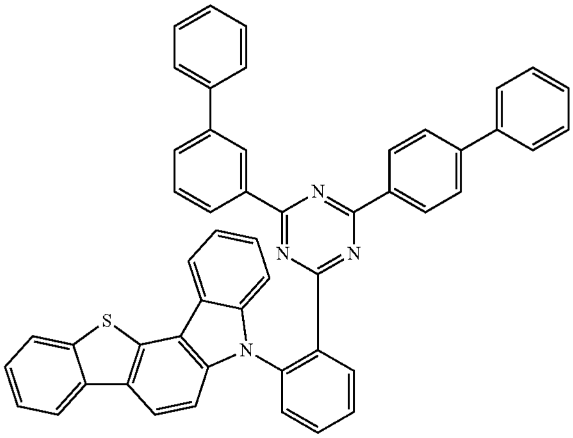
2-303
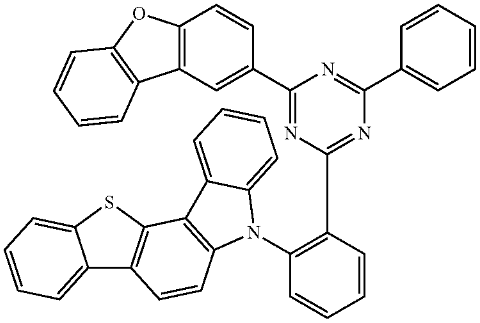
2-304
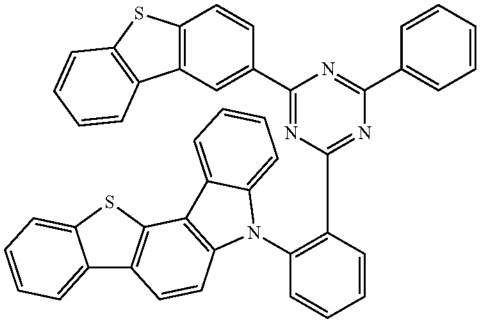
-continued
2-305
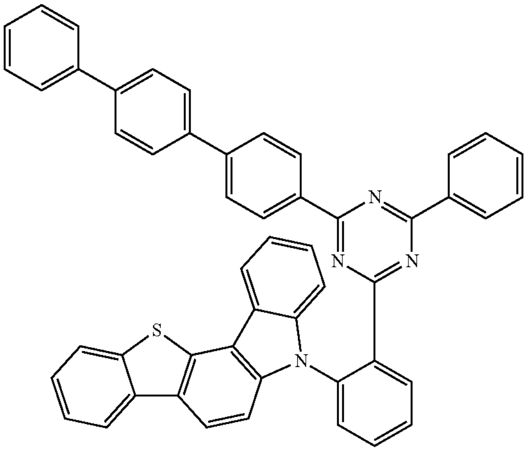
2-306
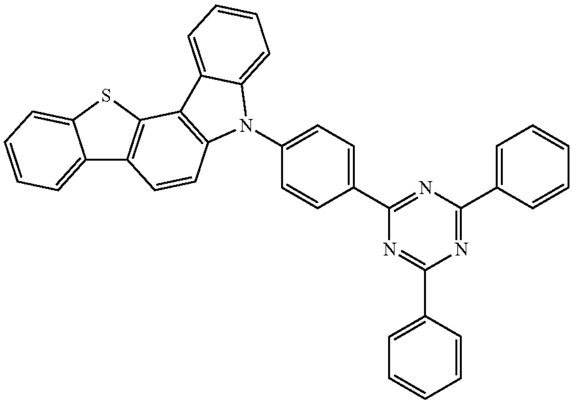
2-307
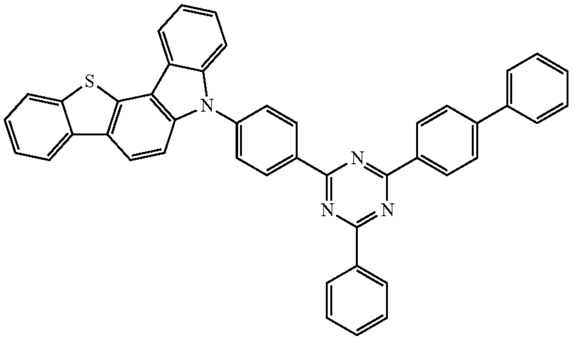
2-308
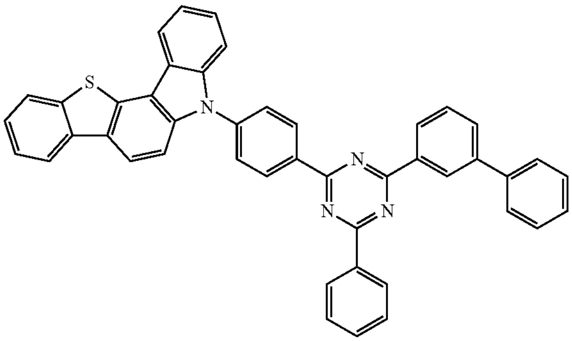

-continued
2-309
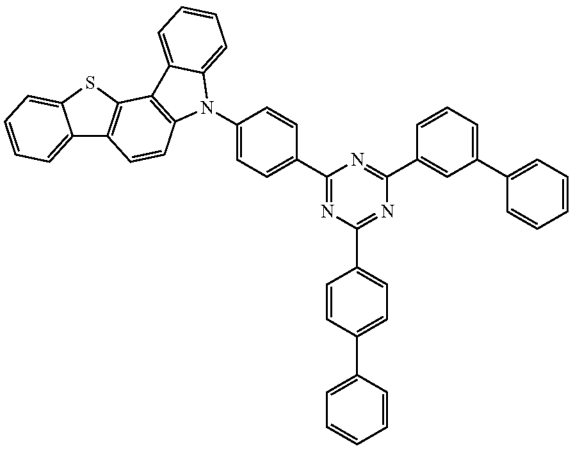
2-310
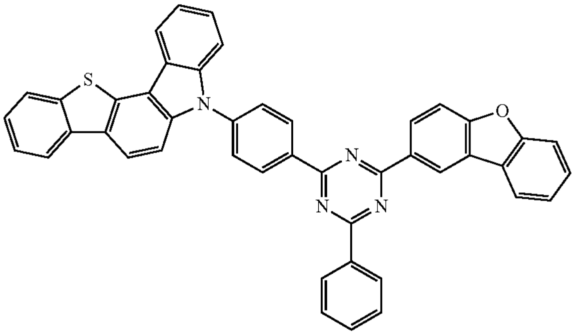
2-311
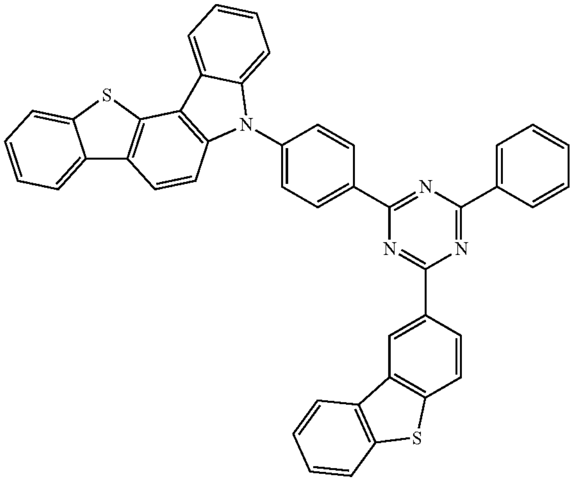
2-312
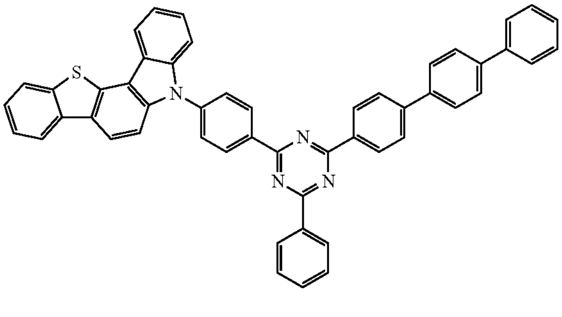
-continued
2-313
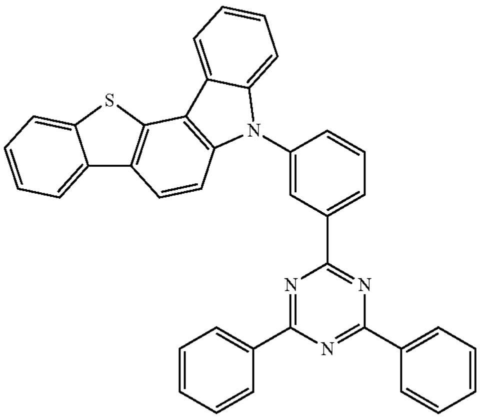
3-314
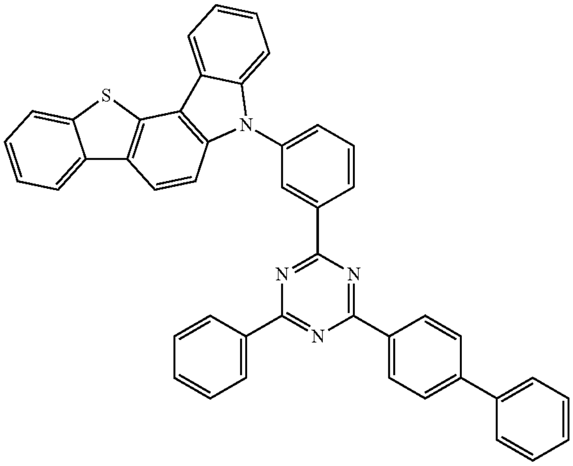
3-315
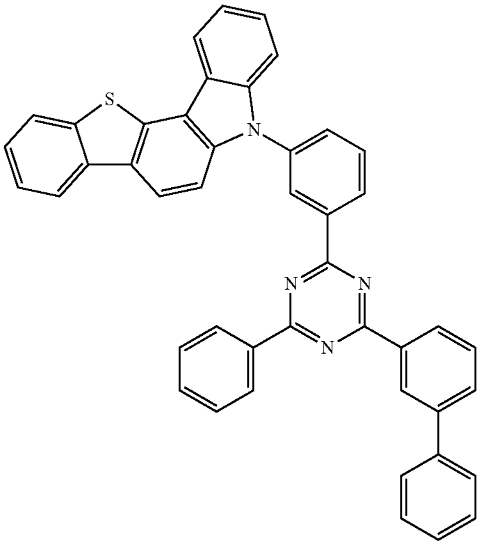

-continued
3-316
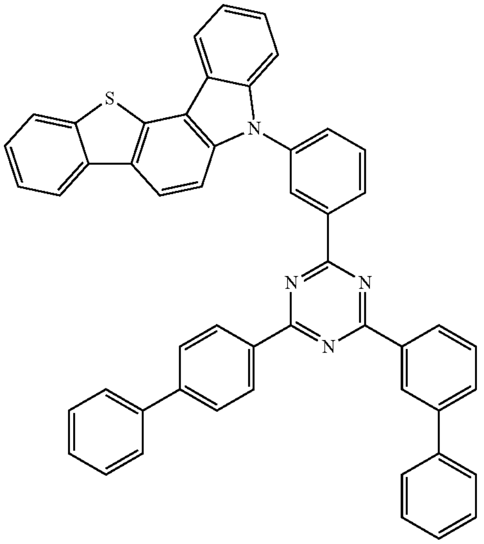
2-317
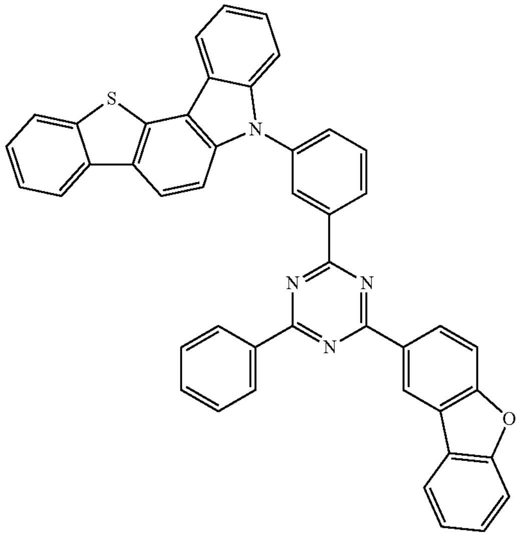
2-318
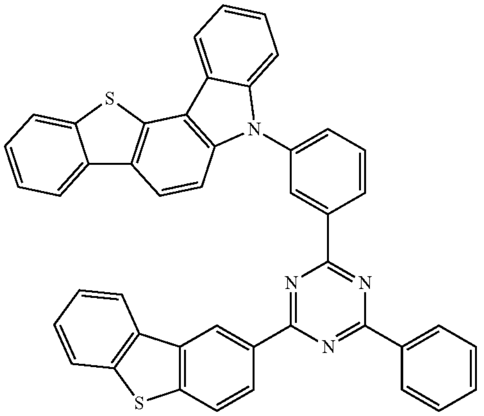
-continued
2-319
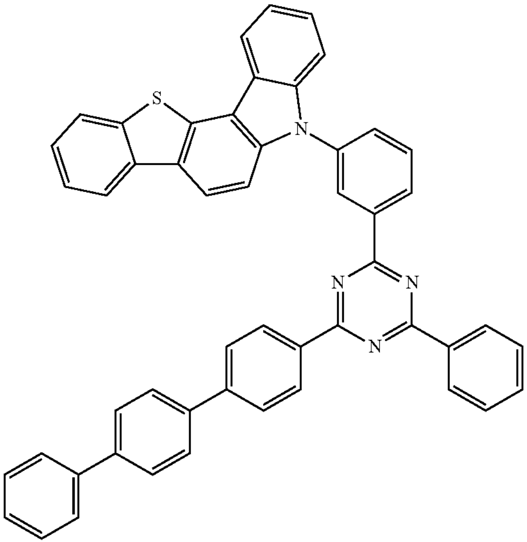
2-320
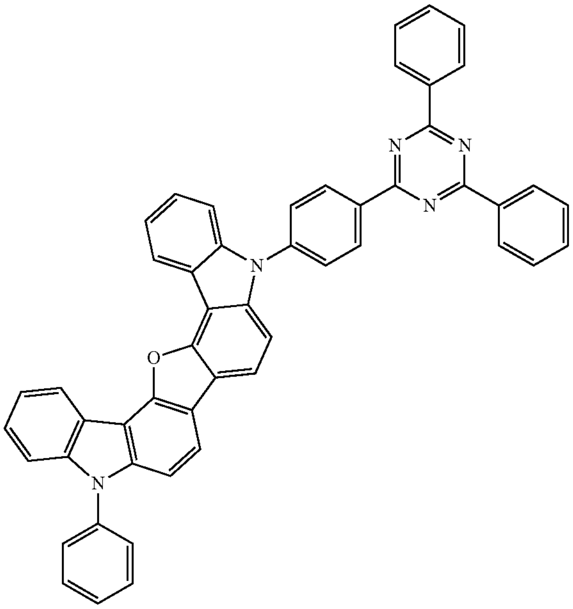
2-321
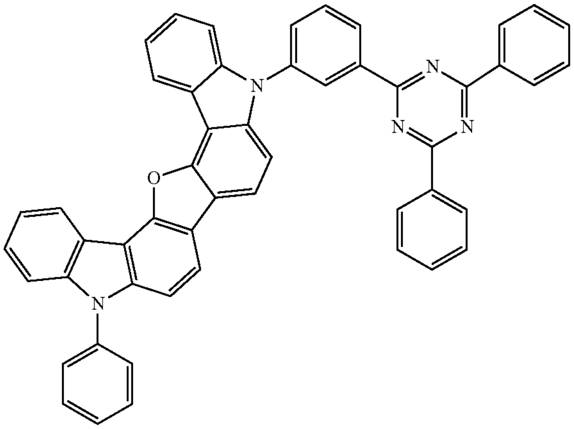

-continued
2-322
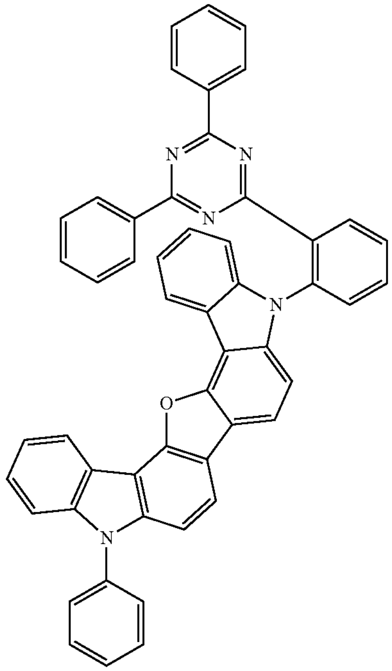
2-323
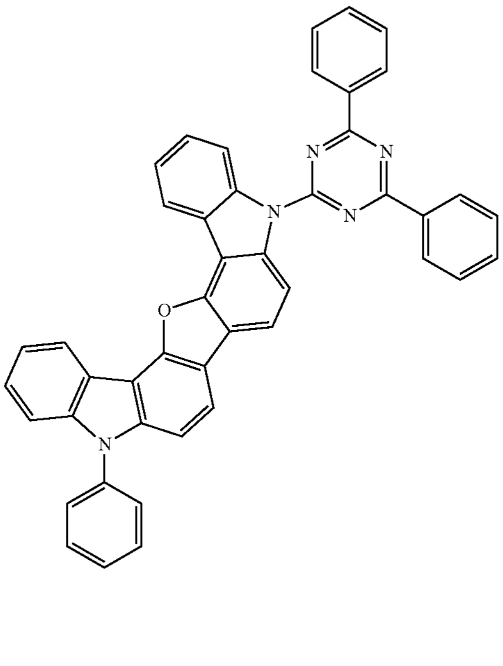
-continued
2-324
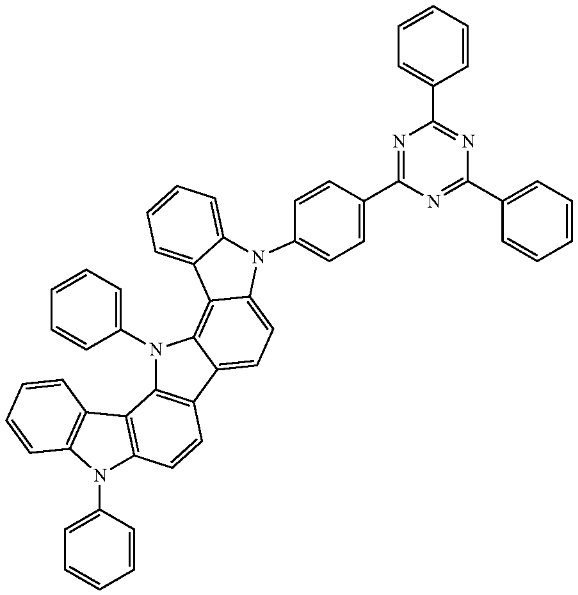
2-325
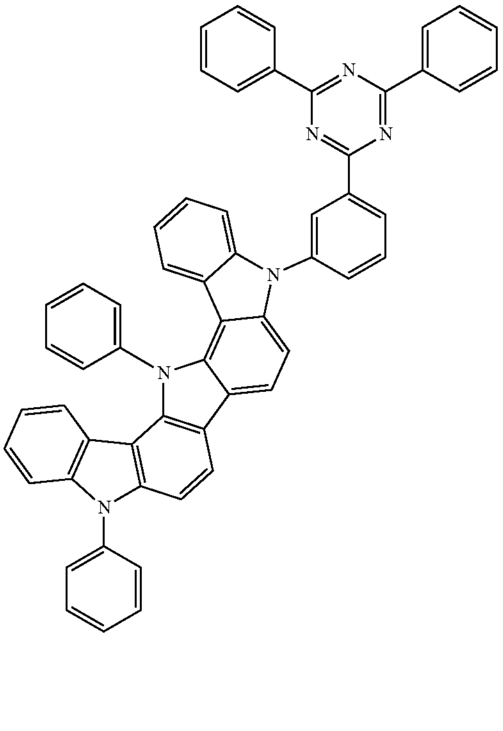

2-326
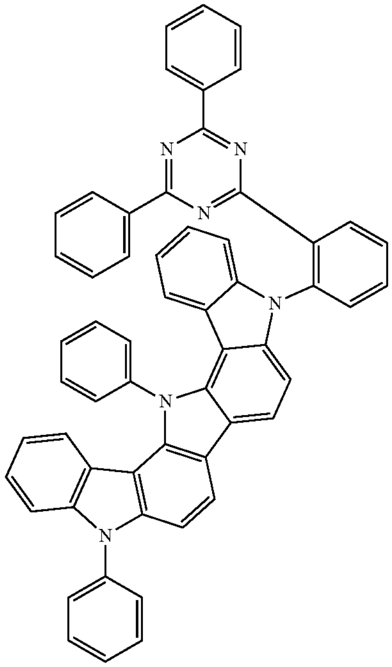
2-327
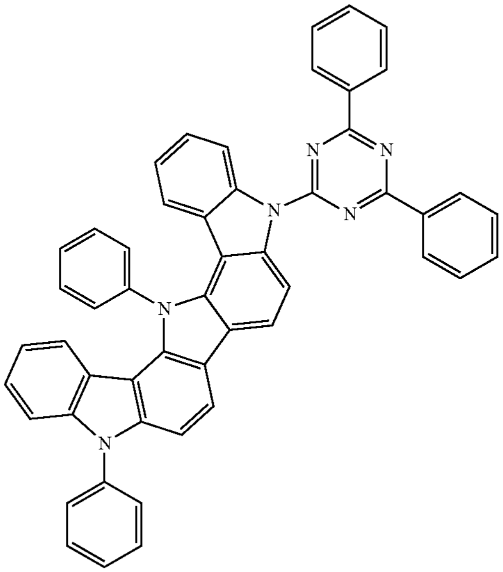
2-328
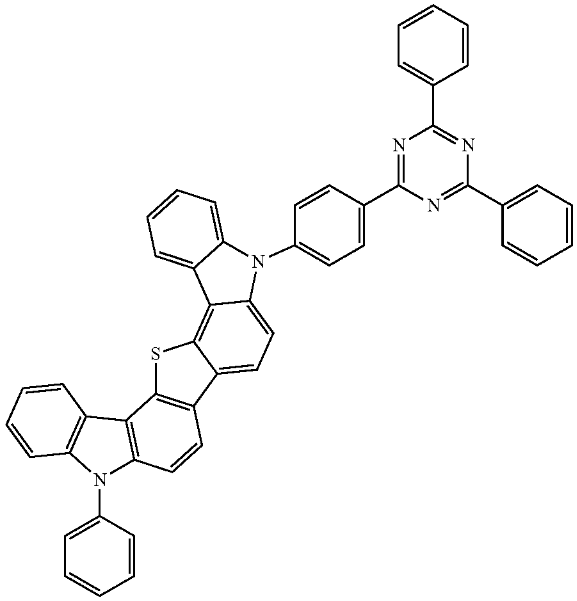
2-329
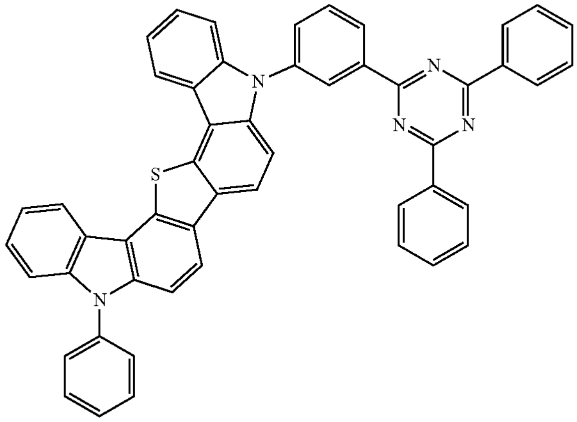

-continued
2-330
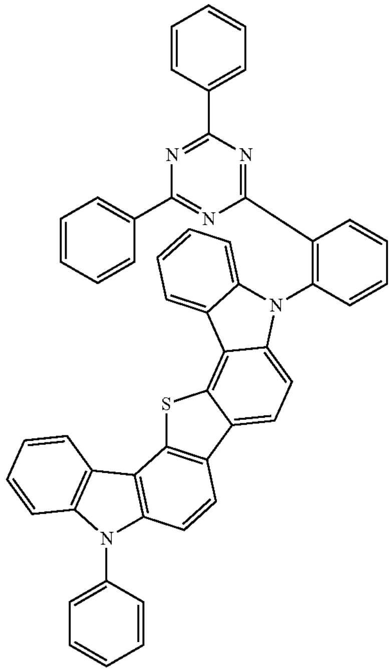
2-331
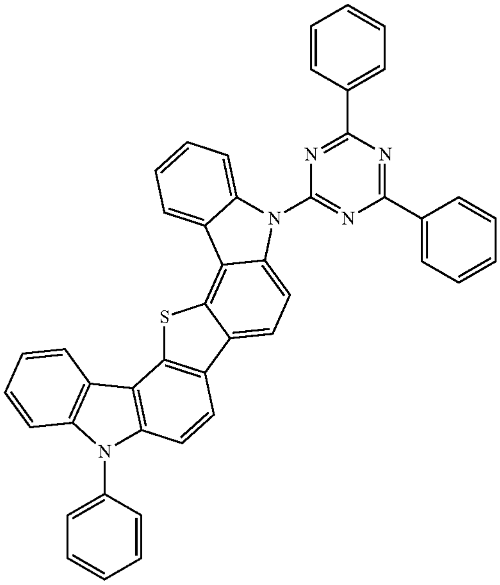
-continued
2-332
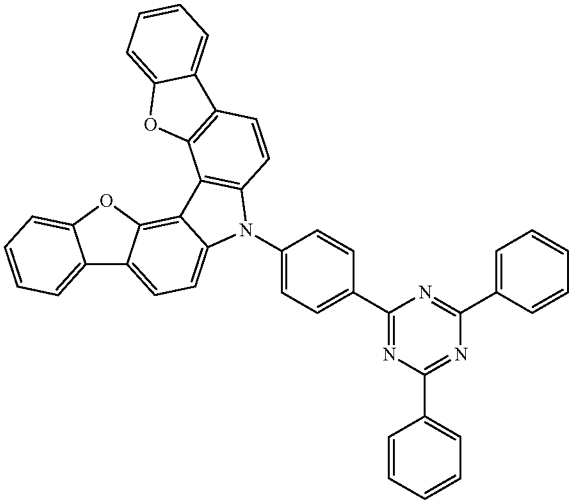
2-333
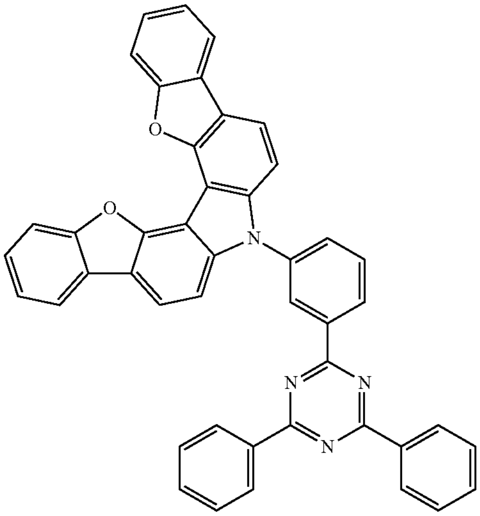
3-334
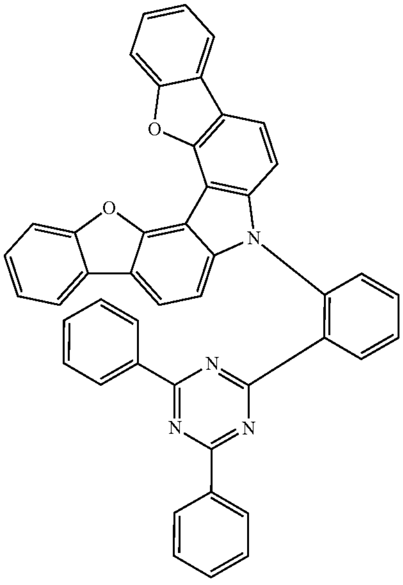

-continued
2-335
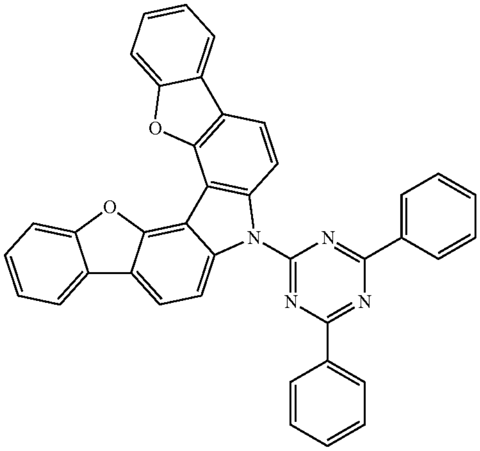
2-336
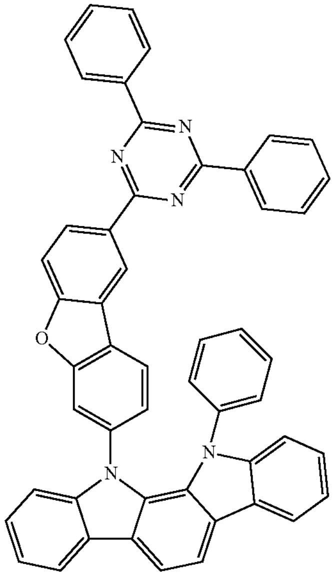
2-337
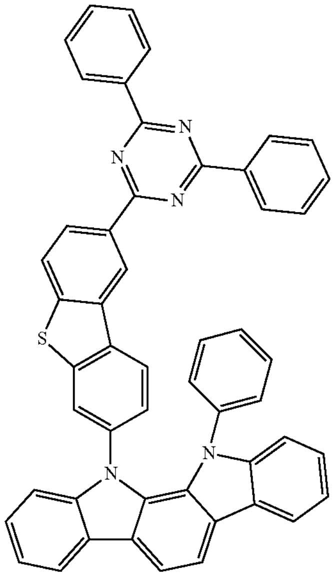
-continued
2-338
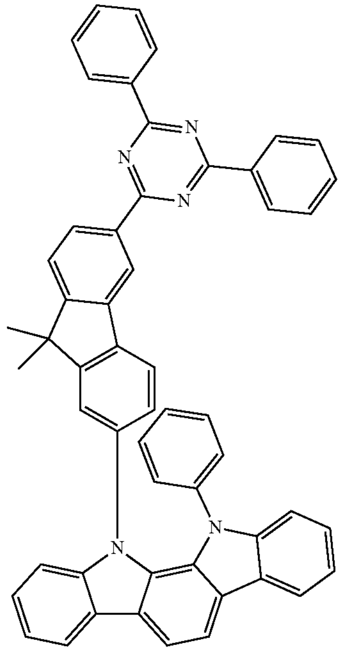
2-339
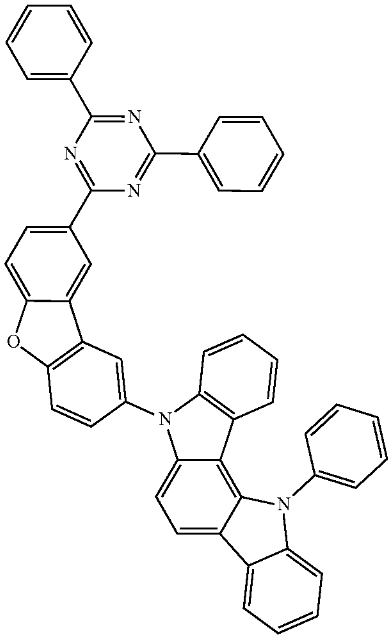

-continued
2-340
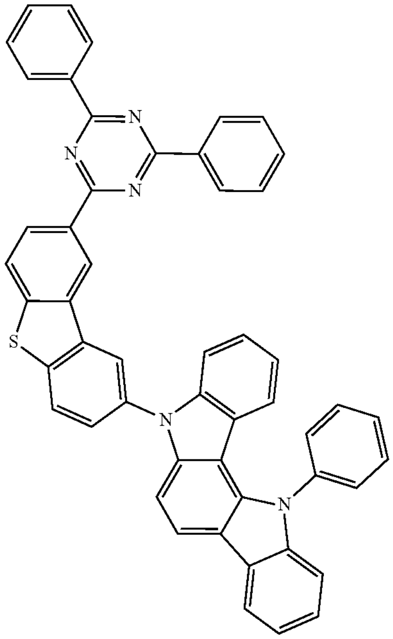
2-341
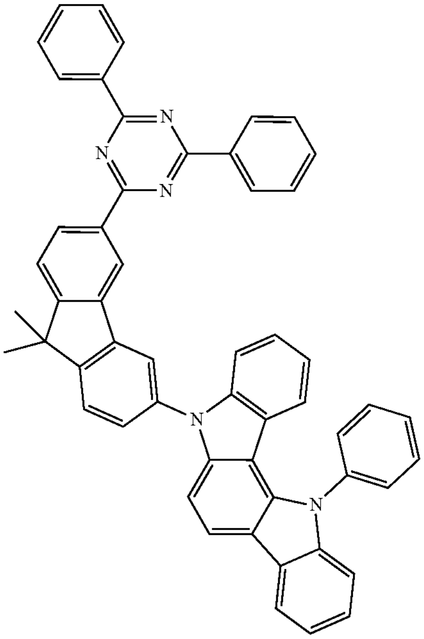
-continued
2-342
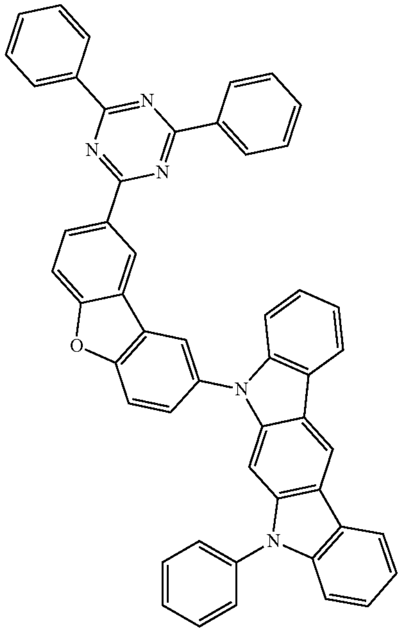
2-343
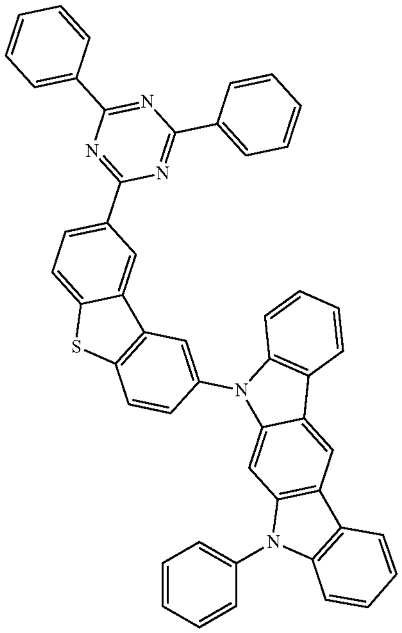

-continued
2-344
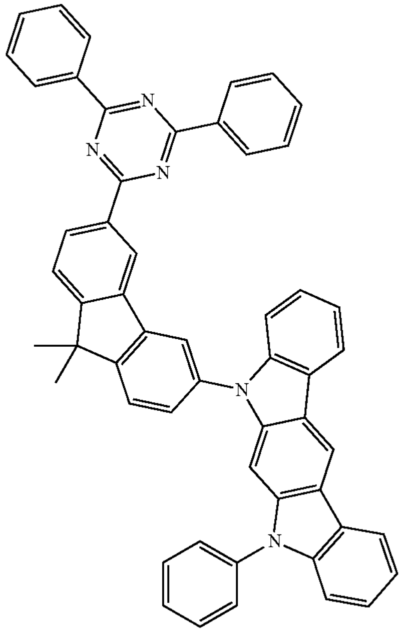
2-345
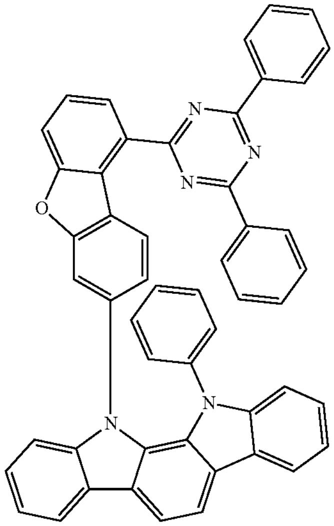
-continued
2-346
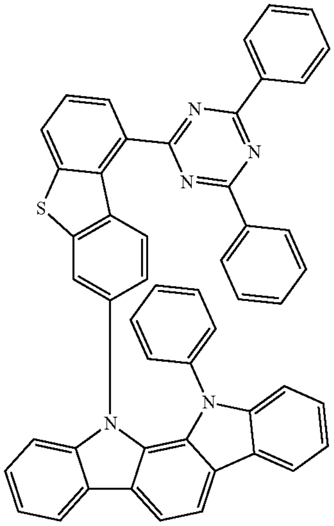
2-347
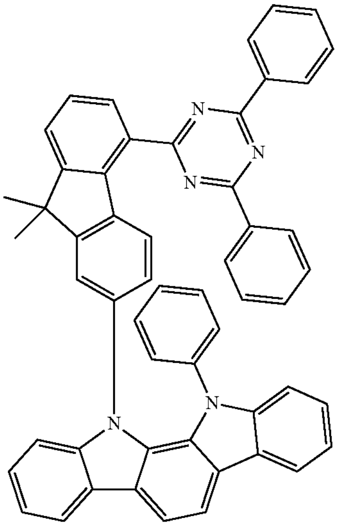
2-348
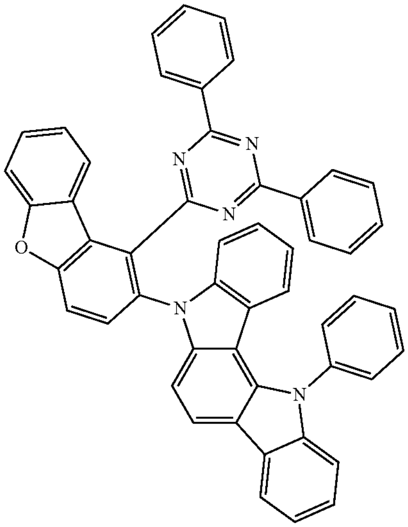

-continued
2-349
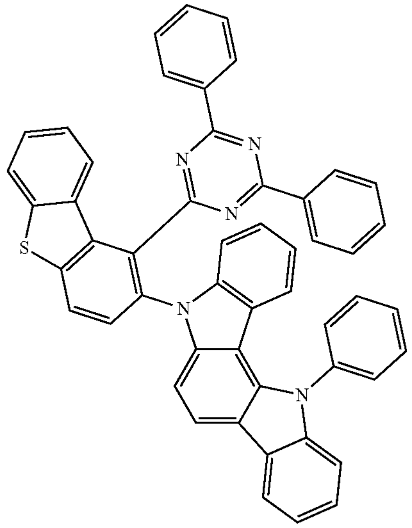
2-350
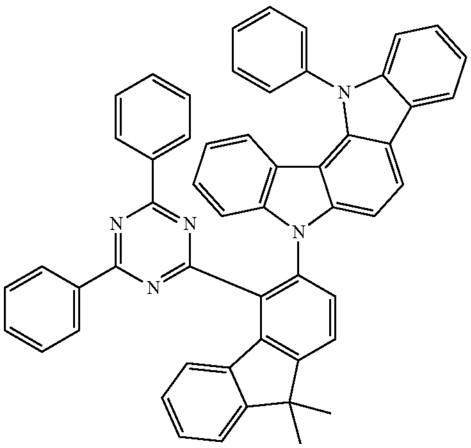
2-351
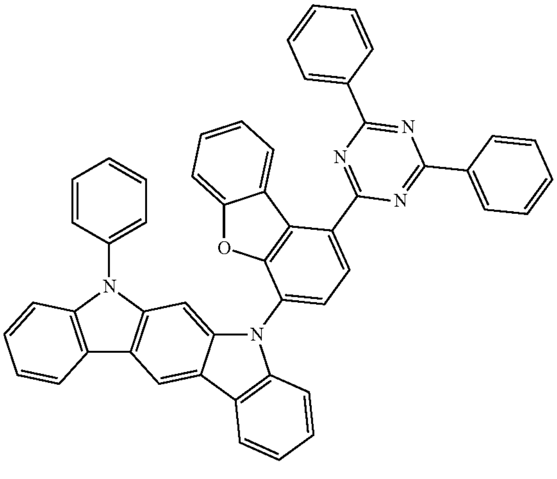
-continued
2-352
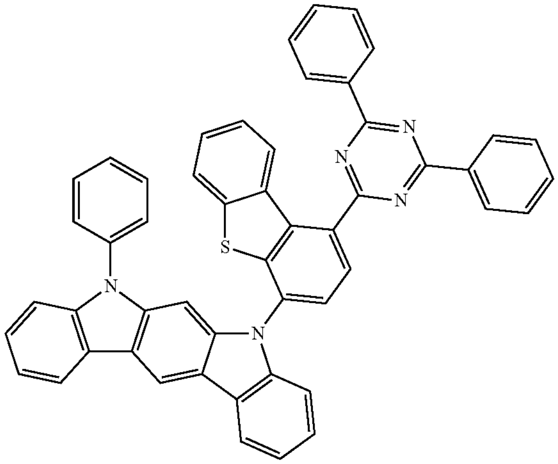
2-353
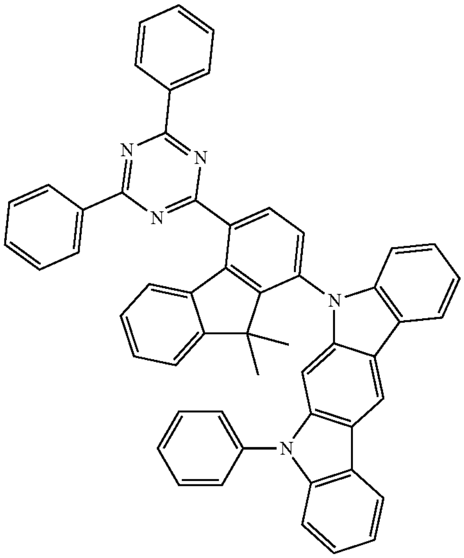
2-354
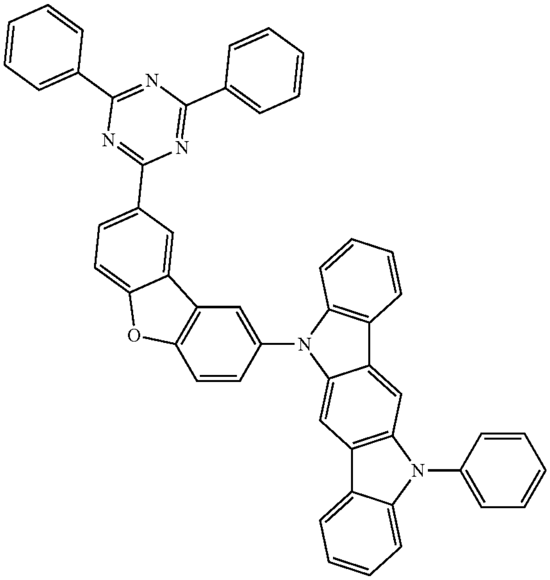

-continued
2-355
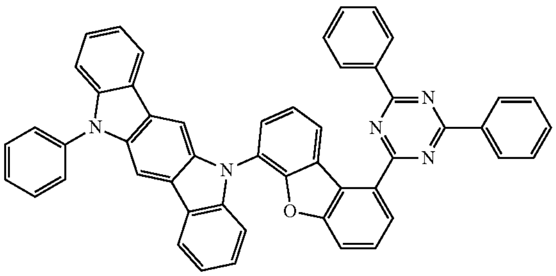
2-356
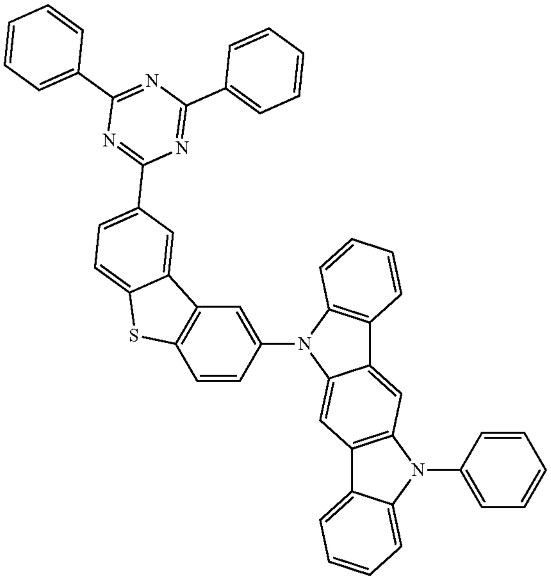
2-357
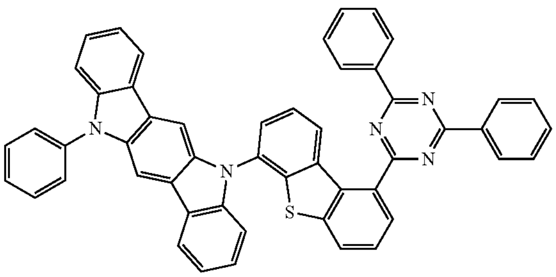
-continued
2-358
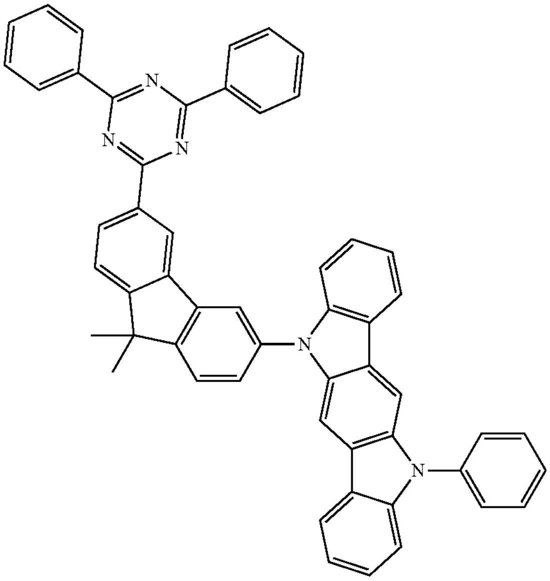
2-359
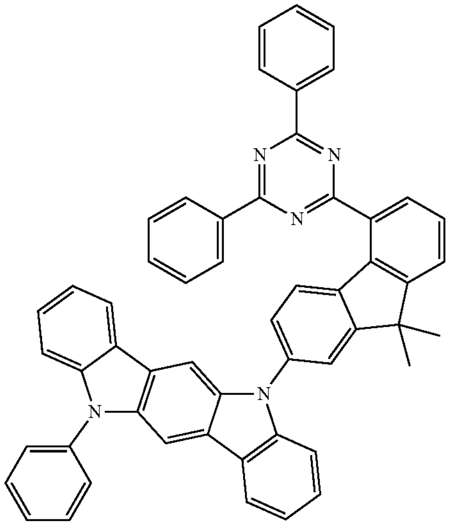
3-360
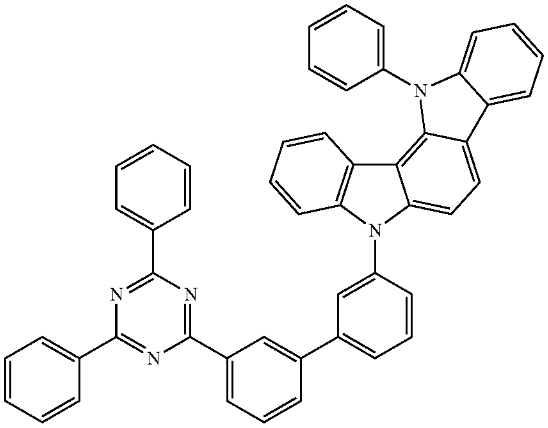

-continued
2-361
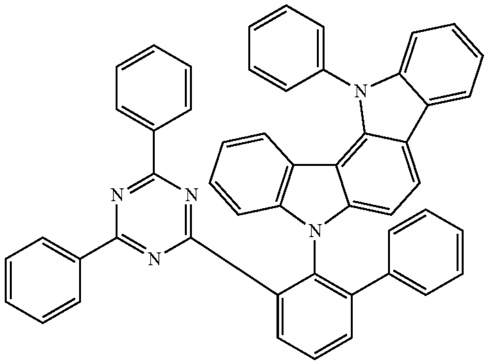
2-362
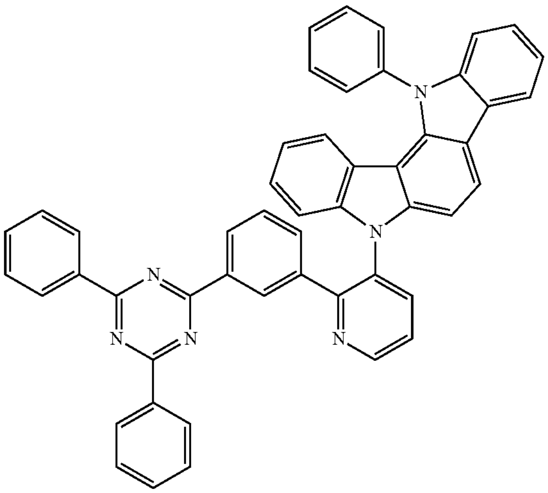
2-363
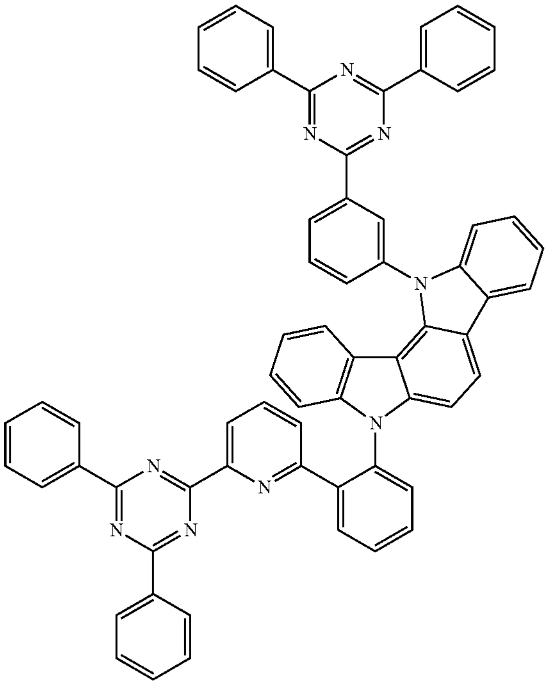
-continued
2-364
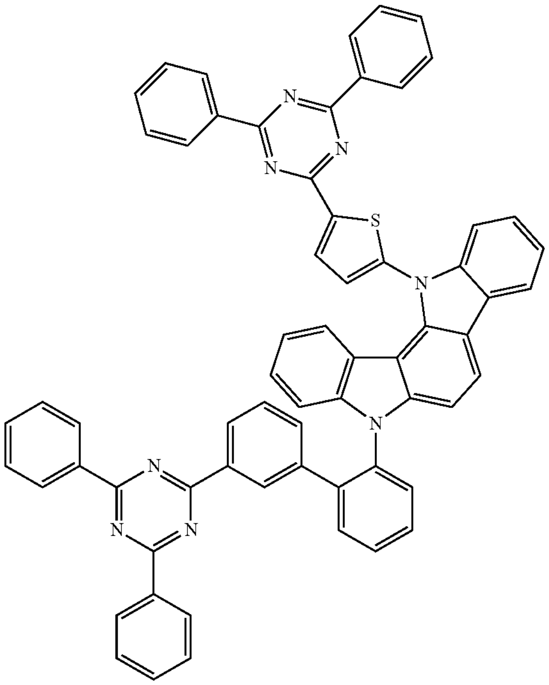
2-365
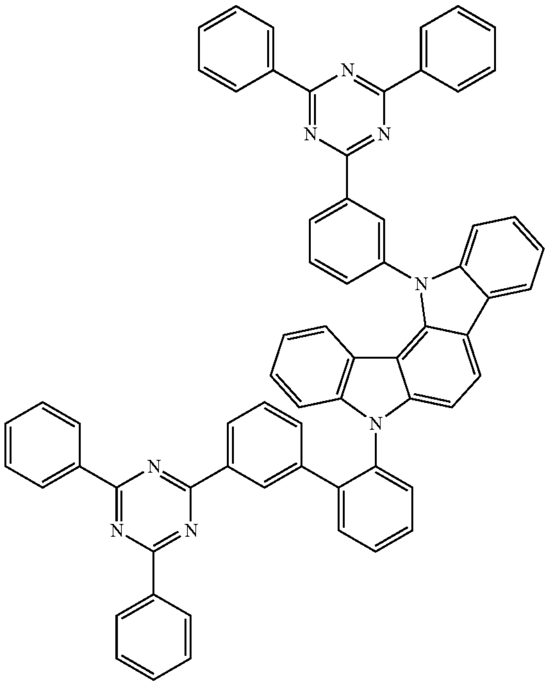

-continued
2-366
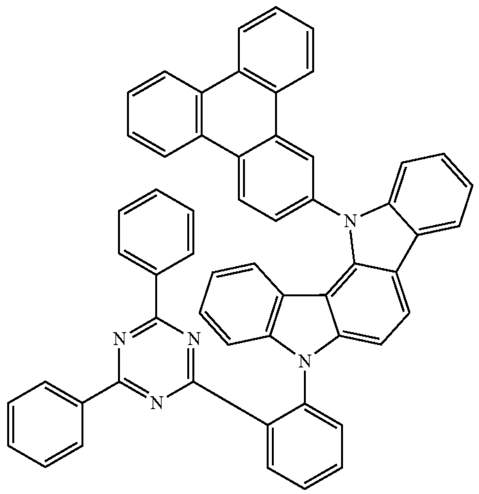
2-367
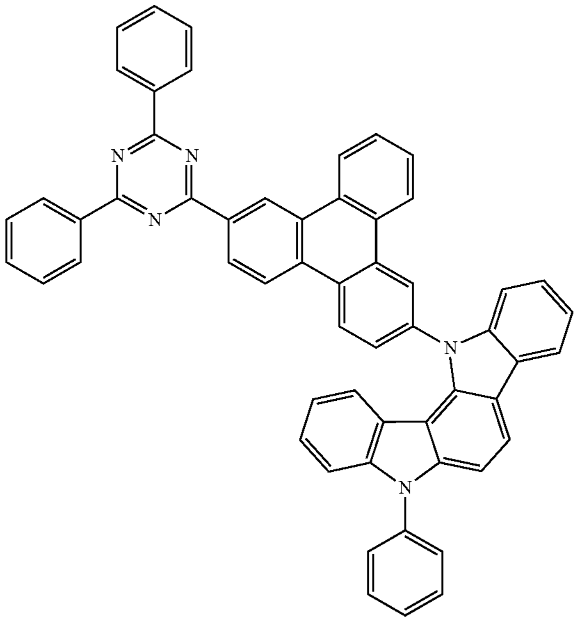
-continued
2-368
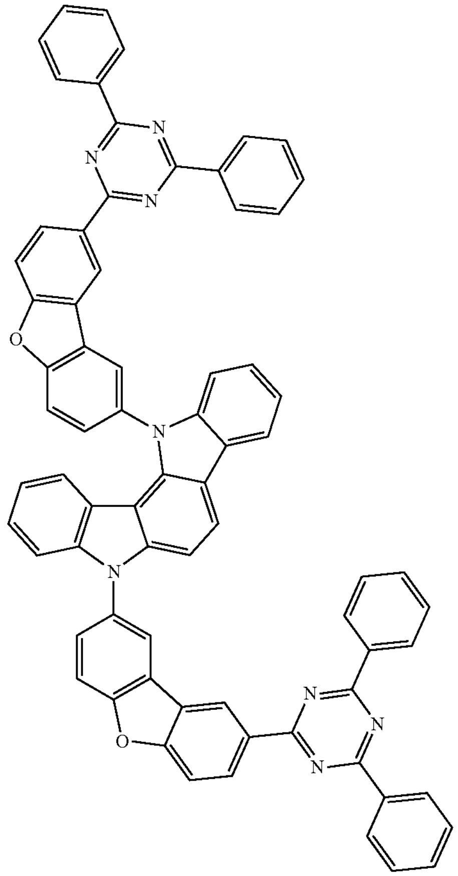
2-369
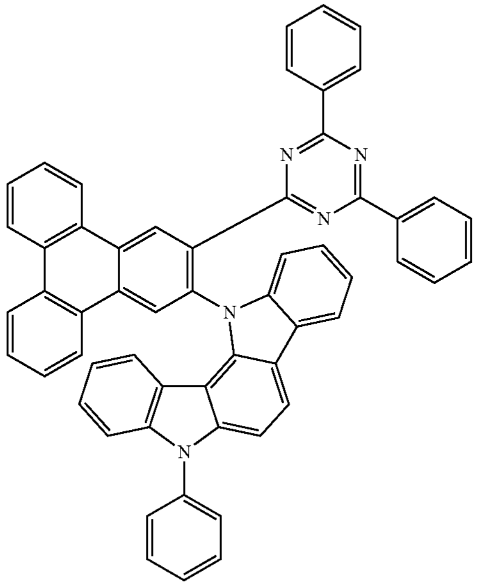

-continued
2-370
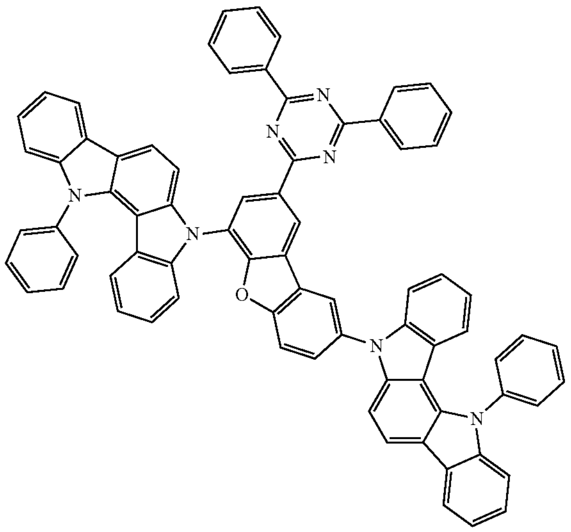
2-371
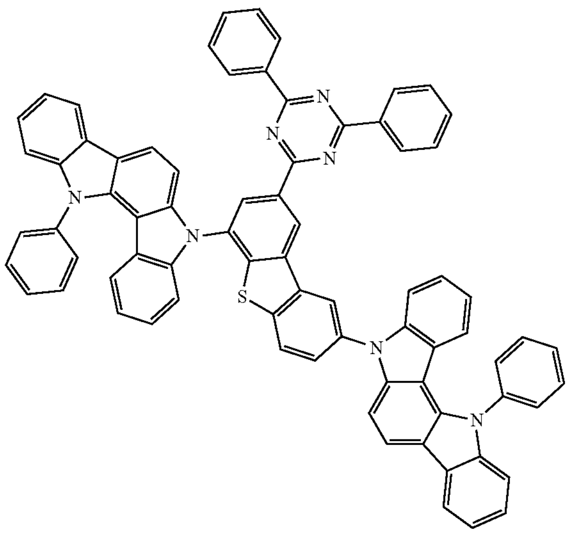
-continued
2-372
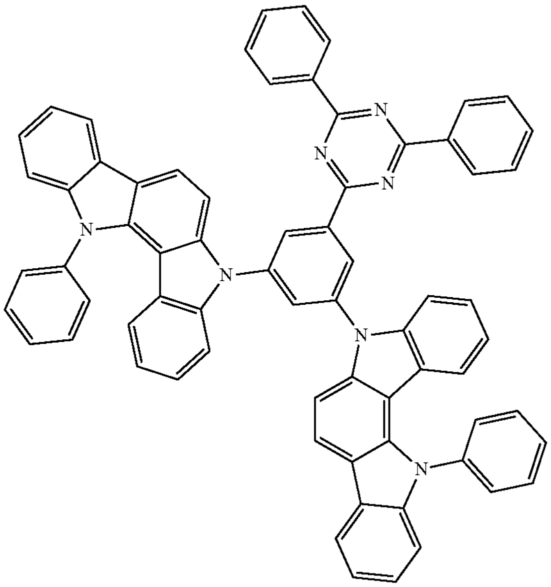
2-373
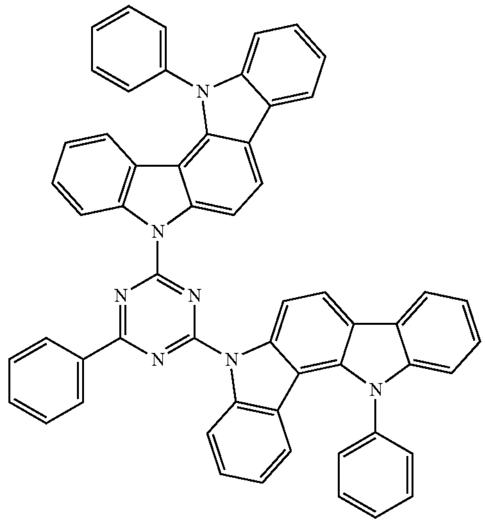
2-374
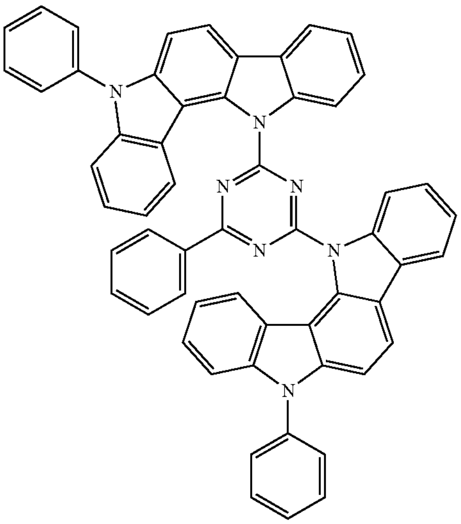

-continued
2-375
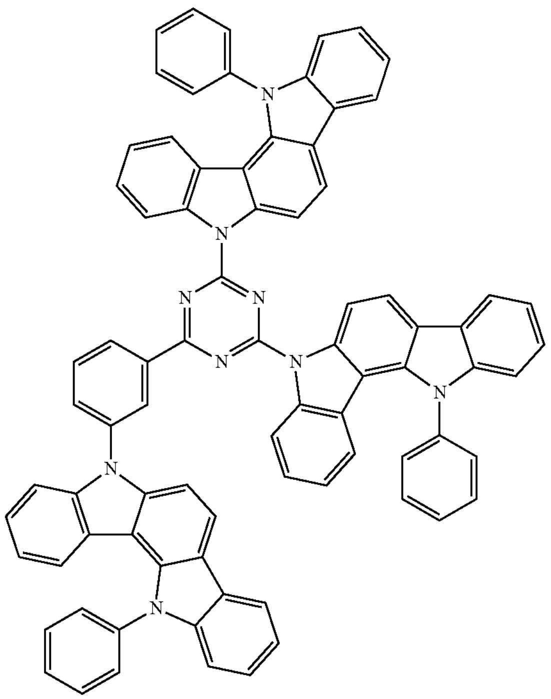
2-376
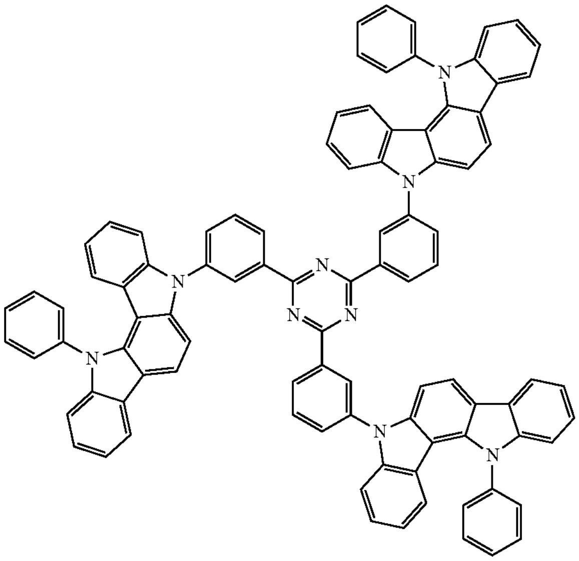
-continued
2-377
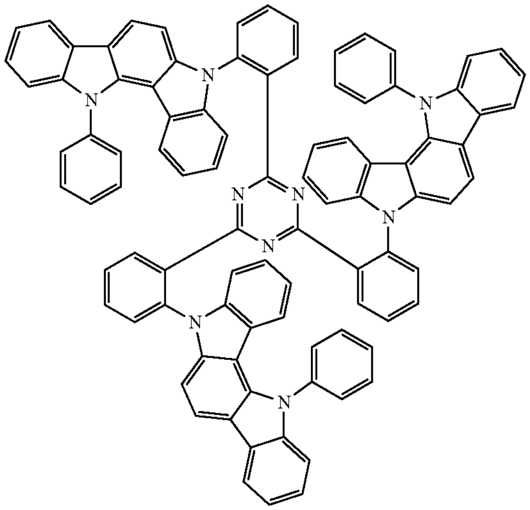
2-378
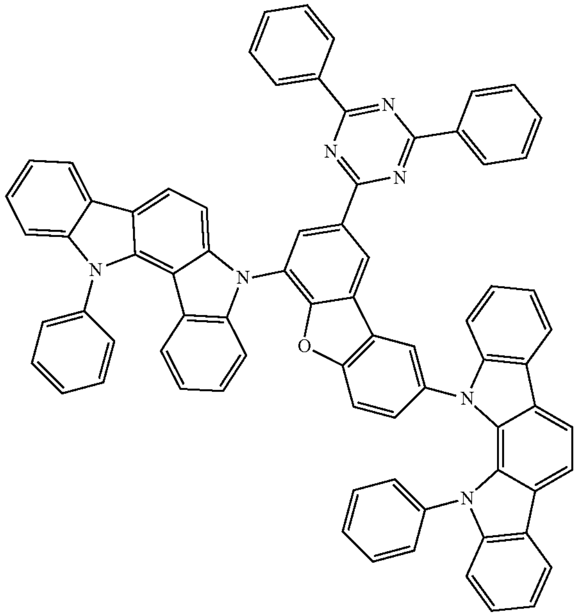

-continued
2-379
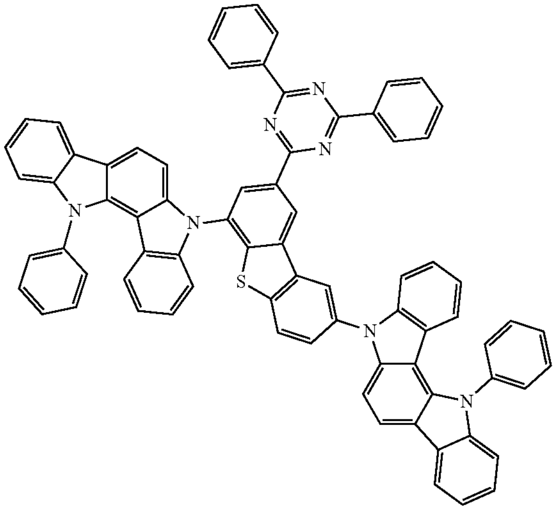
2-380
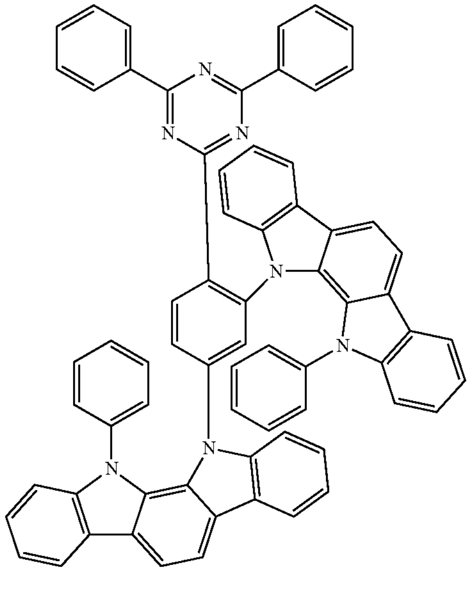
-continued
2-381
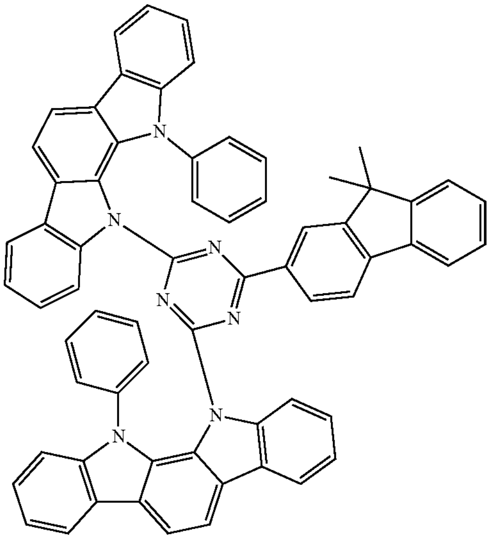
2-382
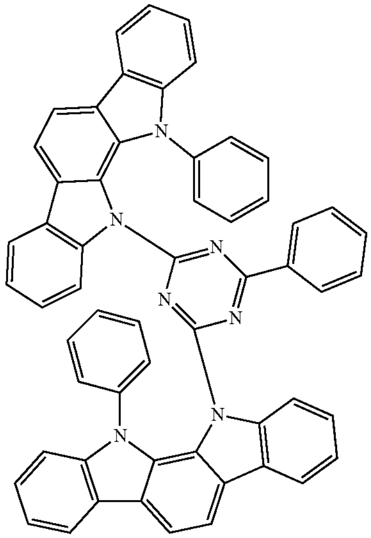
2-383
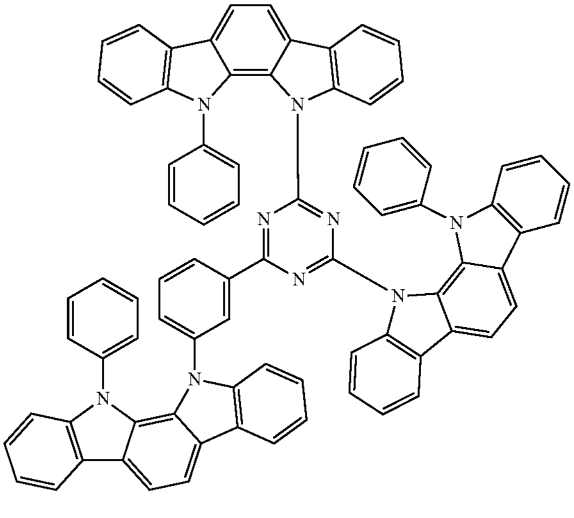

-continued
2-384
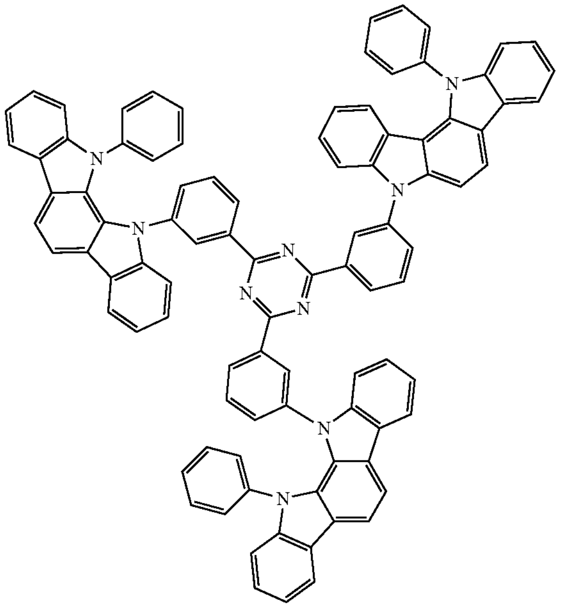
2-385
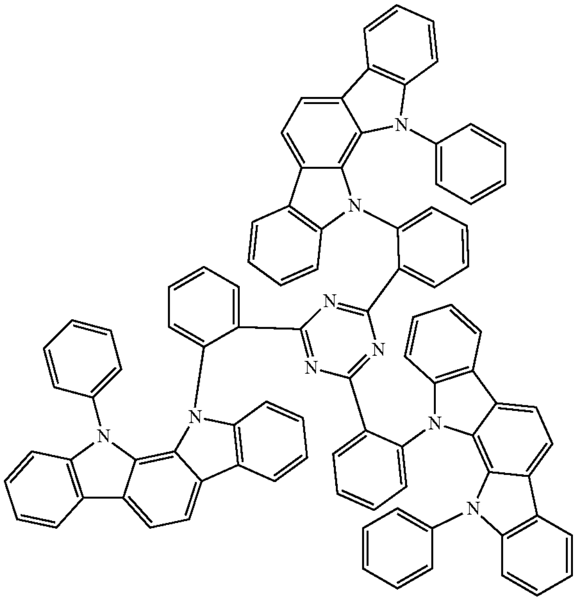
-continued
2-386
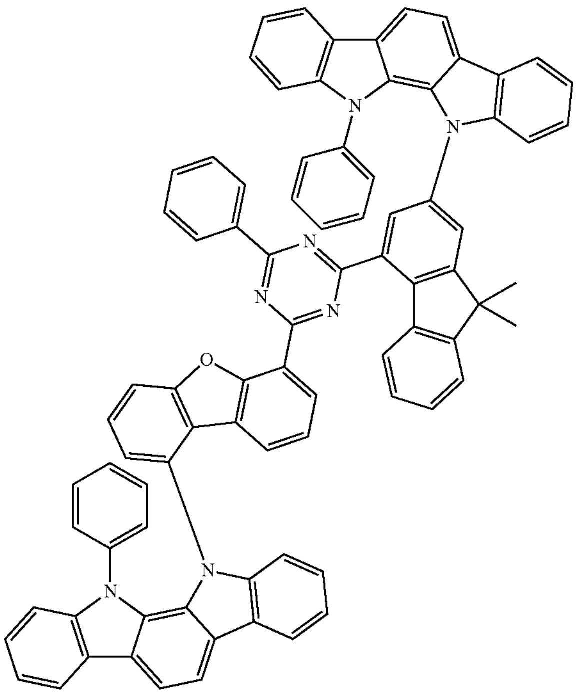
2-387
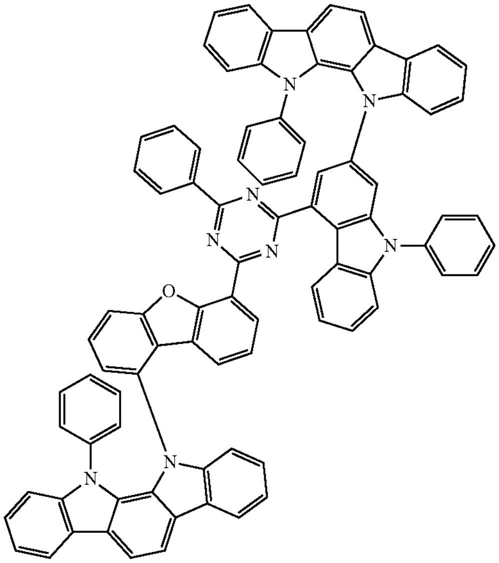

-continued 2-388

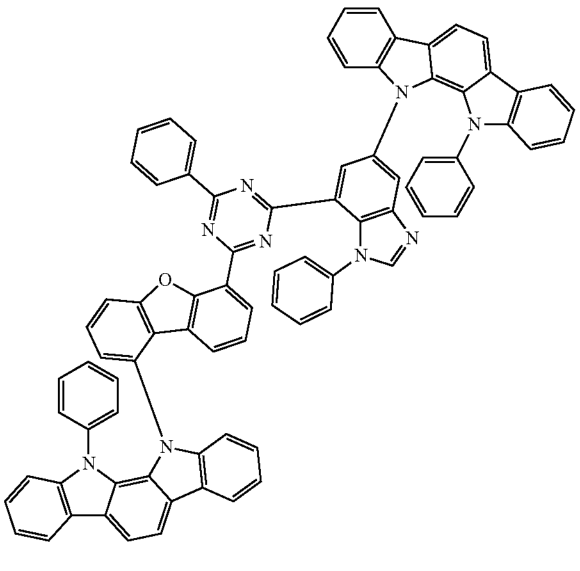

2-389

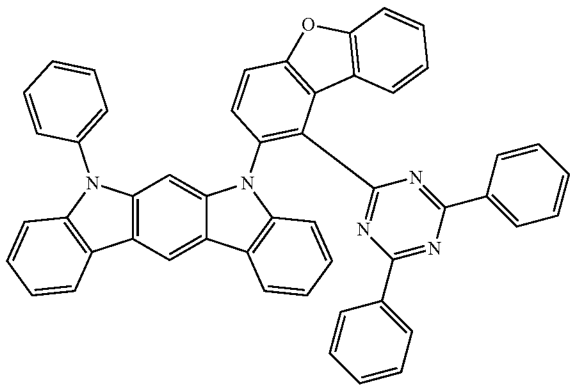

2-390

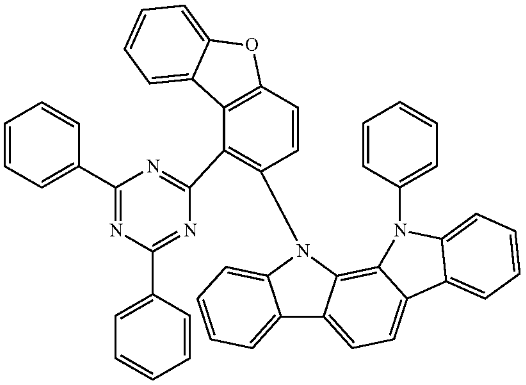

-continued 2-391

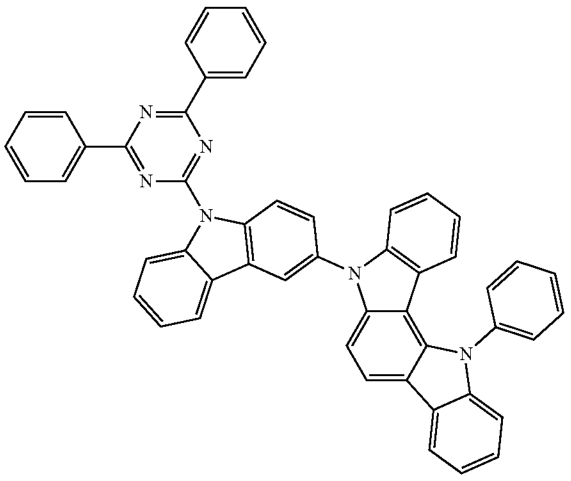

2-392

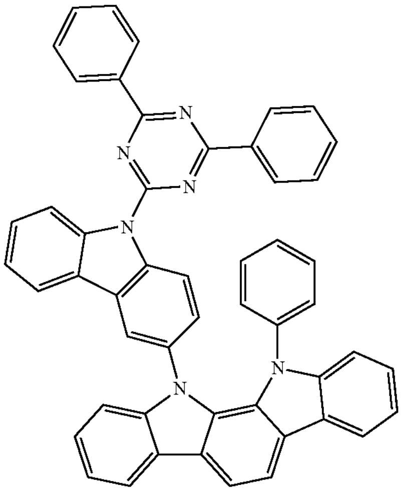

The compound represented by the general formula (1) is a host material, and the compound represented by the general formula (2) is a TADF material. The incorporation of those compounds as a host material or a TADF material into the light-emitting layer can provide a delayed fluorescent emission-type organic EL device having excellent characteristics.

A difference (ΔE) between the excited singlet energy (S1) and excited triplet energy (T1) of the TADF material is preferably 0.2 eV or less, more preferably from 0 eV to 0.15 eV. When the foregoing is satisfied, the material becomes a material excellent as a TADF material. However, when the ΔE becomes as large as, for example, 0.3 eV or more, it becomes difficult for the material to exhibit a function as a TADF material.

In addition, when the host material has an excited triplet energy (T1) larger than the excited singlet energy (S1) and excited triplet energy (T1) of the TADF material, its function as a host is improved.

Each of the TADF material and the host material may be formed of one kind of compound, or may be a mixture of a plurality of compounds.

When two or more kinds of compounds are used as TADF materials, a compound accounting for 50 wt % or more of the compounds only needs to satisfy the above-mentioned characteristic, but each of all the compounds preferably satisfies the above-mentioned characteristic. Similarly, when two or more kinds of compounds are used as host materials, a compound accounting for 50 wt % or more of the compounds only needs to satisfy the above-mentioned characteristic, but each of all the compounds preferably satisfies the above-mentioned characteristic.

In addition, the incorporation of two or more kinds of compounds as host materials can improve the characteristics of the organic EL device. When a compound having the larger singlet energy (S1) is adopted as a first host, and a compound having the smaller singlet energy is adopted as a second host, the first host is preferably the compound represented by the general formula (1). The second host, which may be the compound represented by the general formula (1) or a compound except the compound, is preferably the compound represented by the general formula (1).

Herein, the S1 and the T1 are measured as described below.

A sample compound is vapor-deposited onto a quartz substrate by a vacuum deposition method under the condition of a degree of vacuum of $10^{-4}$ Pa or less to form a deposited film having a thickness of 100 nm. The S1 is calculated by: measuring the emission spectrum of the deposited film; drawing a tangent to the rise-up of the emission spectrum at shorter wavelengths; and substituting a wavelength value λedge [nm] of the point of intersection of the tangent and the axis of abscissa of the spectrum into the following equation (i).

$$S1\ [\text{eV}]=1{,}239.85/\lambda\text{edge} \quad \text{(i)}$$

The T1 is obtained by measuring the phosphorescence spectrum of the deposited film. However, the phosphorescence spectrum of the thin film of a single compound may not be obtained. At that time, a mixed thin film including the sample compound and an appropriate material having a T1 higher than that of the compound is produced, and its phosphorescence spectrum is measured. The T1 is calculated by: drawing a tangent to the rise-up of the phosphorescence spectrum at shorter wavelengths; and substituting a wavelength value λedge [nm] of the point of intersection of the tangent and the axis of abscissa of the spectrum into the equation (ii).

$$T1\ [\text{eV}]=1{,}239.85/\lambda\text{edge} \quad \text{(ii)}$$

Next, the structure of the organic EL device of the present invention is described with reference to the drawings. However, the structure of the organic EL device of the present invention is not limited thereto.

The FIGURE is a sectional view for illustrating a structure example of a general organic EL device used in the present invention. Reference numeral 1 represents a substrate, reference numeral 2 represents an anode, reference numeral 3 represents a hole-injecting layer, reference numeral 4 represents a hole-transporting layer, reference numeral 5 represents a light-emitting layer, reference numeral 6 represents an electron-transporting layer, and reference numeral 7 represents a cathode. The organic EL device of the present invention may include an exciton-blocking layer adjacent to the light-emitting layer, or may include an electron-blocking layer between the light-emitting layer and the hole-injecting layer. The exciton-blocking layer may be inserted on any of the cathode side and the cathode side of the light-emitting layer, and may also be inserted simultaneously on both sides. The organic EL device of the present invention includes the anode, the light-emitting layer, and the cathode as its essential layers. The organic EL device of the present invention preferably includes a hole-injecting/transporting layer and an electron-injecting/transporting layer in addition to the essential layers, and more preferably includes a hole-blocking layer between the light-emitting layer and the electron-injecting/transporting layer. The hole-injecting/transporting layer means any one or both of the hole-injecting layer and the hole-transporting layer, and the electron-injecting/transporting layer means any one or both of an electron-injecting layer and the electron-transporting layer.

It is possible to adopt a reverse structure as compared to the FIGURE, that is, the reverse structure being formed by laminating the layers on the substrate 1 in the order of the cathode 7, the electron-transporting layer 6, the light-emitting layer 5, the hole-transporting layer 4, and the anode 2. In this case as well, some layers may be added or eliminated as required.

—Substrate—

The organic EL device of the present invention is preferably supported by a substrate. The substrate is not particularly limited, and any substrate that has been conventionally used for an organic EL device may be used. For example, a substrate made of glass, a transparent plastic, quartz, or the like may be used.

—Anode—

A material formed of a metal, an alloy, an electrically conductive compound, or a mixture thereof, which has a large work function (4 eV or more), is preferably used as an anode material in the organic EL device. Specific examples of such electrode material include metals, such as Au, and conductive transparent materials, such as CuI, indium tin oxide (ITO), $SnO_2$, and ZnO. In addition, it may be possible to use an amorphous material, such as IDIXO ($In_2O_3$—ZnO), which may be used for producing a transparent conductive film. In order to produce the anode, it may be possible to form any of those electrode materials into a thin film by using a method such as vapor deposition or sputtering and form a pattern having a desired shape thereon by photolithography. Alternatively, in the case of not requiring high pattern accuracy (about 100 μm or more), a pattern may be formed via a mask having a desired shape when any of the above-mentioned electrode materials is subjected to vapor deposition or sputtering. Alternatively, when a coatable substance, such as an organic conductive compound, is used, it is also possible to use a wet film-forming method, such as a printing method or a coating method. When luminescence is taken out from the anode, the transmittance of the anode is desirably controlled to more than 10%. In addition, the sheet resistance as the anode is preferably several hundred Ω/□ or less. The thickness of the film is, depending on its material, selected from the range of typically from 10 nm to 1,000 nm, preferably from 10 nm to 200 nm.

—Cathode—

Meanwhile, a material formed of a metal (referred to as electron-injecting metal), an alloy, an electrically conductive compound, or a mixture thereof, which has a small work function (4 eV or less), is used as a cathode material. Specific examples of such electrode material include sodium, a sodium-potassium alloy, magnesium, lithium, a magnesium/copper mixture, a magnesium/silver mixture, a magnesium/aluminum mixture, a magnesium/indium mixture, an aluminum/aluminum oxide ($Al_2O_3$) mixture, indium, a lithium/aluminum mixture, and a rare earth metal. Of those, for example, a mixture of an electron-injecting metal and a second metal as a stable metal having a larger work function value than that of the former metal, such as a magnesium/silver mixture, a magnesium/aluminum mixture, a magnesium/indium mixture, an aluminum/aluminum oxide ($Al_2O_3$) mixture, or a lithium/aluminum mixture, or aluminum is suitable from the viewpoints of an electron-injecting property and durability against oxidation or the like. The cathode may be produced by forming any of those cathode materials into a thin film by using a method such as vapor deposition or sputtering. In addition, the sheet resistance as the cathode is preferably several hundred Ω/□ or less, and the thickness of the film is selected from the range of typically from 10 nm to 5 μm, preferably from 50 nm to 200 nm. A case in which any one of the anode and cathode of the organic EL device is transparent or semi-transparent so as to transmit emitted light is convenient because the light emission luminance of the device is improved.

In addition, after any of the above-mentioned metals is formed into a film having a thickness of from 1 nm to 20 nm as a cathode, any of the conductive transparent materials mentioned in the description of the anode is formed into a film on the cathode, thereby being able to produce a transparent or semi-transparent cathode. Then, by applying this, it is possible to produce a device in which both the anode and the cathode have transparency.

—Light-Emitting Layer—

The light-emitting layer is a layer that emits light after the production of an exciton by the recombination of a hole injected from the anode and an electron injected from the cathode. Both of the TADF material represented by the general formula (2) and the host material represented by the general formula (1) are used in the light-emitting layer. In addition, the characteristics of the device can be improved by incorporating two or more kinds of host materials as described above. The TADF material is used as a dopant material.

Only one kind of dopant material may be incorporated into the light-emitting layer, or two or more kinds of dopant materials may be incorporated thereinto. The content of the organic light-emitting dopant material formed of the TADF material is preferably from 0.1 wt % to 50 wt %, more preferably from 1 wt % to 30 wt % with respect to the host material.

A phosphorescent light-emitting dopant material is not used in the organic EL device of the present invention because the device of the present invention utilizes TADF.

The host material is preferably a compound having a hole-transporting ability or an electron-transporting ability, and having a high glass transition temperature.

When a plurality of kinds of host materials are used, the respective hosts may be vapor-deposited from different deposition sources, or the plurality of kinds of hosts may be simultaneously vapor-deposited from one deposition source by preliminarily mixing the hosts before the vapor deposition to provide a preliminary mixture.

—Injecting Layer—

The injecting layer refers to a layer formed between an electrode and an organic layer for the purposes of lowering a driving voltage and improving light emission luminance, and includes a hole-injecting layer and an electron-injecting layer. The injecting layer may be interposed between the anode and the light-emitting layer or the hole-transporting layer, or may be interposed between the cathode and the light-emitting layer or the electron-transporting layer. The injecting layer may be formed as required.

—Hole-Blocking Layer—

The hole-blocking layer has, in a broad sense, the function of an electron-transporting layer, and is formed of a hole-blocking material that has a remarkably small ability to transport holes while having a function of transporting electrons, and hence the hole-blocking layer is capable of improving the probability of recombining an electron and a hole in the light-emitting layer by blocking holes while transporting electrons.

A known hole-blocking layer material may also be used in the hole-blocking layer.

—Electron-Blocking Layer—

The electron-blocking layer has, in a broad sense, the function of a hole-transporting layer, and is capable of improving the probability of recombining an electron and a hole in the light-emitting layer by blocking electrons while transporting holes.

A known electron-blocking layer material may be used as a material for the electron-blocking layer, and a material for the hole-transporting layer to be described later may be used as required. The thickness of the electron-blocking layer is preferably from 3 nm to 100 nm, more preferably from 5 nm to 30 nm. The compound represented by the general formula (1) may also be used.

—Exciton-Blocking Layer—

The exciton-blocking layer refers to a layer for blocking excitons produced by the recombination of a hole and an electron in the light-emitting layer from diffusing into charge-transporting layers. The insertion of this layer enables efficient confinement of the excitons in the light-emitting layer, thereby being able to improve the luminous efficiency of the device. In a device in which two or more light-emitting layers are adjacent to each other, the exciton-blocking layer may be inserted between two adjacent light-emitting layers.

A known exciton-blocking layer material may be used as a material for the exciton-blocking layer. Examples thereof include 1,3-dicarbazolylbenzene (mCP) and bis(2-methyl-8-quinolinolato)-4-phenylphenolatoaluminum(III) (BAlq).

—Hole-Transporting Layer—

The hole-transporting layer is formed of a hole-transporting material having a function of transporting holes, and a single hole-transporting layer or a plurality of hole-transporting layers may be formed.

The hole-transporting material has a hole-injecting property or a hole-transporting property or has an electron-blocking property, and any of an organic material and an inorganic material may be used as the hole-transporting material. Any compound selected from conventionally known compounds may be used for the hole-transporting layer. Examples of such hole-transporting material include a porphyrin derivative, an arylamine derivative, a triazole derivative, an oxadiazole derivative, an imidazole derivative, a polyarylalkane derivative, a pyrazoline derivative and a pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a silazane derivative, an aniline-based copolymer, and a conductive high-molecular weight oligomer, in particular, a thiophene oligomer. Of those, a porphyrin derivative, an arylamine derivative, or a styrylamine derivative is preferably used, and an arylamine compound is more preferably used.

—Electron-Transporting Layer—

The electron-transporting layer is formed of a material having a function of transporting electrons, and a single electron-transporting layer or a plurality of electron-transporting layers may be formed.

An electron-transporting material (which also serves as a hole-blocking material in some cases) only needs to have a function of transferring electrons injected from the cathode into the light-emitting layer. Any compound selected from conventionally known compounds may be used for the electron-transporting layer. Examples thereof include a polycyclic aromatic derivative, such as naphthalene, anthracene, or phenanthroline, a tris(8-quinolinolato)aluminum (III) derivative, a phosphine oxide derivative, a nitro-substituted fluorene derivative, a diphenylquinone derivative, a thiopyran dioxide derivative, a carbodiimide, a fluorenylidenemethane derivative, anthraquinodimethane and anthrone derivatives, a bipyridine derivative, a quinoline derivative, an oxadiazole derivative, a benzimidazole derivative, a benzothiazole derivative, and an indolocarbazole derivative. Further, it is also possible to use a polymer material in which any of those materials is introduced in a polymer chain or is used as a polymer main chain.

A method of producing each layer at the time of the production of the organic EL device of the present invention is not particularly limited, and the layer may be produced by any one of a dry process and a wet process.

EXAMPLES

The present invention is hereinafter described in more detail by way of Examples. However, the present invention is not limited to Examples below.

Compounds used in Examples are shown below. In addition, the S1, T1, and S1−T1 (ΔE) of a compound used in each of Examples and Comparative Examples are shown in Table 1.

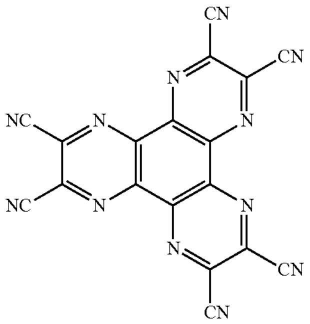

HAT-CN

HT-1

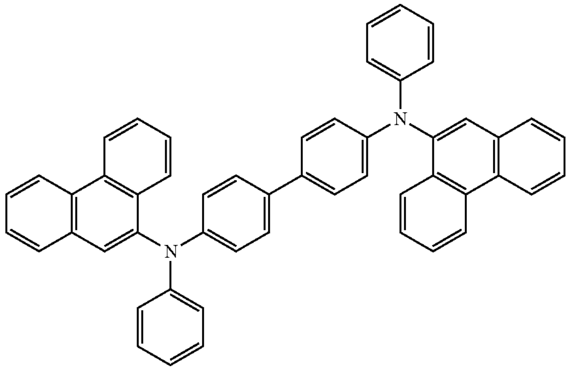

-continued

HT-2

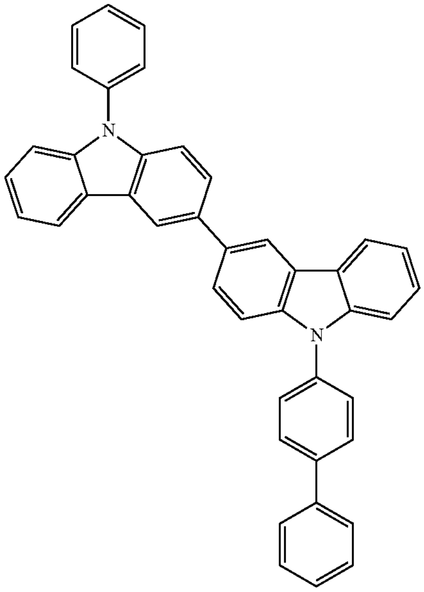

ET-1

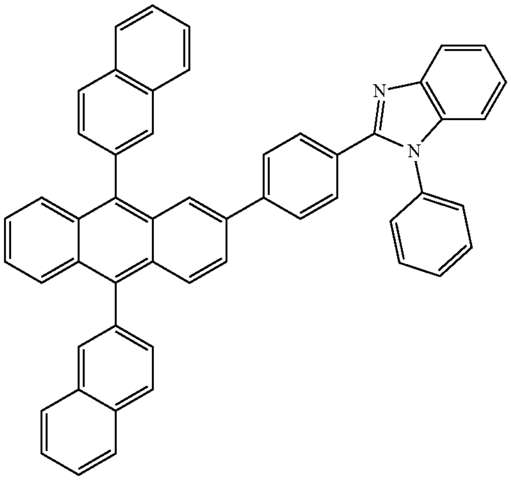

ET-2

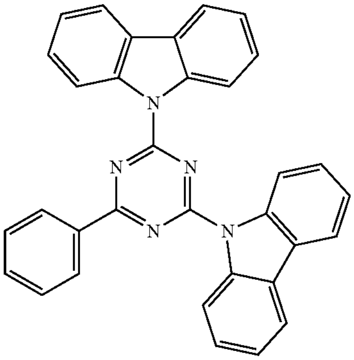

-continued

H-1

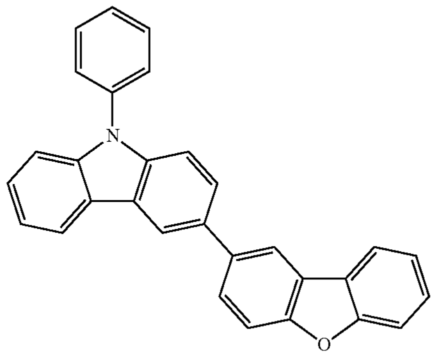

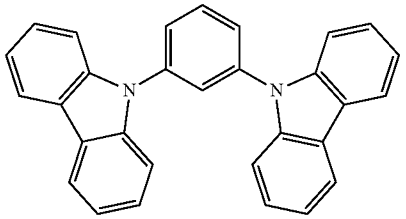

mCP

D-1

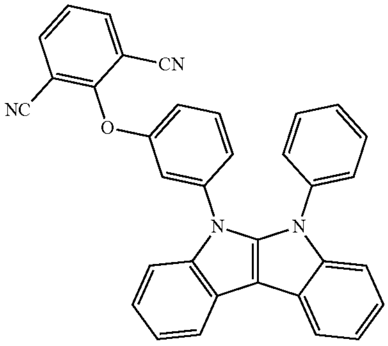

TABLE 1

| Compound | S1 (eV) | T1 (eV) | ΔE (eV) |
|---|---|---|---|
| H-1 | 3.8 | 2.9 | 0.9 |
| 1-1 | 3.7 | 2.9 | 0.8 |
| 1-2 | 3.2 | 2.8 | 0.4 |
| 1-3 | 3.6 | 2.8 | 0.8 |
| 2-50 | 2.9 | 2.9 | 0.0 |
| 2-91 | 2.8 | 2.7 | 0.1 |
| 2-120 | 2.9 | 2.7 | 0.2 |
| 2-178 | 2.7 | 2.7 | 0.0 |
| D-1 | 2.4 | 2.4 | 0.0 |
| mCP | 3.6 | 3.1 | 0.5 |

Experiment Example 1

The fluorescence lifetime of Compound 2-120 was measured. Compound 2-120 and Compound 1-1 were vapor-deposited from different deposition sources onto a quartz substrate by a vacuum deposition method under the condition of a degree of vacuum of $10^{-4}$ Pa or less to form a co-deposited film having a thickness of 100 nm in which the concentration of Compound 2-120 was 15 wt %. The emission spectrum of the thin film was measured and light emission having a peak at 483 nm was observed. In addition, the emission lifetime of the compound was measured with a small fluorescence lifetime-measuring apparatus (Quantaurus-Tau manufactured by Hamamatsu Photonics K.K.) under a nitrogen atmosphere. Fluorescence having an excitation lifetime of 12 ns and delayed fluorescence having an excitation lifetime of 13 μs were observed, and hence it was confirmed that Compound 2-120 was a compound showing delayed fluorescent light emission.

The fluorescence lifetime of each of Compounds 2-50, 2-91, and 2-178 was measured in the same manner as described above. As a result, delayed fluorescence was observed, and hence it was confirmed that the compound was a material showing delayed fluorescent light emission.

Example 1

Each thin film was laminated on a glass substrate having formed thereon an anode formed of ITO having a thickness of 70 nm by a vacuum deposition method at a degree of vacuum of $4.0\times10^{-5}$ Pa. First, HAT-CN was formed into a hole-injecting layer having a thickness of 10 nm on ITO, and then Compound HT-1 was formed into a hole-transporting layer having a thickness of 25 nm. Next, Compound HT-2 was formed into an electron-blocking layer having a thickness of 5 nm. Then, Compound 1-1 serving as a host and Compound 2-50 serving as a dopant were co-deposited from deposition sources different from each other to form a light-emitting layer having a thickness of 30 nm. At this time, the co-deposition was performed under such a deposition condition that the concentration of Compound 2-50 became 30 wt %. Next, Compound ET-2 was formed into a hole-blocking layer having a thickness of 5 nm. Next, Compound ET-1 was formed into an electron-transporting layer having a thickness of 40 nm. Further, lithium fluoride (LiF) was formed into an electron-injecting layer having a thickness of 1 nm on the electron-transporting layer. Finally, aluminum (Al) was formed into a cathode having a thickness of 70 nm on the electron-injecting layer. Thus, an organic EL device was produced.

Examples 1 to 10 and Comparative Examples 1 to 5

Organic EL devices were each produced in the same manner as in Example 1 except that in Example 1, the host and the dopant were changed to compounds shown in Table 2. Herein, when a second host was used as a host, a light-emitting layer was formed by co-depositing the first host and the second host under such a deposition condition that a weight ratio between the first host and the second host became 50:50.

TABLE 2

| | Dopant | Host | Second host |
|---|---|---|---|
| Ex. 1 | 2-50 | 1-1 | — |
| Ex. 2 | 2-50 | 1-3 | — |
| Ex. 3 | 2-120 | 1-1 | — |
| Ex. 4 | 2-120 | 1-3 | — |
| Ex. 5 | 2-91 | 1-1 | — |
| Ex. 6 | 2-91 | 1-3 | — |
| Ex. 7 | 2-178 | 1-1 | — |
| Ex. 8 | 2-178 | 1-3 | — |
| Ex. 9 | 2-120 | 1-1 | 1-2 |
| Ex. 10 | 2-120 | 1-1 | ET-2 |

TABLE 2-continued

| | Dopant | Host | Second host |
|---|---|---|---|
| Comp. Ex. 1 | 2-50 | mCP | — |
| Comp. Ex. 2 | 2-120 | mCP | — |
| Comp. Ex. 3 | 2-50 | H-1 | — |
| Comp. Ex. 4 | 2-120 | H-1 | — |
| Comp. Ex. 5 | D-1 | 1-1 | — |

The local maximum wavelengths of the emission spectra of the produced organic EL devices, and the external quantum efficiencies (EQEs), voltages, and device lifetimes of the devices are shown in the following table. The local maximum wavelengths, the EQEs, and the voltages are values at a driving current density of 2.5 $mA/cm^2$, and are initial characteristics. The lifetimes were each defined as a time period required for a luminance to attenuate to 95% of an initial luminance at a constant current density of 2.5 $mA/cm^2$.

TABLE 3

| | Local maximum emission wavelength (nm) | EQE (%) | Voltage (V) | Lifetime (h) |
|---|---|---|---|---|
| Ex. 1 | 505 | 8.7 | 3.9 | 80 |
| Ex. 2 | 505 | 9.1 | 3.9 | 86 |
| Ex. 3 | 480 | 10.3 | 4.2 | 81 |
| Ex. 4 | 480 | 12.0 | 3.9 | 101 |
| Ex. 5 | 485 | 13.2 | 3.9 | 63 |
| Ex. 6 | 485 | 14.8 | 4.0 | 90 |
| Ex. 7 | 500 | 15.2 | 4.1 | 139 |
| Ex. 8 | 500 | 16.4 | 3.9 | 152 |
| Ex. 9 | 480 | 14.0 | 4.5 | 162 |
| Ex. 10 | 480 | 15.0 | 4.2 | 172 |
| Comp. Ex. 1 | 505 | 6.2 | 5.5 | 12 |
| Comp. Ex. 2 | 480 | 8.6 | 5.2 | 20 |
| Comp. Ex. 3 | 505 | 7.6 | 4.7 | 40 |
| Comp. Ex. 4 | 480 | 9.2 | 4.6 | 55 |
| Comp. Ex. 5 | 530 | 6.5 | 4.2 | 2 |

As can be seen from the table, Examples 1 to 10 in each of which the host represented by the general formula (1) and the dopant represented by the general formula (2) are used in the light-emitting layer have high luminous efficiencies and excellent lifetime characteristics as compared to those of Comparative Examples 1 and 2 in each of which mCP generally used as a host is used. In addition, it is found that Examples 1 to 8 in each of which the host represented by the general formula (1) and the dopant represented by the general formula (2) are used in the light-emitting layer have excellent lifetime characteristics as compared to that of Comparative Example 5 in which the indoloindole compound is used as the dopant. In addition, it is found that Examples 1 to 8 in each of which the para-biphenylcarbazole compound is used have high luminous efficiencies and excellent lifetime characteristics as compared to those of Comparative Examples 3 and 4 in each of which the phenylcarbazole compound is used. In addition, it is found that Examples 9 and 10 in each of which the second host is used have high luminous efficiencies and excellent lifetime characteristics as compared to those of Example 3 in which the single host is used.

REFERENCE SIGNS LIST

1 substrate, 2 anode, 3 hole-injecting layer, 4 hole-transporting layer, 5 light-emitting layer, 6 electron-transporting layer, 7 cathode

The invention claimed is:

1. An organic electroluminescent device, comprising one or more light-emitting layers between an anode and a cathode opposite to each other, wherein at least one of the light-emitting layers consists of one or two kinds of host material represented by the following general formula (1) and at least one kind of thermally activated delayed fluorescent light-emitting material represented by the following general formula (2):

(1)

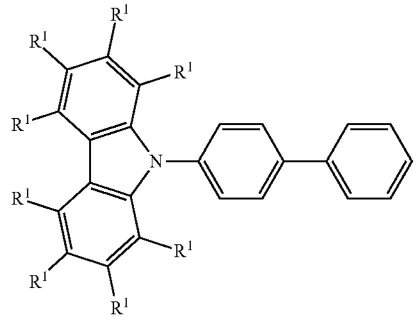

wherein, $R^1$s each independently represent hydrogen, an aliphatic hydrocarbon group having 1 to 8 carbon atoms, an unsubstituted aromatic hydrocarbon group having 6 to 18 carbon atoms, an unsubstituted aromatic heterocyclic group having 3 to 17 carbon atoms, or a linked aromatic group formed by linking 2 to 6 aromatic rings of aromatic groups each selected from the aromatic hydrocarbon group and the aromatic heterocyclic group, provided that none of $R^1$s represents a carbazolyl group; and at least one of $R^1$s represents an aromatic group selected from the group consisting of an unsubstituted phenyl group, an unsubstituted dibenzofuranyl group, a substituted or an unsubstituted dibenzothiophenyl group, an unsubstituted triazolyl group, and a linked aromatic group formed by linking 2 to 4 of the groups;

(2)

$(Z)_a{-}Ar^1$ (2a)

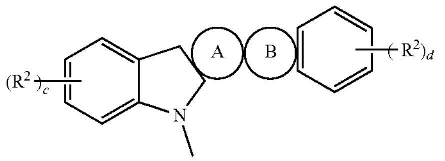

(2b)

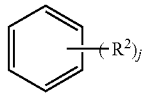

(2c)

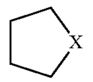

wherein,

Z is represented by the formula (2a), and in the formula (2a), a ring A is an aromatic hydrocarbon ring represented by the formula (2b), a ring B is a heterocycle represented by the formula (2c), and the ring A and the ring B are each fused with an adjacent ring at arbitrary positions, and X is N—$Ar^2$;

$Ar^1$ represents a group represented by the following formula (3):

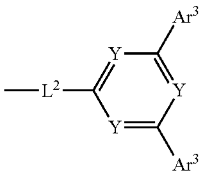

(3)

wherein Ys each represent a N atom or $CR^3$, and at least one of Ys represents a N atom, $L^2$ represents a single bond, an aromatic hydrocarbon group having 6 to 18 carbon atoms, or an aromatic heterocyclic group having 3 to 17 carbon atoms, $R^3$ represents a hydrogen atom, or a substituted or unsubstituted aromatic hydrocarbon group having 6 to 18 carbon atoms, and $Ar^3$s each independently represent a hydrogen atom, a substituted or unsubstituted aromatic hydrocarbon group having 6 to 18 carbon atoms, a substituted or unsubstituted aromatic heterocyclic group having 3 to 17 carbon atoms, or a linked aromatic group formed by linking 2 to 4 aromatic rings of aromatic groups each selected from the aromatic hydrocarbon group and the aromatic heterocyclic group;

$Ar^2$ represents a substituted or unsubstituted aromatic hydrocarbon group having 6 to 18 carbon atoms, a substituted or unsubstituted aromatic heterocyclic group having 3 to 17 carbon atoms, or a linked aromatic group formed by linking 2 to 6 aromatic rings of aromatic groups each selected from the aromatic hydrocarbon group and the aromatic heterocyclic group;

$R^2$s each independently represent an aliphatic hydrocarbon group having 1 to 10 carbon atoms; and a represents an integer of 1, c and d each independently represent an integer of 0, and j represents an integer of 0.

2. The organic electroluminescent device according to claim 1, wherein at least two of R's each represent the aromatic group.

3. The organic electroluminescent device according to claim 1, wherein a difference between an excited singlet energy (S1) and an excited triplet energy (T1) of the thermally activated delayed fluorescent material represented by the general formula (2) is 0.2 eV or less, and the host material represented by the general formula (1) has an excited triplet energy (T1) larger than the excited singlet energy (S1) and the excited triplet energy (T1) of the thermally activated delayed fluorescent material.

* * * * *